United States Patent
Yoshizaki et al.

(10) Patent No.: US 11,201,297 B2
(45) Date of Patent: Dec. 14, 2021

(54) ORGANIC ELECTROLUMINESCENCE DEVICE AND ELECTRONIC DEVICE

(71) Applicant: IDEMITSU KOSAN CO., LTD., Chiyoda-ku (JP)

(72) Inventors: Kei Yoshizaki, Sodegaura (JP); Toshinari Ogiwara, Sodegaura (JP); Yuichiro Kawamura, Sodegaura (JP); Keiichi Yasukawa, Sodegaura (JP); Kei Yoshida, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 383 days.

(21) Appl. No.: 16/356,183

(22) Filed: Mar. 18, 2019

(65) Prior Publication Data
US 2019/0288221 A1    Sep. 19, 2019

(30) Foreign Application Priority Data
Mar. 19, 2018    (JP) ................... JP2018-051802

(51) Int. Cl.
*H01L 51/00* (2006.01)
*H01L 51/50* (2006.01)

(52) U.S. Cl.
CPC ........ *H01L 51/0072* (2013.01); *H01L 51/006* (2013.01); *H01L 51/008* (2013.01);
(Continued)

(58) Field of Classification Search
CPC ......... H01L 2251/5384; H01L 51/0008; H01L 51/0054; H01L 51/0058; H01L 51/006;
(Continued)

(56) References Cited

U.S. PATENT DOCUMENTS 5,683,823 A * 11/1997 Shi .................. C09K 11/06
                                                428/690
2016/0190469 A1    6/2016 Ogiwara et al.
(Continued)

FOREIGN PATENT DOCUMENTS

JP         2016-6033       1/2016
WO    WO 2012/153780 A1   11/2012
(Continued)

OTHER PUBLICATIONS

Nguyen et al., Bull. Korean Chem. Soc. (2014), vol. 35, No. 4, pp. 1247-1250. (Year: 2014).*
(Continued)

*Primary Examiner* — Dawn L Garrett
(74) *Attorney, Agent, or Firm* — Oblon, McClelland, Maier & Neustadt, L.L.P.

(57) ABSTRACT

An organic electroluminescence device includes an anode, a second organic layer, a first organic layer, and a cathode in this order. The first organic layer contains a first compound and a second compound. The second organic layer contains a third compound. The first compound is a compound represented by a formula (1). The second compound is a delayed fluorescent compound. The third compound is a compound represented by a formula (3). In the formula (1), X is a nitrogen atom or a carbon atom bonded to Y, Y being a hydrogen atom or a substituent. In the formula (3), n is an integer ranging from 1 to 4, $X_B$ is a group represented by a formula (3A). In the formula (3A), $Ar_1$ and $Ar_2$ are each independently a monovalent or polyvalent aromatic hydrocarbon group, and Cz is a group represented by a formula (3B-1) or the like.

(Continued)

US 11,201,297 B2
Page 2

(58) Field of Classification Search
CPC ............. H01L 51/0067; H01L 51/0071; H01L 51/0072; H01L 51/0073; H01L 51/008; H01L 51/5012; H01L 51/5016; H01L 51/5056; H01L 51/5072; H01L 51/5092; H01L 51/5096
See application file for complete search history.

(56) References Cited

U.S. PATENT DOCUMENTS

| | | |
|---|---|---|
| 2020/0083460 A1 | 3/2020 | Duan et al. |
| 2021/0020846 A1 | 1/2021 | Yoshizaki et al. |
| 2021/0074925 A1 | 3/2021 | Yoshizaki et al. |
| 2021/0151683 A1 | 5/2021 | Sakaino et al. |

FOREIGN PATENT DOCUMENTS

| | | |
|---|---|---|
| WO | WO 2013/038650 A1 | 3/2013 |
| WO | WO 2013/180241 A1 | 12/2013 |
| WO | WO 2014/092083 A1 | 6/2014 |
| WO | WO 2014/104346 A1 | 7/2014 |
| WO | WO 2016/056559 A1 | 4/2016 |
| WO | WO 2019/013063 A1 | 1/2019 |
| WO | WO 2019/181858 A1 | 9/2019 |
| WO | WO 2019/181859 A1 | 9/2019 |

OTHER PUBLICATIONS

Adachi, C., et al. "Yuki Hando-tai no Debaisu Bussei (Device Physics of Organic Semiconductors)", Kodansha, 2012, pp. 261-268 (with English Tranlstation).

Uoyama, H., et al. "Highly efficient organic light-emitting diodes from delayed fluorescence", Nature, vol. 492, 2012, pp. 234-238.

Japanese Office Action dated Jun. 29, 2021 in Japanese Patent Application No. 2018-051802, 2 pages.

\* cited by examiner

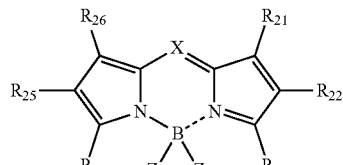

(1)

$(Cz)_n$—$X_B$ (3)

$Ar_1$—$(Ar_2)_k$ (3A)

(3B-1)

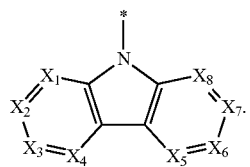

36 Claims, 5 Drawing Sheets

(52) U.S. Cl.
CPC ...... *H01L 51/0058* (2013.01); *H01L 51/0067* (2013.01); *H01L 51/0073* (2013.01); *H01L 51/5016* (2013.01); *H01L 51/0008* (2013.01); *H01L 51/5056* (2013.01); *H01L 51/5072* (2013.01); *H01L 51/5092* (2013.01); *H01L 51/5096* (2013.01)

ORGANIC ELECTROLUMINESCENCE DEVICE AND ELECTRONIC DEVICE

The entire disclosure of Japanese Patent Application No. 2018-051802 filed Mar. 19, 2018 is expressly incorporated by reference herein.

TECHNICAL FIELD

The present invention relates to an organic electroluminescence device and an electronic device.

BACKGROUND ART

When a voltage is applied to an organic electroluminescence device (hereinafter, occasionally referred to as "organic EL device"), holes and electrons are injected into an emitting layer from an anode and a cathode, respectively. The injected electrons and holes are recombined in the emitting layer to form excitons.

At this time, according to the electron spin statistics theory, singlet excitons and triplet excitons are generated at a ratio of 25%:75%.

A fluorescent organic EL device with emission caused by singlet excitons, which has been applied to a full-color display for a mobile phone, TV and the like, is inferred to exhibit an internal quantum efficiency of 25% at a maximum.

Accordingly, studies have been made in order to improve the performance of organic EL devices.

Use of triplet excitons in combination with singlet excitons has been expected to allow the organic EL device to emit light with higher efficiency. In view of the above, a highly efficient fluorescent organic EL device with thermally activated delayed fluorescence (sometimes referred to as "delayed fluorescence, hereinafter) has been proposed and studied.

For instance, a thermally activated delayed fluorescence (TADF) mechanism has been studied. The TADF mechanism uses a phenomenon where inverse intersystem crossing from triplet excitons to singlet excitons thermally occurs when a material having a small energy difference ($\Delta ST$) between singlet energy level and triplet energy level is used. As for thermally activated delayed fluorescence, refer to, for instance, ADACHI, Chihaya, ed. (Apr. 1, 2012), "Yuki Hando-tai no Debaisu Bussei (Device Physics of Organic Semiconductors)", Kodansha, pp. 261-268. Organic EL devices with such a TADF mechanism are disclosed in, for instance, Patent Literature 2 (WO 2016/056559). Further, Patent Literature 1 (JP 2016-6033 A) discloses a compound having a structure similar to a compound disclosed in Patent Literature 2.

However, further improvement in performance is demanded in the field of organic EL devices.

SUMMARY OF THE INVENTION

An object of the invention is to provide a high-performance organic electroluminescence device. Specifically, an object of the invention is to provide an organic electroluminescence device capable of improving at least one of luminous efficiency and lifetime.

Another object of the invention is to provide an electronic device including the organic electroluminescence device.

An organic electroluminescence device according to an aspect of the invention includes:

an anode;
a cathode;
a first organic layer interposed between the anode and the cathode;
a second organic layer interposed between the anode and the first organic layer, in which
the first organic layer includes a first compound and a second compound,
the second organic layer includes a third compound,
the first compound is a compound represented by a formula (1) below,
the second compound is a delayed fluorescent compound, and
the third compound is a compound represented by a formula (3) below,

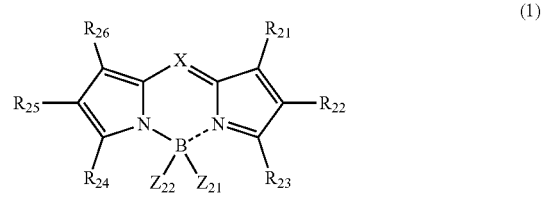

where: in the formula (1): X is a nitrogen atom, or a carbon atom bonded to Y;

Y is a hydrogen atom or a substituent;

$R_{21}$ to $R_{26}$ each independently represent a hydrogen atom or a substituent, or at least one of a pair of $R_{21}$ and $R_{22}$, a pair of $R_{22}$ and $R_{23}$, a pair of $R_{24}$ and $R_{25}$, and a pair of $R_{25}$ and $R_{26}$ are mutually bonded to form a ring;

Y and $R_{21}$ to $R_{26}$ as the substituents are each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, a substituted or unsubstituted alkylthio group having 6 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 7 to 30 carbon atoms, a substituted or unsubstituted heteroaryl group having 5 to 30 ring atoms, a halogen atom, a carboxy group, a substituted or unsubstituted ester group, a substituted or unsubstituted carbamoyl group, a substituted or unsubstituted amino group, a nitro group, a cyano group, a substituted or unsubstituted silyl group, and a substituted or unsubstituted siloxanyl group;

$Z_{21}$ and $Z_{22}$ each independently represent a substituent, or $Z_{21}$ and $Z_{22}$ are mutually bonded to form a ring; and $Z_{21}$ and $Z_{22}$ as the substituents are each independently a group selected from the group consisting of a halogen atom, a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms,

  (3)

where: in the formula (3): n is 1, 2, 3 or 4;
a plurality of Cz are mutually the same or different when n is 2, 3, or 4;
$X_B$ is a group represented by a formula (3A) below; and
Cz is a group represented by a formula (3B-1) or a formula (3B-2) below, Ar$_1$—(Ar$_2$)$_k$  (3A)

where, in the formula (3A): Ar$_1$ and Ar$_2$ are each independently a substituted or unsubstituted monovalent or polyvalent aromatic hydrocarbon group having 6 to 18 ring carbon atoms;
k is 0, 1, or 2;
a plurality of Ar$_2$ are mutually the same or different when k is 2;
when Ar$_1$ has a substituent D1, the substituent D1 is each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted aralkyl group having 7 to 30 carbon atoms, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 ring carbon atoms, a substituted or unsubstituted silyl group, a halogen atom, a cyano group, and a nitro group;
when Ar$_2$ has a substituent D2, the substituent D2 is selected from the same group for the substituent D1;
when n is 1, Cz is bonded to Ar$_1$ or bonded to Ar$_2$, and
when n is 2, 3, or 4, a plurality of Cz are each independently bonded to Ar or bonded to Ar$_2$,

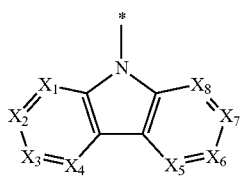  (3B-1)

where, in the formula (3B-1): $X_1$ to $X_8$ are each independently a nitrogen atom or CR$_A$;
R$_A$ represents a hydrogen atom or a substituent, or one or more pairs of adjacent ones of the plurality of R$_A$ are mutually bonded to form a ring;
R$_A$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group;
when R$_A$ is a substituted or unsubstituted heteroaryl group having 5 to 30 ring atoms, the heteroaryl group is each independently a carbazolyl group or an azacarbazolyl group;
a plurality of R$_A$ are mutually the same or different; and
the nitrogen atom in the formula (3B-1) is bonded to one of Ar$_1$ and Ar$_2$ in the formula (3A),

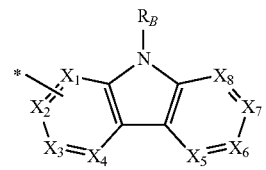  (3B-2)

where, in the formula (3B-2): $X_1$ to $X_4$ each independently represent a carbon atom bonded to one of Ar$_1$ and Ar$_2$ in the formula (3A), a nitrogen atom or CR$_C$, R$_C$ being a hydrogen atom or a substituent, or one or more of pairs of adjacent one of R$_C$ being mutually bonded to form a ring, one of $X_1$ to $X_4$ being the carbon atom bonded to one of Ar$_1$ and Ar$_2$ in the formula (3A);
$X_5$ to $X_8$ represent a nitrogen atom or CR$_D$, R$_D$ being a hydrogen atom or a substituent, or one or more pairs of adjacent ones of the plurality of R$_D$ being mutually bonded to form a ring;
R$_B$, R$_C$ and R$_D$ are each independently selected from the same group for R$_A$ in the formula (3B-1), a plurality of R$_C$ being mutually the same or different, a plurality of R$_D$ being mutually the same or different;
in the third compound, a substituent meant by "substituted or unsubstituted" is selected from the group consisting of a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group; and
when the substituent E has a further substituent F, the substituent F is selected from the group consisting of an unsubstituted aryl group having 6 to 30 ring carbon atoms, an unsubstituted alkyl group having 1 to 30 carbon atoms, an unsubstituted alkyl halide group having 1 to 30 carbon atoms, an unsubstituted cycloalkyl group having 3 to 30 ring carbon atoms, an unsubstituted silyl group, an unsubstituted alkoxy group having 1 to 30 carbon atoms, an unsubstituted alkoxy halide group having 1 to 30 carbon atoms, an unsubstituted aryloxy group having 6 to 30 carbon atoms, an unsubstituted alkylthio group having 1 to 30 carbon atoms, an unsubstituted arylthio group having 6 to 30 ring carbon atoms, an unsubstituted aralkyl group having 7 to 30 carbon atoms, an unsubstituted alkenyl group having 2 to 30 carbon atoms, a halogen atom, an unsubstituted alkynyl group having 2 to 30 carbon atoms, a cyano group, a hydroxy group, a nitro group, and a carboxy group, the substituent F having no further substituent.

According to another aspect of the invention, an electronic device including the organic electroluminescence device according to the above aspect of the invention is provided.

The above aspect of the invention can provide a high-performance organic electroluminescence device. Specifically, the above aspect of the invention can provide an organic electroluminescence device capable of improving at least one of luminous efficiency and lifetime.

Moreover, the another aspect of the invention can provide an electronic device including the organic electroluminescence device.

BRIEF EXPLANATION OF DRAWING(S)

FIG. 1 schematically illustrates an arrangement of an organic electroluminescence device according to an exemplary embodiment.

FIG. 2 schematically illustrates a transient-PL measuring machine.

DESCRIPTION OF EMBODIMENT(S)

First Exemplary Embodiment

Arrangement(s) of an organic EL device according to a first exemplary embodiment of the invention will be described below.

The organic EL device includes two electrodes (i.e. an anode and a cathode) and an organic layer therebetween. The organic layer includes a plurality of layers formed of an organic compound(s). The organic layer may further include an inorganic compound. The organic EL device according to the first exemplary embodiment includes a first organic layer between the anode and the cathode and a second organic layer between the anode and the first organic layer.

The first organic layer is preferably an emitting layer. The second organic layer is not limited as long as the second organic layer is adapted to be present between the anode and the first organic layer. The second organic layer is preferably, for instance, any one of a hole injecting layer, a hole transporting layer, and an electron blocking layer.

In the organic EL device of the first exemplary embodiment, the first organic layer is an emitting layer, and the second organic layer is an electron blocking layer.

It is preferable that the second organic layer is adjacent to the first organic layer. Specifically, the electron blocking layer is preferably between the emitting layer and the anode and adjacent to the emitting layer.

The organic layer may consist solely of the first organic layer and the second organic layer. The organic layer may further include a layer used in an organic EL device. For instance, the organic layer may further include at least one layer selected from the group consisting of a hole injecting layer, a hole transporting layer, an electron injecting layer, an electron transporting layer, and a hole blocking layer.

Figure 1:
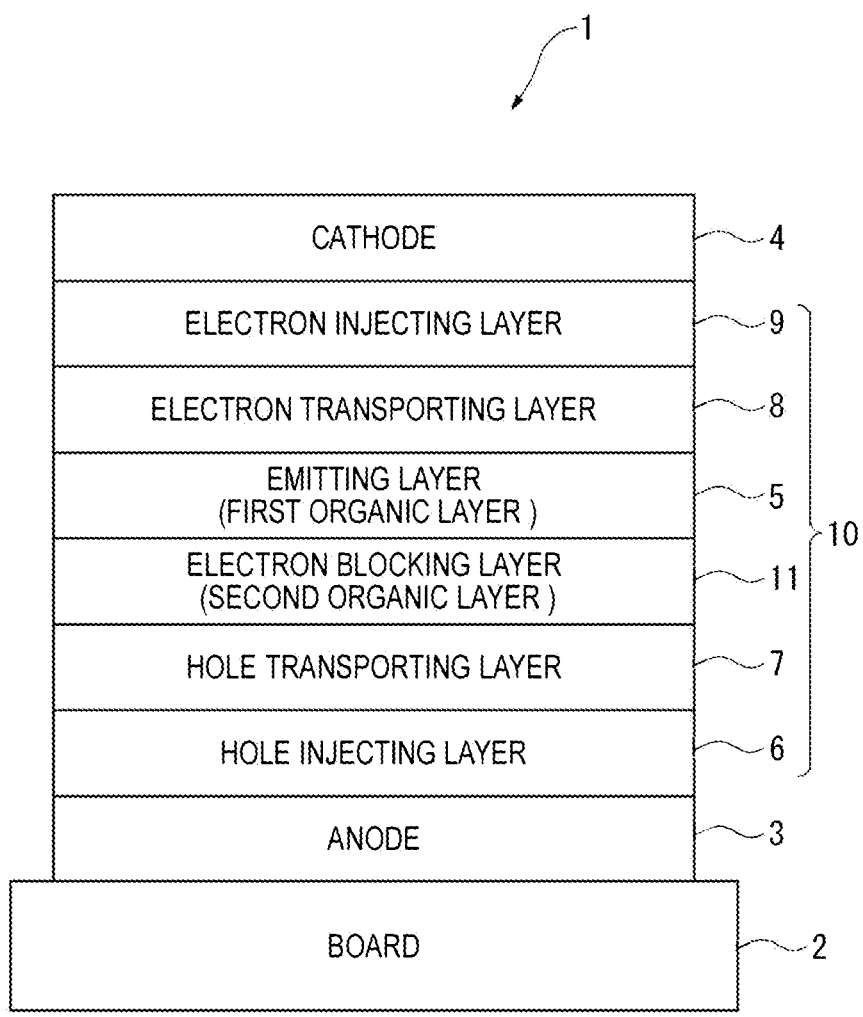

FIG. 1 schematically shows an exemplary arrangement of the organic EL device of the first exemplary embodiment.

The organic EL device 1 includes a light-transmissive substrate 2, an anode 3, a cathode 4, and an organic layer 10 provided between the anode 3 and the cathode 4. The organic layer 10 includes a hole injecting layer 6, a hole transporting layer 7, an electron blocking layer 11 (second organic layer), an emitting layer 5 (the first organic layer), an electron transporting layer 8, and an electron injecting layer 9, which are sequentially laminated on the anode 3.

The emitting layer 5 of the organic EL device 1 in the first exemplary embodiment contains a first compound and a second compound.

The first compound is a compound represented by the formula (1). The second compound is a delayed fluorescent compound.

The emitting layer 5 may include a metal complex.

The emitting layer 5 preferably contains no phosphorescent metal complex. The emitting layer 5 may also preferably contain no metal complex.

It is preferable that the first compound is a dopant material (sometimes referred to as a guest material, emitter, or emitting material) and the second compound is preferably a host material (sometimes referred to as a matrix material).

In the first exemplary embodiment, the electron blocking layer 11 includes a compound represented by the formula (3).

The inventors have found that the performance of the organic EL device can be improved when the first organic layer includes the first compound (i.e. the compound represented by the formula (1)) and the delayed fluorescent second compound, and the second organic layer includes the third compound (i.e. the compound represented by the formula (3)). Specifically, the inventors have found that at least one of luminous efficiency and lifetime can be improved.

The inventors have selected a compound having a specific skeleton in which a carbazolyl group and an aromatic hydrocarbon group are bonded (sometimes referred to as "specific Cz-aryl skeleton" hereinafter) as the third compound. In the first exemplary embodiment, it is speculated that the presence of the compound having the specific Cz-aryl skeleton in the second organic layer (electron blocking layer in the first exemplary embodiment) between the anode and the first organic layer (emitting layer in the first exemplary embodiment) reduces the amount of holes supplied to the first organic layer to improve a carrier balance factor in the first organic layer, resulting in an improvement in the performance of the organic EL device.

Especially, it is believed that, since the compound having the specific Cz-aryl skeleton (the third compound), which has a tendency of increasing the value of ionization potential (Ip), is present in the second organic layer, the amount of holes supplied to the first organic layer is eminently reduced.

Accordingly, at least one of luminous efficiency and lifetime can be improved by the first exemplary embodiment. In other words, a high-performance organic EL device can be provided by the first exemplary embodiment.

Arrangement(s) of an organic EL device according to the first exemplary embodiment will be detailed below. The codes will be omitted in the description below.

First Organic Layer

The first organic layer (emitting layer in the first exemplary embodiment) contains a first compound and a second compound.

First Compound

The first compound is a compound represented by a formula (1) below.

The first compound is preferably a fluorescent compound.

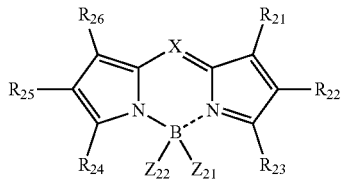
(1)

In the formula (1): X is a nitrogen atom, or a carbon atom bonded to Y;

Y is a hydrogen atom or a substituent;

$R_{21}$ to $R_{26}$ each independently represent a hydrogen atom or a substituent, or at least one of a pair of $R_{21}$ and $R_{22}$, a pair of $R_{22}$ and $R_{23}$, a pair of $R_{24}$ and $R_{25}$, and a pair of $R_{25}$ and $R_{26}$ are mutually bonded to form a ring; Y and $R_{21}$ to $R_{26}$ as the substituents are each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, a substituted or unsubstituted alkylthio group having 6 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 7 to 30 carbon atoms, a substituted or unsubstituted heteroaryl group having 5 to 30 ring atoms, a halogen atom, a carboxy group, a substituted or unsubstituted ester group, a substituted or unsubstituted carbamoyl group, a substituted or unsubstituted amino group, a nitro group, a cyano group, a substituted or unsubstituted silyl group, and a substituted or unsubstituted siloxanyl group;

$Z_{21}$ and $Z_{22}$ each independently represent a substituent, or $Z_{21}$ and $Z_{22}$ are mutually bonded to form a ring; and $Z_{21}$ and $Z_{22}$ as the substituents are each independently a group selected from the group consisting of a halogen atom, a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

In the formula (1), when, for instance, the pair of $R_{25}$ and $R_{26}$ are mutually bonded to form a ring, the first compound is represented by a formula (11) below.

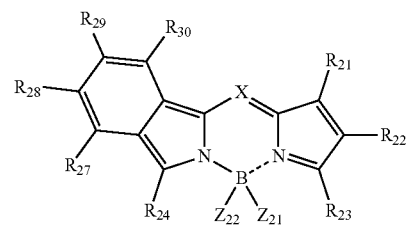
(11)

In the formula (11), X, Y, $R_{21}$ to $R_{24}$, $Z_{21}$, and $Z_{22}$ represent the same as, Y, $R_{21}$ to $R_{24}$, $Z_{21}$, and $Z_{22}$ in the formula (1), respectively. $R_{27}$ to $R_{30}$ are each independently a hydrogen atom or a substituent, the substituent for $R_{27}$ to $R_{30}$ being the same as the substituent for $R_{21}$ to $R_{24}$.

In the formula (1), when $Z_{21}$ and $Z_{22}$ are mutually bonded to form a ring, the first compound is represented by, for instance, a formula (1A) or a formula (1B) below. However, the structure of the first compound is not limited to the structures below.

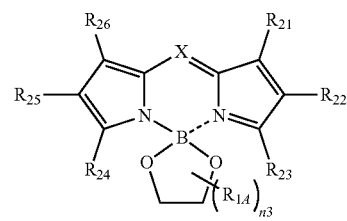
(1A)

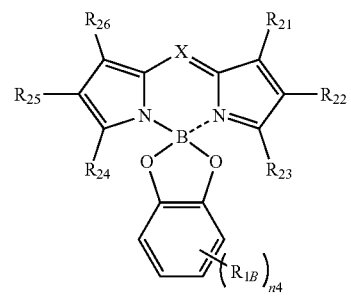
(1B)

In the formula (1A), X, Y and $R_{21}$ to $R_{26}$ are the same as X, Y, and $R_{21}$ to $R_{26}$ in the formula (1), respectively. $R_{1A}$ are each independently a hydrogen atom or a substituent, $R_{1A}$ as a substituent being the same as the substituent for $R_{21}$ to $R_{26}$. n3 is 4.

In the formula (1B), X, Y and $R_{21}$ to $R_{26}$ represent the same as X, Y, and $R_{21}$ to $R_{26}$ in the formula (1), respectively. $R_{1B}$ are each independently a hydrogen atom or a substituent, the substituent for $R_{1B}$ being selected from the same group for the substituent for $R_{21}$ to $R_{26}$. n4 is 4.

At least one of $Z_{21}$ and $Z_{22}$ (preferably $Z_{21}$ and $Z_{22}$) is preferably a group selected from the group consisting of a substituted or unsubstituted alkyl group having 1 to 30 carbon atoms, a substituted or unsubstituted alkyl halide group having 6 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

It is more preferable that at least one of $Z_{21}$ and $Z_{22}$ is a group selected from the group consisting of a fluorine-atom-substituted alkoxy group having 1 to 30 carbon atoms, fluorine-atom-substituted aryloxy group having 6 to 30 ring carbon atoms, and a fluoroalkyl-group-substituted aryloxy group having 6 to 30 ring carbon atoms.

It is further preferable that at least one of $Z_{21}$ and $Z_{22}$ is a fluorine-atom-substituted alkoxy group having 1 to 30 carbon atoms. It is especially preferable that $Z_{21}$ and $Z_{22}$ are each a fluorine-atom-substituted alkoxy group having 1 to 30 carbon atoms.

It is also preferable that $Z_{21}$ and $Z_{22}$ are the same.

Meanwhile, it is also preferable that at least one of $Z_{21}$ and $Z_{22}$ is a fluorine atom. More preferably, $Z_{21}$ and $Z_{22}$ are fluorine atoms.

At least one of $Z_{21}$ and $Z_{22}$ is also preferably a group represented by a formula (1a) below.

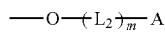

(1a)

In the formula (1a), A is a substituted or unsubstituted alkyl group having 1 to 6 carbon atoms, a substituted or unsubstituted alkyl halide group having 1 to 6 carbon atoms, or a substituted or unsubstituted aryl group having 6 to 12 ring carbon atoms, $L_2$ is a substituted or unsubstituted alkylene group having 1 to 6 carbon atoms, or a substituted or unsubstituted arylene group having 6 to 12 ring carbon atoms, m is 0, 1, 2, 3, 4, 5, 6, or 7, and, when m is 2, 3, 4, 5, 6, or 7, a plurality of $L_2$ are mutually the same or different. m is preferably 0, 1 or 2. When m is 0, A is directly bonded to O (oxygen atom).

In the formula (1), when $Z_{21}$ and $Z_{22}$ are groups represented by the formula (1a), the first compound is a compound represented by a formula (10) below.

It is also preferable that the first compound is a compound represented by a formula (10) below.

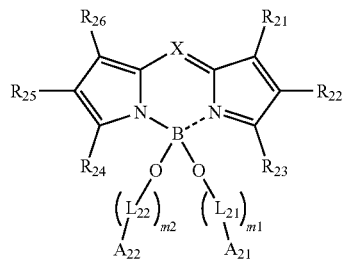

(10)

In the formula (10), X, Y when X is a carbon atom bonded to Y, and $R_{21}$ to $R_{26}$ represent the same as X, Y, and $R_{21}$ to $R_{26}$ in the formula (1). $A_{21}$ and $A_{22}$ are selected from the same group for A in the formula (1a), $A_{21}$ and $A_{22}$ being mutually the same or different. $L_{21}$ and $L_{22}$ are the same as $L_2$ in the formula (1a), $L_{21}$ and $L_{22}$ being mutually the same or different. m1 and m2 are each independently 0, 1, 2, 3, 4, 5, 6, or 7, preferably 0, 1, or 2. When m1 is 2, 3, 4, 5, 6, or 7, the plurality of $L_{21}$ are mutually the same or different. When m2 is 2, 3, 4, 5, 6, or 7, the plurality of $L_{22}$ are mutually the same or different. When m1 is 0, $A_{21}$ is directly bonded to O (oxygen atom). When m2 is 0, $A_{22}$ is directly bonded to O (oxygen atom).

At least one of A and $L_2$ in the formula (1a) is preferably substituted by a halogen atom, more preferably by a fluorine atom.

A in the formula (1a) is more preferably a perfluoroalkylene group having 1 to 6 carbon atoms, or a perfluoroaryl group having 6 to 12 ring carbon atoms, further preferably a perfluoroalkyl group having 1 to 6 carbon atoms.

$L_2$ in the formula (1a) is more preferably a perfluoroalky group having 1 to 6 carbon atoms, or a perfluoroarylene group having 6 to 12 ring carbon atoms, further preferably a perfluoroalkylene group having 1 to 6 carbon atoms.

Specifically, it is also preferable that the first compound is the compound represented by a formula (10a) below.

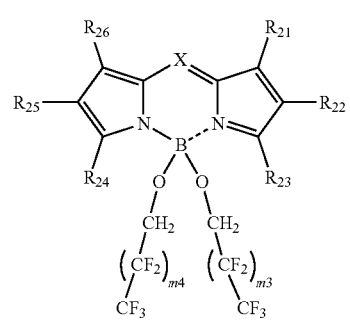

(10a)

In the formula (10a): X represents the same as X in the formula (1), Y when X is a carbon atom bonded to Y represents the same as Y in the formula (1);

$R_{21}$ to $R_{26}$ each independently represent the same as $R_{21}$ to $R_{26}$ in the formula (1);

m3 is in a range from 0 to 4;

m4 is in a range from 0 to 4; and m3 and m4 are mutually the same or different.

In the formulae (1), (11), (10) and (10a):

X is a carbon atom bonded to Y; Y is a hydrogen atom or a substituent; and Y as a substituent is preferably a substituent selected from the group consisting of a substituted or unsubstituted alkyl group having 1 to 30 carbon atoms, a substituted or unsubstituted alkyl halide group having 1 to 30 carbon atoms, and a substituted or unsubstituted aryl group having 6 to 30 ring carbon atoms, more preferably a substituted or unsubstituted aryl group having 6 to 30 ring carbon atoms.

In the formulae (1), (11), (10) and (10a), more preferably:

X is a carbon atom bonded to Y; Y is a hydrogen atom or a substituent; and Y as a substituent is a substituted or unsubstituted aryl group having 6 to 30 ring carbon atoms, and when Y as a substituent is an aryl group having 6 to 30 ring carbon atoms having a substituent, the substituent is a substituted or unsubstituted alkyl group having 1 to 30 carbon atoms, a substituted or unsubstituted alkyl halide group having 1 to 30 carbon atoms, a substituted or unsubstituted alkoxy group having 1 to 30 carbon atoms, a substituted or unsubstituted alkoxy halide group having 1 to 30 carbon atoms, or an aryl group having 6 to 30 ring carbon atoms substituted by an alkyl group having 1 to 30 carbon atoms.

Though $Z_{21}$ and $Z_{22}$ of the first compound may be mutually bonded to form a ring, $Z_{21}$ and $Z_{22}$ are preferably not bonded to form no ring.

It is preferable that at least one of $R_{21}$, $R_{23}$, $R_{24}$, and $R_{26}$ in the formulae (1), (10), and (10a) is a substituted or unsubstituted alkyl group having 1 to 30 carbon atoms or a substituted or unsubstituted alkyl halide group having 1 to 30 carbon atoms.

It is preferable that $R_{21}$, $R_{23}$, $R_{24}$, and $R_{26}$ in the formulae (1), (10), and (10a) are each a substituted or unsubstituted alkyl group having 1 to 30 carbon atoms or a substituted or unsubstituted alkyl halide group having 1 to 30 carbon atoms. In this case, $R_{22}$ and $R_{25}$ are preferably hydrogen atoms.

It is preferable that at least one of $R_{21}$, $R_{23}$, $R_{24}$, and $R_{26}$ in the formulae (1), (10), and (10a) is a substituted or unsubstituted aryl group having 6 to 30 ring carbon atoms.

It is more preferable that $R_{21}$, $R_{23}$, $R_{24}$, and $R_{26}$ in the formulae (1), (10), and (10a) are each a substituted or unsubstituted aryl group having 6 to 30 ring carbon atoms. In this case, $R_{22}$ and $R_{25}$ are preferably hydrogen atoms.

In the formulae (1), (10) and (10a), more preferably, $R_{21}$, $R_{23}$, $R_{24}$, and $R_{26}$ each independently represent a substituted or unsubstituted alkyl group having 1 to 30 (preferably 1 to 6) carbon atoms, a substituted or unsubstituted alkyl halide group having 1 to 30 (preferably 1 to 6) carbon atoms, or an aryl group having 6 to 30 (preferably 6 to 12) ring carbon atoms substituted by an alkyl group having 1 to 30 carbon atoms, and $R_{22}$ and $R_{25}$ are hydrogen atoms.

It is preferable that at least one of $R_{21}$, $R_{23}$, and $R_{24}$ in the formula (11) is a substituted or unsubstituted alkyl group having 1 to 30 carbon atoms or a substituted or unsubstituted alkyl halide group having 1 to 30 carbon atoms.

It is more preferable that $R_{21}$, $R_{23}$, and $R_{24}$ in the formula (11) are each a substituted or unsubstituted alkyl group having 1 to 30 carbon atoms or a substituted or unsubstituted alkyl halide group having 1 to 30 carbon atoms. In this case, $R_{22}$ is preferably a hydrogen atom.

It is preferable that at least one of $R_{21}$, $R_{23}$, and $R_{24}$ in the formula (11) is a substituted or unsubstituted aryl group having 6 to 30 ring carbon atoms.

It is more preferable that $R_{21}$, $R_{23}$, and $R_{24}$ in the formula (11) are each a substituted or unsubstituted aryl group having 6 to 30 ring carbon atoms. In this case, $R_{22}$ is preferably a hydrogen atom.

In the formula (11), more preferably:

$R_{21}$, $R_{23}$, and $R_{24}$ each independently represent a substituted or unsubstituted alkyl group having 1 to 30 (preferably 1 to 6) carbon atoms, a substituted or unsubstituted alkyl halide group having 1 to 30 (preferably 1 to 6) carbon atoms, or an aryl group having 6 to 30 (preferably 6 to 12) ring carbon atoms substituted by an alkyl group having 1 to 30 carbon atoms; and $R_{22}$ is a hydrogen atom.

In the first compound, examples of the fluorine-atom-substituted alkoxy group include: 2,2,2-trifluoroethoxy group, 2,2-difluoroethoxy group, 2,2,3,3,3-pentafluoro-1-propoxy group, 2,2,3,3-tetrafluoro-1-propoxy group, 1,1,1,3,3,3-hexafluoro-2-propoxy group, 2,2,3,3,4,4,4-heptafluoro-1-butyloxy group, 2,2,3,3,4,4-hexafluoro-1-butyloxy group, nonafluoro-tert-butyloxy group, 2,2,3,3,4,4,5,5,5-nonafluoropentanoxy group, 2,2,3,3,4,4,5,5,6,6,6-undecafluorohexanoxy group, 2,3-bis(trifluoromethyl)-2,3-butanedioxy group, 1,1,2,2-tetra(trifluoromethyl)ethyleneglykoxy group, 4,4,5,5,6,6,6-heptafluorohexane-1,2-dioxy group, and 4,4,5,5,6,6,7,7,8,8,9,9,9-tridecafluorononane-1,2-dioxy group.

In the first compound, examples of the fluorine-atom substituted aryloxy group, or the fluoroalkyl-group-substituted aryloxy group include pentafluorophenoxy group, 3,4,5-trifluorophenoxy group, 4-trifluoromethylphenoxy group, 3,5-bistrifluoromethylphenoxy group, 3-fluoro-4-trifluoromethylphenoxy group, 2,3,5,6-tetrafluoro-4-trifluoromethylphenoxy group, 4-fluorocatecholato group, 4-trifluoromethylcatecholato group, and 3,5-bistrifluoromethylcatecholato group.

Herein, the substituent meant by "substituted or unsubstituted" in the first compound is preferably a substituent selected from the group consisting of a substituted or unsubstituted aryl group having 6 to 30 ring carbon atoms, substituted or unsubstituted heteroaryl group having 5 to 30 ring atoms, alkyl group having 1 to 30 carbon atoms, alkyl halide group having 1 to 30 carbon atoms, cycloalkyl group having 3 to 30 ring carbon atoms, cyano group, amino group, substituted amino group, halogen atom, alkoxy group having 1 to 30 carbon atoms, aryloxy group having 6 to 30 carbon atoms, arylthio group having 6 to 30 ring carbon atoms, aralkyl group having 7 to 30 carbon atoms, substituted phosphoryl group, substituted silyl group, nitro group, carboxy group, alkenyl group having 2 to 30 carbon atoms, alkynyl group having 2 to 30 carbon atoms, alkylthio group having 1 to 30 carbon atoms, alkylsilyl group having 3 to 30 carbon atoms, arylsilyl group having 6 to 30 ring carbon atoms, and hydroxy group.

The substituent meant by "substituted or unsubstituted" in the first compound is more preferably a substituent selected from the group consisting of a substituted or unsubstituted aryl group having 6 to 30 ring carbon atoms, substituted or unsubstituted heteroaryl group having 5 to 30 ring atoms, alkyl group having 1 to 30 carbon atoms, alkyl halide group having 1 to 30 carbon atoms, and cycloalkyl group having 3 to 30 ring carbon atoms.

The substituent meant by "substituted or unsubstituted" in the first compound is further preferably a substituent selected from the group consisting of a substituted or unsubstituted aryl group having 6 to 12 ring carbon atoms, substituted or unsubstituted heteroaryl group having 5 to 12 ring atoms, alkyl group having 1 to 6 carbon atoms, alkyl halide group having 1 to 6 carbon atoms, and cycloalkyl group having 3 to 12 ring carbon atoms.

The first compound is preferably a fluorescent compound.

In this case, the first compound preferably emits light having a main peak wavelength ranging from 400 nm to 700 nm.

The use of the fluorescent first compound in the emitting layer in combination with the second compound (delayed fluorescent compound) promotes improvement in at least one of luminous efficiency and lifetime of organic EL devices.

The main peak wavelength herein means a peak wavelength of fluorescence spectrum exhibiting a maximum luminous intensity among fluorescence spectra measured in a toluene solution in which a target compound is dissolved at a concentration ranging from $10^{-6}$ mol/L to $10^{-5}$ mol/L. The main peak wavelength is measured using a spectrophotofluorometer (F-7000, manufactured by Hitachi High-Tech Science Corporation).

The first compound preferably exhibits a red or green light emission.

Herein, the red light emission refers to light emission whose main peak wavelength of fluorescence spectrum is in a range from 600 nm to 660 nm.

When the first compound is a red fluorescent compound, the main peak wavelength of the first compound is preferably in a range from 600 nm to 660 nm, more preferably in a range from 600 nm to 640 nm, further preferably in a range from 610 nm to 630 nm.

Herein, the green light emission refers to light emission whose main peak wavelength of fluorescence spectrum is in a range from 500 nm to 560 nm.

When the first compound is a green fluorescent compound, the main peak wavelength of the first compound is preferably in a range from 500 nm to 560 nm, more preferably in a range from 500 nm to 540 nm, further preferably in a range from 510 nm to 530 nm.

An example of the organic EL device according to the first exemplary embodiment includes an anode, a cathode, a first organic layer between the anode and the cathode, and a second organic layer between the anode and the first organic layer, the first organic layer containing the first compound and the second compound, the second organic layer containing the third compound, the first compound being represented by the formula (1) and having its main peak wavelength in a range from 600 nm to 660 nm, the second compound being a delayed fluorescent compound, the third compound being represented by the formula (3).

Another example of the organic EL device according to the first exemplary embodiment includes an anode, a cathode, a first organic layer between the anode and the cathode, and a second organic layer between the anode and the first organic layer, the first organic layer containing the first compound and the second compound, the second organic layer containing the third compound, the first compound being represented by the formula (1) and having its main peak wavelength in a range from 500 nm to 560 nm, the second compound being a delayed fluorescent compound, the third compound being represented by the formula (3).

It should be noted that the invention is not limited to the examples of the organic EL device mentioned above.

Method of Preparing First Compound

The first compound can be prepared by any known method.

Specific examples of the first compound of the first exemplary embodiment are shown below. It should be noted that the first compound according to the invention is not limited to these specific examples. It should also be noted that coordinate bond between a boron atom and a nitrogen atom in a pyrromethene skeleton herein can be illustrated in a variety of manners (e.g. in a dotted line, in an arrow, or omitted). The coordinate bond is illustrated in a dotted line or omitted herein.

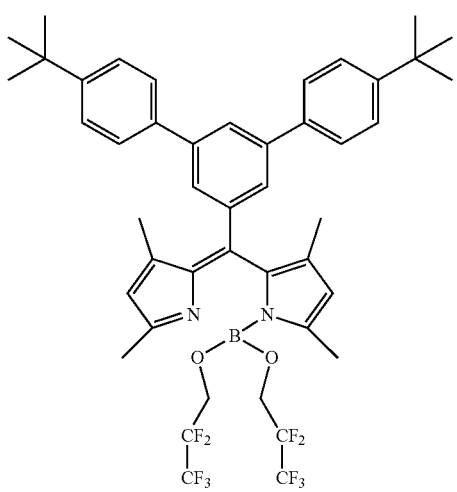

-continued

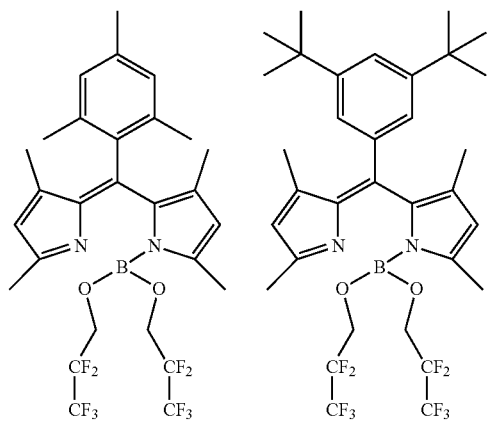

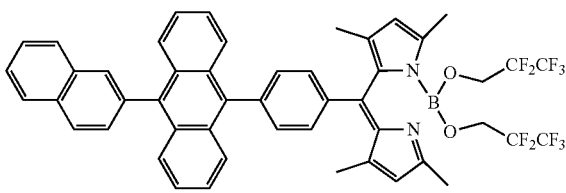

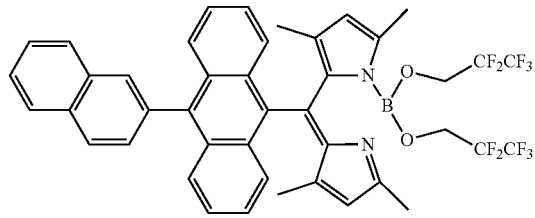

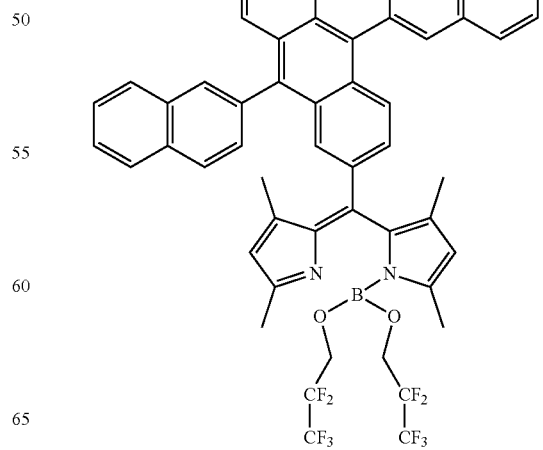

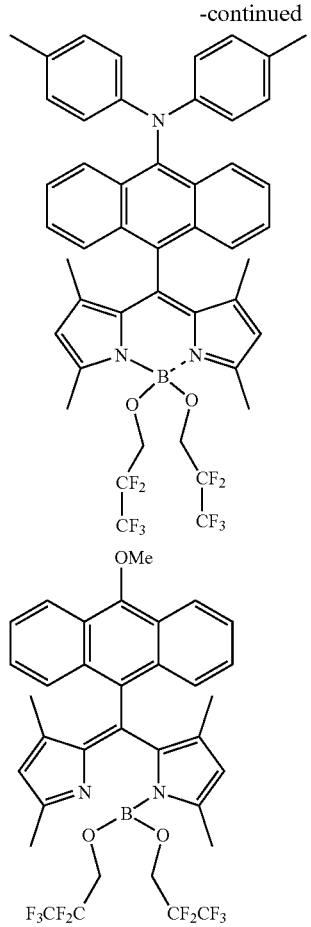
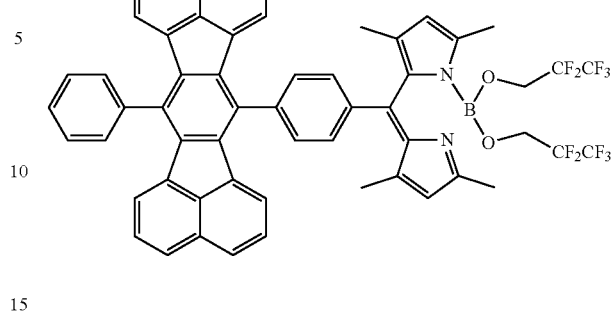
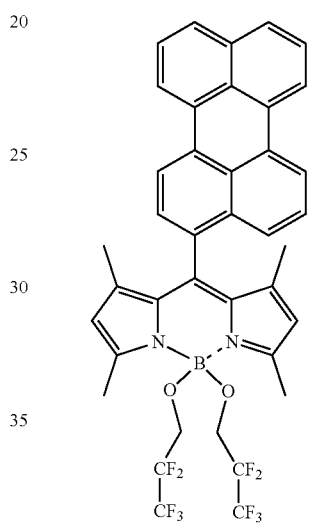
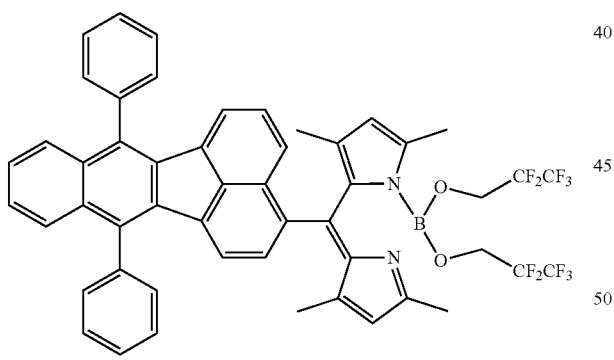
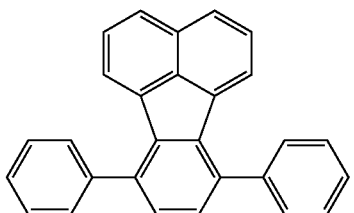
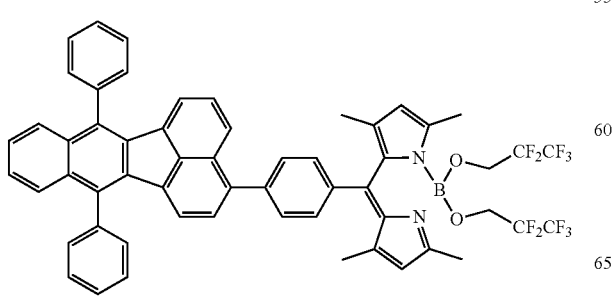
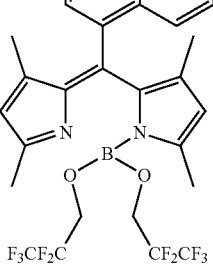

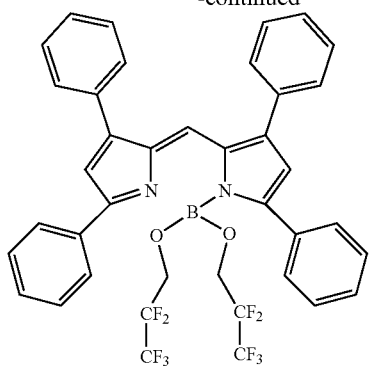
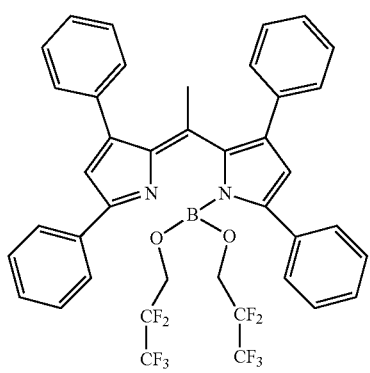
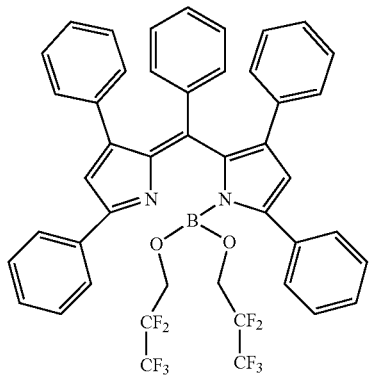
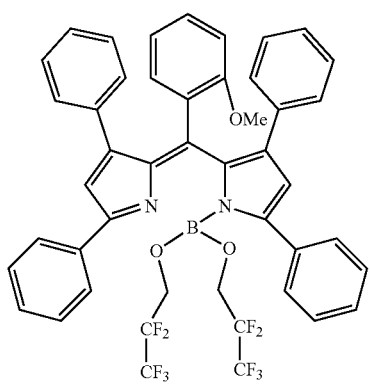
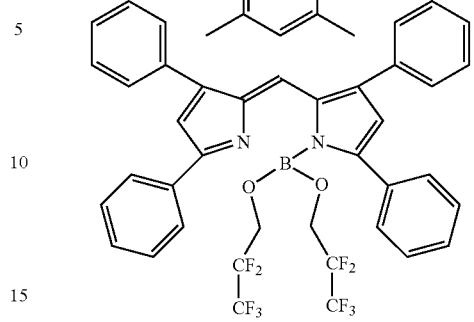
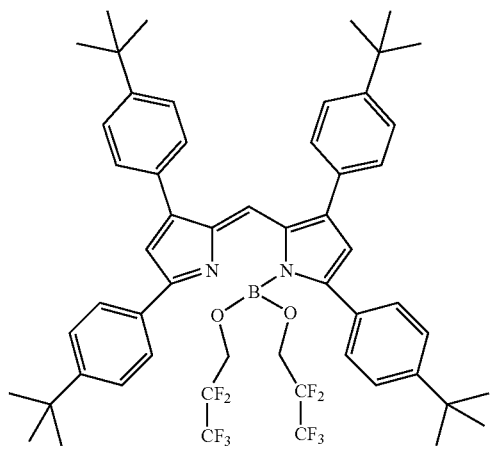
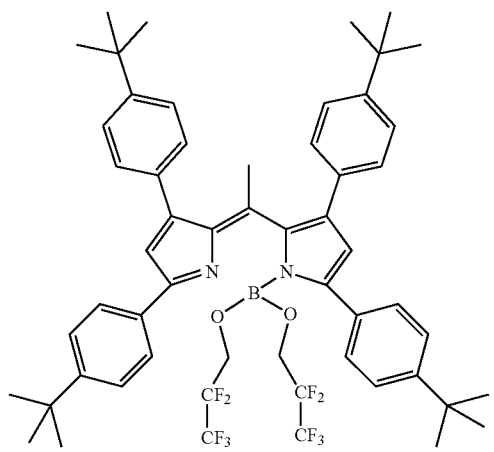
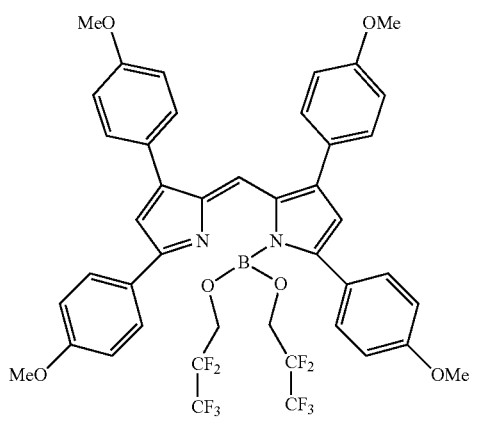

-continued
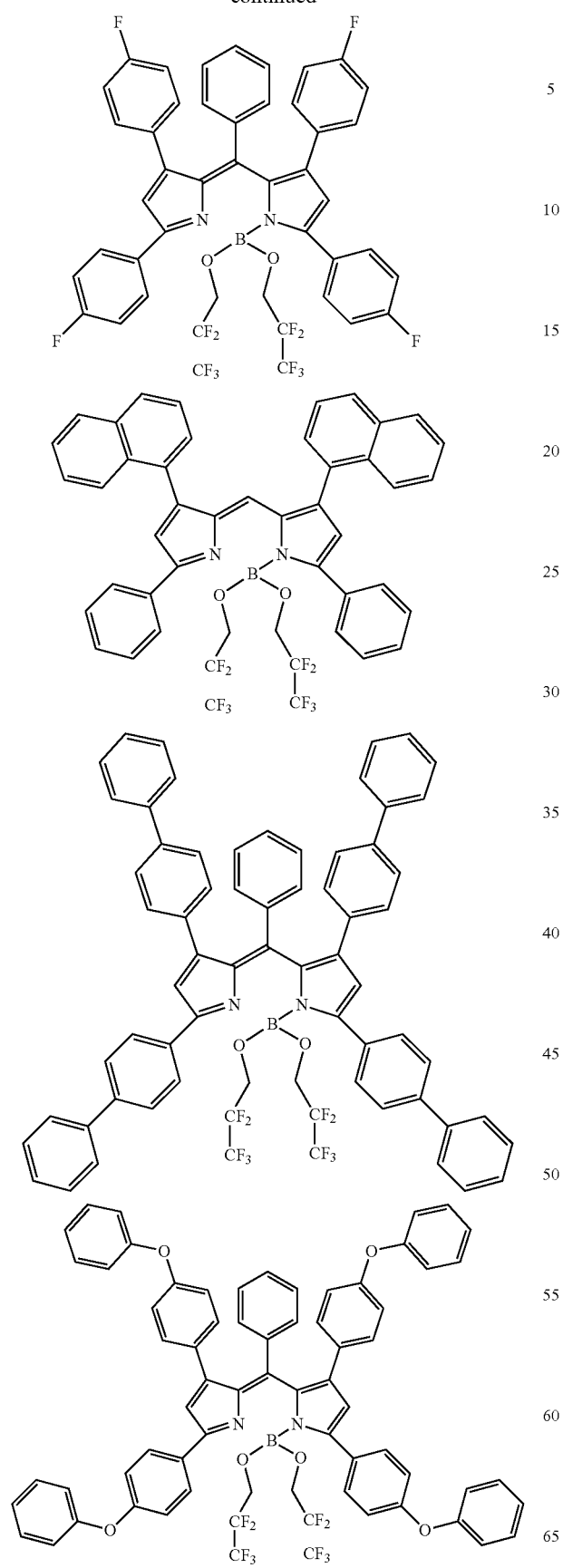
-continued
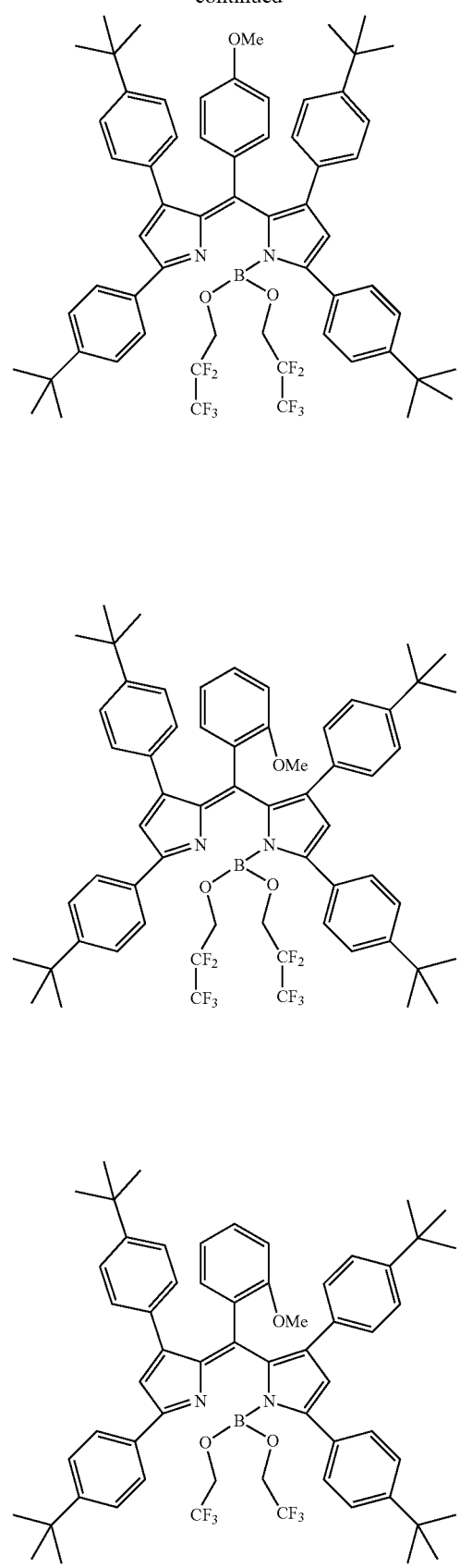

21
-continued
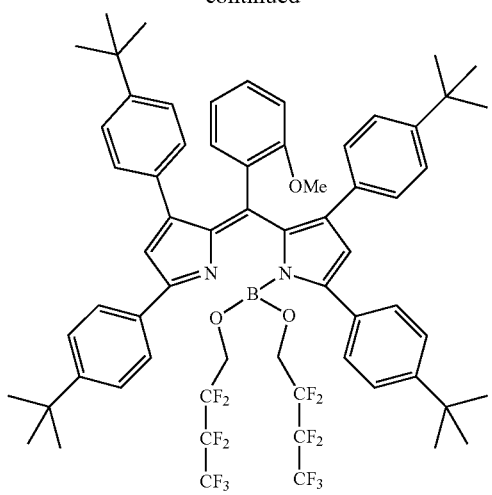
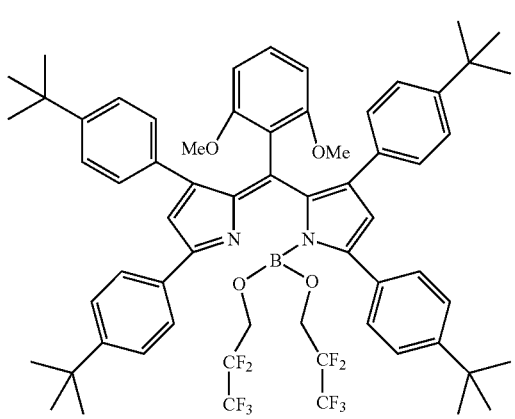
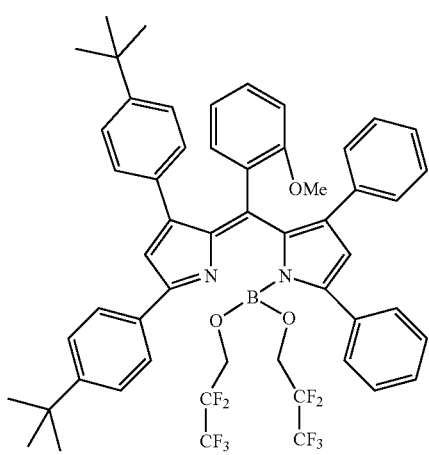
22
-continued
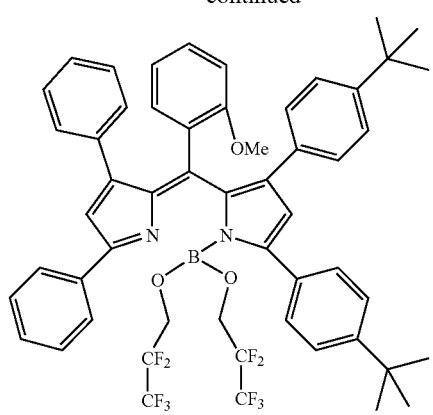
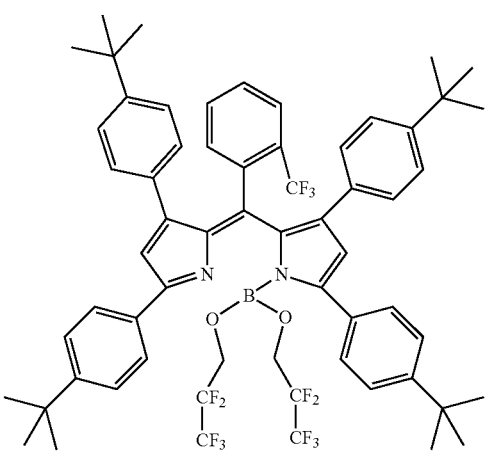
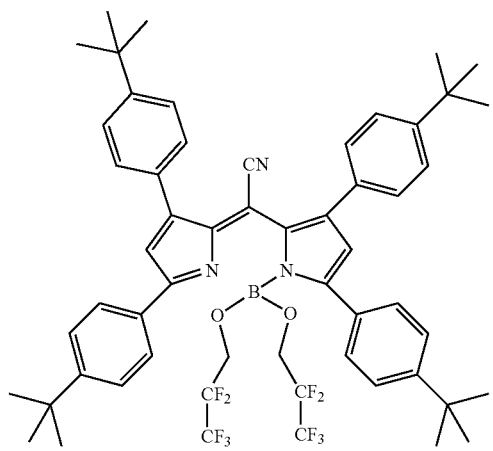

23
-continued
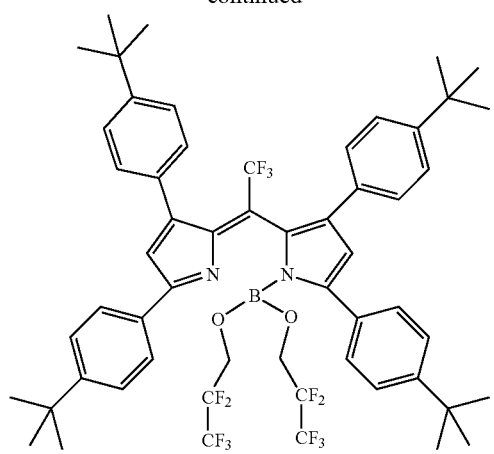
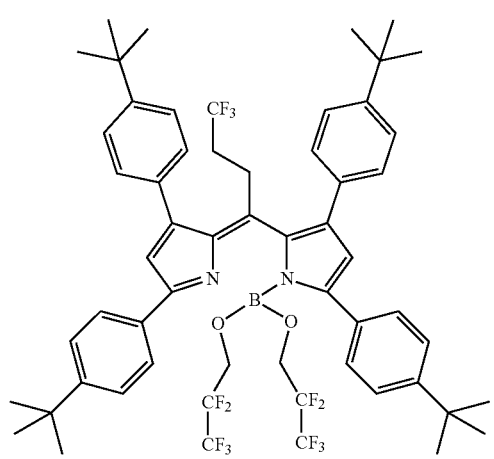
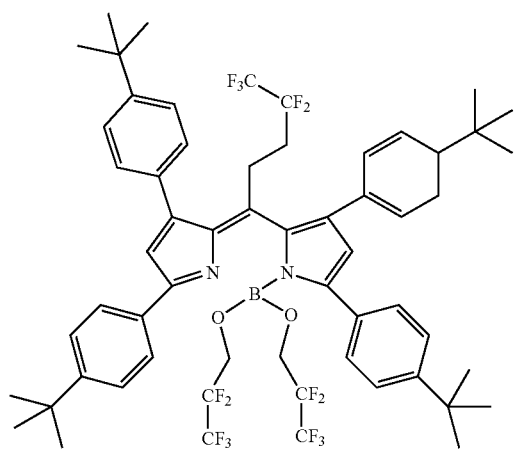
24
-continued
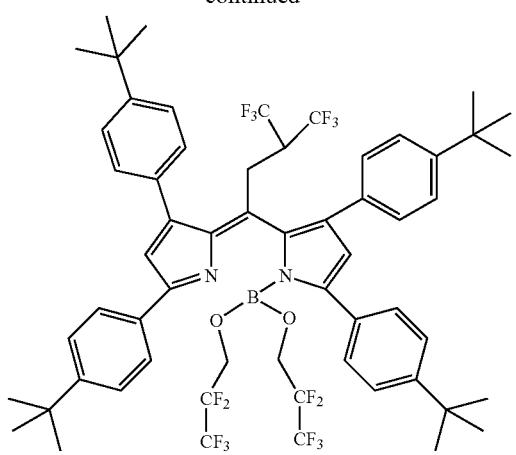
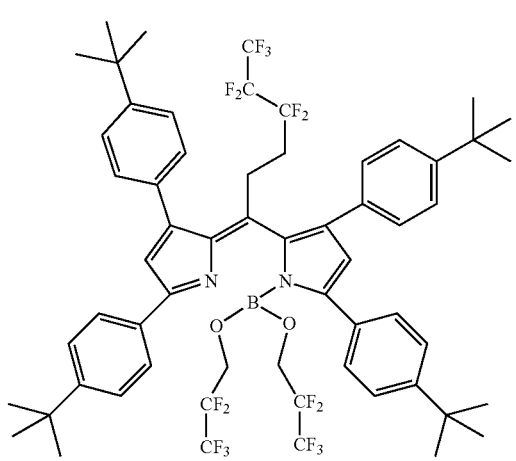
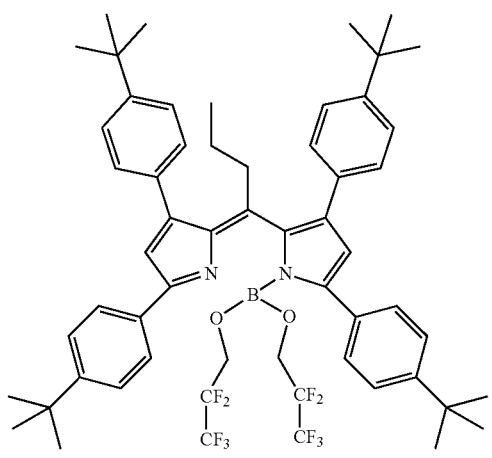

25
-continued
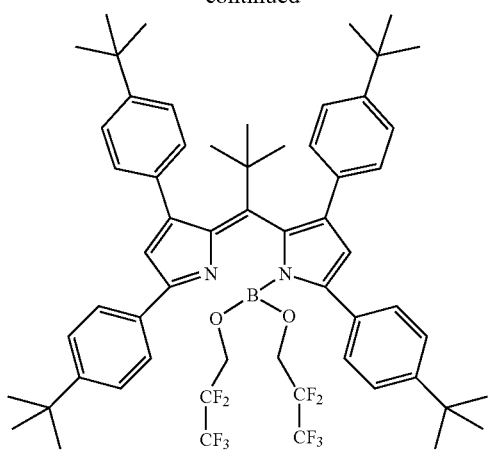
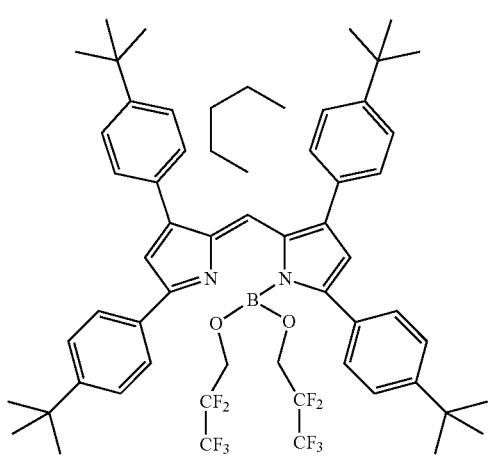
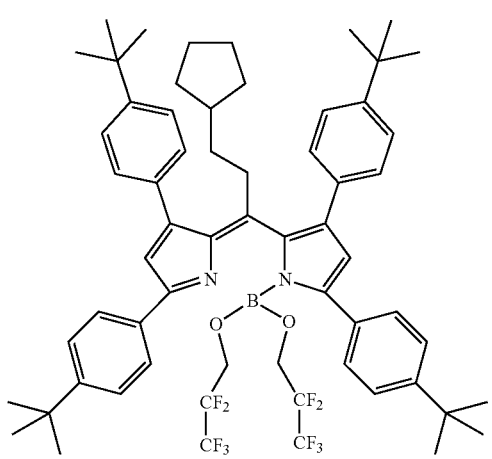
26
-continued
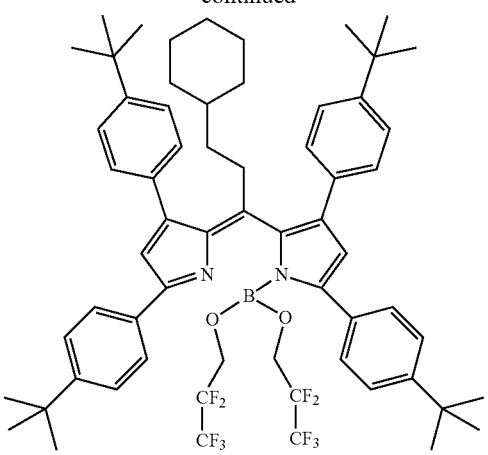
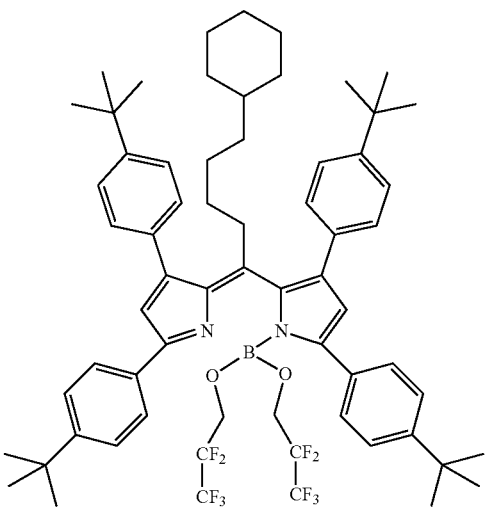
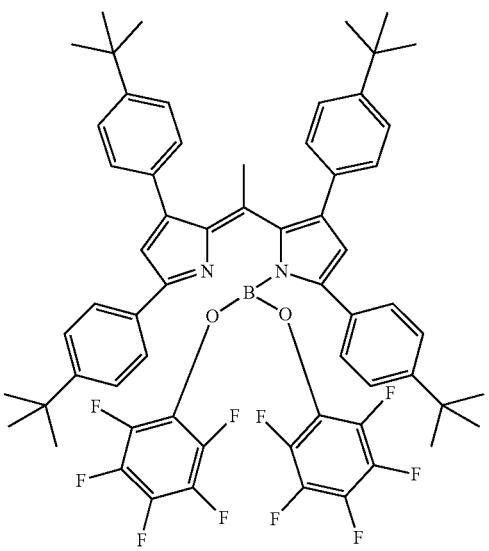

27
-continued
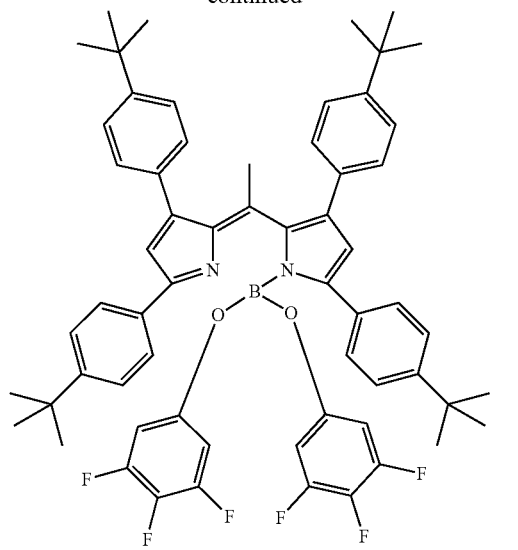
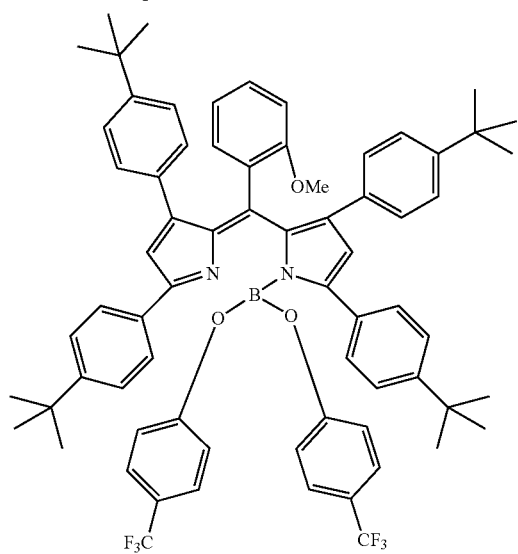
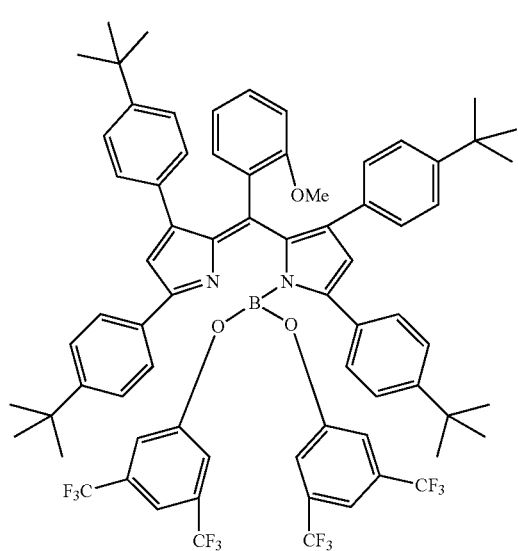
28
-continued
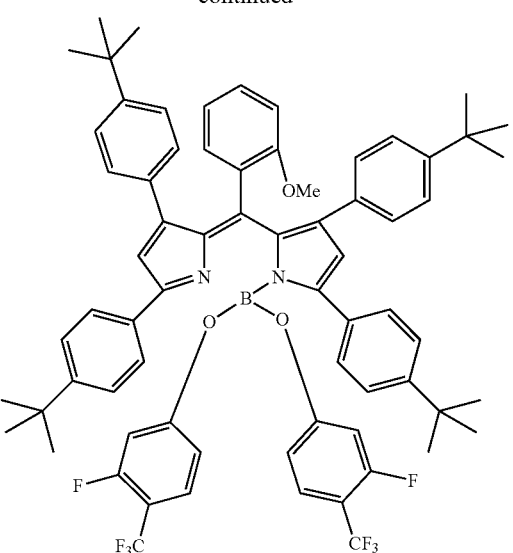
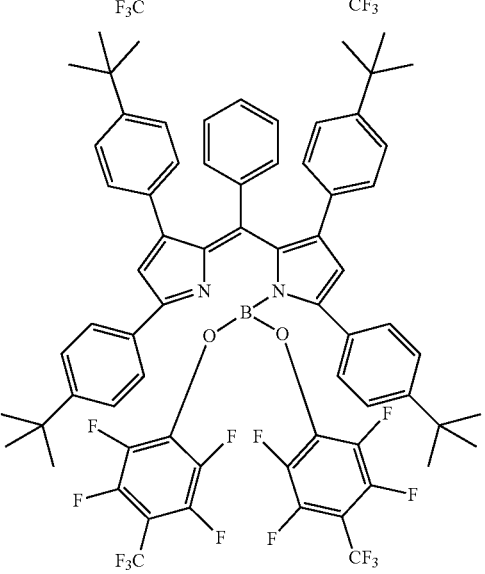
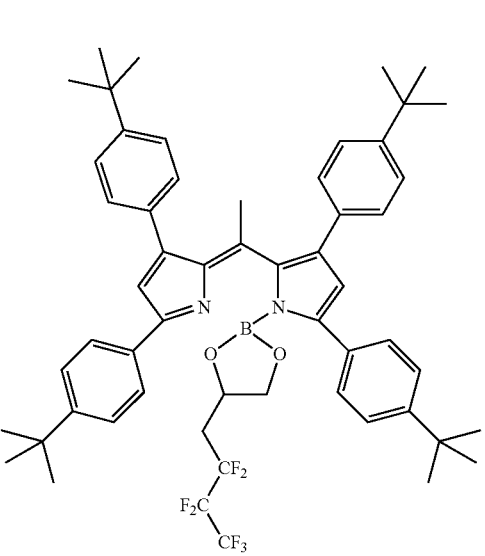

29
-continued
30
-continued
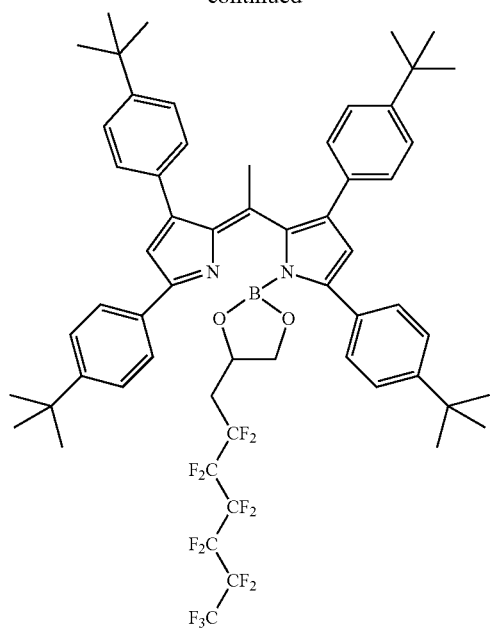
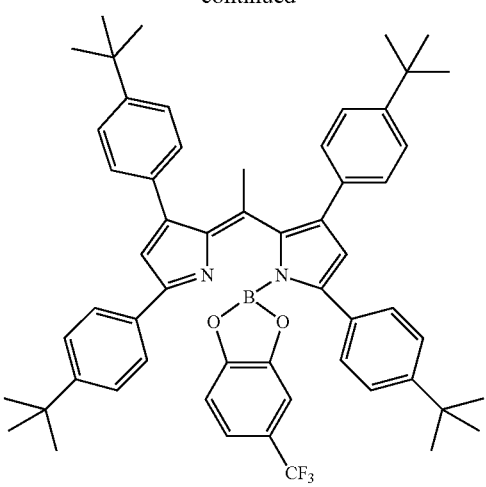
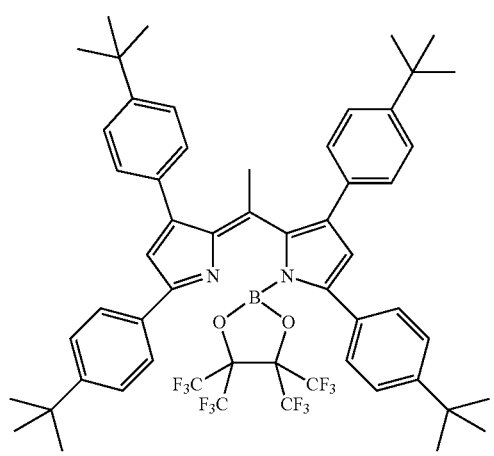
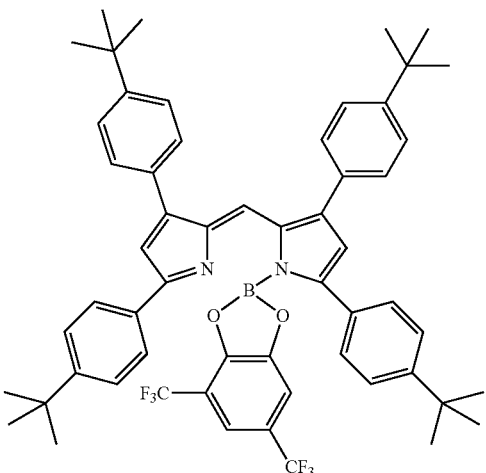
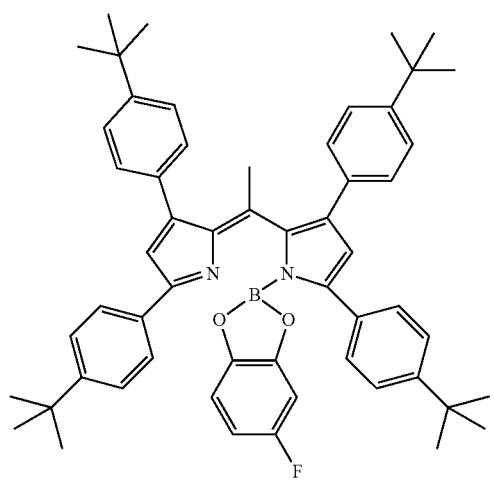
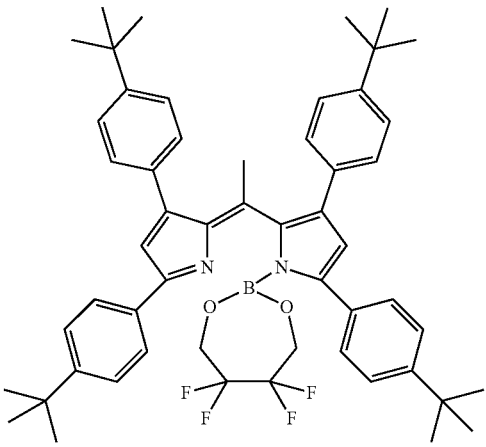

31
-continued
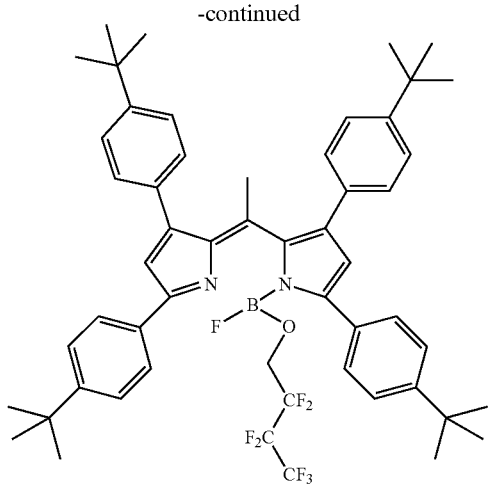
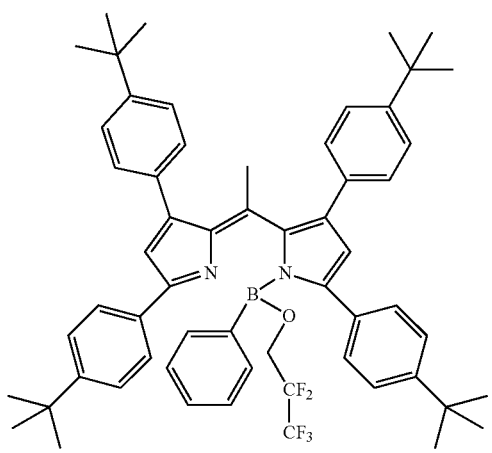
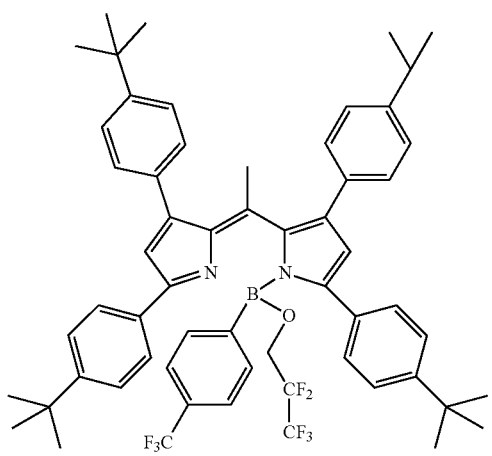
32
-continued
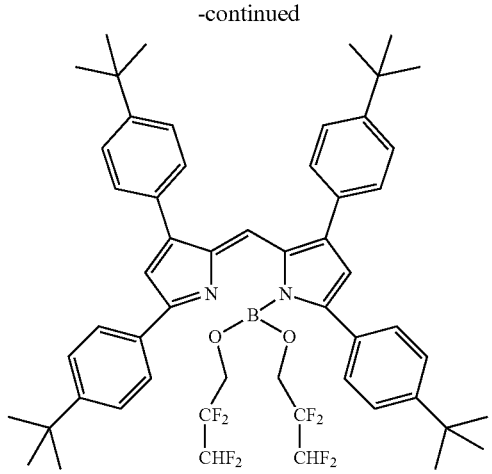
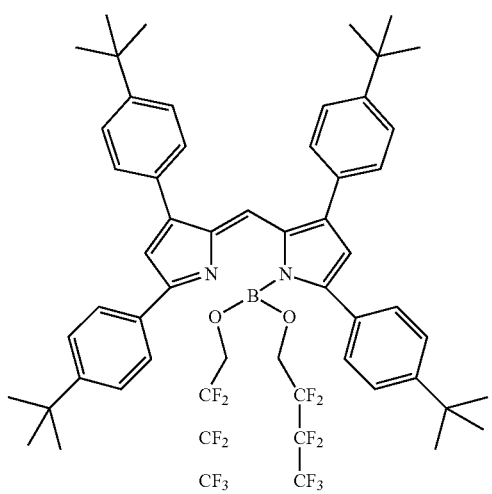
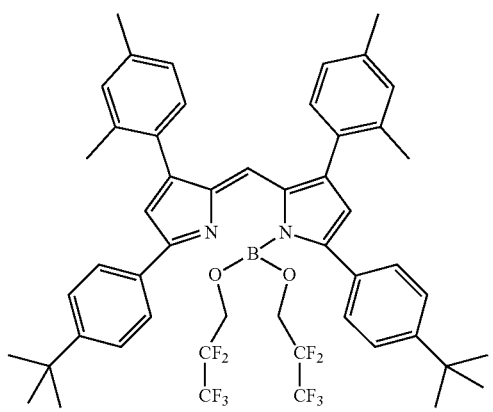

33
-continued
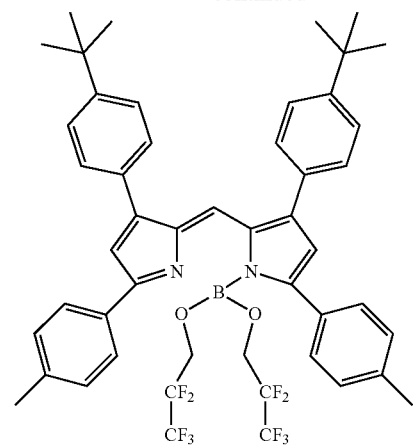
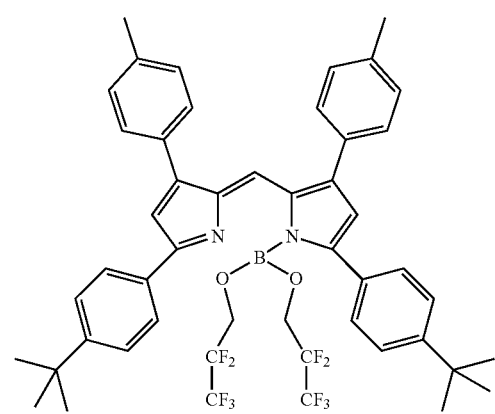
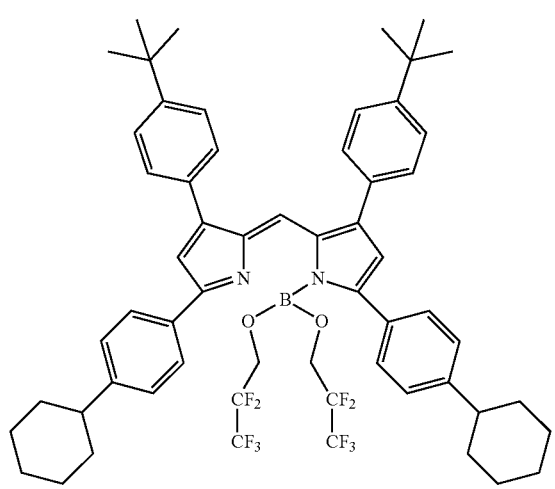
34
-continued
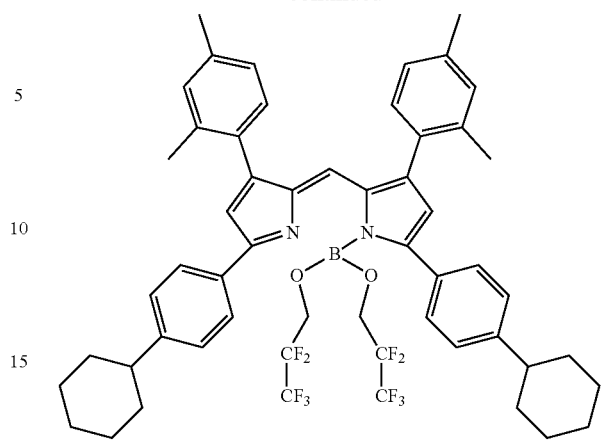
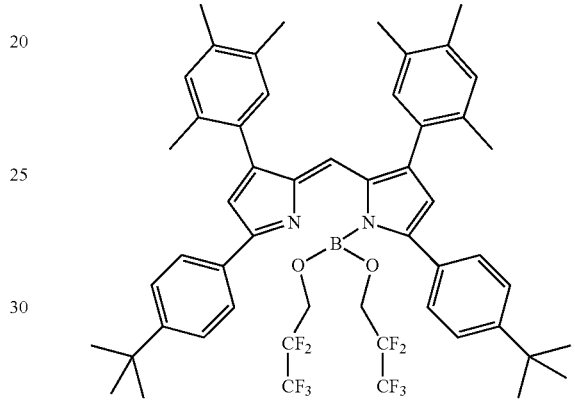
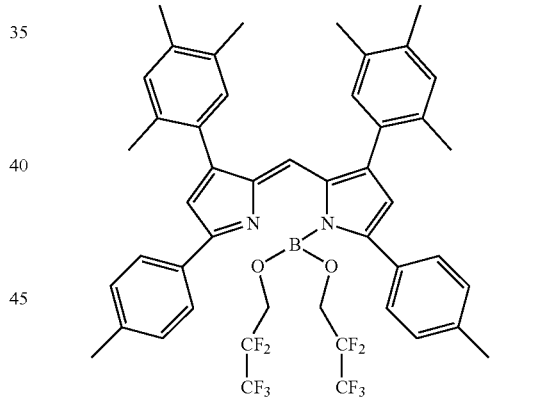
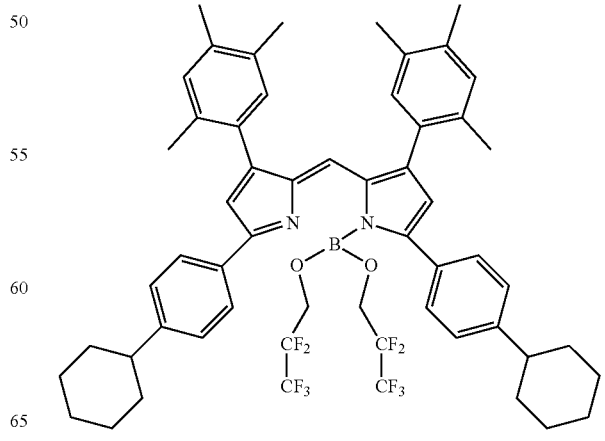

-continued
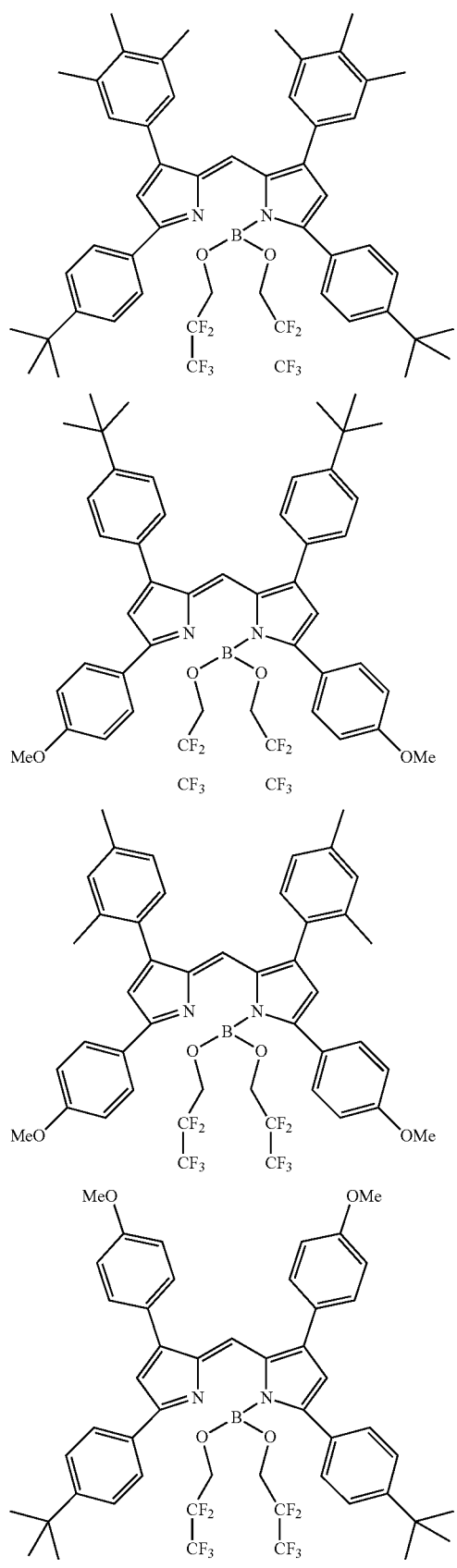
-continued
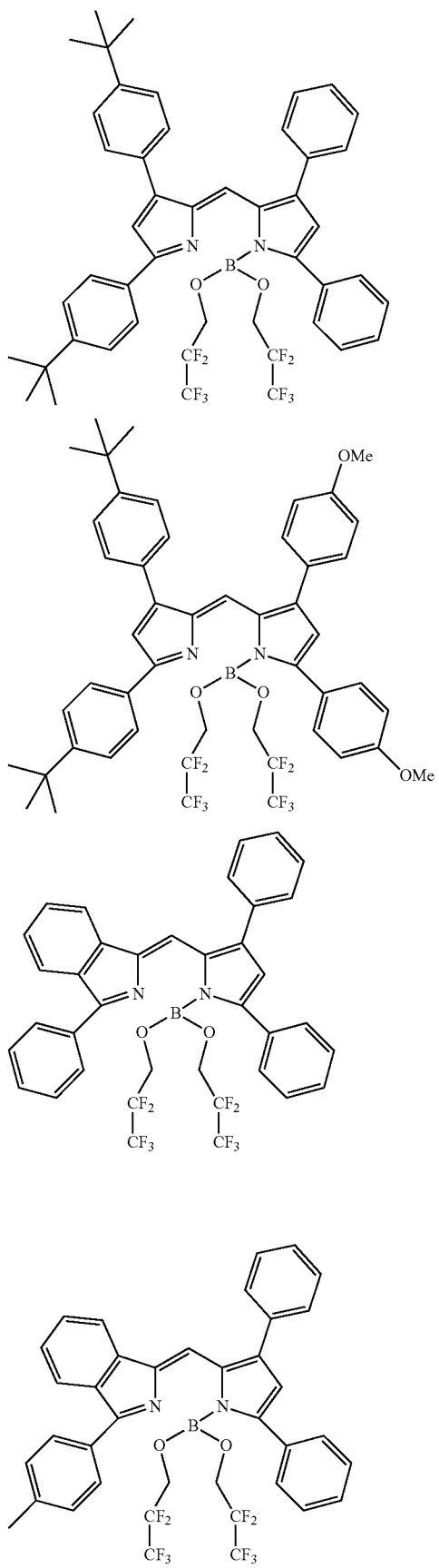

-continued
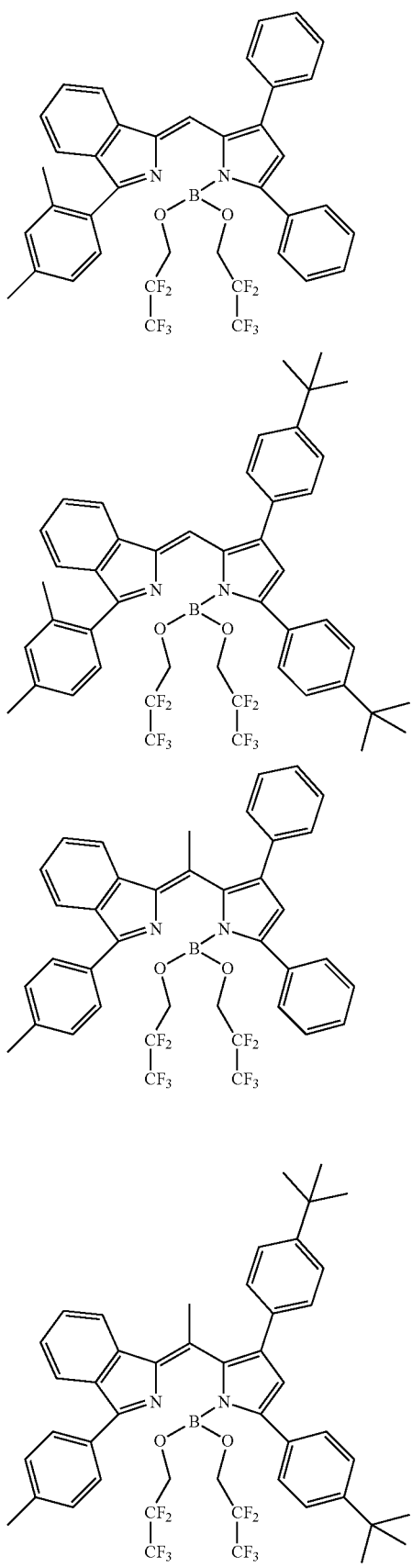
-continued
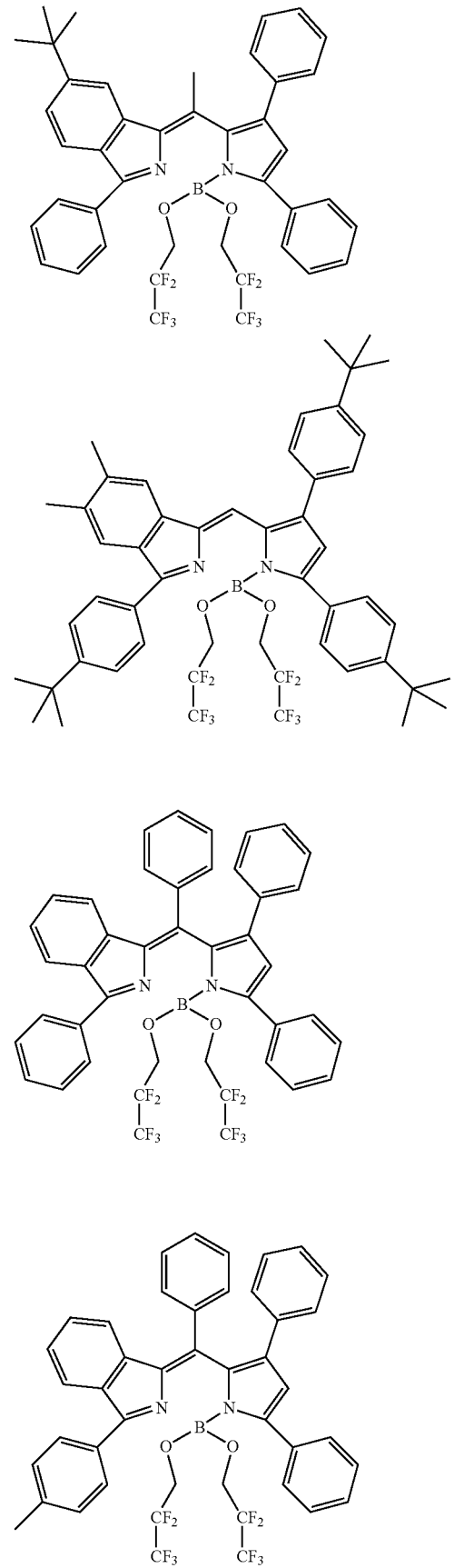

39
-continued
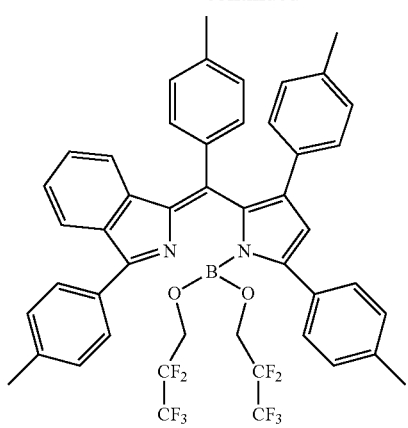
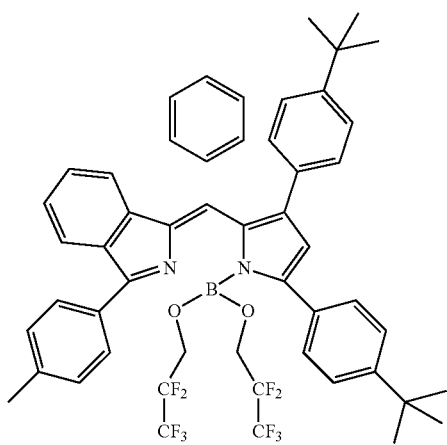
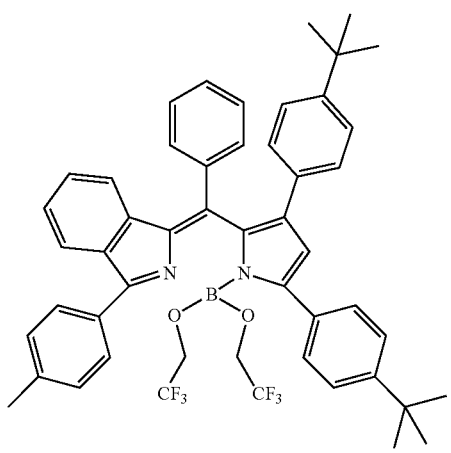
40
-continued
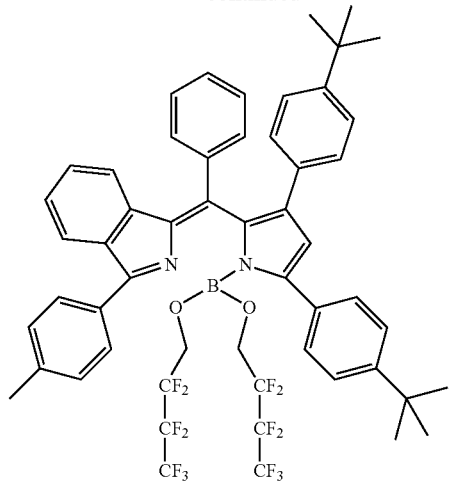
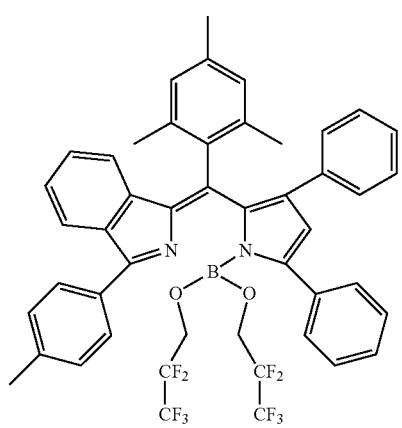
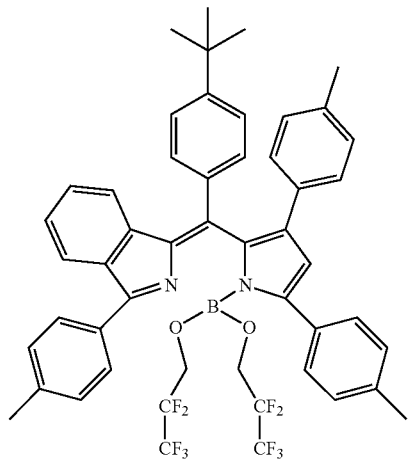

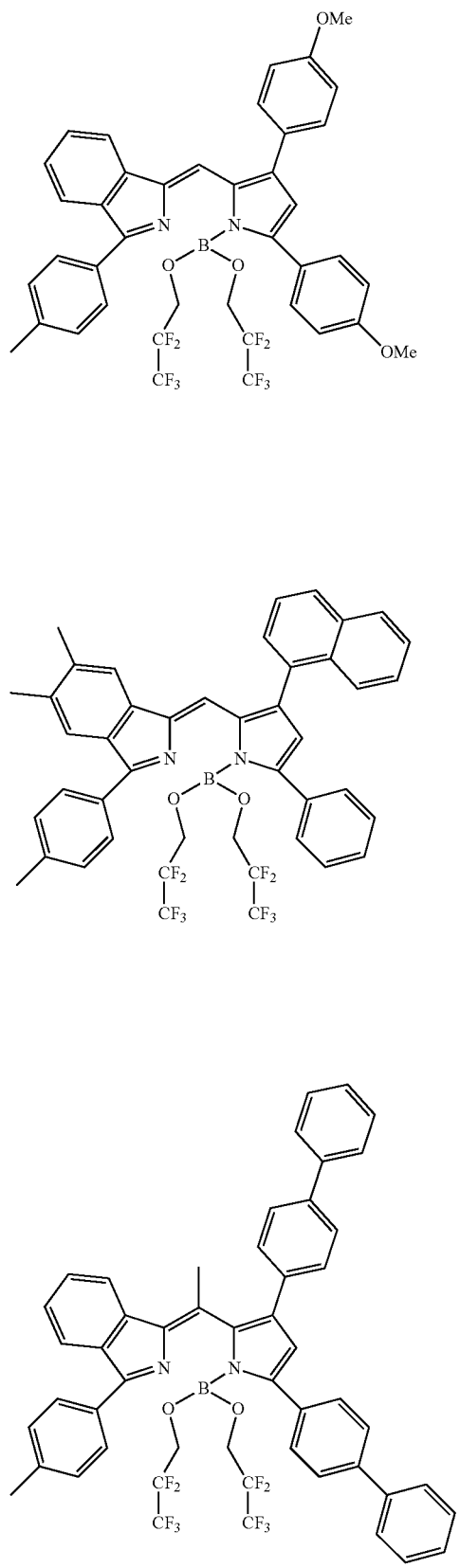
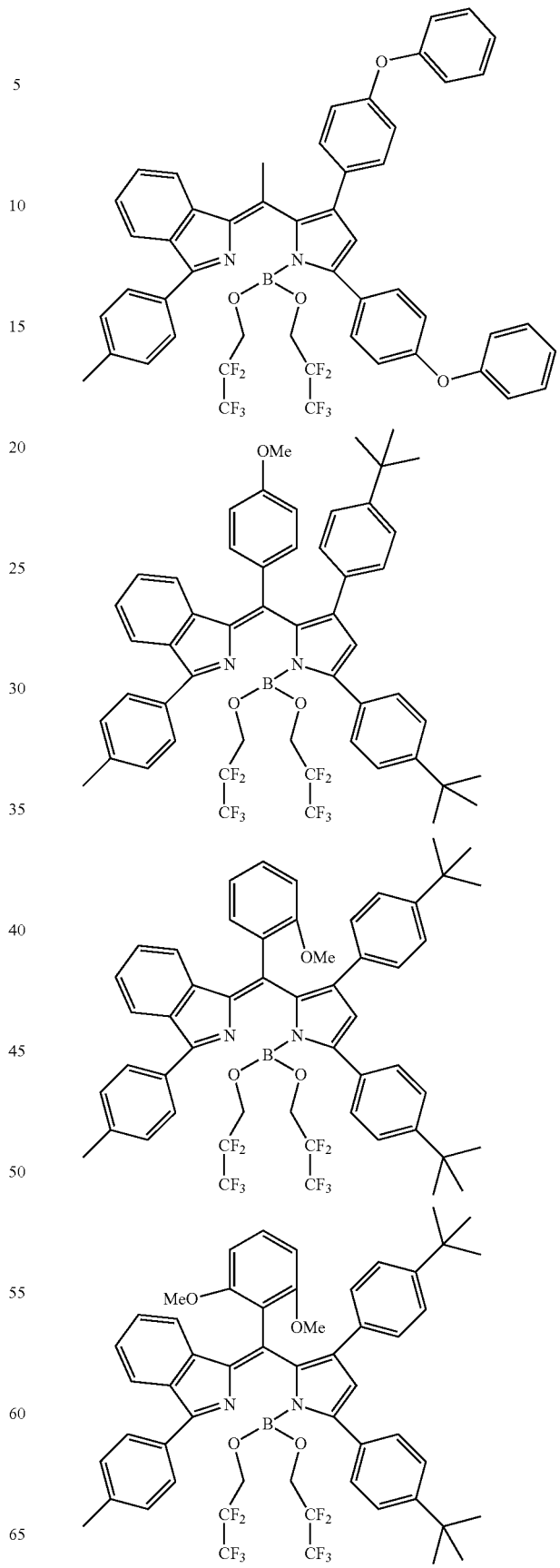

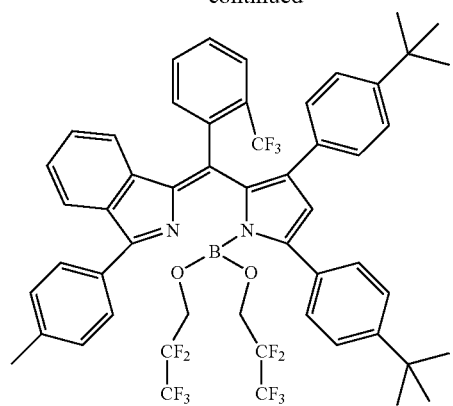
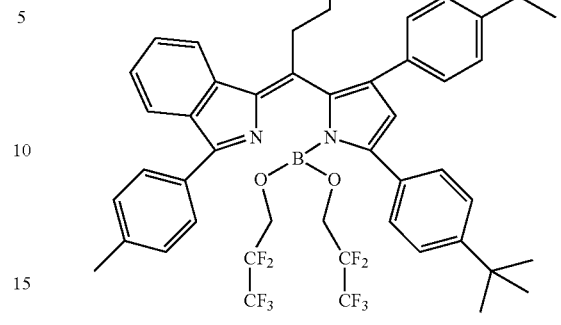
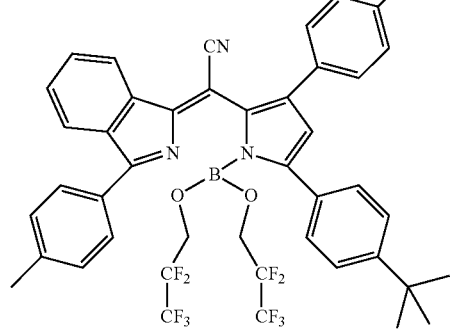
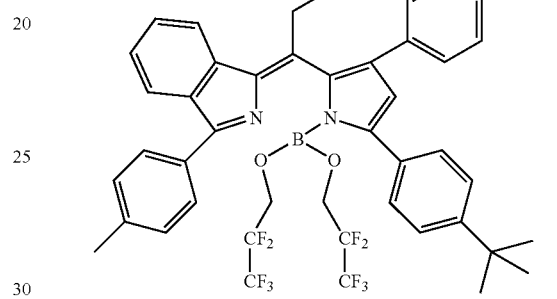
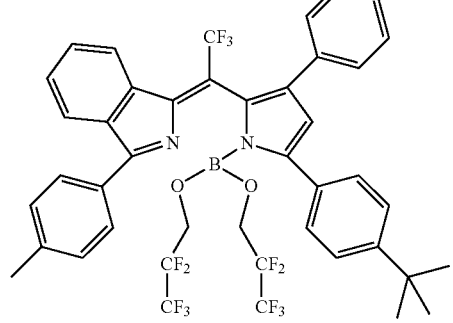
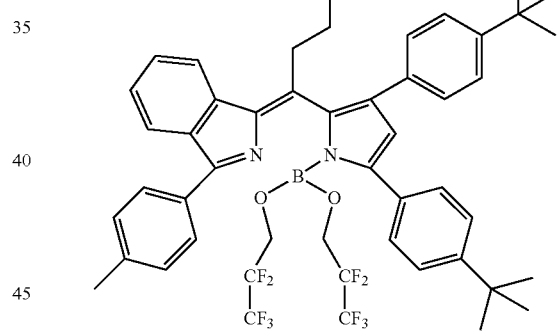
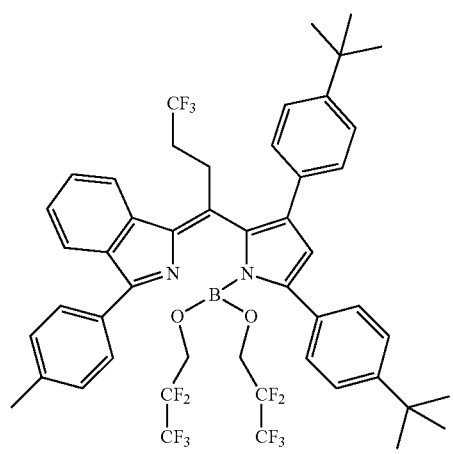
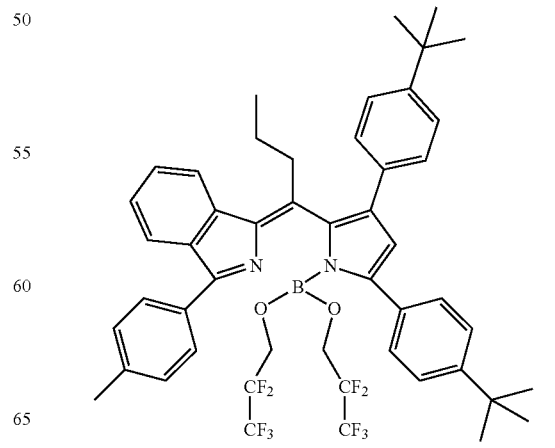

45
-continued
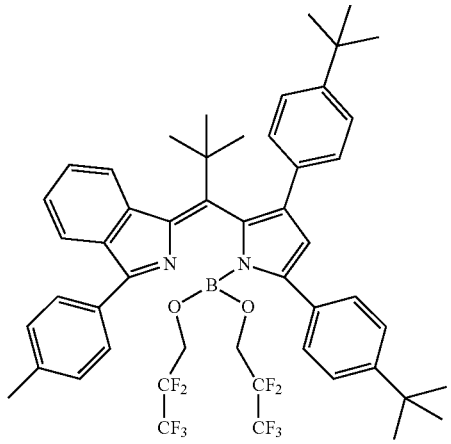
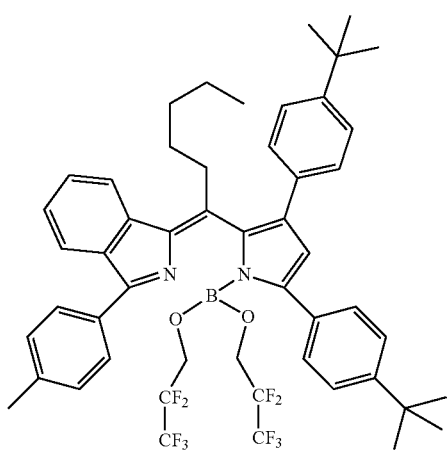
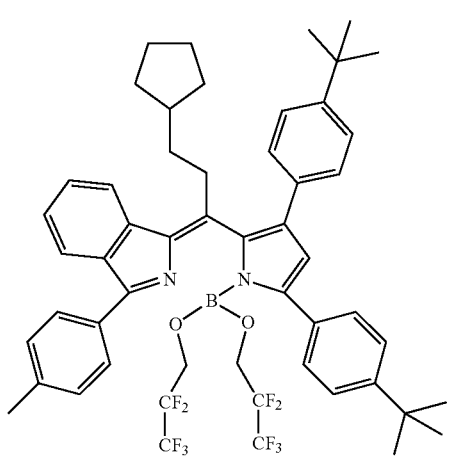
46
-continued
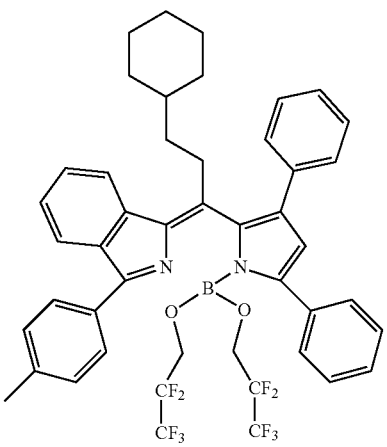
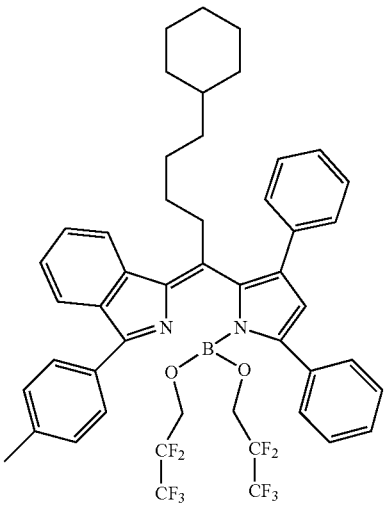
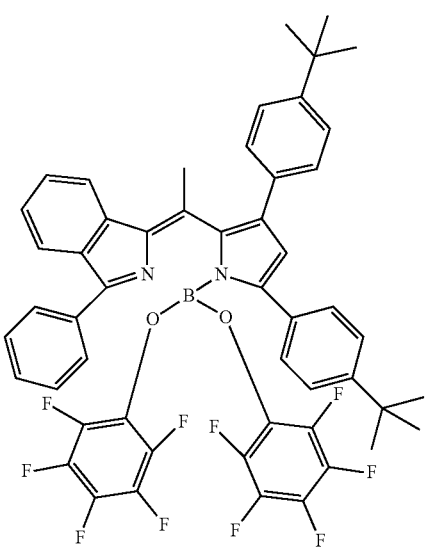

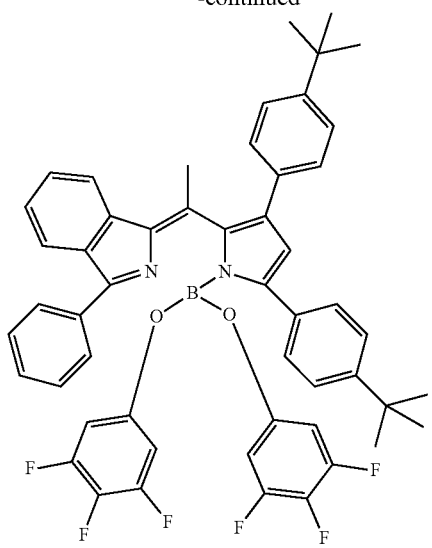
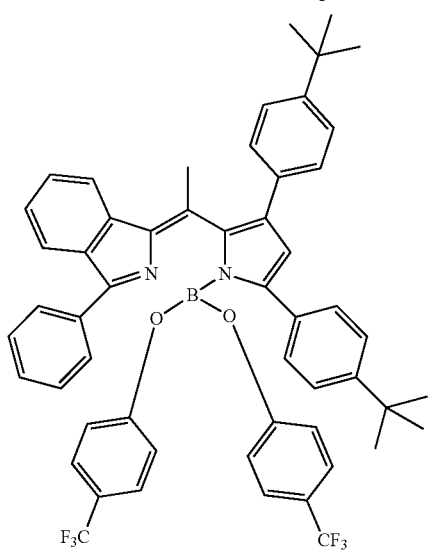
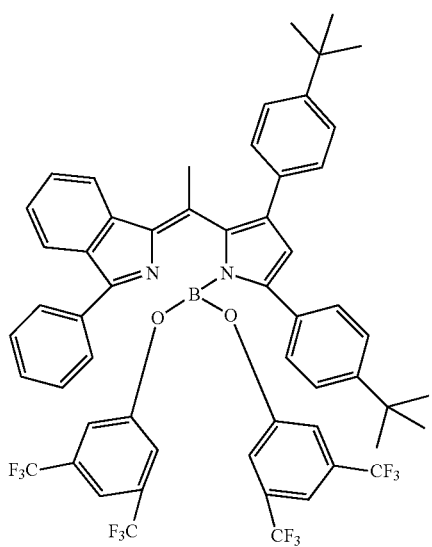
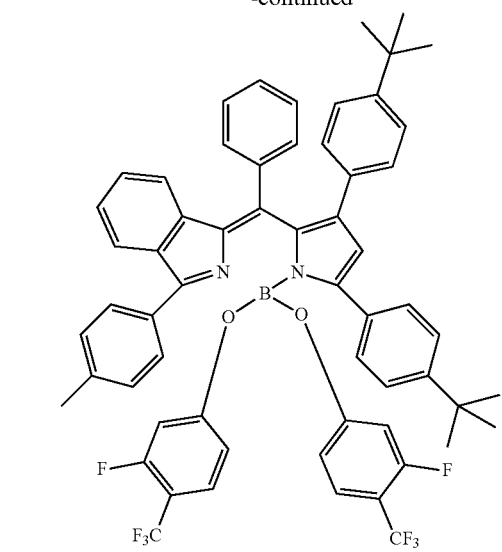
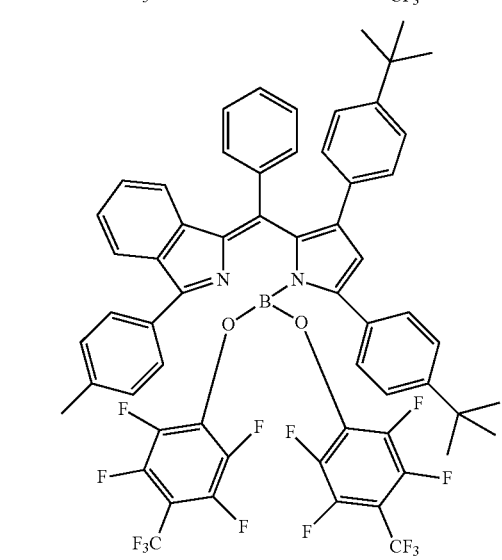
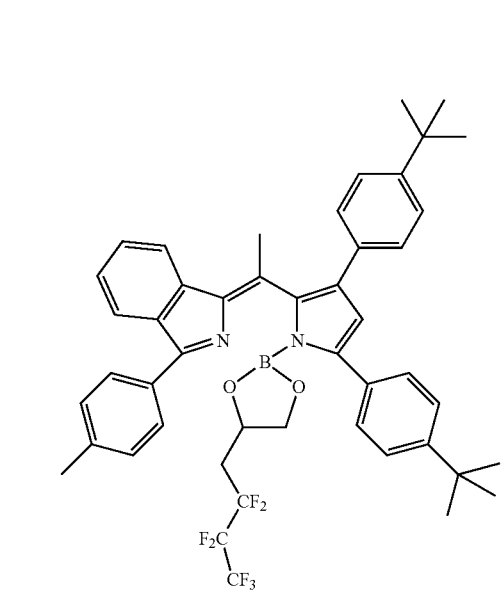

49
-continued
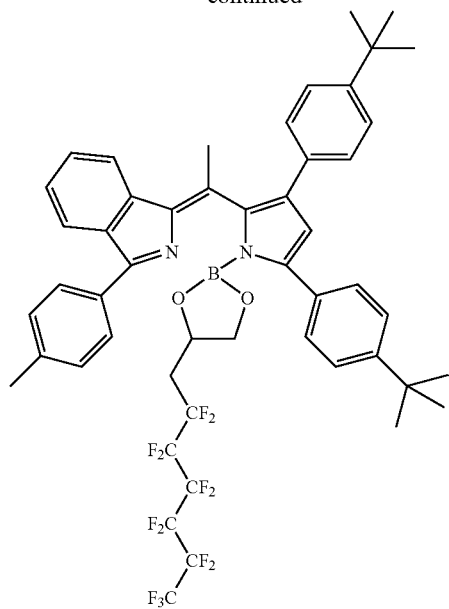
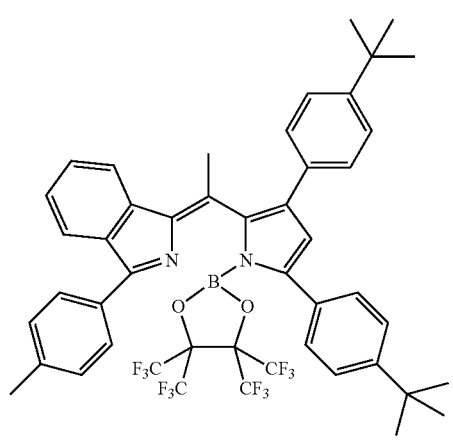
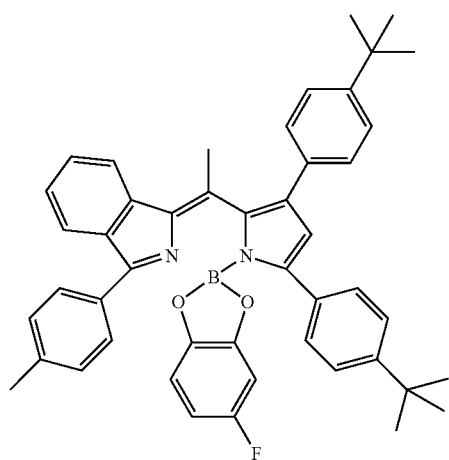
50
-continued
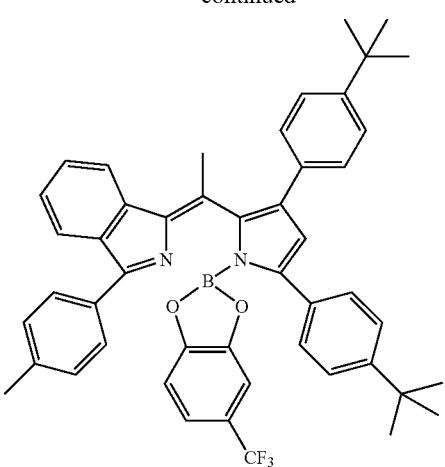
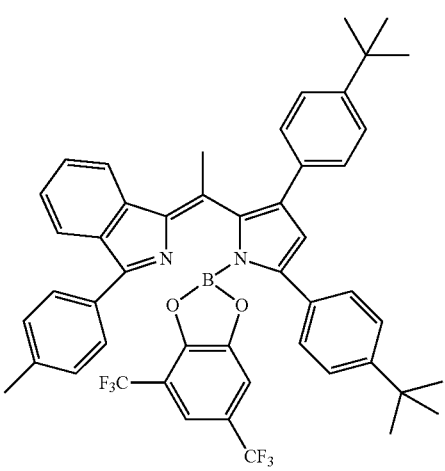
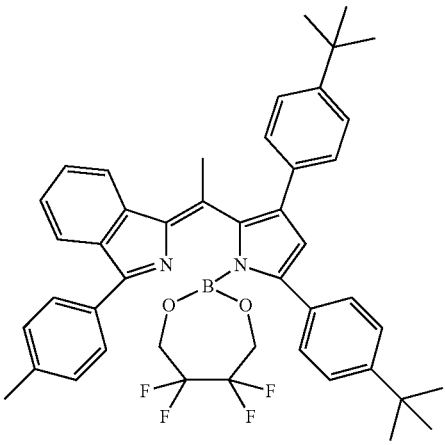

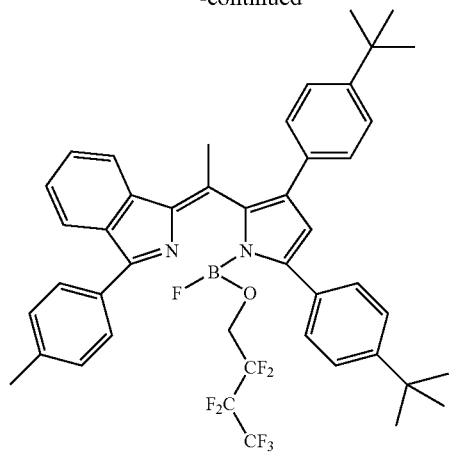
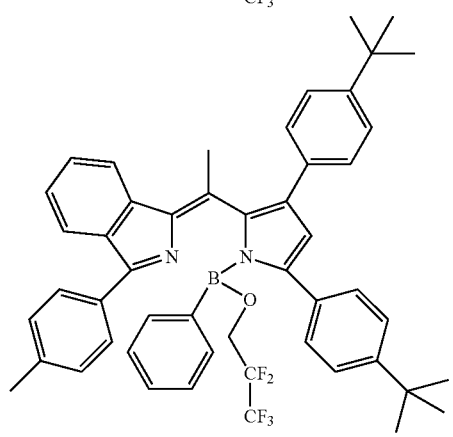
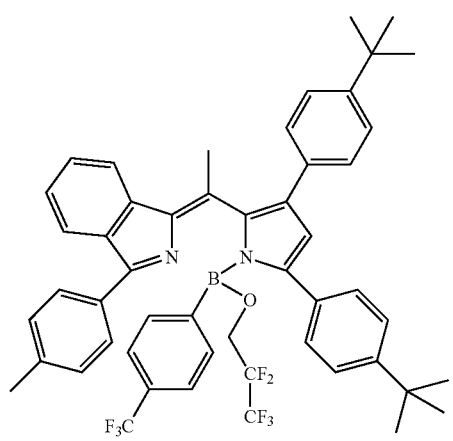
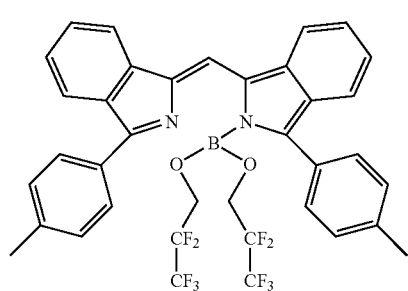
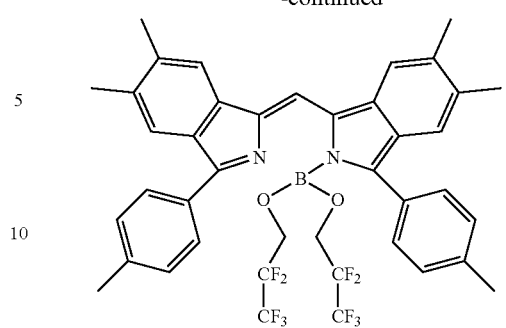
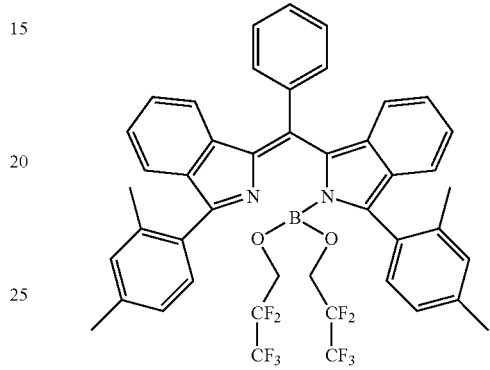
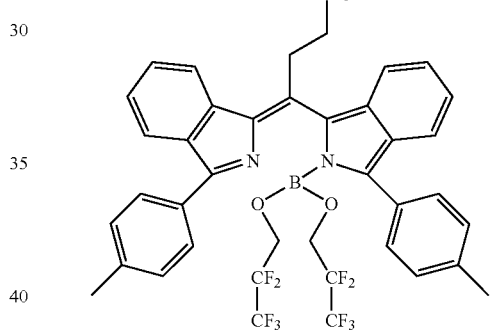
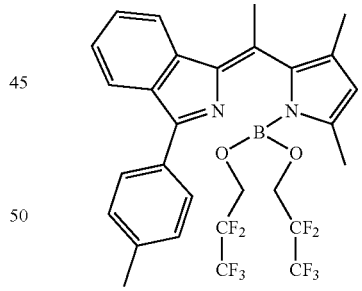
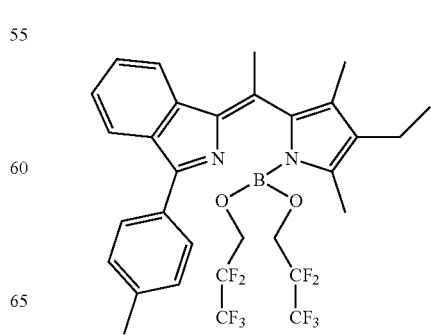

53
-continued
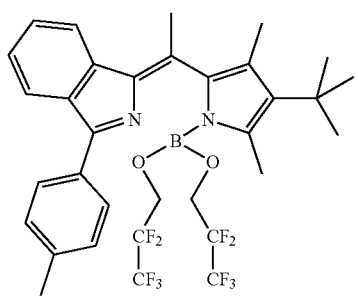
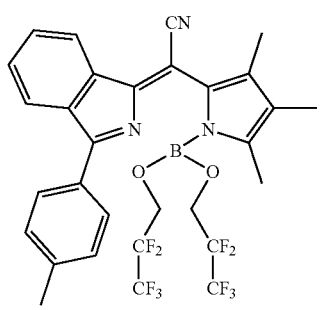
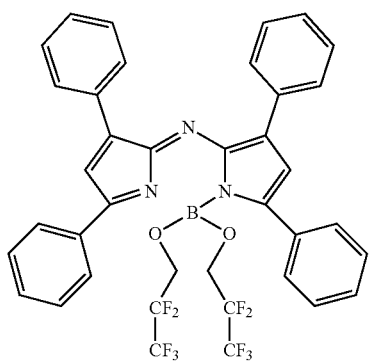
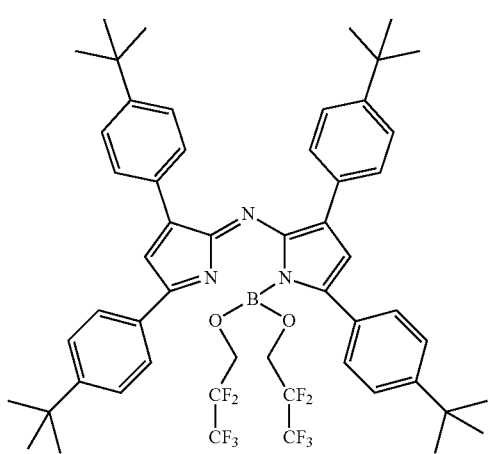
54
-continued
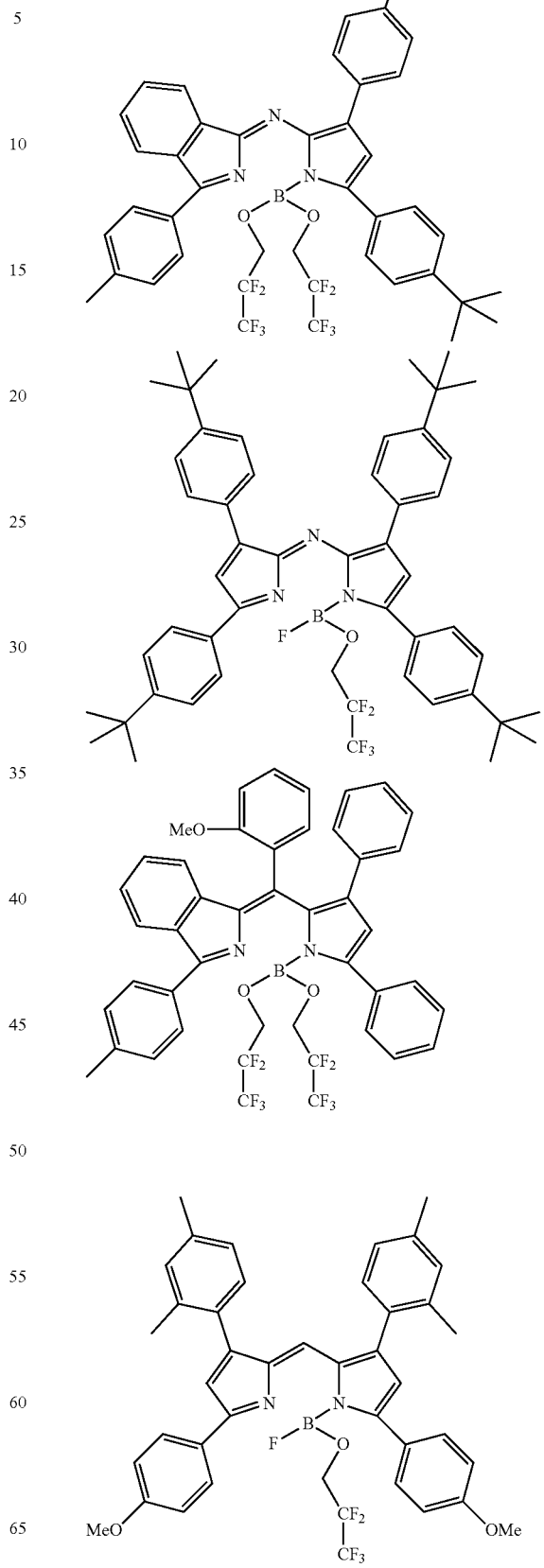

55
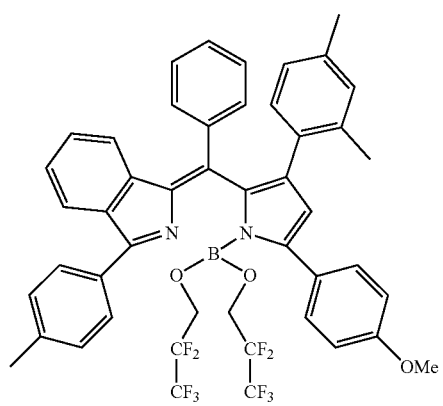
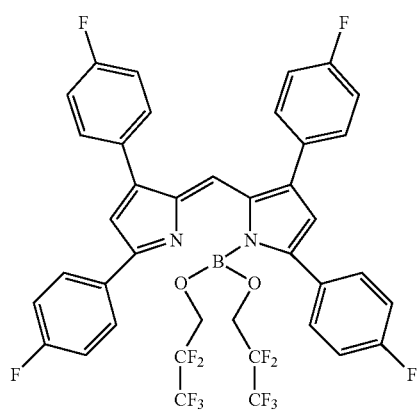
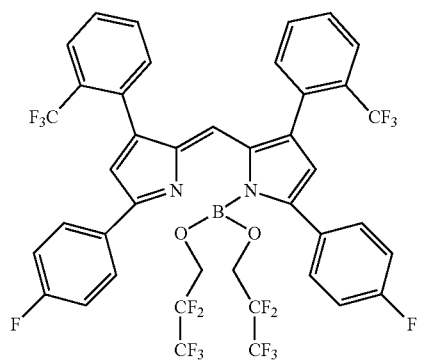
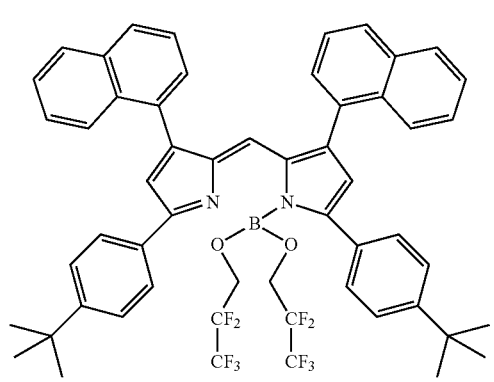
56
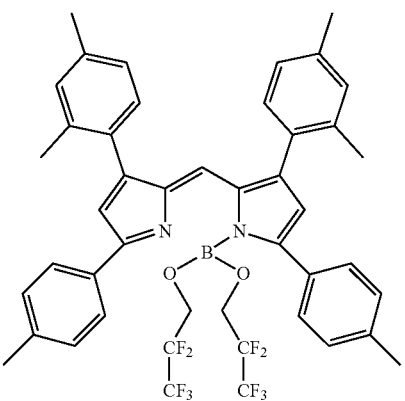
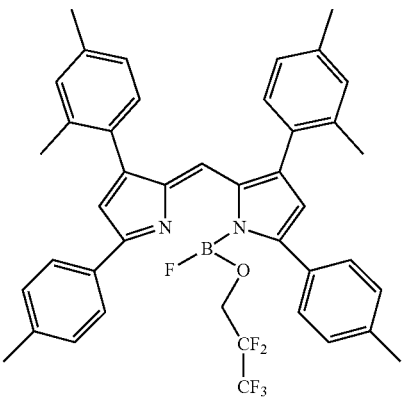
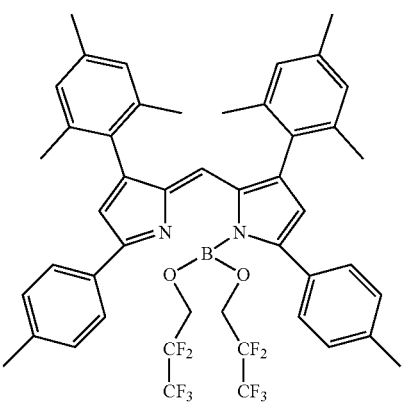
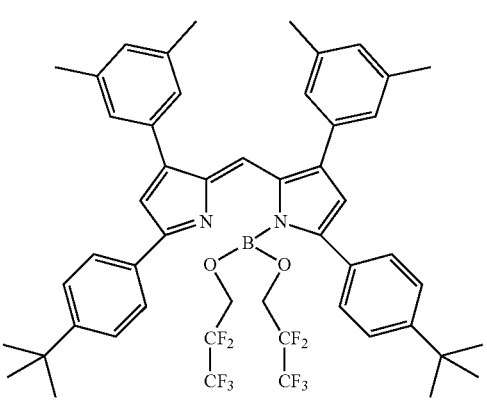

57
-continued
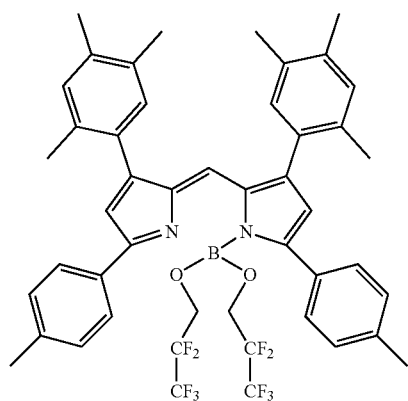
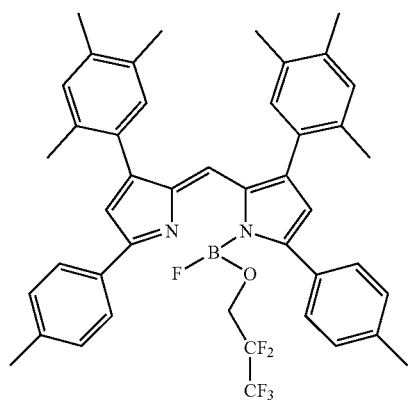
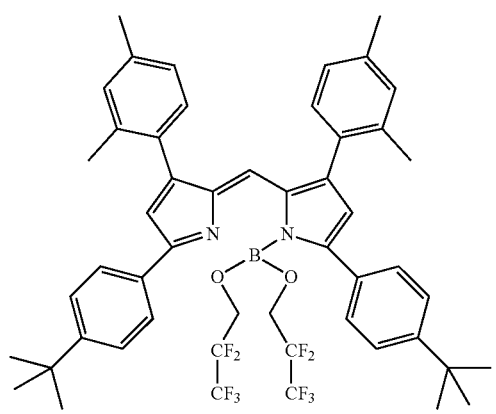
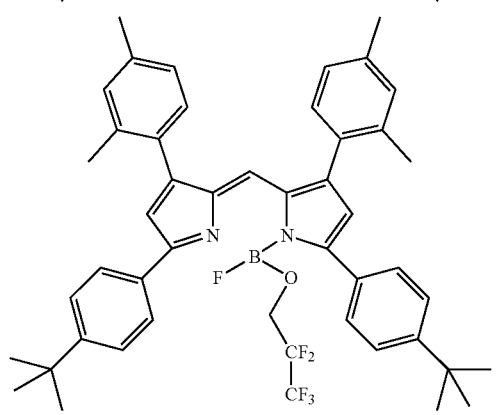
58
-continued
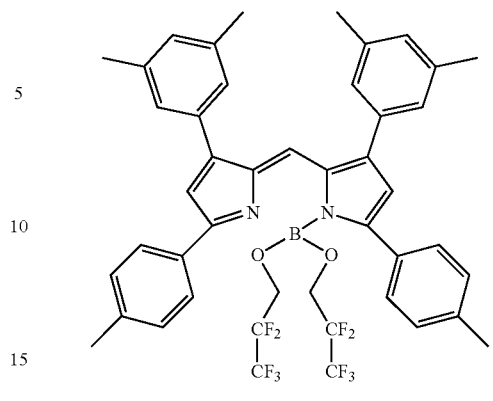
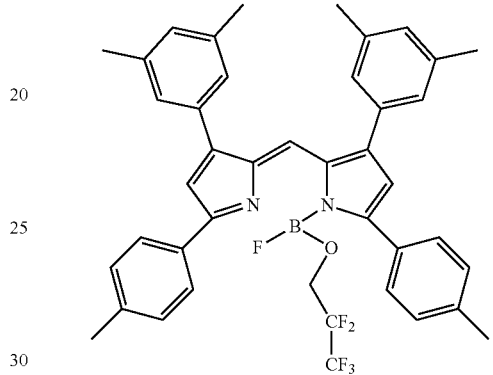
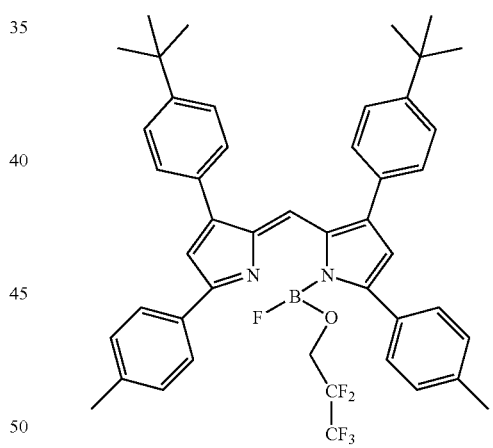
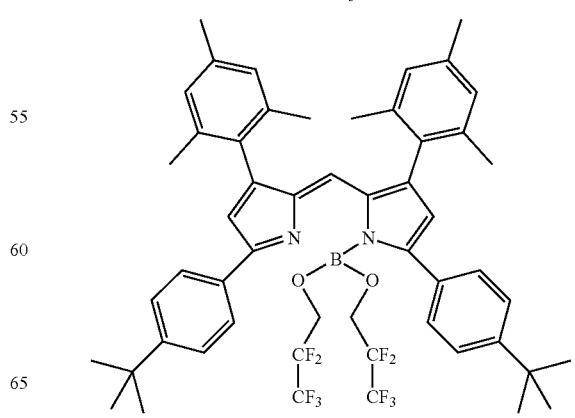

59
-continued
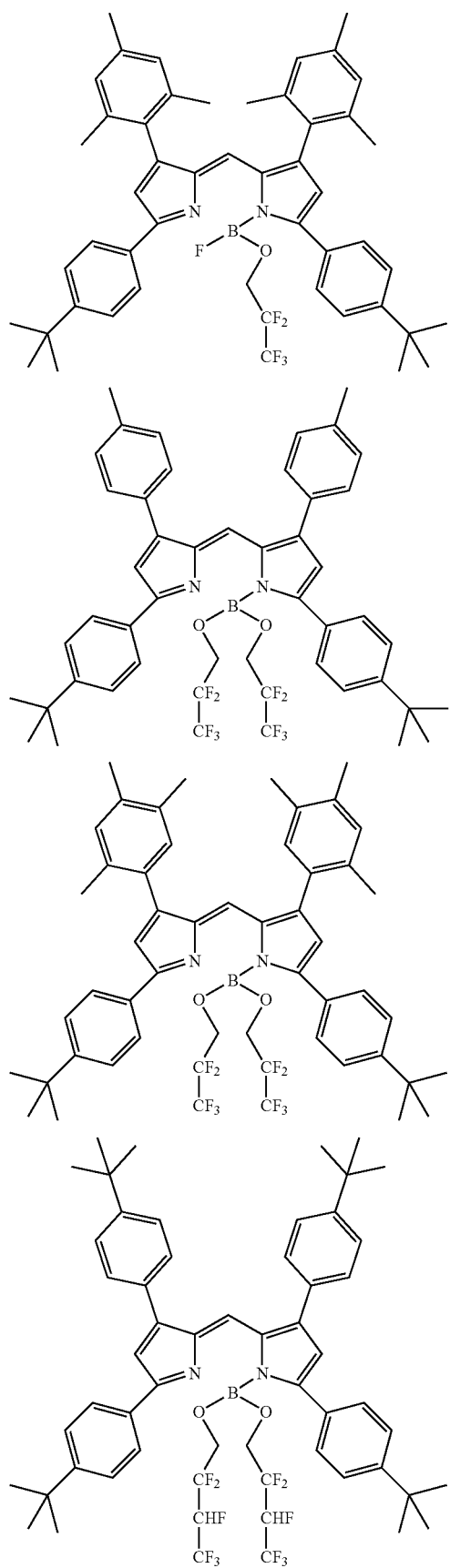
60
-continued
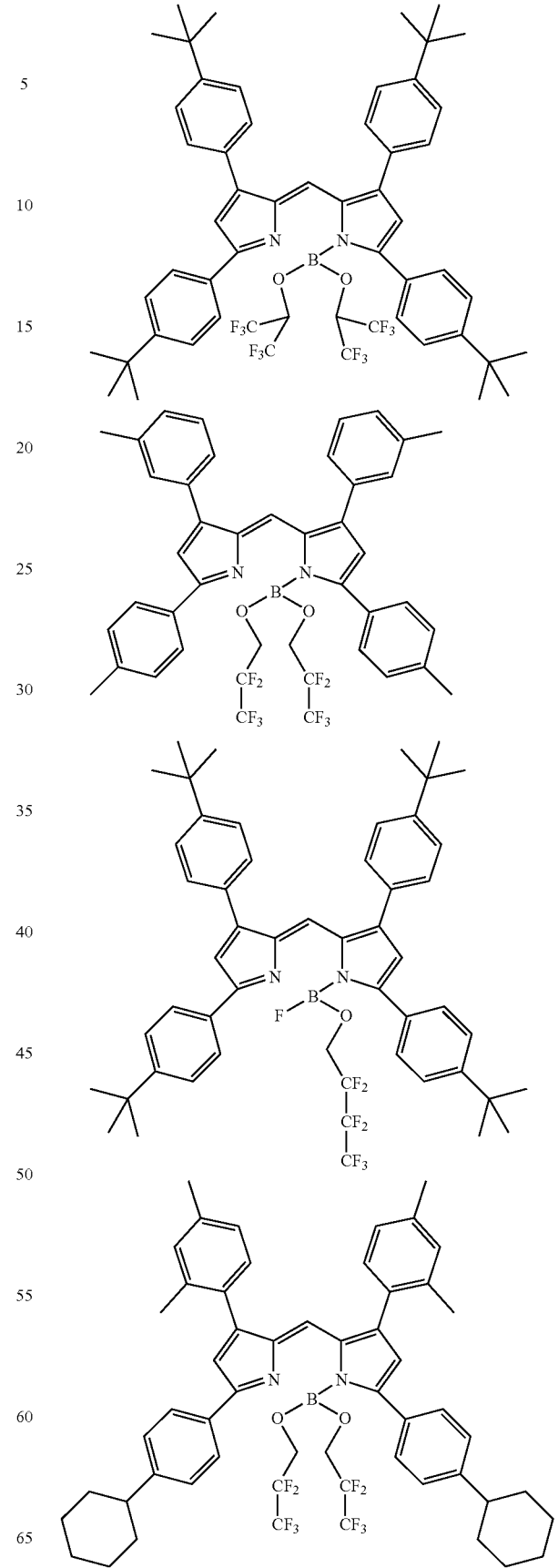

-continued
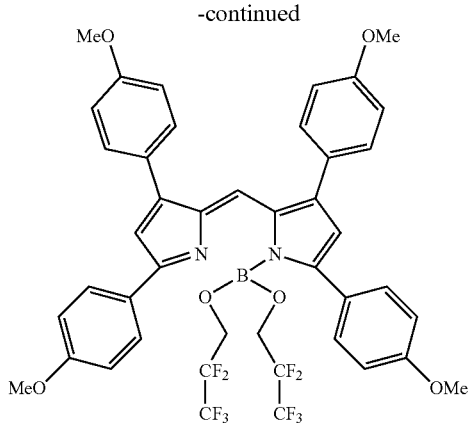
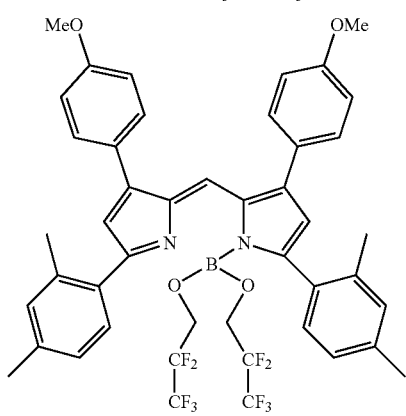
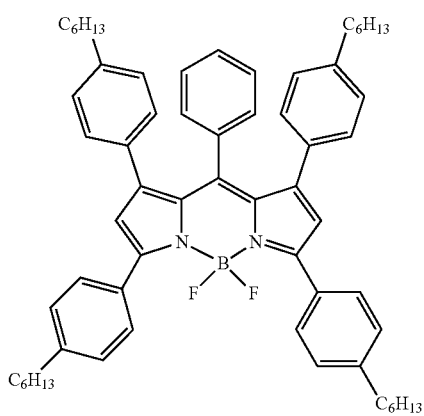
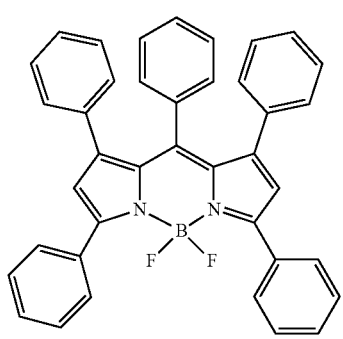
-continued
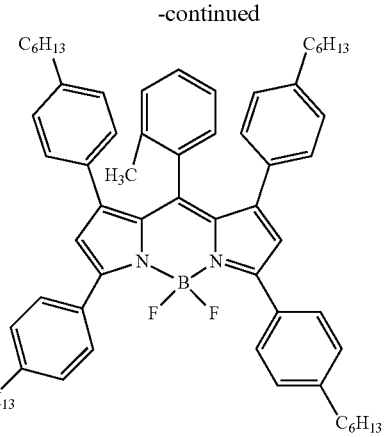
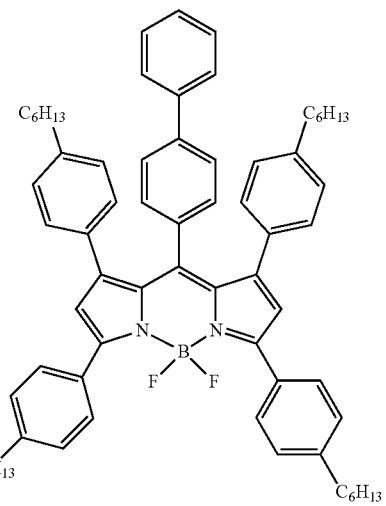
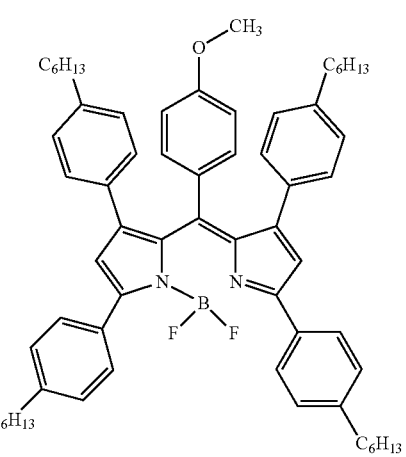

63
-continued
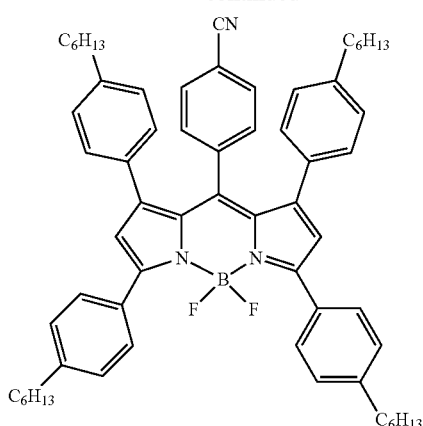
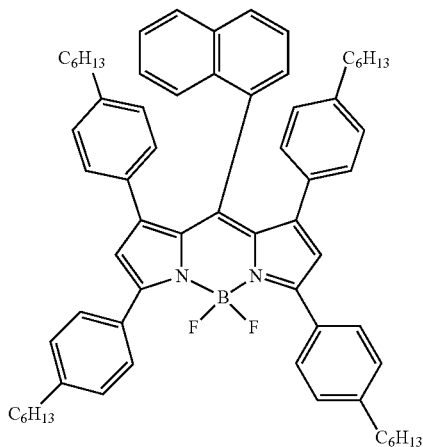
64
-continued
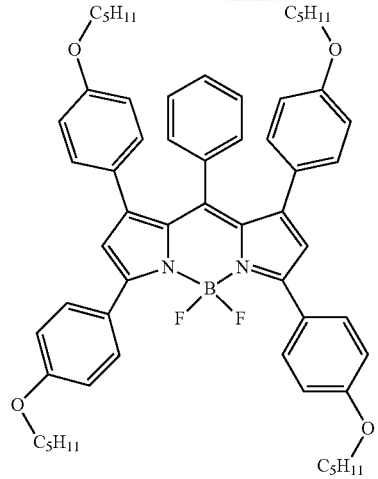
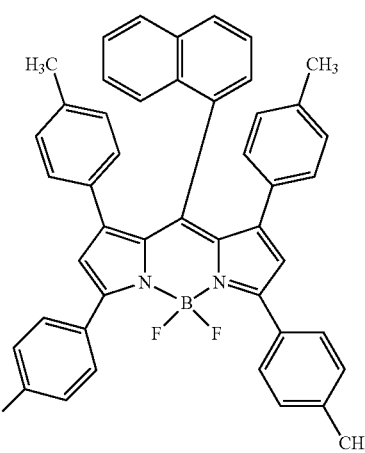
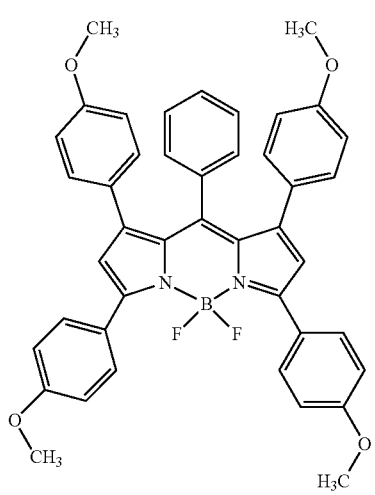
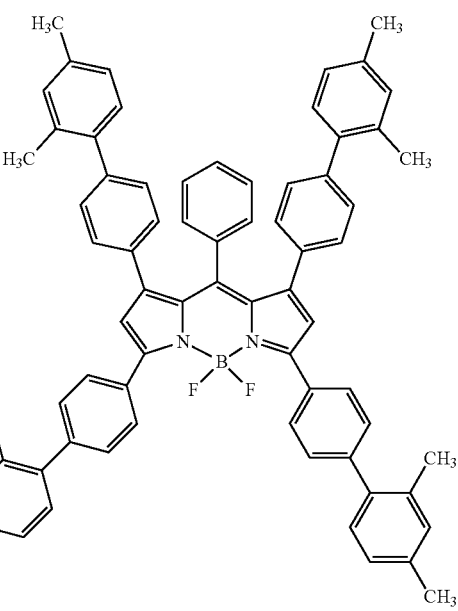

65
-continued
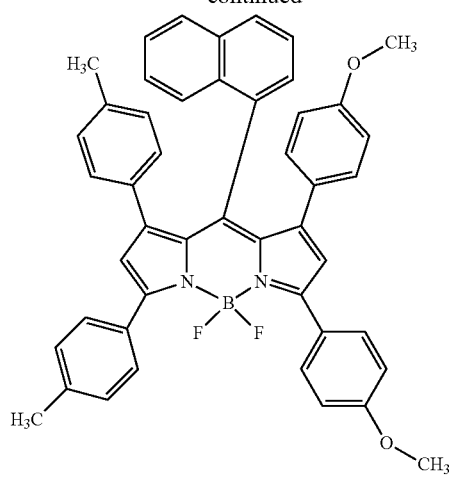
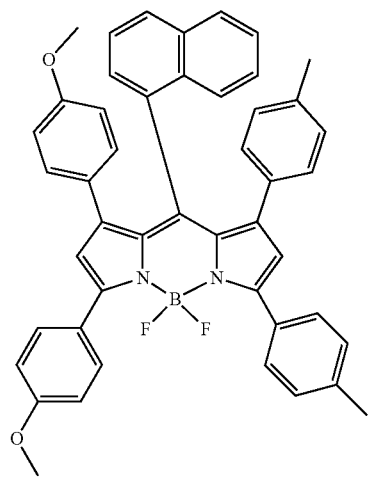
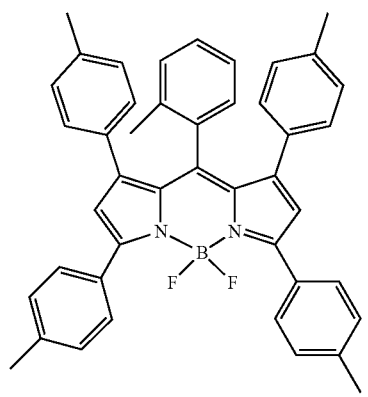
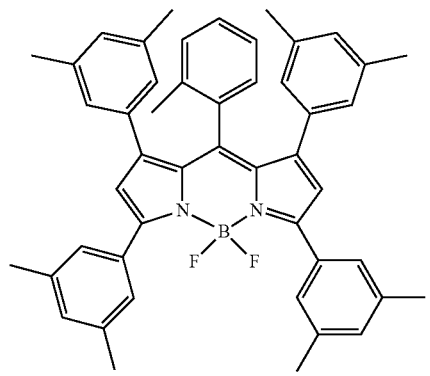
66
-continued
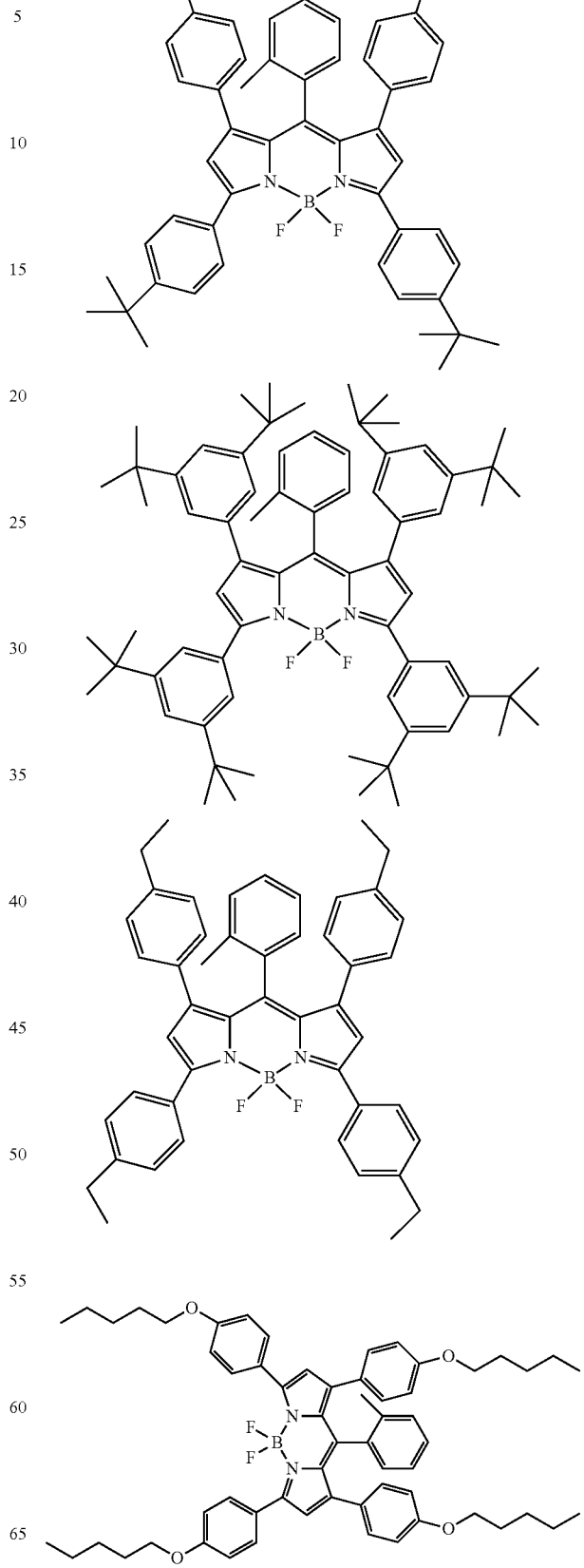

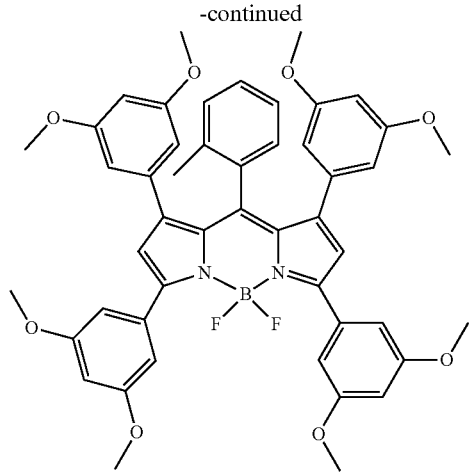
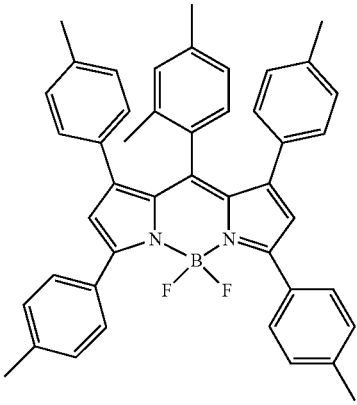
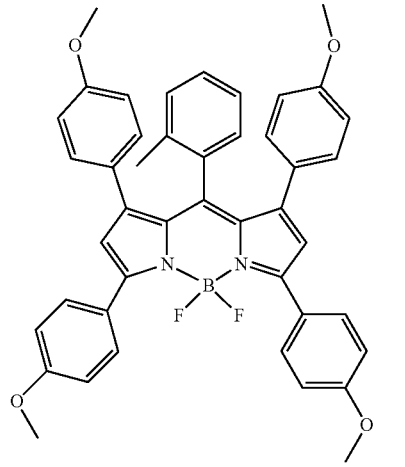
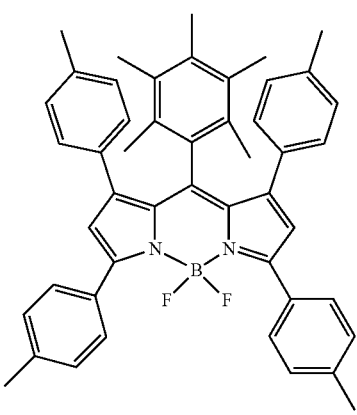
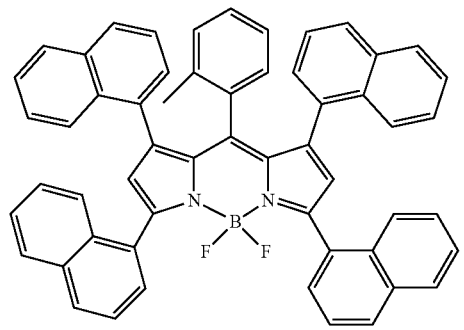
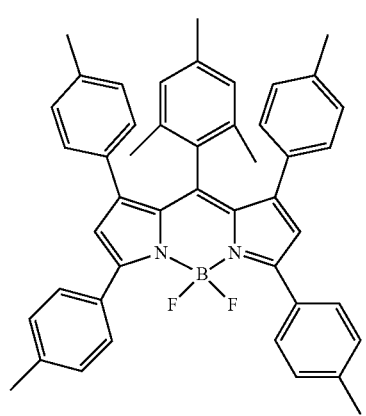
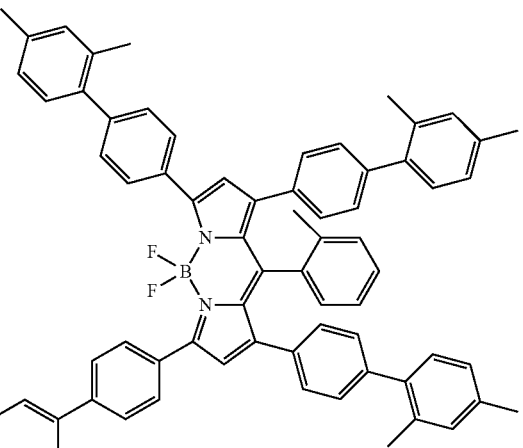

69
-continued
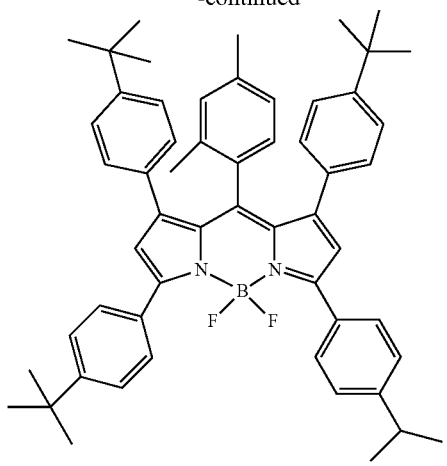
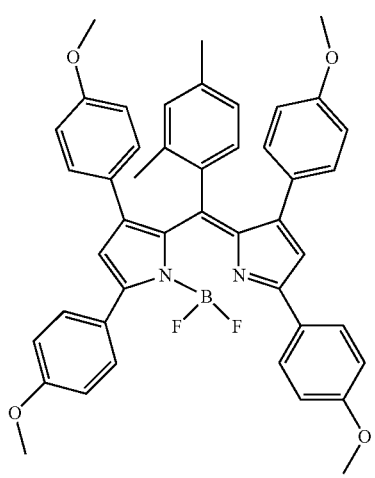
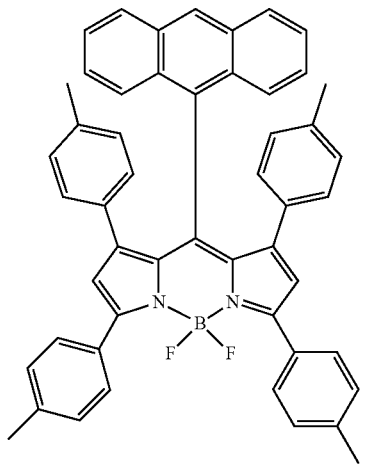
70
-continued
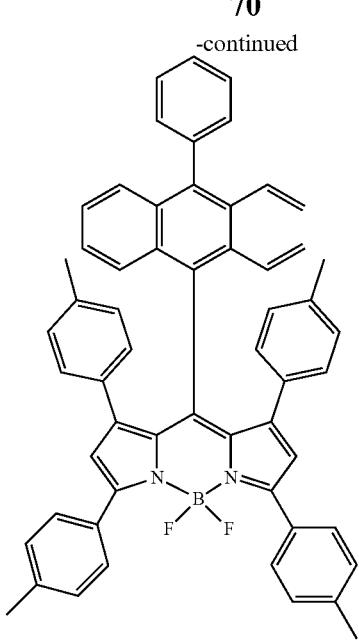
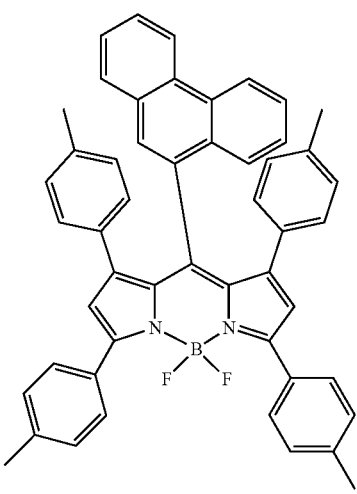
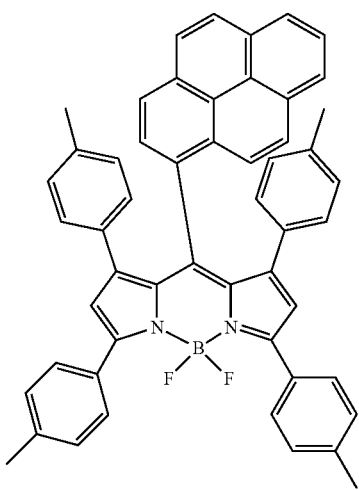

71
-continued
72
-continued
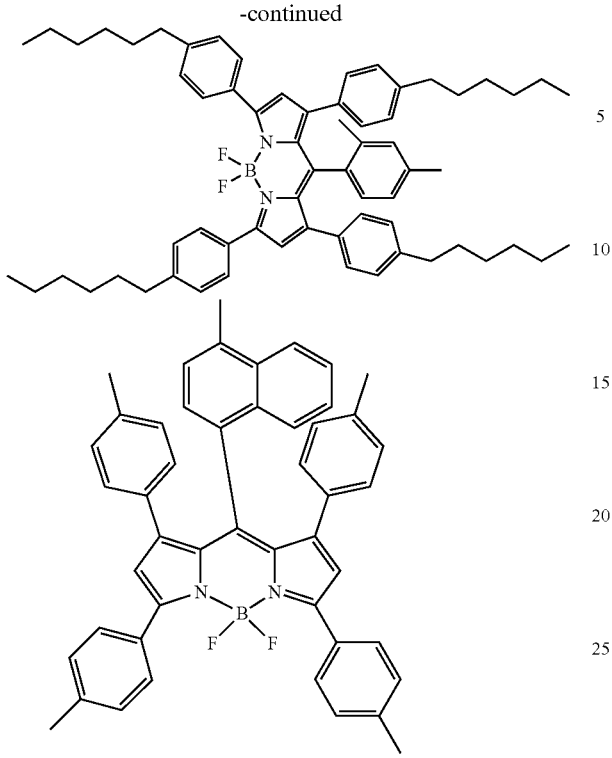
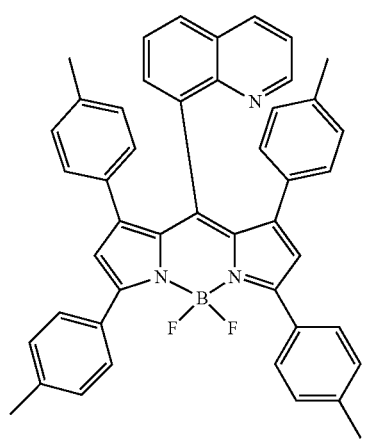
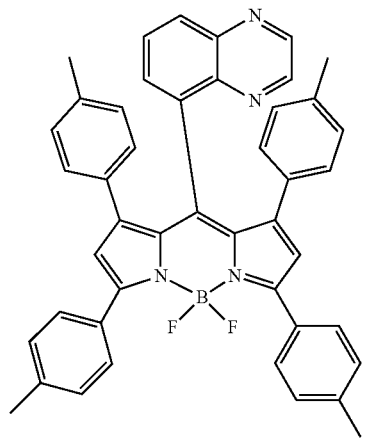
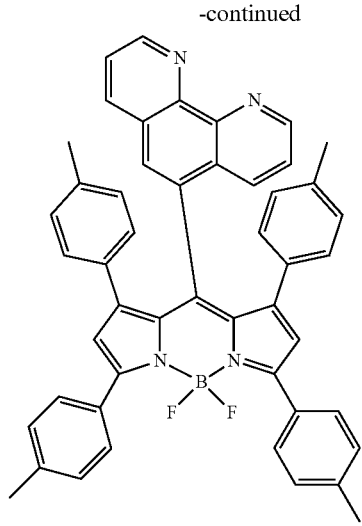
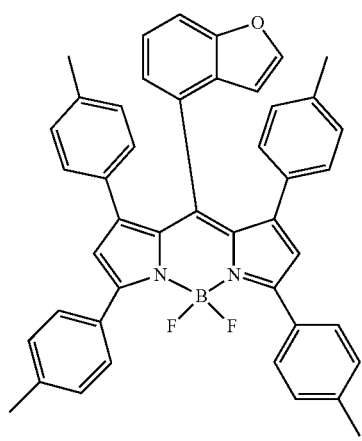
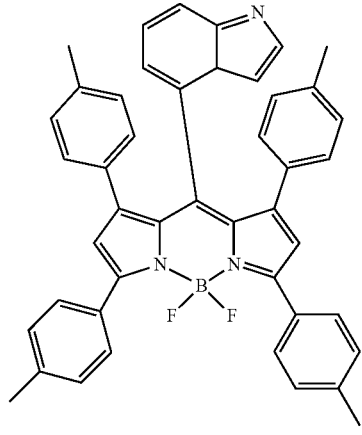

-continued
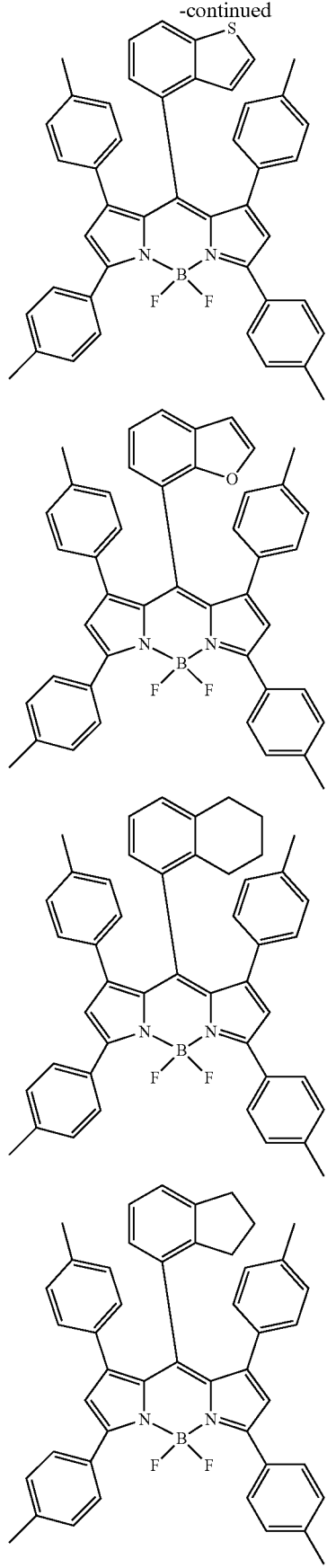
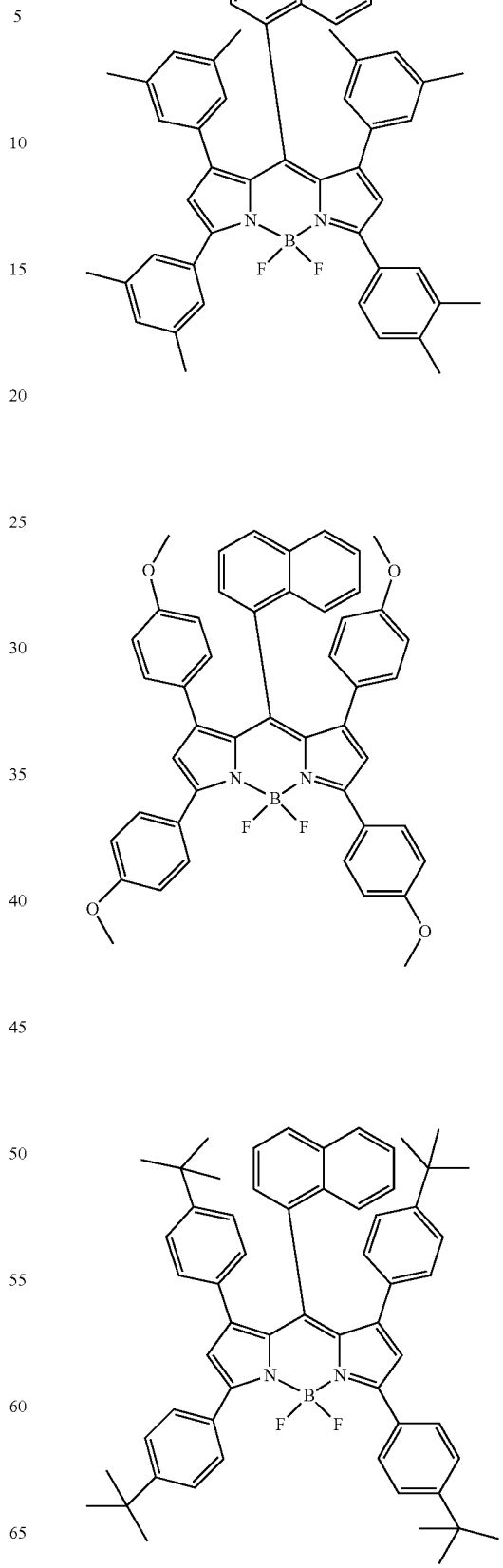

-continued
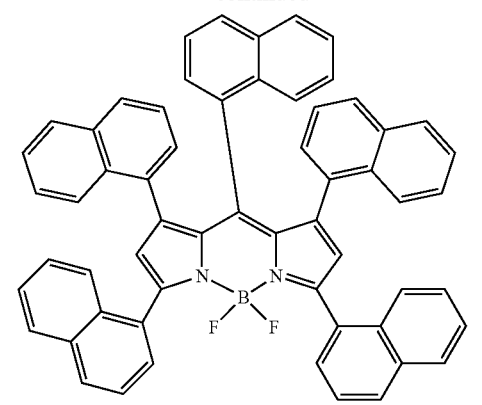
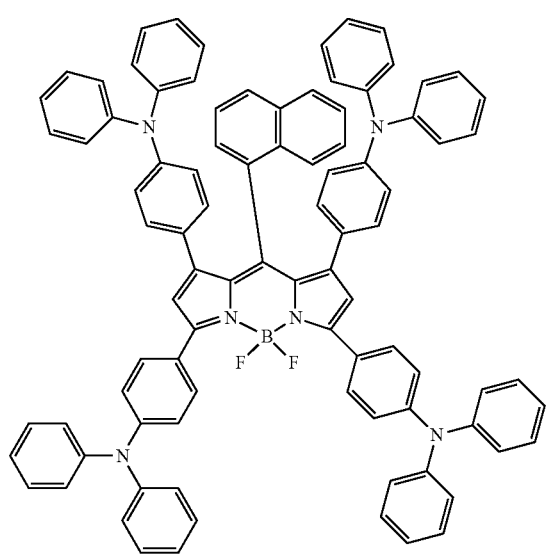
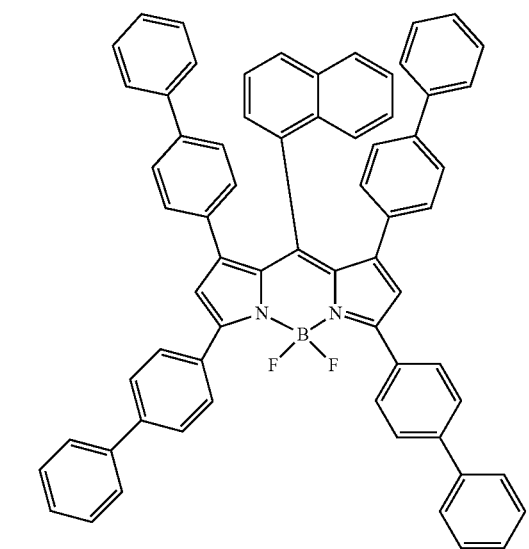
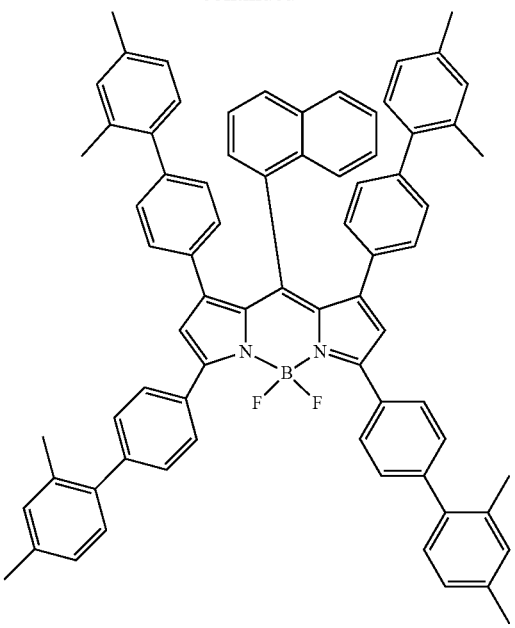
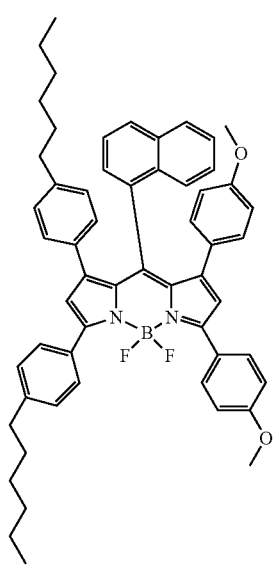
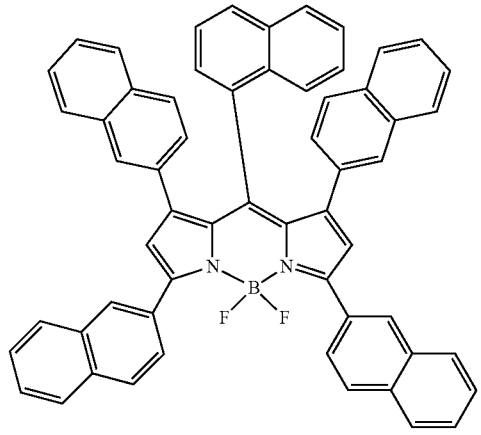

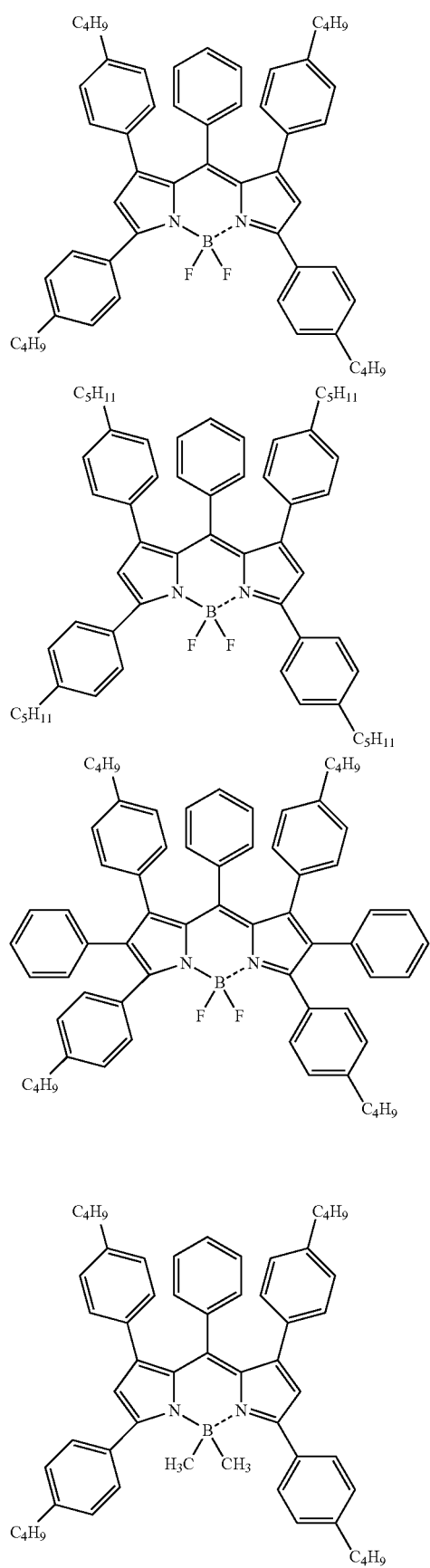
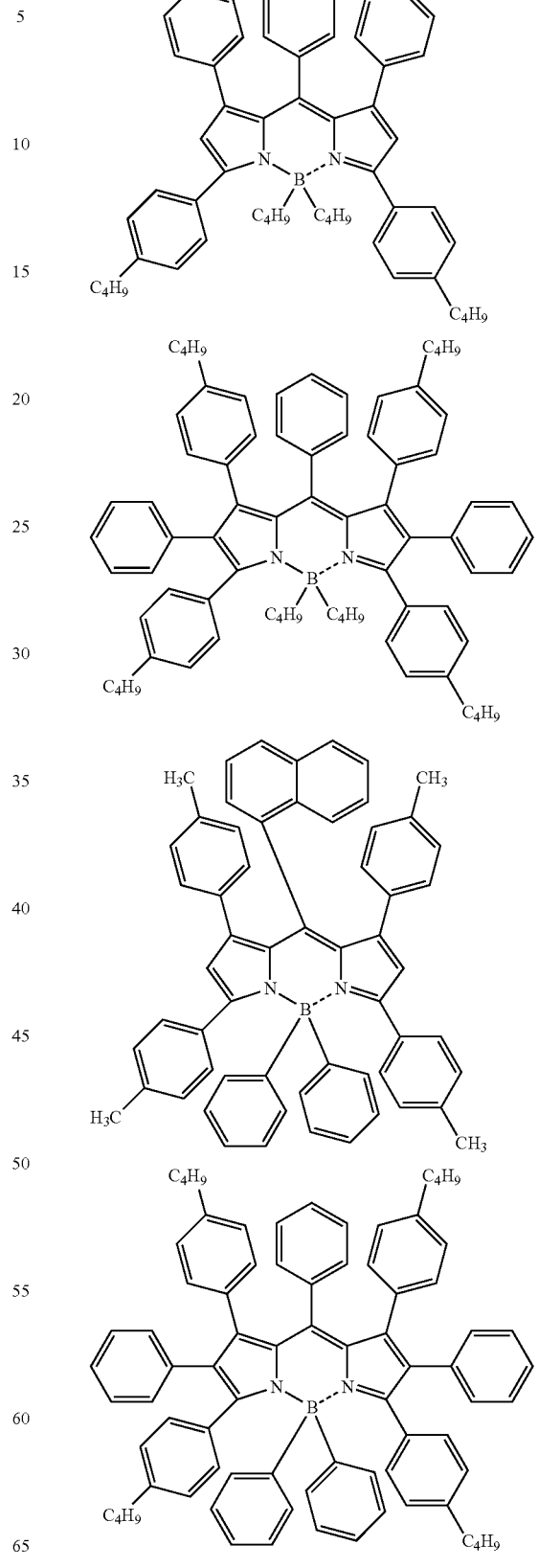

79
-continued
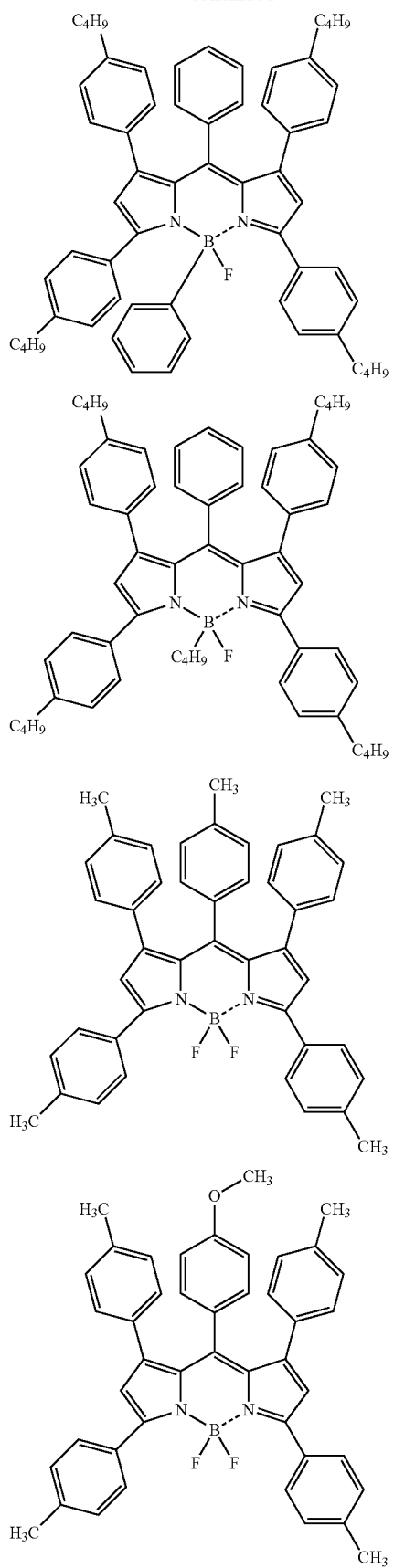
80
-continued
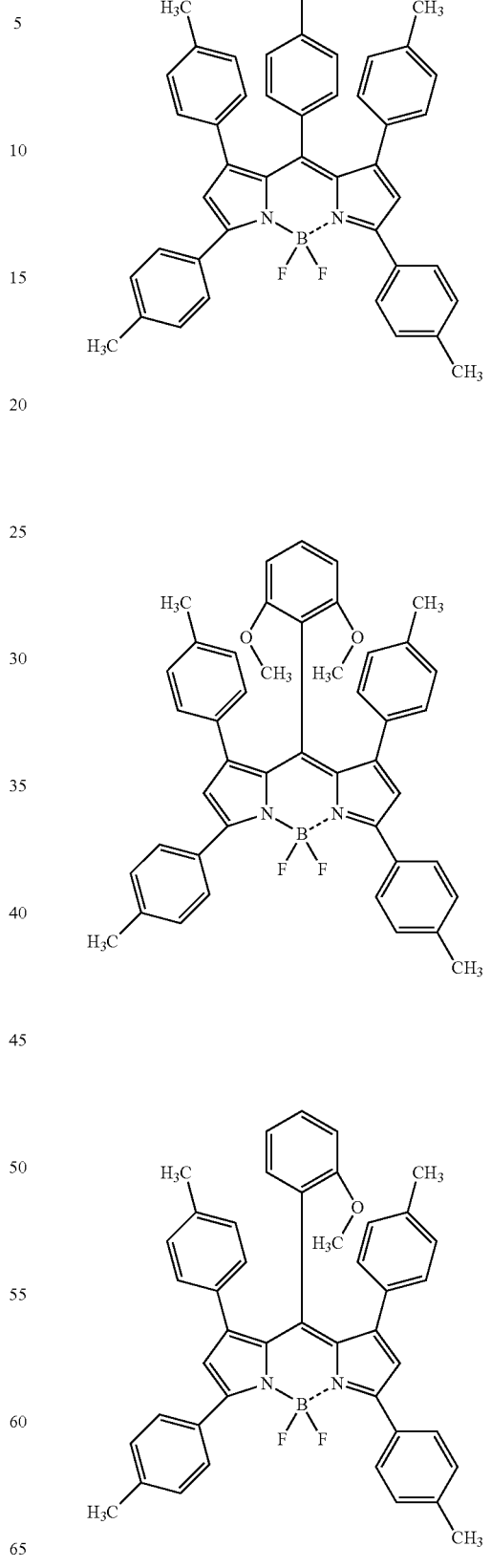

81
-continued
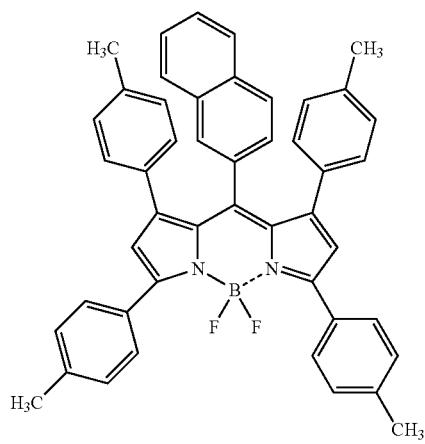
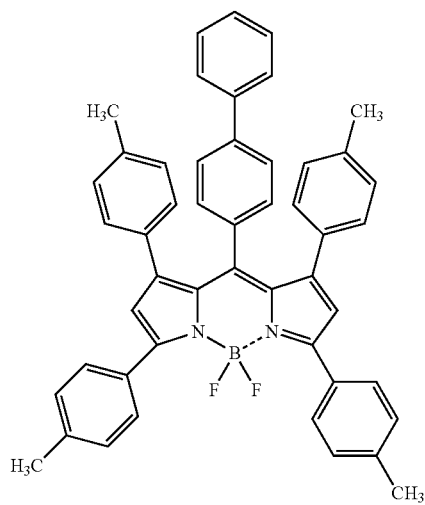
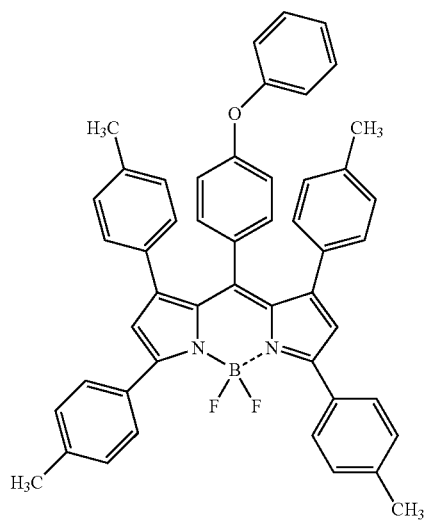
82
-continued
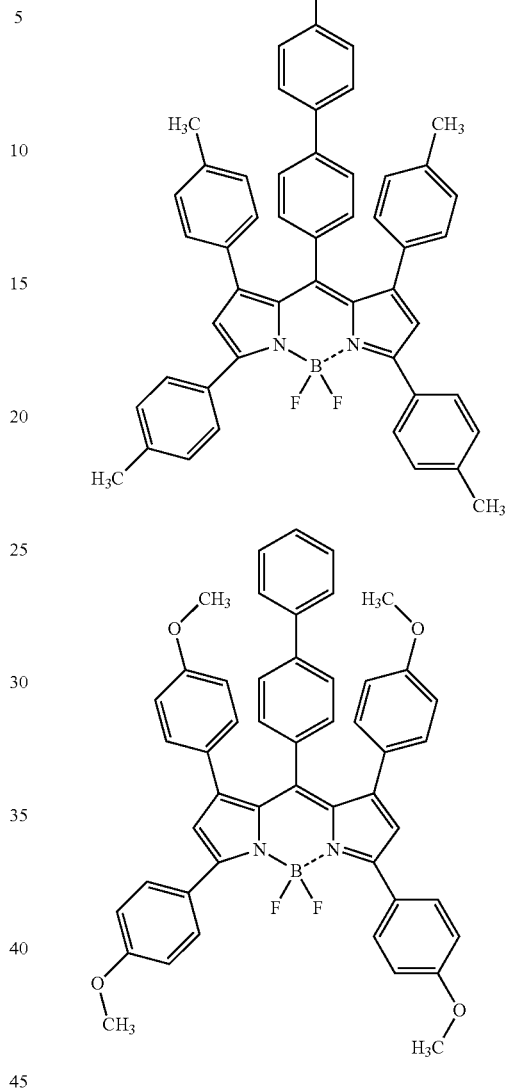
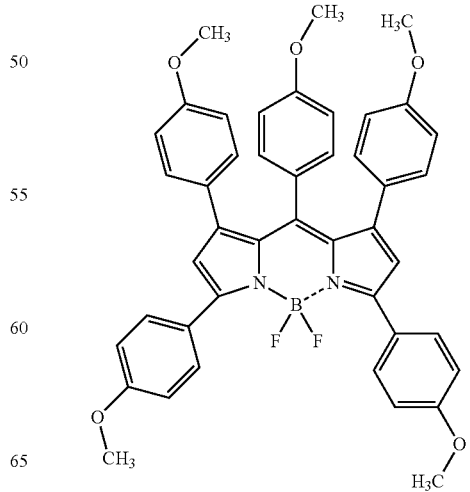

-continued
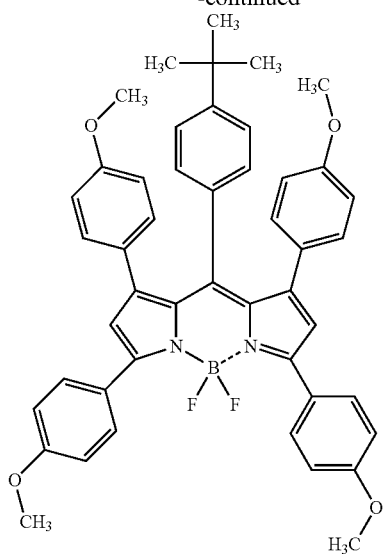
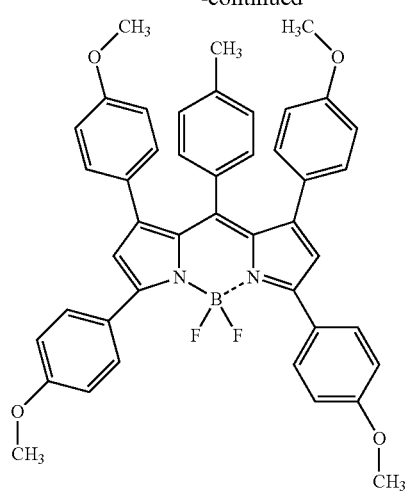
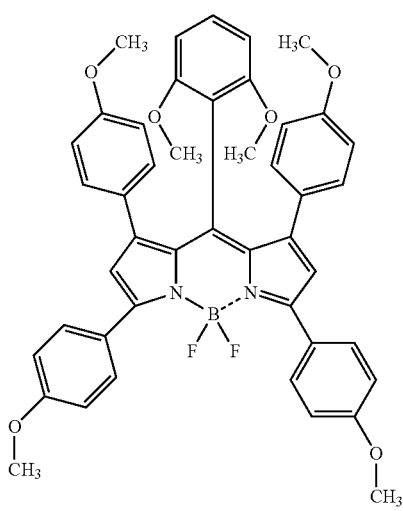
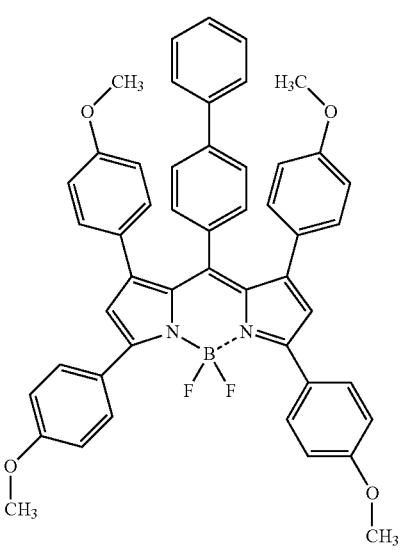
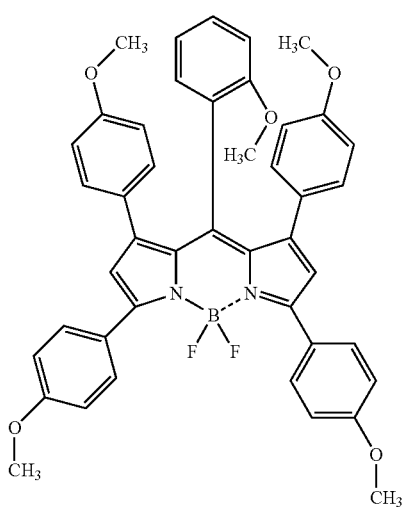
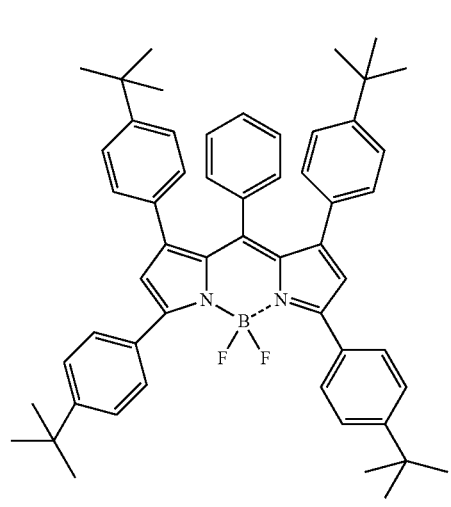

85
-continued
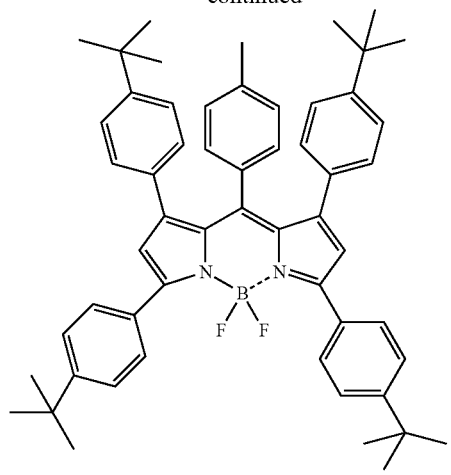
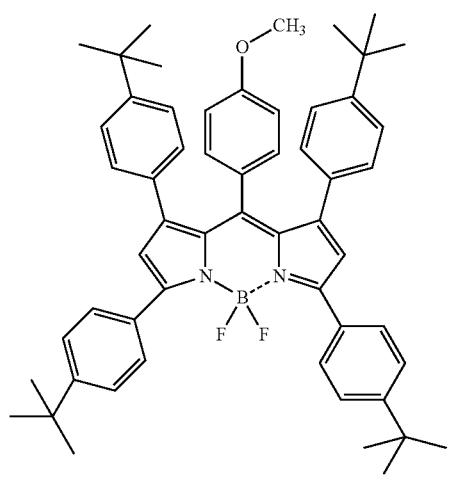
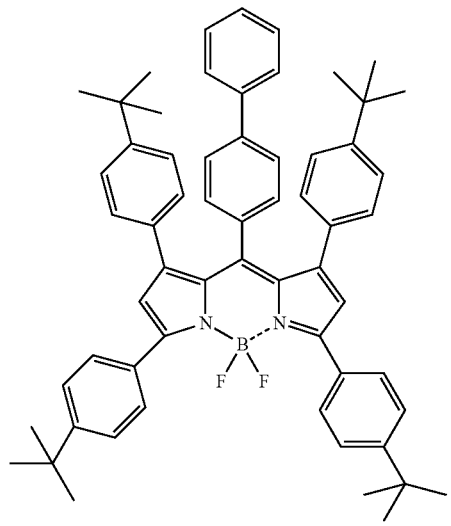
86
-continued
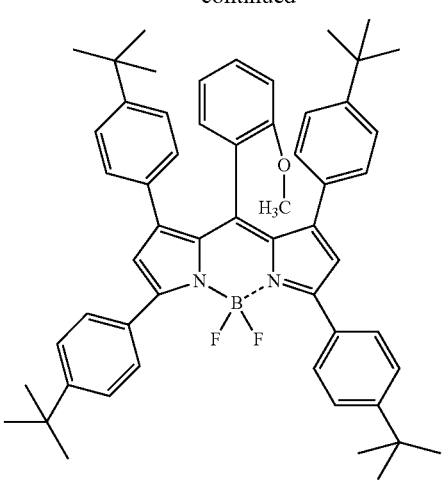
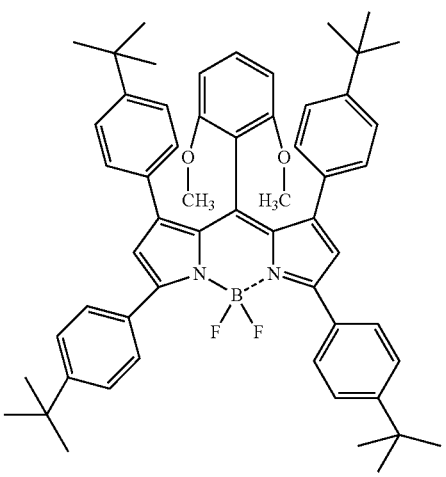
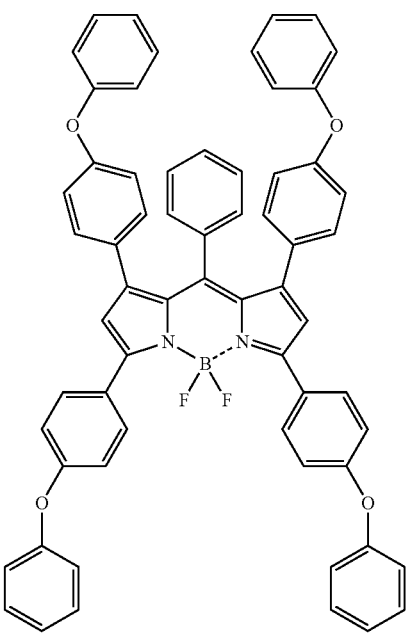

87
-continued
88
-continued
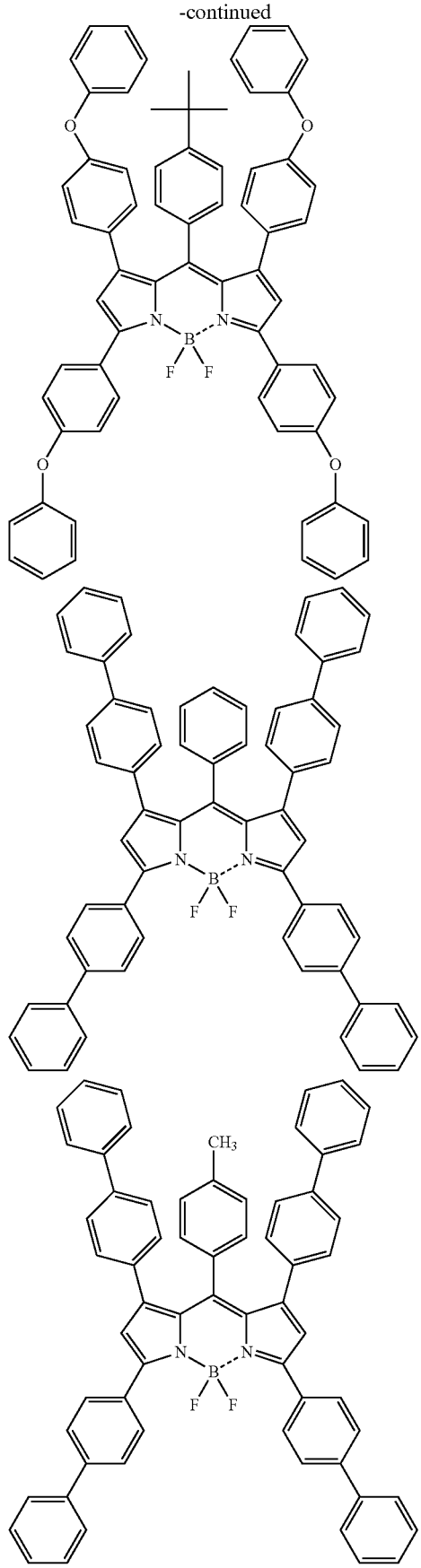
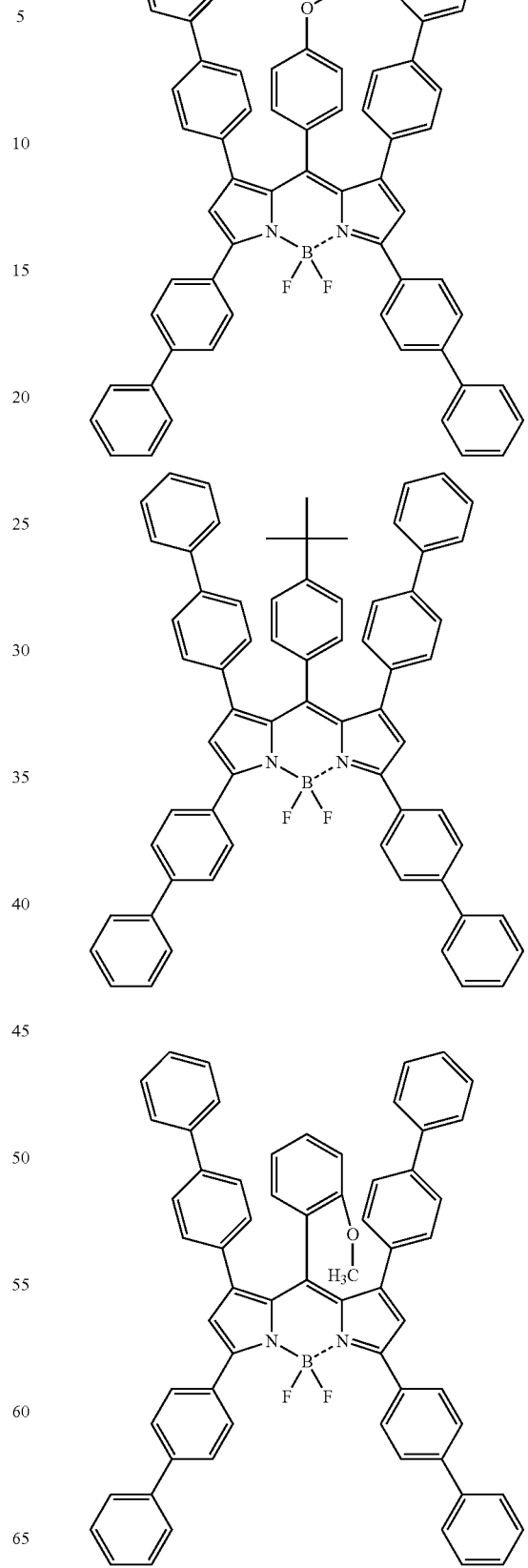

89
-continued
90
-continued
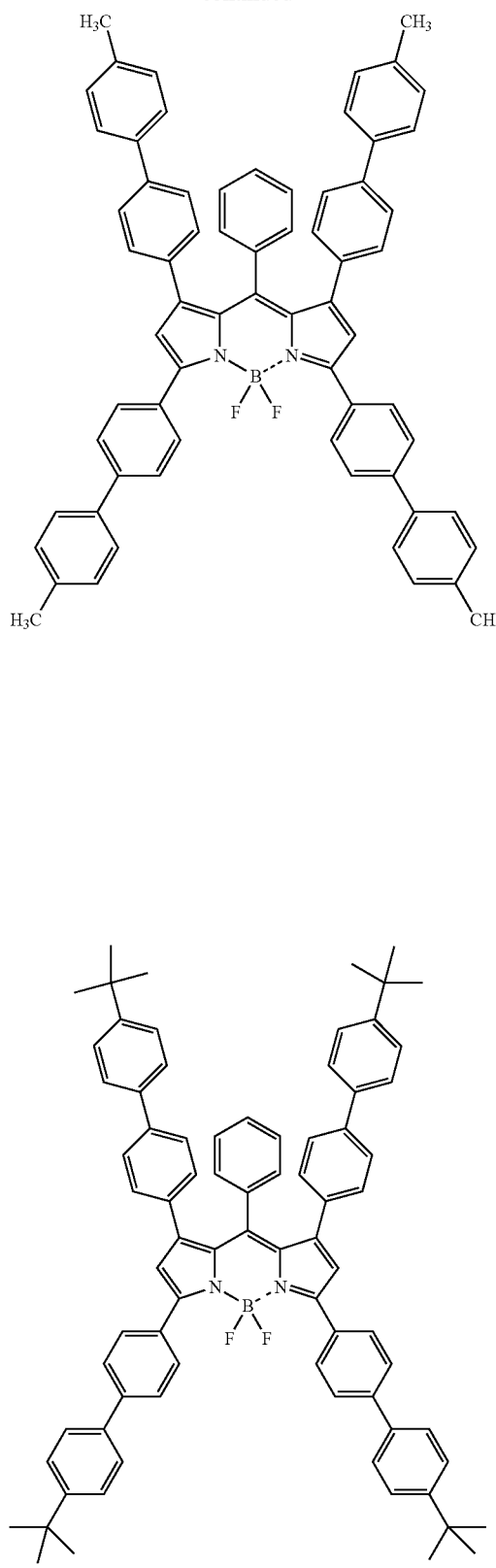
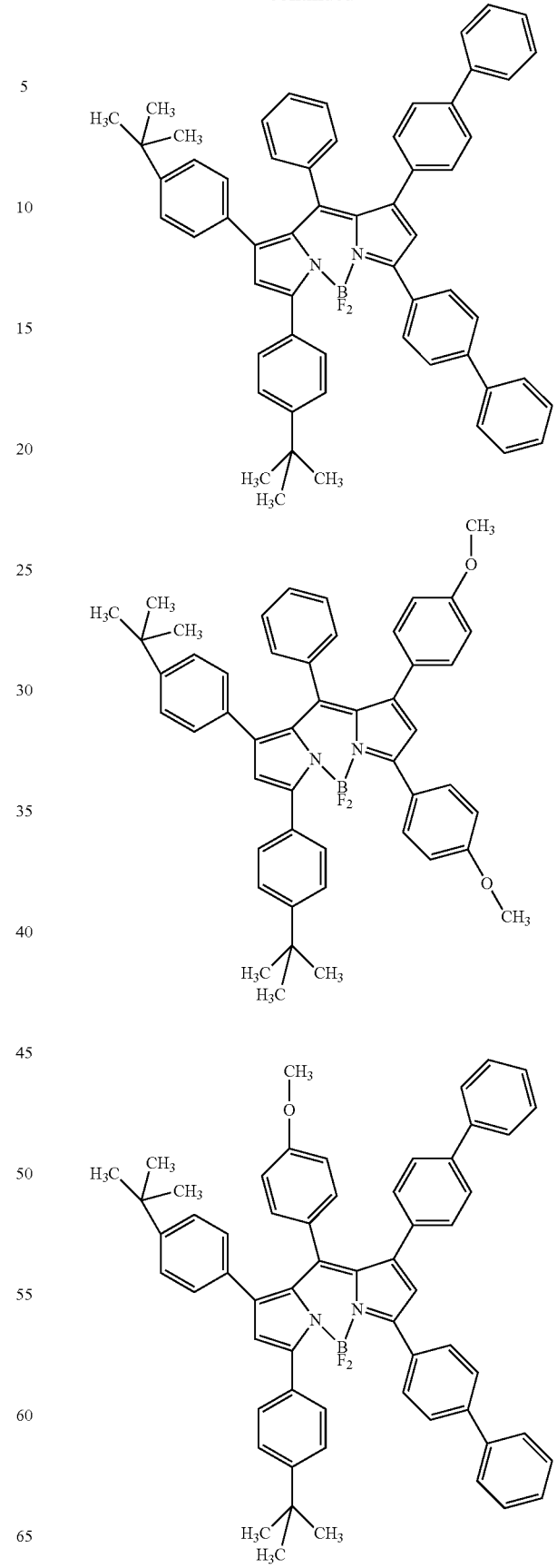

91
-continued
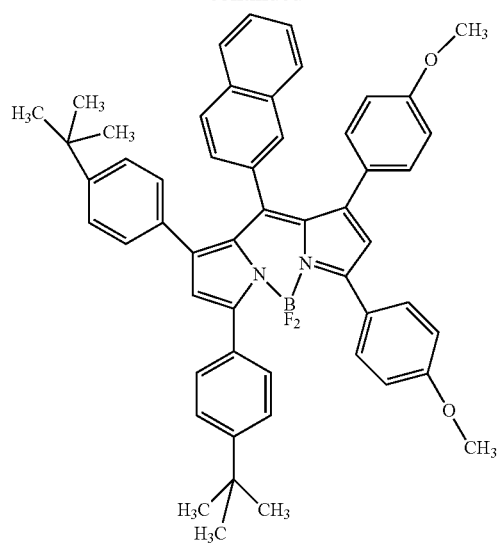
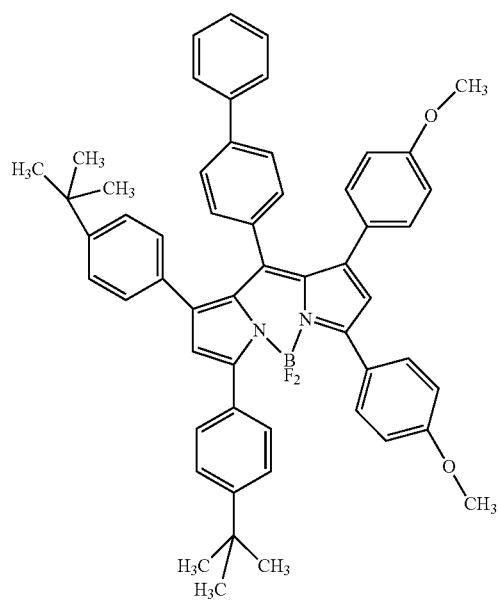
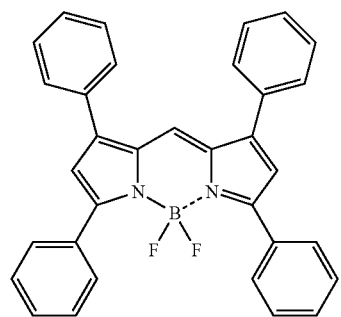
92
-continued
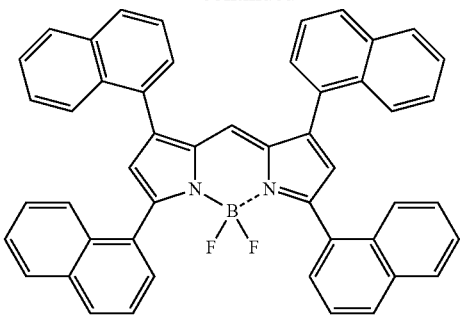
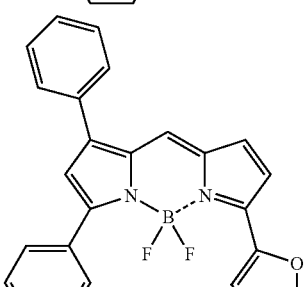
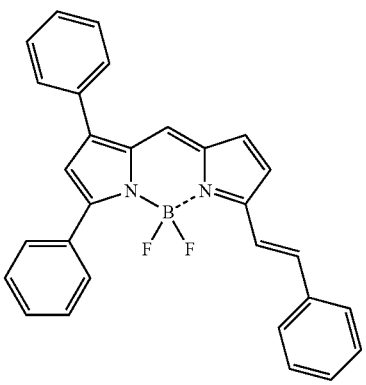
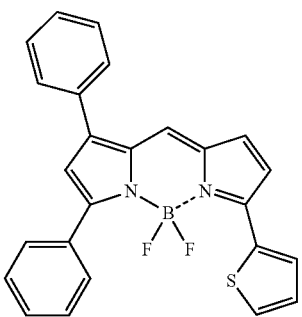
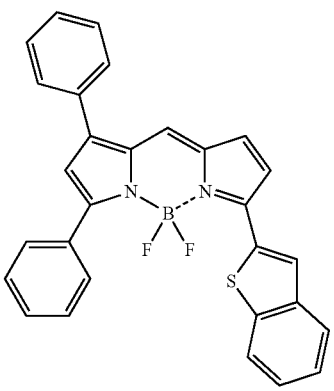

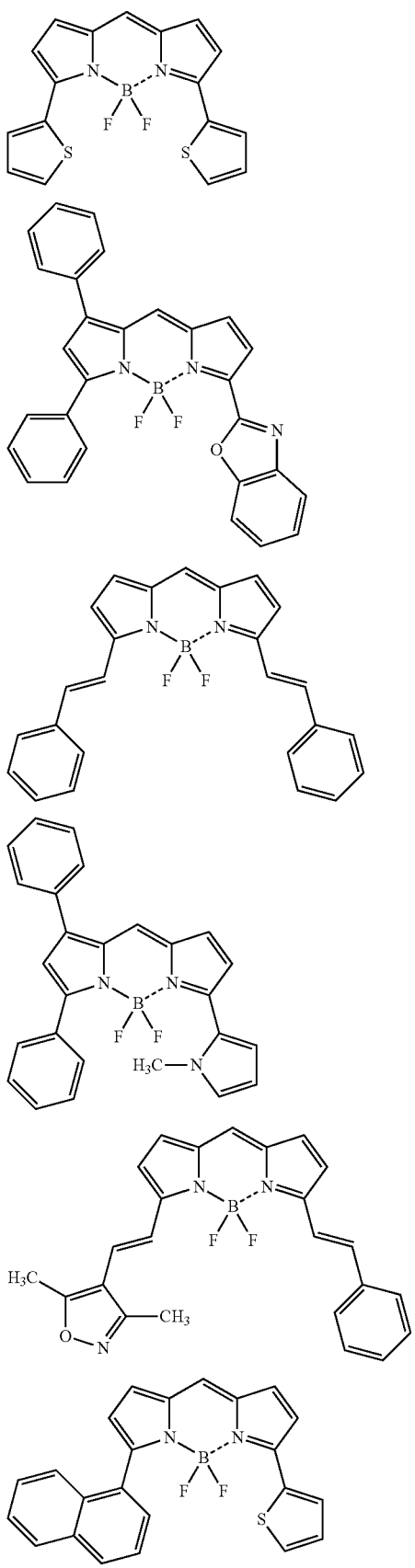
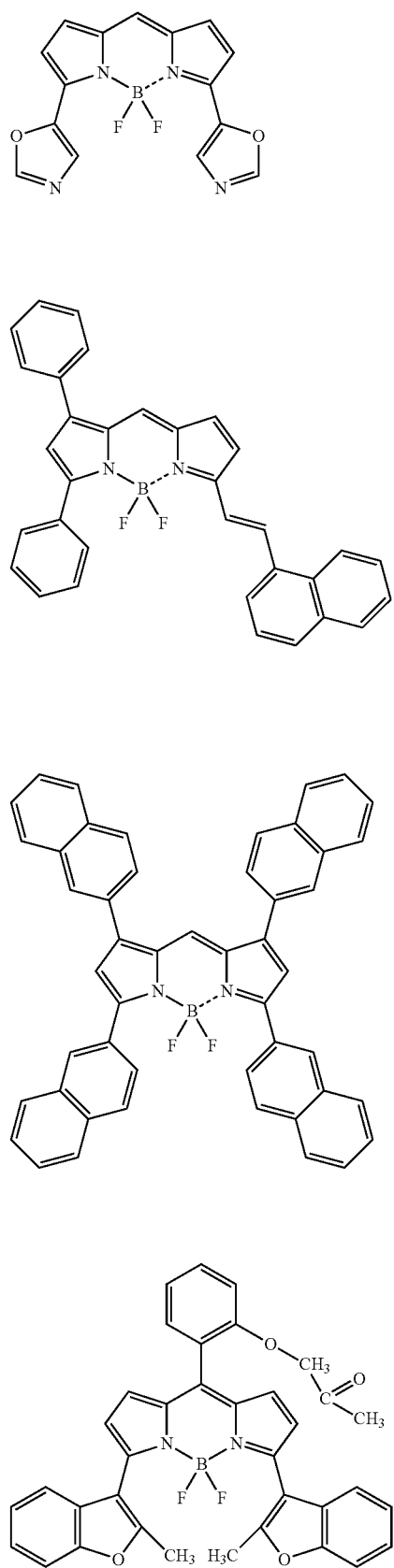

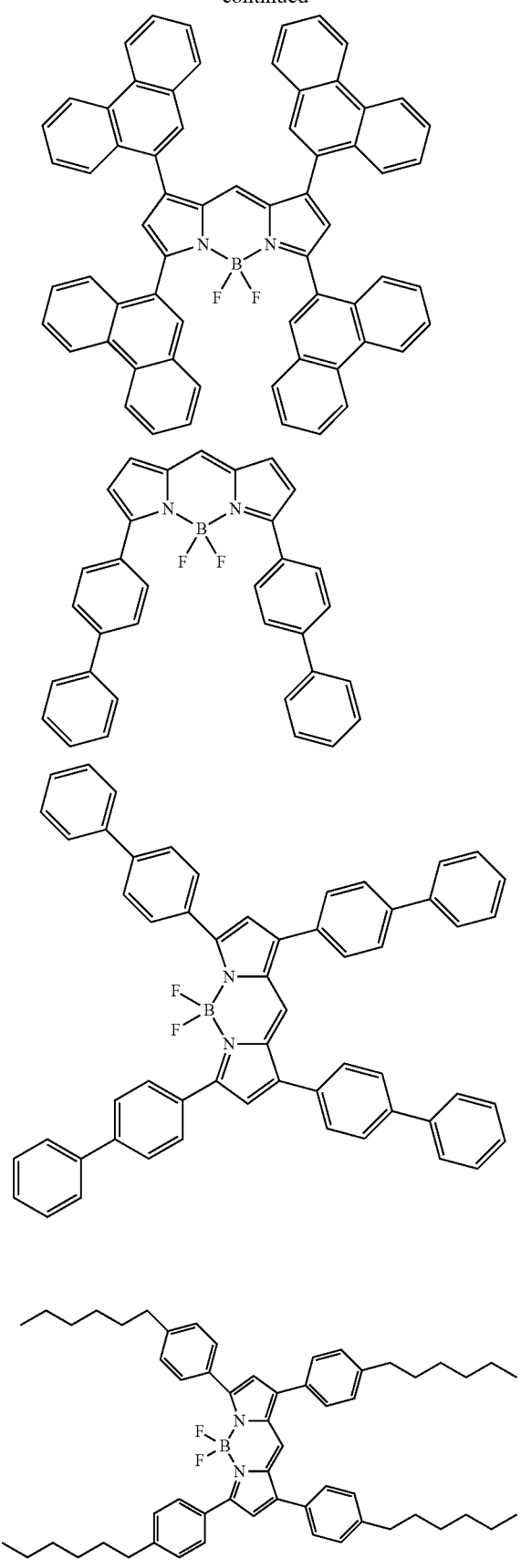
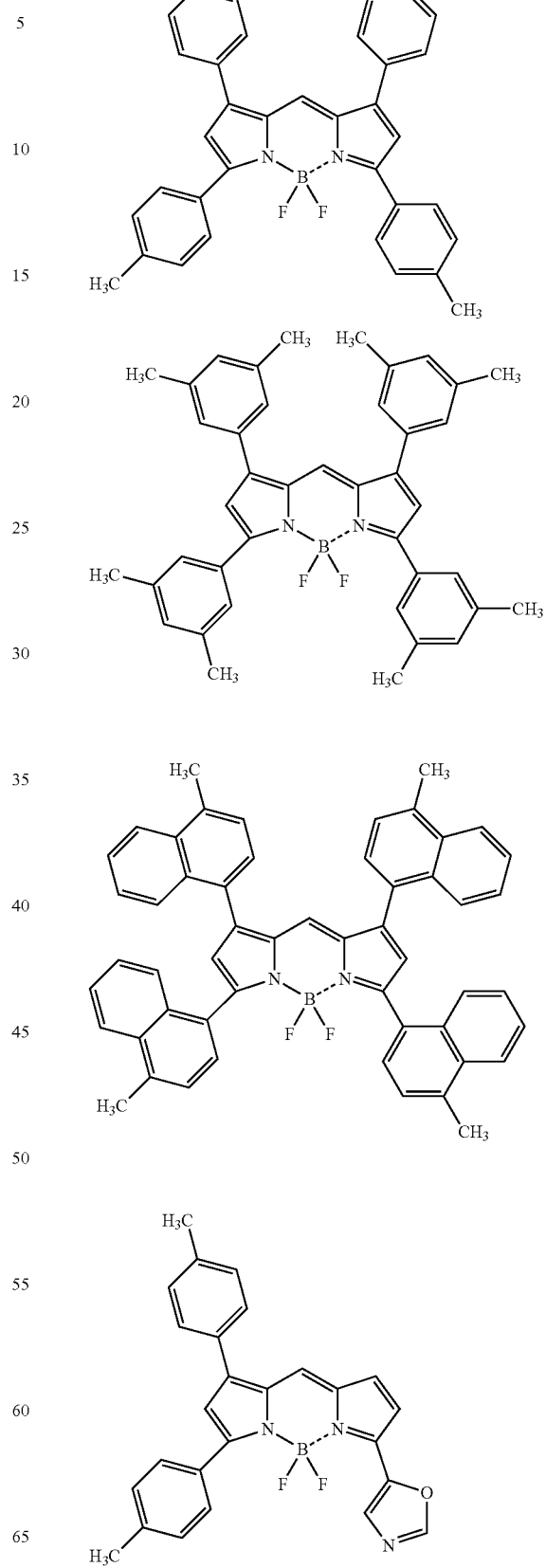

97
-continued
98
-continued
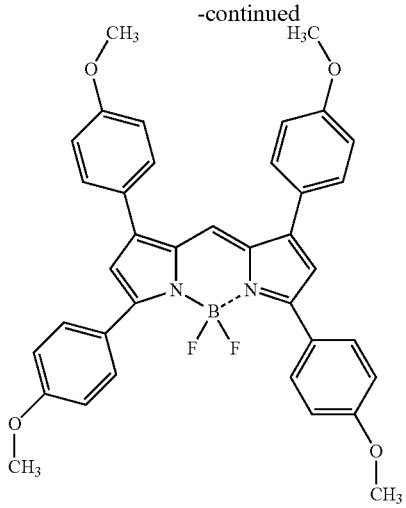
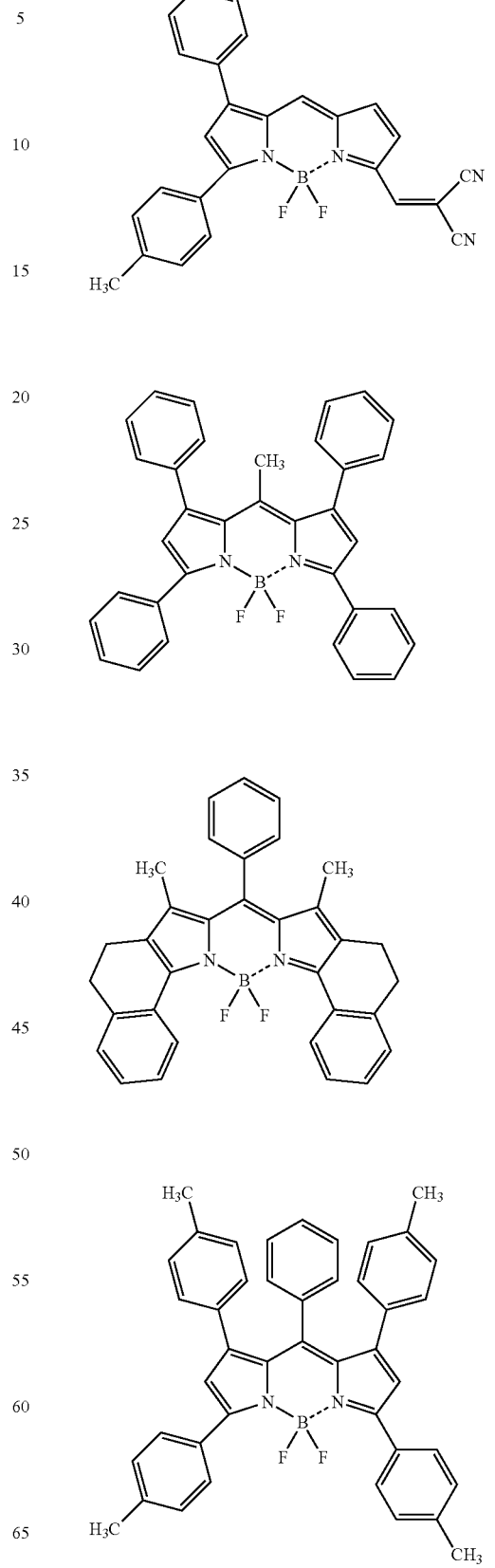

99
-continued
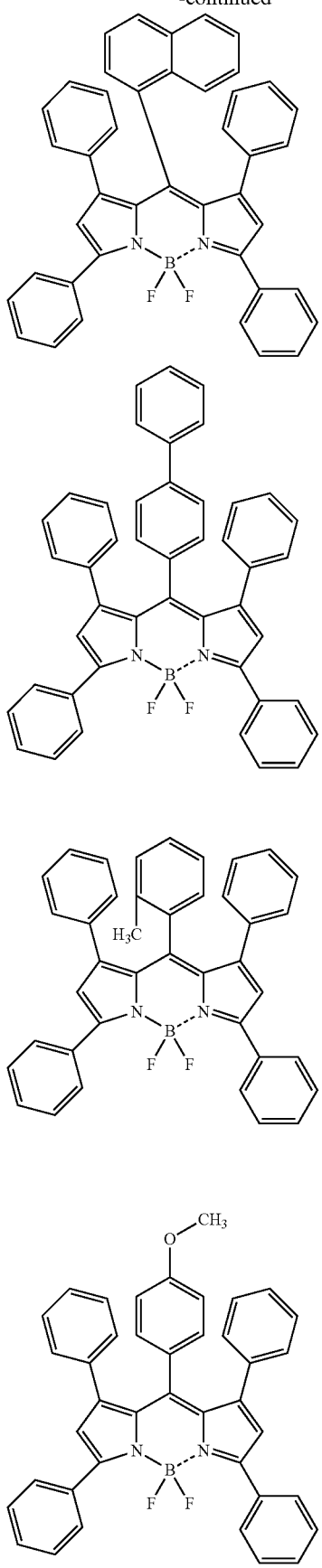
100
-continued
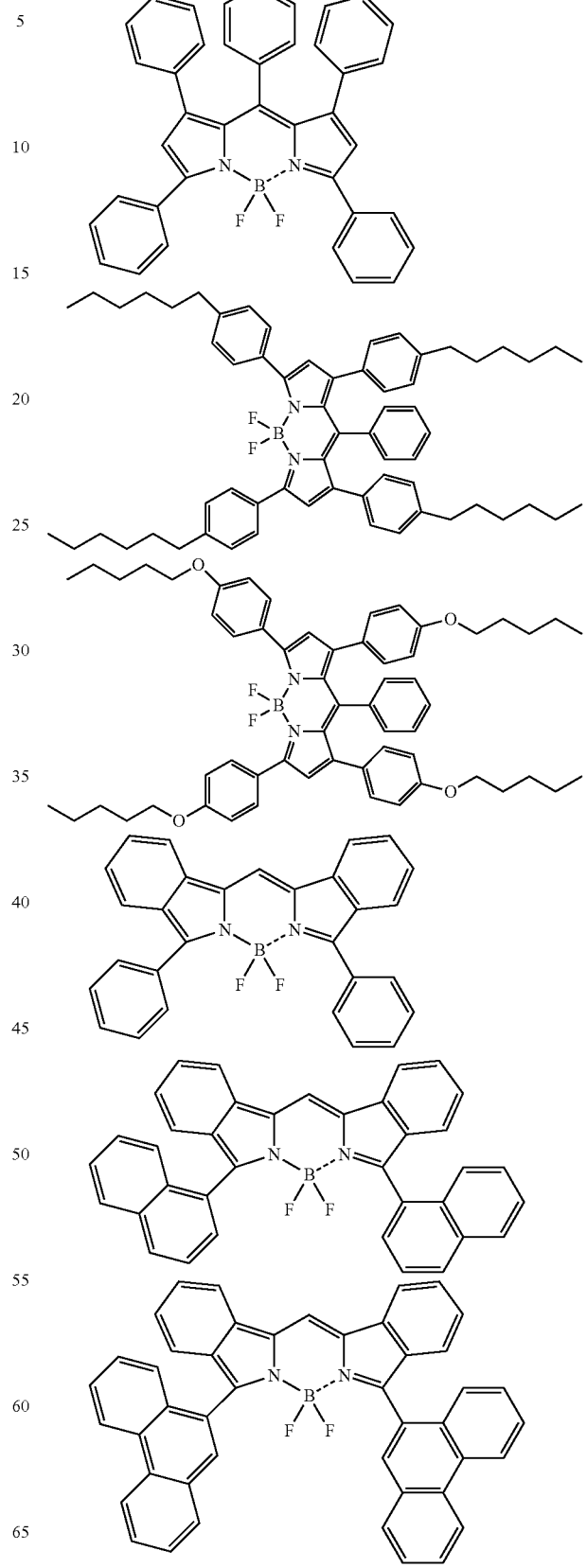

101
-continued
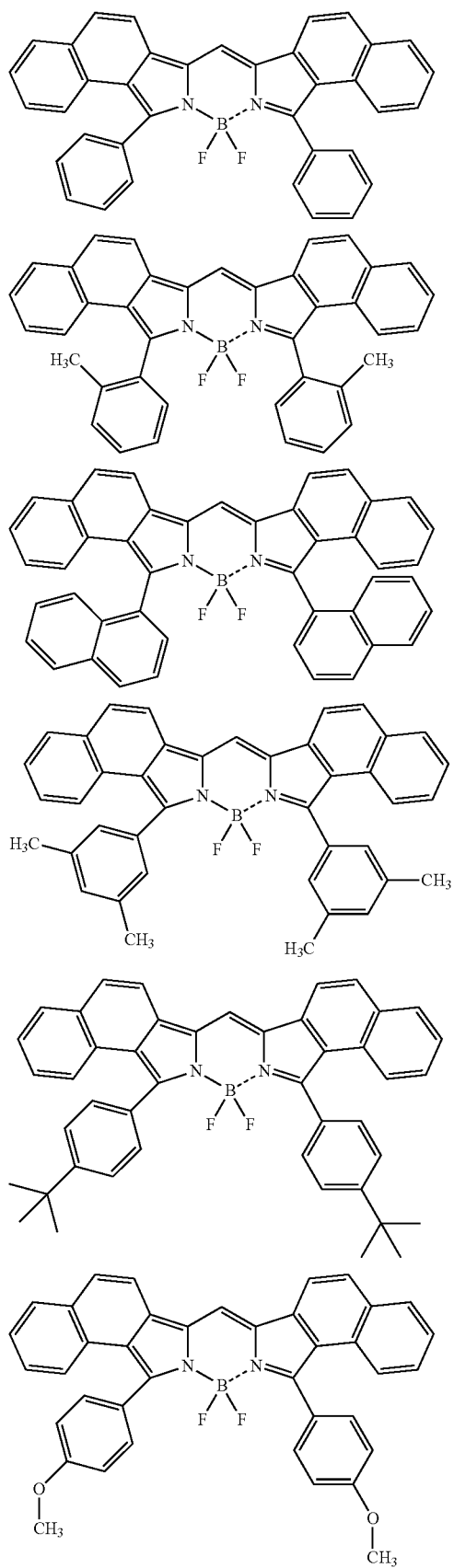
102
-continued
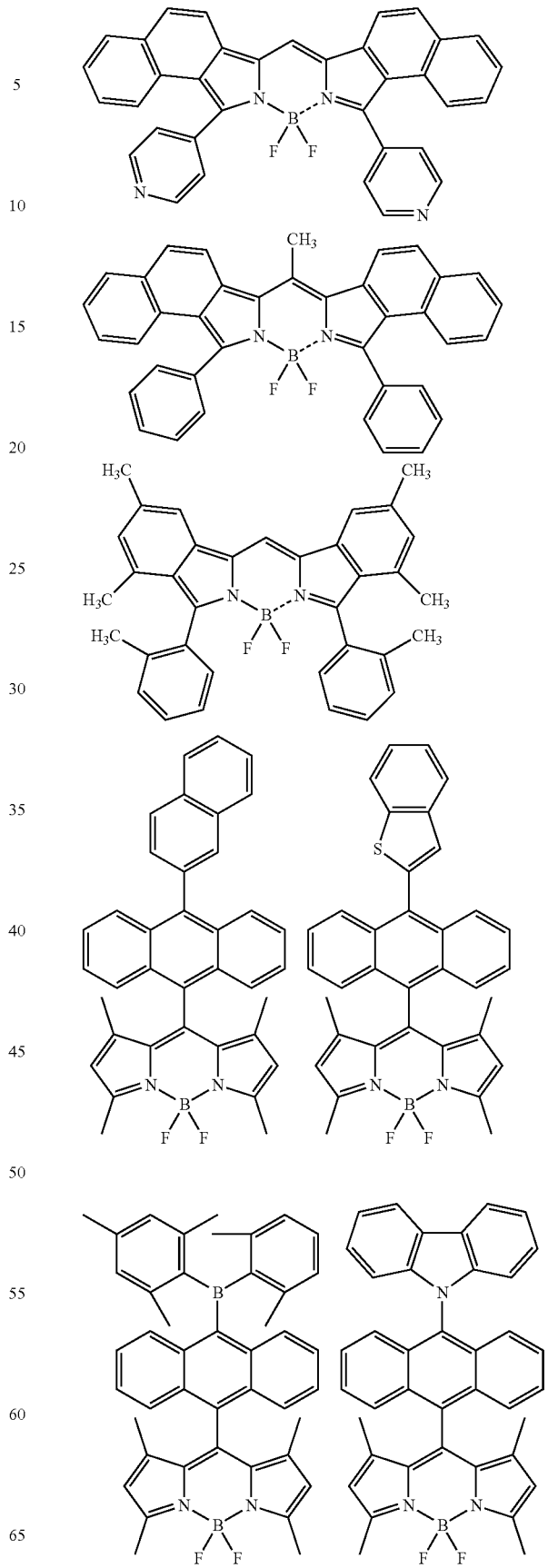

103
-continued
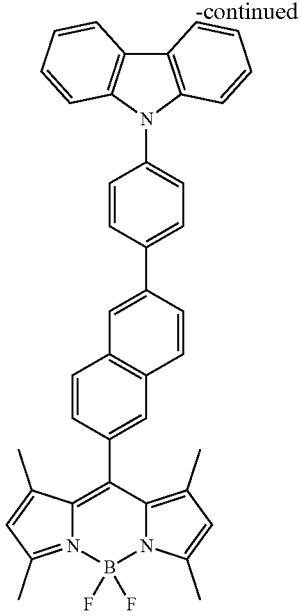
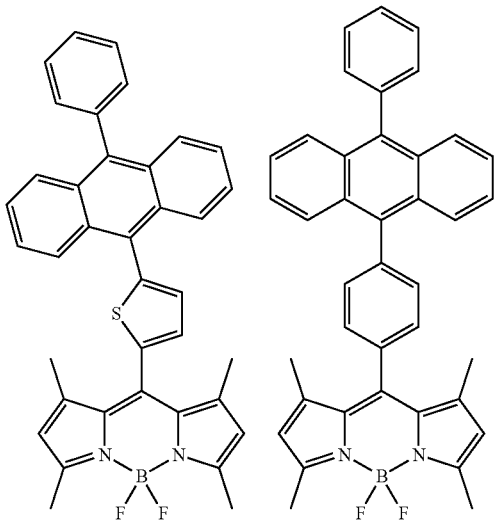
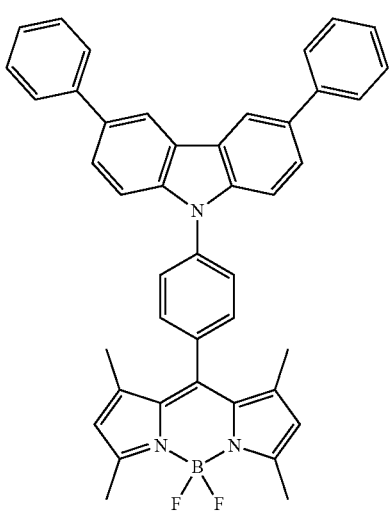
104
-continued
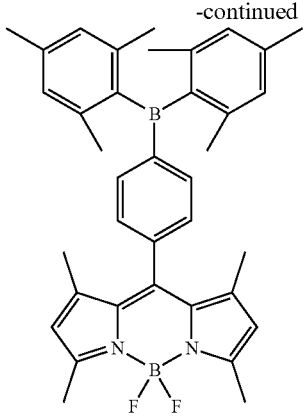
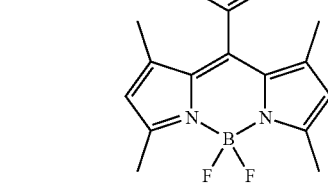
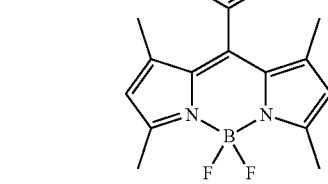
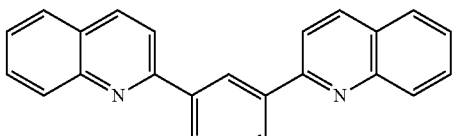
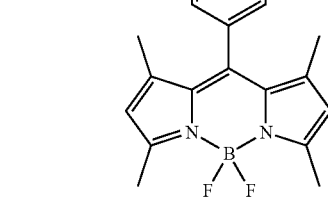

| 105 -continued | 106 -continued |
|---|---|
| 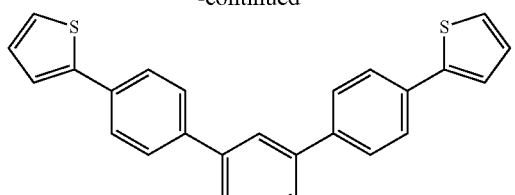 | 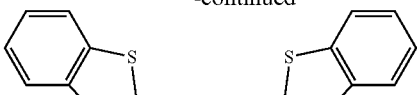 |
| 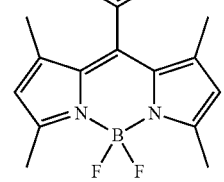 | 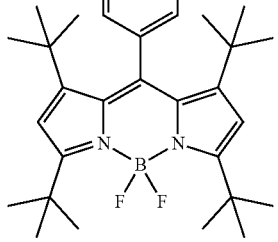 |
| 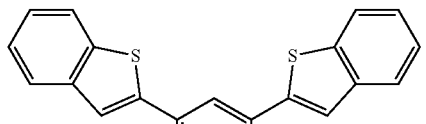 | 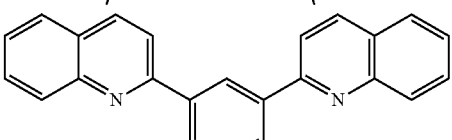 |
| 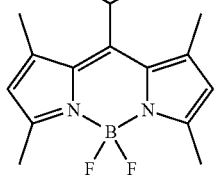 | 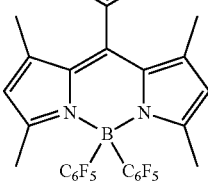 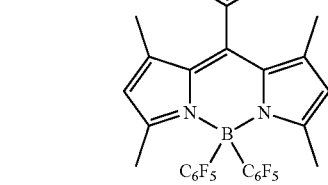 |
| 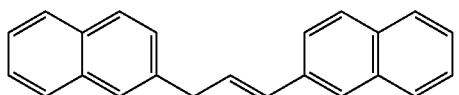 | 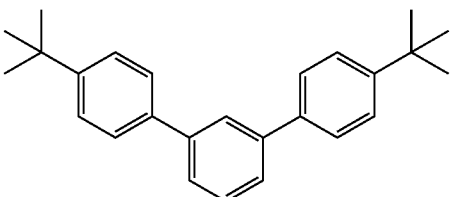 |
| 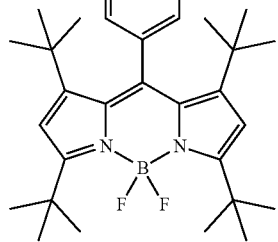 | 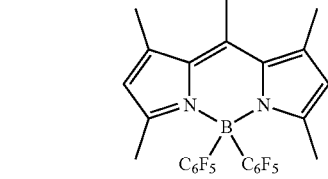 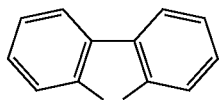 |
| 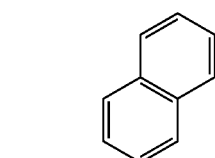 | 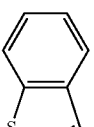  |
| 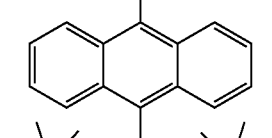 | 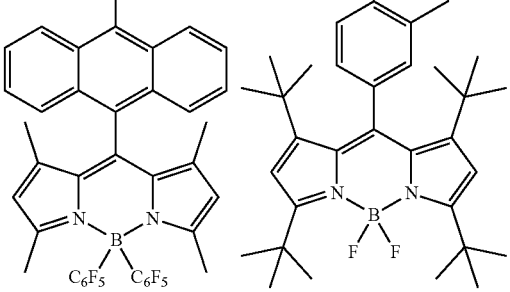 |
| 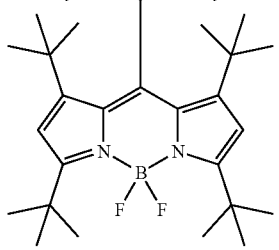 | |

107
-continued
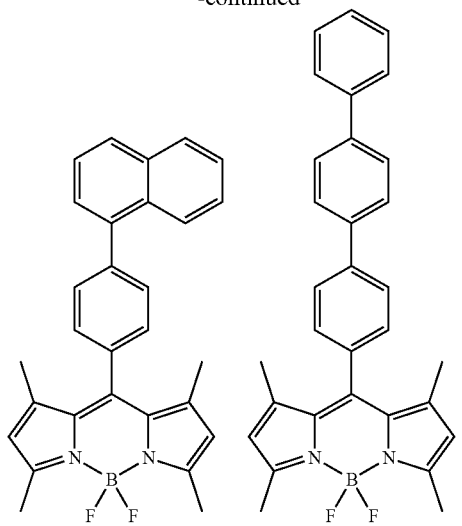
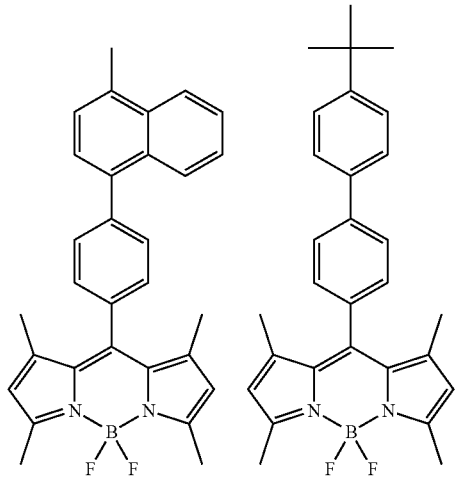
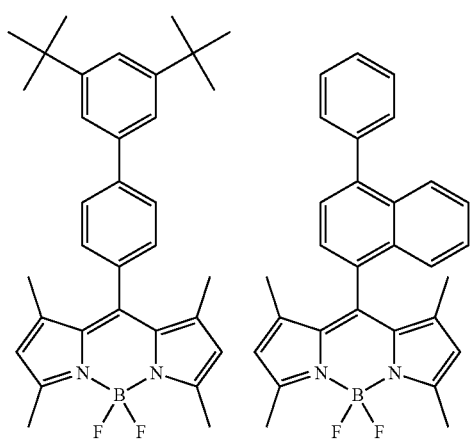
108
-continued
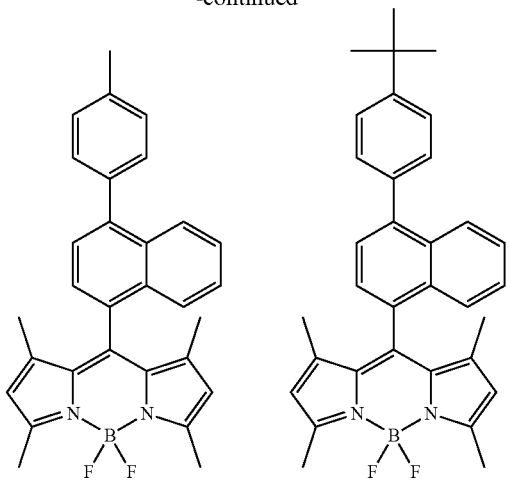
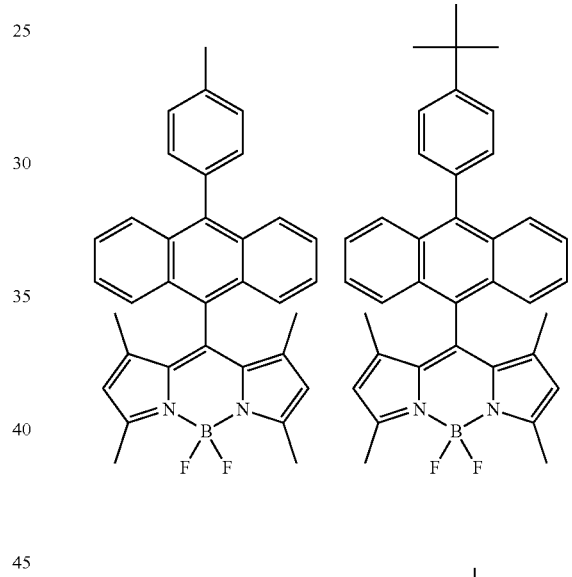
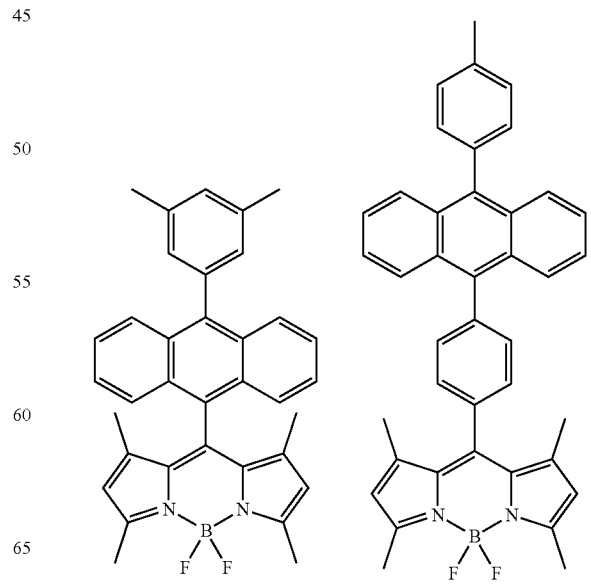

-continued
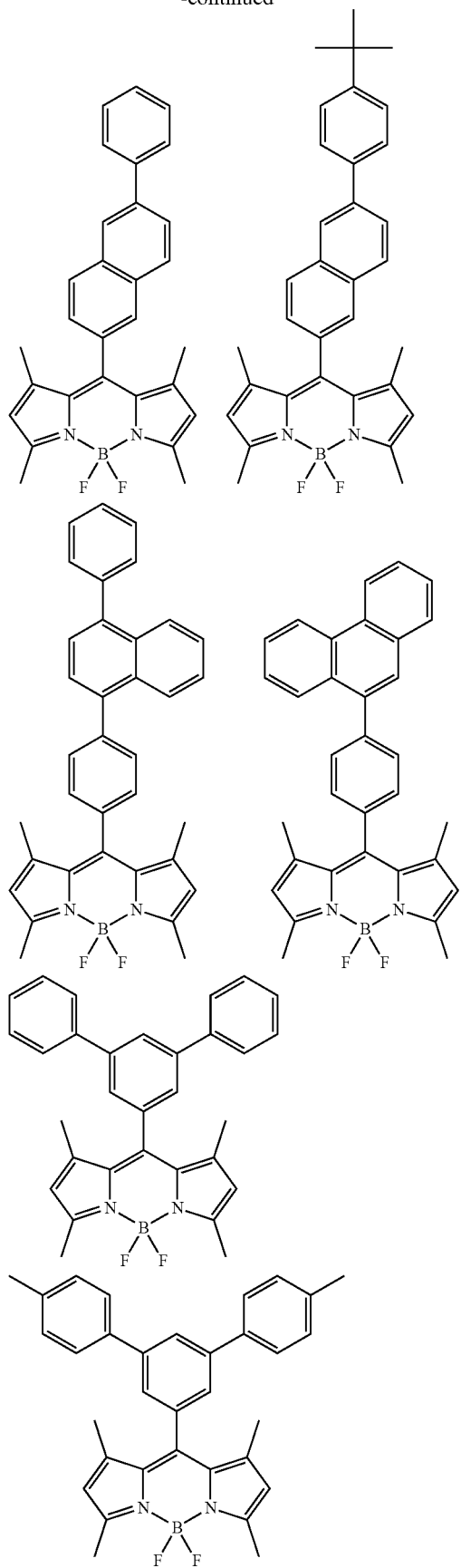
-continued
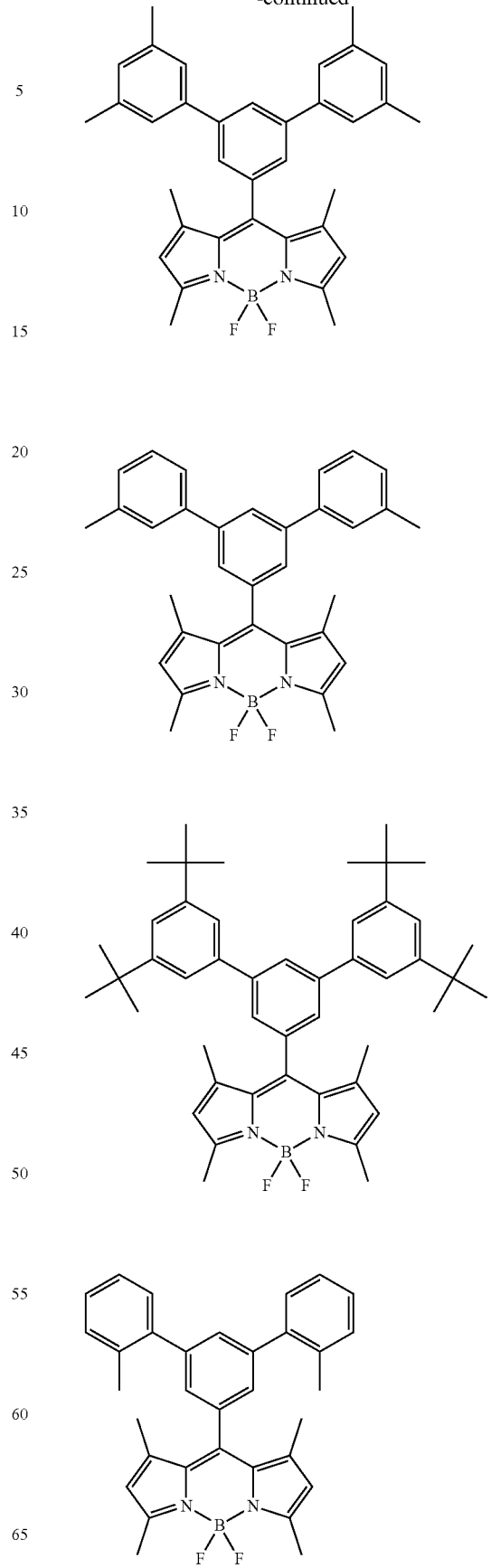

111
-continued
112
-continued
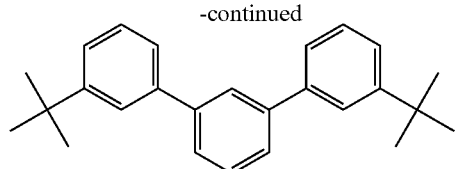
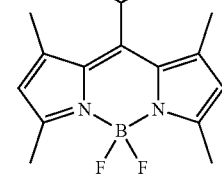
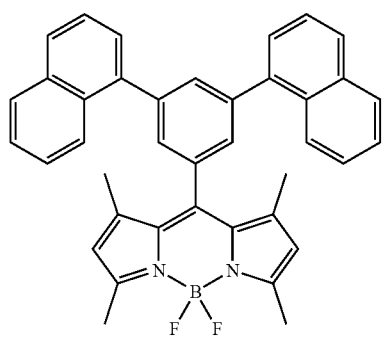
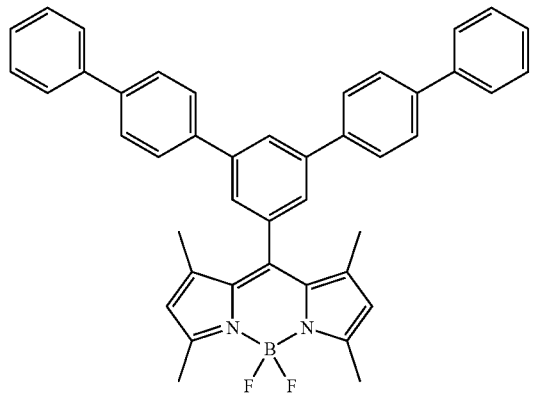
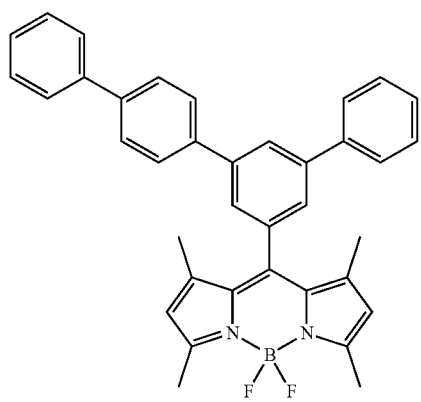
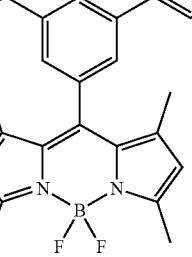
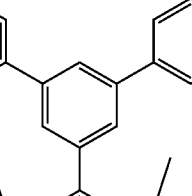
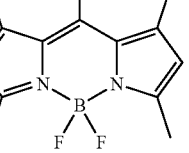

113
-continued
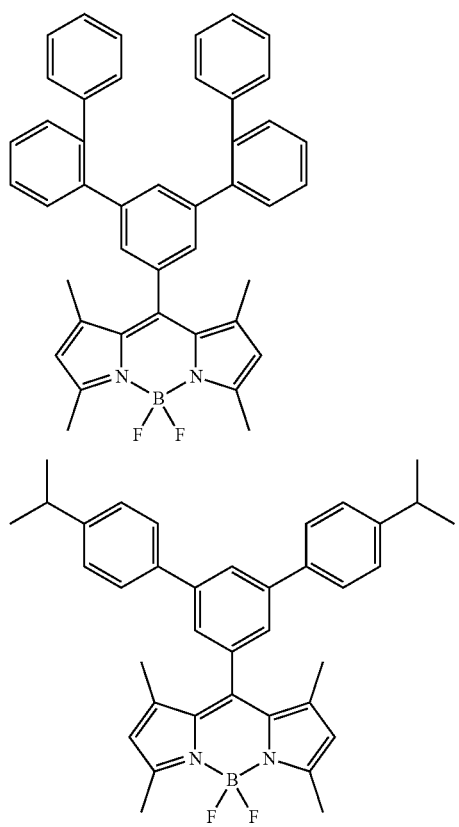
114
-continued
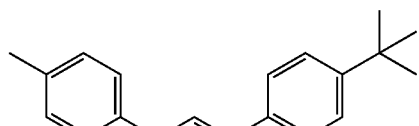
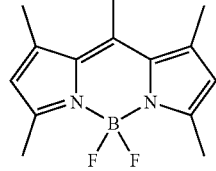
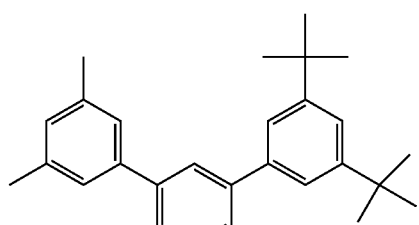
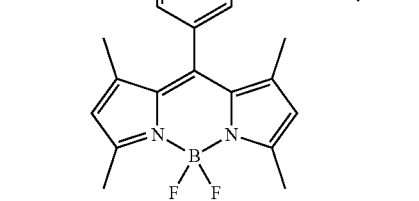
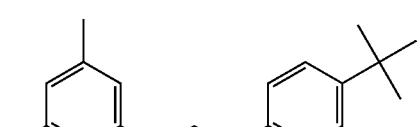
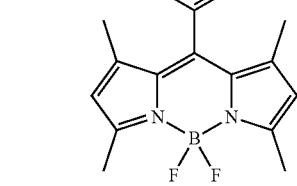
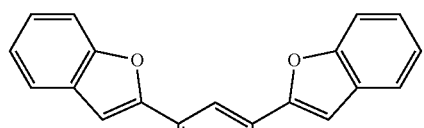
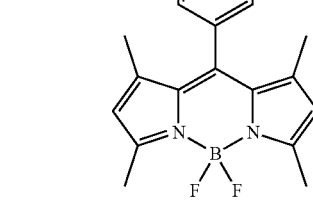

115
-continued
116
-continued
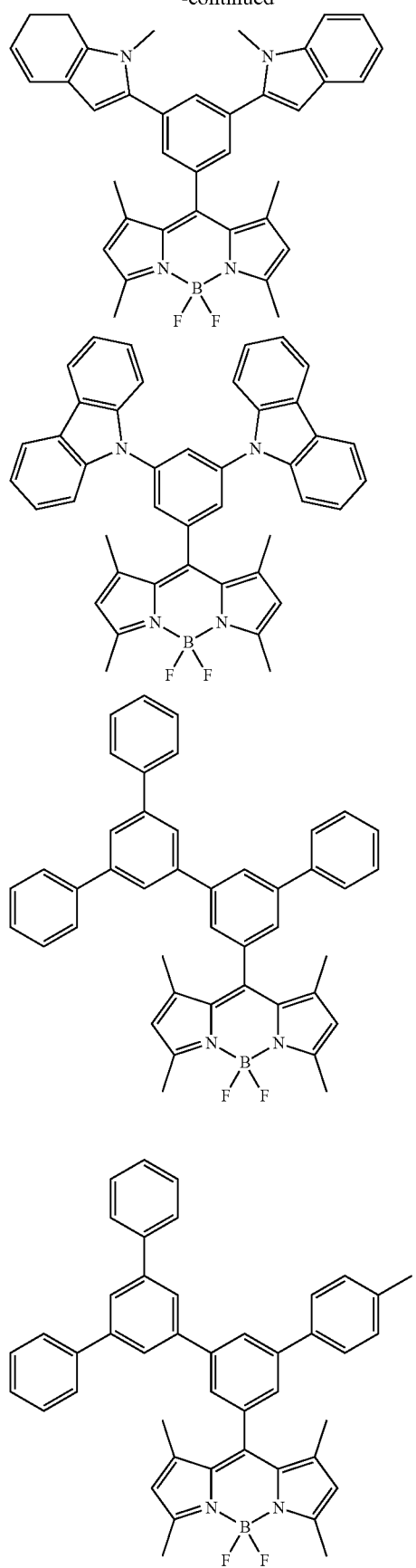
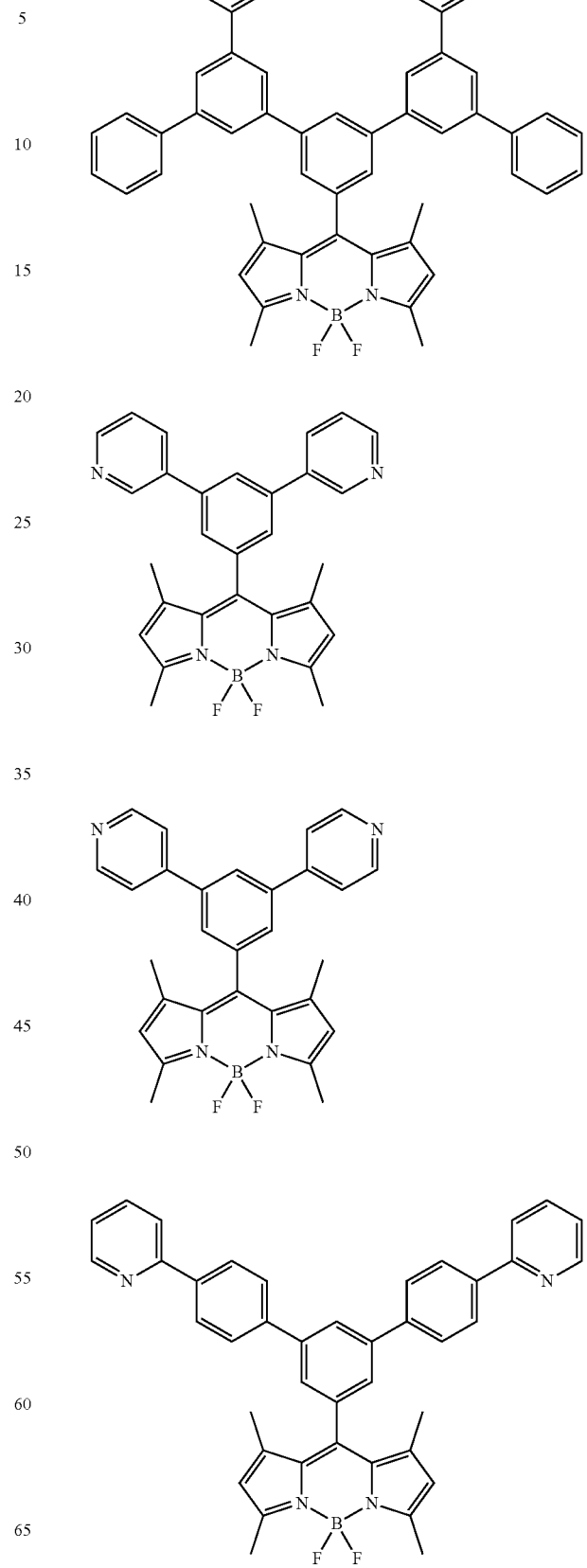

117
-continued
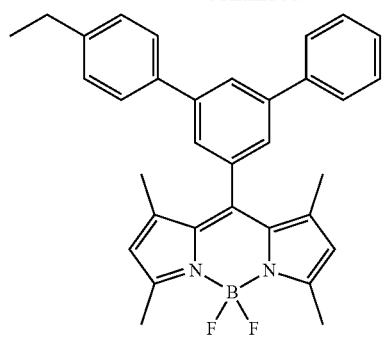
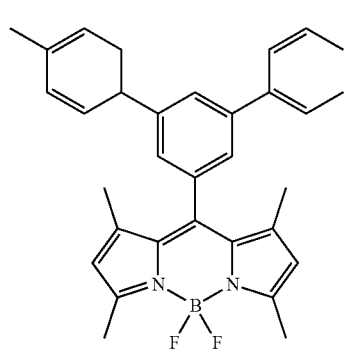
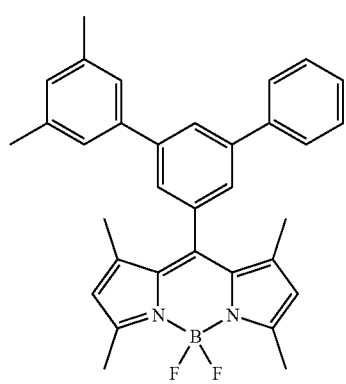
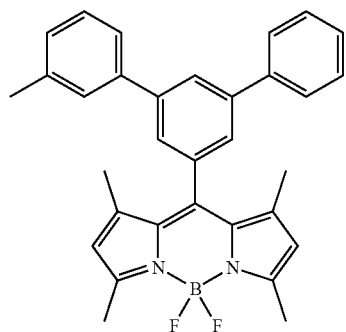
118
-continued
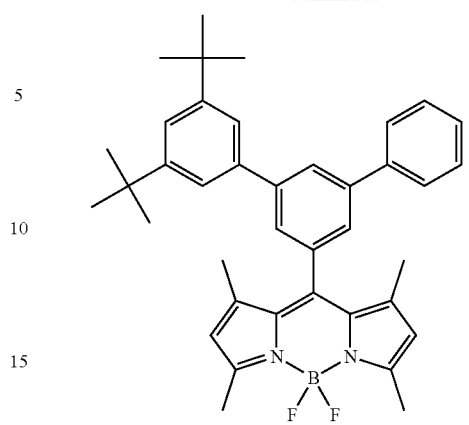
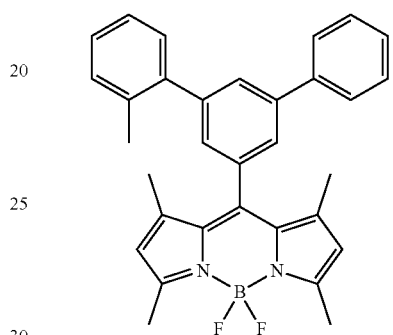
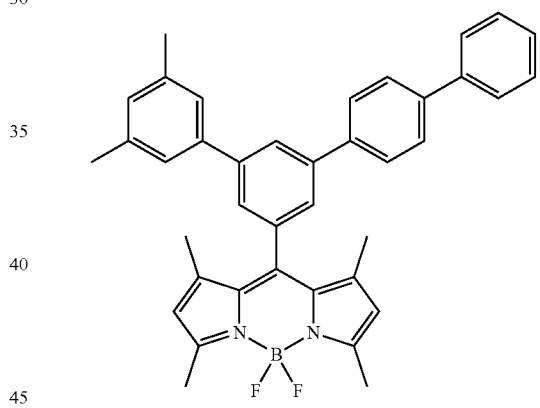
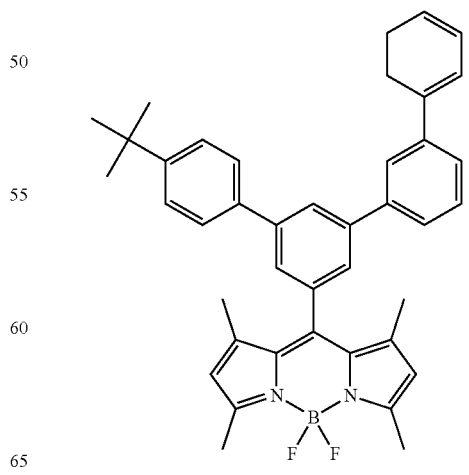

-continued
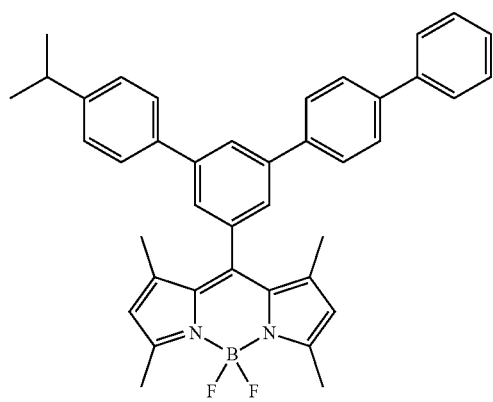
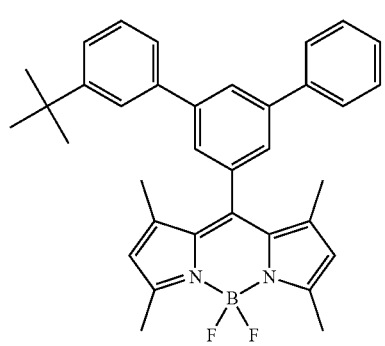
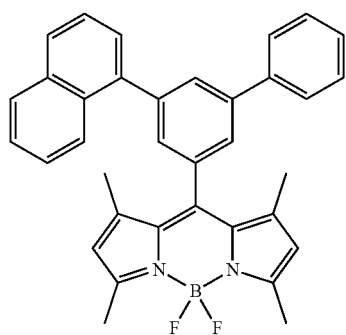
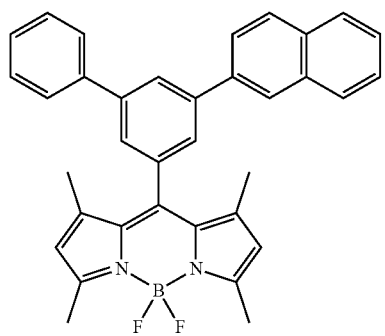
-continued
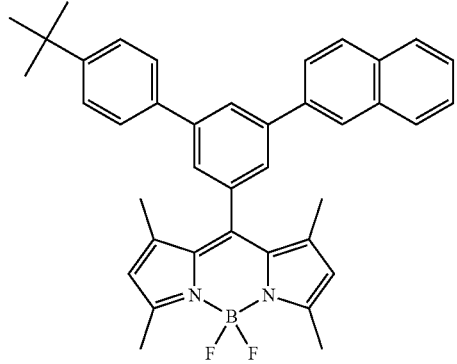
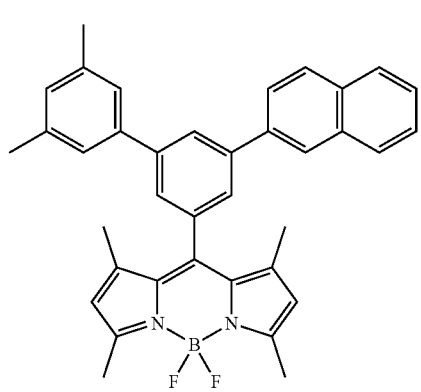
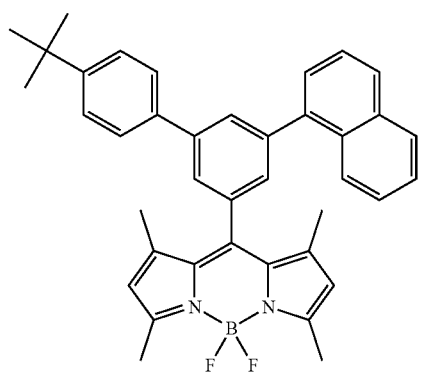
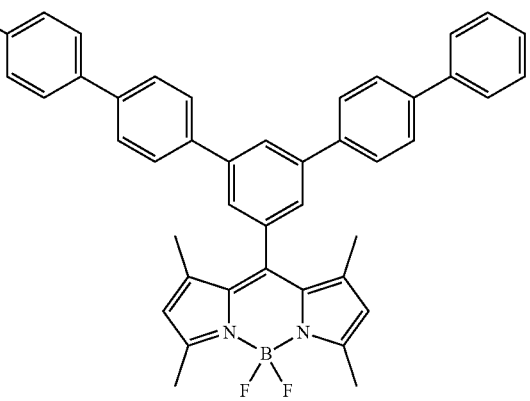

121
-continued
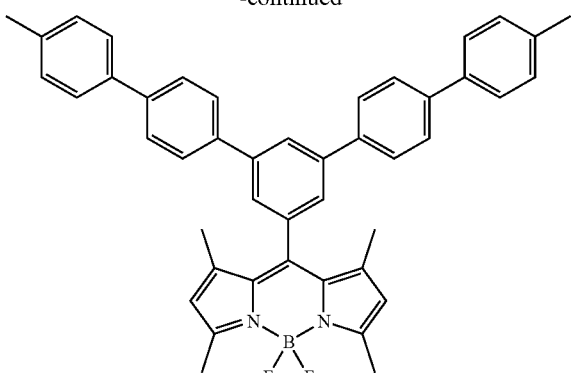
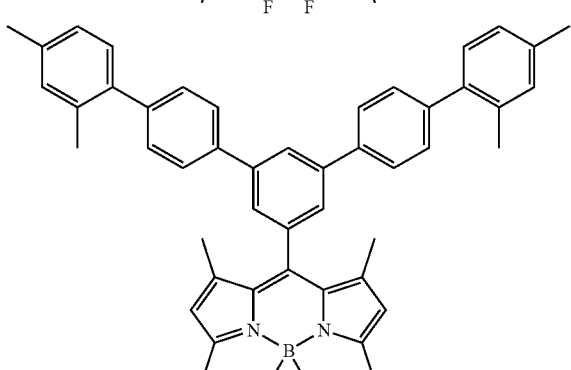
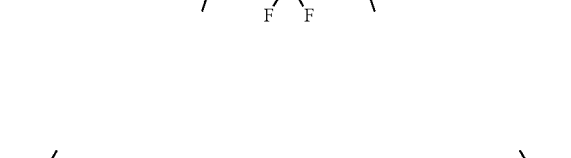
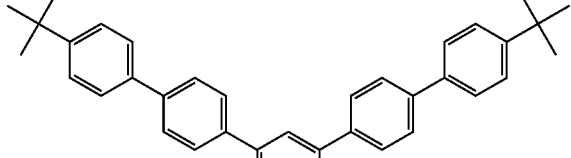
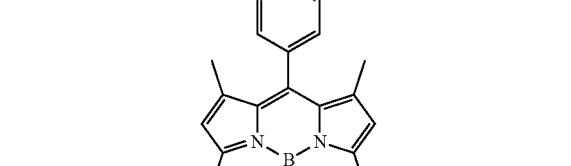
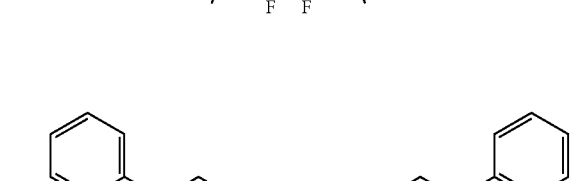
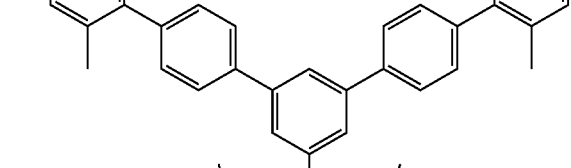
122
-continued
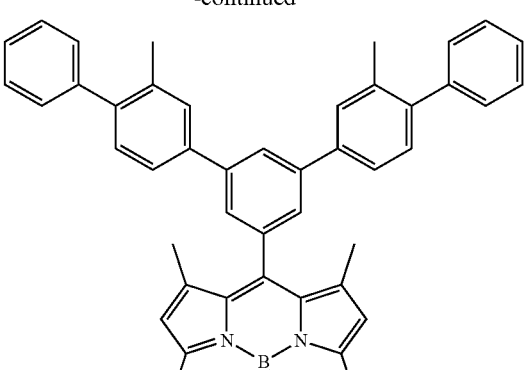
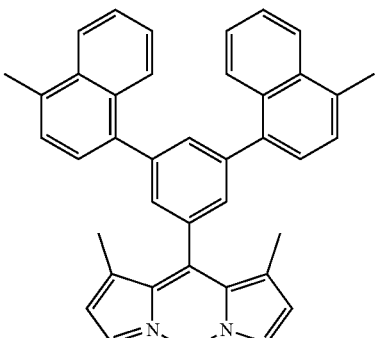
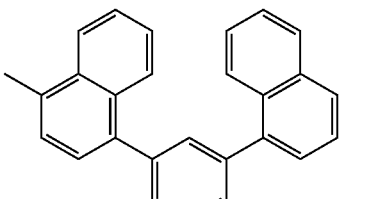
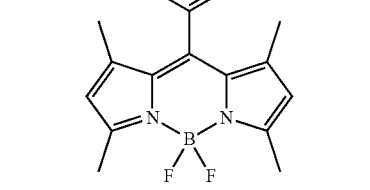
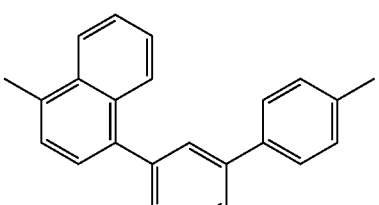
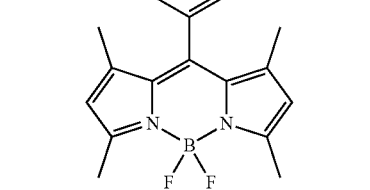

-continued

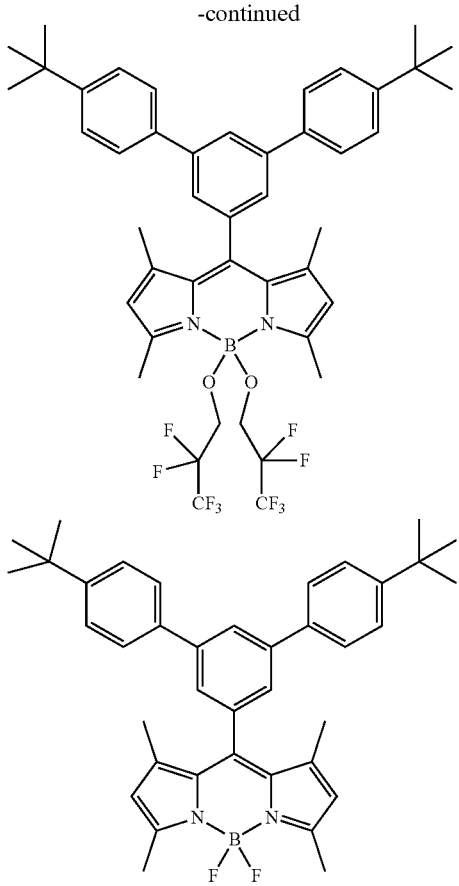

Second Compound

The second compound is a delayed fluorescent compound.

The second compound in the exemplary embodiment is not a phosphorescent metal complex. Preferably, the second compound in the exemplary embodiment is not a metal complex.

In the exemplary embodiment, the second compound is exemplified by a compound represented by a formula (2) below.

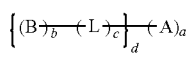
(2)

In the formula (2):

A is an acceptor (electron accepting) moiety having a moiety selected from formulae (a-1) to (a-7) below, a plurality of A being mutually the same or different when a plurality of A are present, the plurality of A being optionally mutually bonded to form a saturated or unsaturated ring;

B is a donor (electron dibatubg) moiety having a moiety selected from formulae (b-1) to (b-6) below, a plurality of B being mutually the same or different when a plurality of B are present, the plurality of B being optionally mutually bonded to form a saturated or unsaturatedring;

a, b, and d are each independently 1, 2, 3, 4, or 5;

c is 0, 1, 2, 3, 4 or 5;

when c is 0, A and B are bonded via a single bond or a spiro bond;

when c is 1, 2, 3, 4 or 5, L is a linking group selected from the group consisting of a substituted or unsubstituted aromatic hydrocarbon group having 6 to 30 ring carbon atoms, and a substituted or unsubstituted heterocyclic group having 5 to 30 ring atoms; and when a plurality of L are present, the plurality of L are mutually the same or different and are optionally mutually bonded to form a saturated or unsaturated ring.

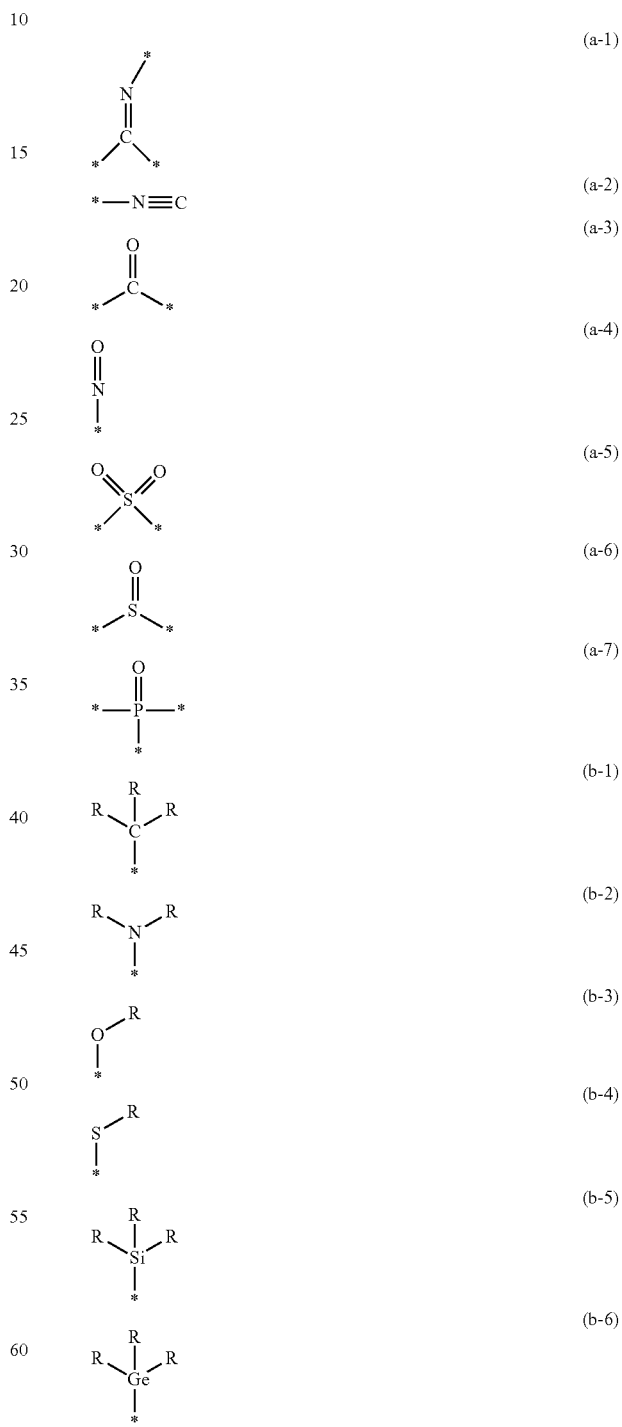

In the formulae (b-1) to (b-6): R each independently represent a hydrogen atom or a substituent, the substituent for R being selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms; and when a plurality of R are present, the plurality of R are mutually the same or different and are optionally mutually bonded to form a saturated or unsaturated ring.

Examples of the bonding form of the compound represented by the formula (2) are shown in Table 1 below.

TABLE 1

| No. | a | b | c | d | Bonding Form |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—B—A, B<A,A |
| (1D) | 1 | 2 | 0 | 1 | B—B—A, B,B>A |
| (1E) | 2 | 1 | 1 | 1 | B—L—A—A, B—L<A,A |
| (1F) | 1 | 2 | 1 | 1 | B—B—L—A, B,B>L—A |
| (1G) | 1 | 1 | 2 | 1 | B—L—L—A |
| (1H) | 1 | 1 | 1 | 2 | B—L>A, B—L>A, B—L—B—L—A |

In the exemplary embodiment, the second compound preferably has a moiety represented by a formula (200) below and a moiety represented by a formula (2Y) below in one molecule.

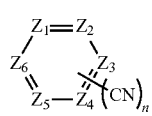
(200)

In the formula (200), CN is a cyano group; and n is an integer of 1 or more, n being preferably an integer in a range from 1 to 5, more preferably 2 or 4.

$Z_1$ to $Z_6$ are each independently a nitrogen atom, a carbon atom bonded to CN, or a carbon atom bonded to another atom in the molecule of the second compound. For instance, when $Z_1$ is a carbon atom bonded to CN, at least one of remaining five atoms (i.e. $Z_2$ to $Z_6$) is a carbon atom bonded to another atom in the molecule of the second compound. The another atom may be an atom of a moiety represented by a formula (2Y) below or an atom of a substituent or a linking group for bonding the moiety.

The second compound of the exemplary embodiment may have a moiety in a form of a six-membered ring formed by $Z_1$ to $Z_6$, or, alternatively, have a moiety in a form of a fused ring formed by fusing a further ring to the six-membered ring.

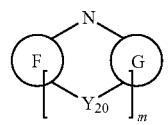
(2Y)

In the formula (2Y): F and G each independently represent a cyclic structure; m is 0 or 1; and when m is 1, $Y_{20}$ represents a single bond, an oxygen atom, a sulfur atom, a selenium atom, a carbon atom, a silicon atom, or a germanium atom.

When m is 0 in the formula (2Y), the formula (2Y) is represented by a formula (20Y) below.

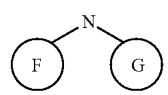
(20Y)

The cyclic structures F and G in the formula (20Y) represent the same as the cyclic structures F and G in the formula (2Y).

When m is 1 in the formula (2Y), the formula (2Y) is represented by any one of formulae (22) to (28) below.

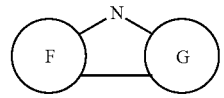
(22)

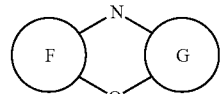
(23)

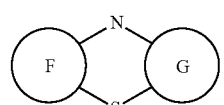
(24)

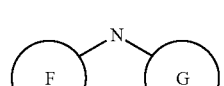
(25)

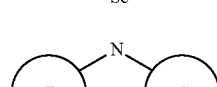
(26)

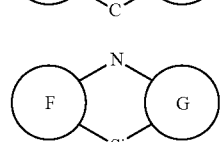
(27)

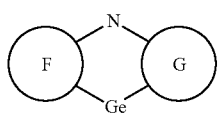
(28)

The cyclic structures F and G in the formulae (22) to (28) represent the same as the cyclic structures F and G in the formula (2Y).

In the first exemplary embodiment, the cyclic structures F and G are each preferably a five-membered ring or a six-membered ring, the five-membered or six-membered ring preferably being an unsaturated ring, more preferably an unsaturated six-membered ring.

In the exemplary embodiment, the second compound is preferably a compound represented by a formula (20) below.

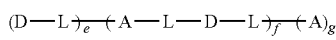
(20)

In the formula (20):

A is represented by the formula (200), where CN represents a cyano group, n is an integer of 1 or more, $Z_1$ to $Z_6$ each independently represent a nitrogen atom, a carbon atom bonded to CN, a carbon atom bonded to R, a carbon atom bonded to L, or a carbon atom bonded to D, at least one of $Z_1$ to $Z_6$ being the carbon atom bonded to CN and at least one of $Z_1$ to $Z_6$ being the carbon atom bonded to L or D; and R is each independently a hydrogen atom or a substituent, the substituent for R being selected from the group consisting of a halogen atom, a substituted or unsubstituted aryl group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms.

In the formula (20), D is represented by the formula (2Y), where the cyclic structures F and G are unsubstituted or substituted, m is 0 or 1, and, when m is 1, $Y_{20}$ represents a single bond, an oxygen atom, a sulfur atom, a selenium atom, a carbonyl group, $CR_{21}R_{22}$, $SiR_{23}R_{24}$ or $GeR_{25}R_{26}$, $R_{21}$ to $R_{26}$ representing the same group for R. When m is 1 in the formula (2Y), the formula (2Y) is represented by any one of the formulae (22) to (25) and formulae (21Y) to (24Y) below.

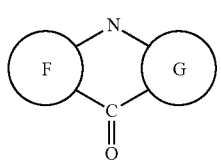
(21Y)

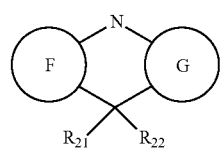
(22Y)

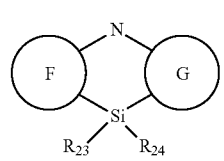
(23Y)

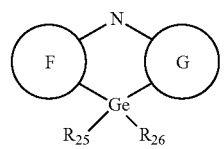
(24Y)

In the formula (20):

(i) when L is present between A and D,

L is a single bond, a substituted or unsubstituted aromatic hydrocarbon group having 6 to 14 ring carbon atoms, a substituted or unsubstituted aromatic heterocyclic group having 5 to 14 ring atoms, $CR_{81}R_{82}$, $NR_{83}$, O, S, $SiR_{84}R_{85}$, $CR_{86}R_{87}$—$CR_{88}R_{89}$, $CR_{90}$=$CR_{91}$, a substituted or unsubstituted alicyclic hydrocarbon group, or a substituted or unsubstituted aliphathic heterocyclic group; and $R_{81}$ to $R_{91}$ each independently represent the same as R.

In the formula (20):

(ii) when L is at a terminal end of a molecule of the second compound, L represents the same as R.

In the formula (20):

f is an integer of 1 or more; e and g are each independently an integer of 0 or more; a plurality of A are optionally mutually the same or different; a plurality of D are optionally mutually the same or different; and a plurality of L are optionally mutually the same or different.

The formula (20) is represented by, for instance, formulae (201) to (220) below.

TABLE 2

| Formula No. | e, f, g in formula (20) | Formula |
|---|---|---|
| (201) | e = 0, f = 1, g = 0 | A-L-D |
| (202) | e = 0, f = 1, g = 0 | A-D |
| (203) | e = 0, f = 1, g = 1 | A-L-D-L-A |
| (204) | e = 0, f = 1, g = 1 | A-D-A |
| (205) | e = 1, f = 1, g = 0 | D-L-A-L-D |
| (206) | e = 1, f = 1, g = 0 | D-A-D |

TABLE 3

| Formula No. | e, f, g in formula (20) | Formula |
|---|---|---|
| (207) | e = 1, f = 1, g = 1 | D-L-A-L-D-L-A |
| (208) | e = 1, f = 1, g = 1 | D-A-D-A |
| (209) | e = 1, f = 2, g = 0 | D-L-A-L-D-L-A-L-D |
| (210) | e = 1, f = 2, g = 0 | D-A-D-A-D |
| (211) | e = 0, f = 2, g = 1 | A-L-D-L-A-L-D-L-A |
| (212) | e = 0, f = 2, g = 1 | A-D-A-D-A |

TABLE 4

| Formula No. | e, f, g in formula (20) | Formula |
|---|---|---|
| (213) | e = 2, f = 1, g = 0 | 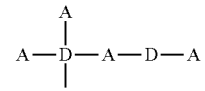 |
| (214) | e = 2, f = 1, g = 0 | 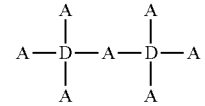 |
| (215) | e = 3, f = 1, g = 0 | 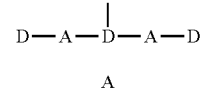 |
| (216) | e = 3, f = 1, g = 0 | 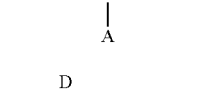 |

TABLE 5

| Formula No. | e, f, g in formula (20) | Formula |
|---|---|---|
| (217) | e = 0, f = 1, g = 2 | |
| (218) | e = 0, f = 1, g = 2 | |
| (219) | e = 0, f = 1, g = 3 | 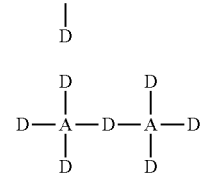 |
| (220) | e = 0, f = 1, g = 3 | |

Further, in the repeating unit in parentheses suffixed by a repeating number f in the formula (20), D may be bonded to A via L, or A may be bonded to D via L. For instance, the repeating unit may be branched as shown in formulae (221) to (228) below.

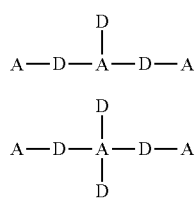

(221)

(222)

(223)

(224)

(225)

(226)

(227)

(228)

The second compound in the first exemplary embodiment is not limited to the compounds represented by the formulae (201) to (228). It should be noted that omission of L in the formulae (201) to (228) means that L is a single bond between A and D or L is a hydrogen atom at a terminal end of the molecule of the second compound.

In order to keep ΔST of the molecule at a small level, it is preferable that L is not a fused aromatic ring in terms of molecule design. However, a fused aromatic ring may be used as long as thermally activated delayed fluorescence can be obtained. Further, since the molecule has to be designed so that A and D are accurately disposed in a single molecule, the second compound of the first exemplary embodiment is preferably a low molecular material. Accordingly, it is preferable that the molecular weight of the second compound of the first exemplary embodiment is 5000 or less, more preferably 3000 or less. The second compound in the first exemplary embodiment preferably includes the moiety represented by the formula (200) and the moiety represented by the formula (2Y).

The organic EL device containing the second compound emits light through a thermally activated delayed fluorescence mechanism.

In the first exemplary embodiment, the formula (2Y) is preferably represented by at least one of a formula (2a) and a formula (2x) below.

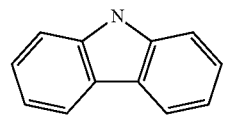

(2a)

-continued

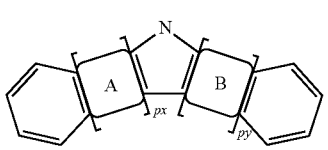

(2x)

In the formula (2x), A and B each independently represent a cyclic structure represented by a formula (2c) below or a cyclic structure represented by a formula (2d) below, the cyclic structures A and B being fused to adjacent cyclic structure(s) at any position(s). px and py are each independently an integer ranging from 0 to 4, px and py representing the number of the cyclic structure A and the number of the cyclic structure B, respectively. When px is an integer ranging from 2 to 4, a plurality of the cyclic structures A may be mutually the same or different. When py is an integer ranging from 2 to 4, a plurality of the cyclic structures B may be mutually the same or different. Accordingly, when, for instance, px is 2, the cyclic structures A may be two cyclic structures each represented by a formula (2c), two cyclic structures each represented by a formula (2d), or a combination of one cyclic structure represented by the formula (2c) and one cyclic structure represented by the formula (2d).

(2c)

(2d)

In the formula (2d), $Z_7$ represents a carbon atom, a nitrogen atom, a sulfur atom, or an oxygen atom.

When px is 0 and the number of py is c in the formula (2x), the formula (2x) is represented by a formula (2b) below.

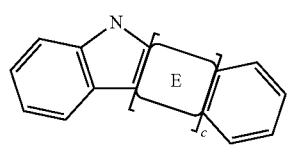

(2b)

In the formula (2b), c is an integer ranging from 1 to 4. When c is an integer ranging from 2 to 4, a plurality of the cyclic structures E may be mutually the same or different. In the formula (2b), E represents the cyclic structure represented by the formula (2c) or the cyclic structure represented by the formula (2d), the cyclic structure E being fused to adjacent cyclic structure(s) at any position(s). Accordingly, when, for instance, c is 2, the two cyclic structures E may be two cyclic structures each represented by the formula (2c), two cyclic structures each represented by the formula (2d), or a combination of one cyclic structure represented by the formula (2c) and one cyclic structure represented by the formula (2d).

The presence of the moieties represented by the formula (200) and the formula (2Y) in a single molecule allows a design capable of effectively reducing ΔST.

The second compound in the first exemplary embodiment preferably includes a moiety represented by a formula (2e) below in a molecule.

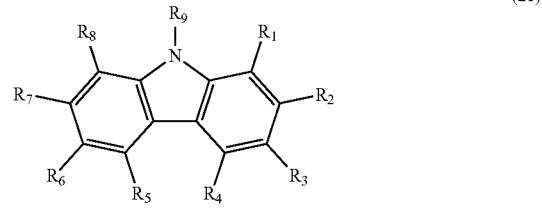

(2e)

$R_1$ to $R_9$ in the formula (2e) each independently represent a hydrogen atom, a substituent, or a single bond to another atom in the molecule of the second compound.

The substituent for $R_1$ to $R_9$ is a substituent selected the group consisting of a halogen atom, a substituted or unsubstituted aryl group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms. It should be noted that at least one of $R_1$ to $R_9$ is a single bond to another atom in the molecule of the second compound.

In the formula (2e), at least one pair of the substituents selected from $R_1$ to $R_9$ are optionally bonded to form a cyclic structure. When the cyclic structure is formed, among substituents $R_1$ to $R_9$ bonded to the carbon atoms of the six-membered ring or the nitrogen atom of the five-membered ring in the formula (2e), a pair of substituents selected from $R_1$ to $R_8$ each bonded to adjacent carbon atoms of the six-membered ring and $R_9$ of the five-membered ring form the cyclic structure. Specifically, at least one of pairs of substituents consisting of $R_1$ and $R_2$, $R_2$ and $R_3$, $R_3$ and $R_4$, $R_4$ and $R_5$, $R_5$ and $R_6$, $R_6$ and $R_7$, $R_7$ and $R_8$, $R_8$ and $R_9$, and $R_1$ and $R_9$ forms a mutual bonding to form a cyclic structure.

In the first exemplary embodiment, the cyclic structure formed by the bonding of the substituents is preferably a fused ring. For instance, the cyclic structure formable in the formula (2e) is a fused six-membered cyclic structure.

The second compound in the first exemplary embodiment preferably includes a moiety represented by a formula (2y) below in a molecule.

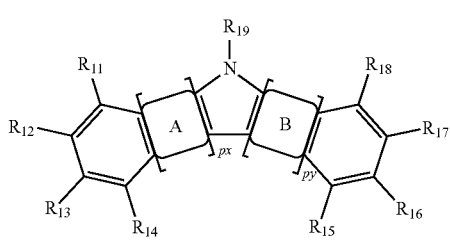

(2y)

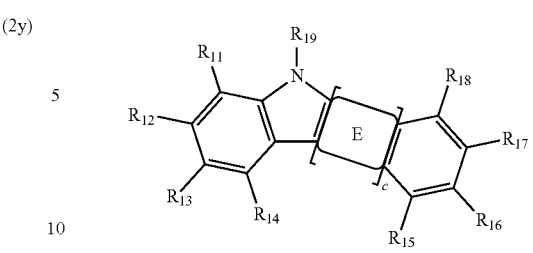

(2f)

In the formula (2y), $R_{11}$ to $R_{19}$ each independently represent the same as $R_1$ to $R_9$ of the formula (2e). It should be noted that at least one of $R_{11}$ to $R_{19}$ is a single bond to another atom in the molecule of the second compound. In the formula (2y), at least one pair of the substituents selected from $R_{11}$ to $R_{19}$ are optionally bonded to form a cyclic structure. In the formula (2y), A and B each independently represent a cyclic structure represented by a formula (2g) below or a cyclic structure represented by a formula (2h) below, the cyclic structures A and B being fused to adjacent cyclic structure(s) at any position(s). px represents the number of the cyclic structure A and is an integer ranging from 0 to 4. When px is an integer ranging from 2 to 4, a plurality of the cyclic structures A may be mutually the same or different. When py is an integer ranging from 2 to 4, a plurality of the cyclic structures B may be mutually the same or different. py represents the number of the cyclic structure B and is an integer ranging from 0 to 4. Accordingly, when, for instance, px is 2, the two cyclic structures A may be two cyclic structures each represented by the formula (2g) below, two cyclic structures each represented by the formula (2h) below, or a combination of one cyclic structure represented by the formula (2g) and one cyclic structure represented by the formula (2h).

In the formula (2y), $R_{11}$ to $R_{19}$ each independently represent the same as $R_1$ to $R_9$ of the formula (2e). It should be noted that at least one of $R_{11}$ to $R_{19}$ is a single bond to another atom in the molecule of the second compound. In the formula (2f), at least one pair of the substituents selected from $R_{11}$ to $R_{19}$ are optionally bonded to form a cyclic structure. In the formula (2f), E represents the cyclic structure represented by the formula (2g) or the cyclic structure represented by the formula (2h), the cyclic structure E being fused to adjacent cyclic structure(s) at any position(s). c represents the number of the cyclic structure E and is an integer ranging from 1 to 4. When c is an integer ranging from 2 to 4, a plurality of the cyclic structures E may be mutually the same or different. Accordingly, when, for instance, c is 2, the two cyclic structures E may be two cyclic structures each represented by the formula (2g) below, two cyclic structures each represented by the formula (2h) below, or a combination of one cyclic structure represented by the formula (2g) and one cyclic structure represented by the formula (2h).

The second compound of the first exemplary embodiment is preferably represented by a formula (2A) below.

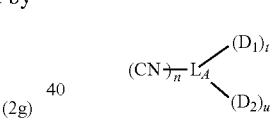

(2A)

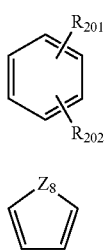

(2g)

(2h)

In the formula (2g), $R_{201}$ and $R_{202}$ each independently are selected from the same for the above $R_1$ to $R_9$, $R_{201}$ and $R_{202}$ being optionally mutually bonded to form a cyclic structure. $R_{201}$ and $R_{202}$ are each bonded to corresponding one of carbon atoms of the six-membered ring of the formula (2g).

In the formula (2h), $Z_8$ represents $CR_{203}R_{204}$, $NR_{205}$, a sulfur atom, or an oxygen atom, $R_{203}$ to $R_{205}$ each independently selected from the same group for the substituent for $R_1$ to $R_9$.

In the formula (2y), at least one pair of the substituents selected from $R_{11}$ to $R_{19}$ and $R_{201}$ to $R_{205}$ are optionally bonded to form a cyclic structure.

When px is 0 and the number of py is c in the formula (2y), the formula (2y) is represented by a formula (2f) below.

In the formula (2A), n is an integer of 1 or more, t is an integer of 1 or more and u is an integer of 0 or more. $L_A$ is a substituted or unsubstituted aromatic hydrocarbon ring having 6 to 30 ring carbon atoms, or a substituted or unsubstituted aromatic heterocyclic ring having 6 to 30 ring atoms. CN is a cyano group. $D_1$ and $D_2$ are each independently represented by the formula (2Y), where the cyclic structures F and G are unsubstituted or substituted, m is 0 or 1, and, when m is 1, $Y_{20}$ represents a single bond, an oxygen atom, a sulfur atom, a selenium atom, a carbonyl group, $CR_{21}R_{22}$, $SiR_{23}R_{24}$ or $GeR_{25}R_{26}$, $R_{21}$ to $R_{26}$ being selected from the same group for R. When m is 1 in the formula (2Y), the formula (2Y) is represented by any one of the formulae (22) to (25) and the formulae (21Y) to (24Y). $D_1$ and $D_2$ may be the same or different. When t is 2 or more, a plurality of $D_1$ may be mutually the same or different. When u is 2 or more, a plurality of $D_2$ may be mutually the same or different.

In the first exemplary embodiment, it is preferable that $L_A$ is a substituted or unsubstituted aromatic hydrocarbon ring having 6 to 14 ring carbon atoms. Examples of the aromatic hydrocarbon ring having 6 to 14 ring carbon atoms include benzene, naphthalene, fluorene, and phenanthrene. $L_A$ is further preferably an aromatic hydrocarbon ring having 6 to 10 ring carbon atoms.

Examples of the aromatic heterocyclic ring having 6 to 30 ring atoms for $L_A$ include pyridine, pyrimidine, pyrazine, quinoline, quinazoline, phenanthroline, benzofuran, and dibenzofuran.

In the first exemplary embodiment, $D_1$ or $D_2$ is optionally bonded to a first carbon atom of the aromatic hydrocarbon ring represented by $L_A$ in the formula (2A), and CN is optionally bonded to a second carbon atom adjacent to the first carbon atom. For instance, in the second compound according to the first exemplary embodiment, D may be bonded to a first carbon atom $C_1$ and a cyano group may be bonded to a second carbon atom $C_2$ adjacent to the first carbon atom $C_1$ as in a moiety represented by a formula (2B) below. D in the formula (2B) below is the same as the above $D_1$ or $D_2$. Wavy lines in the formula (2B) below each represent a bonding position to another structure or atom.

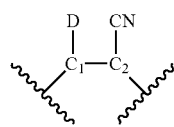

(2B)

$D_1$ or $D_2$ having the structure represented by the formula (2a) or (2b) and a cyano group, which are adjacently bonded to the aromatic hydrocarbon ring represented by $L_A$, reduces the value of ΔST of the compound.

In the first exemplary embodiment, t is preferably an integer of 2 or more. When two or more of $D_1$ are bonded to the aromatic hydrocarbon ring represented by $L_A$, the structures of the plurality of $D_1$ may be the same or different.

The second compound of the first exemplary embodiment is preferably represented by a formula (21) below.

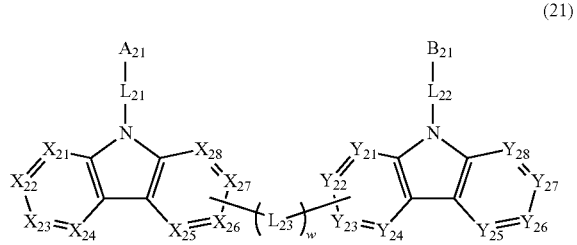

(21)

In the formula (21), $A_{21}$ and $B_{21}$ each independently represent a substituted or unsubstituted aromatic hydrocarbon group having 6 to 30 ring carbon atoms, or a substituted or unsubstituted aromatic heterocyclic group having 5 to 30 ring atoms.

$X_{21}$ to $X_{28}$ and $Y_{21}$ to $Y_{28}$ each independently represent a nitrogen atom, a carbon atom bonded to $R^D$, or a carbon atom bonded to $L_{23}$, where at least one of $X_{25}$ to $X_{28}$ is a carbon atom bonded to $L_{23}$, and at least one of $Y_{21}$ to $Y_{24}$ is a carbon atom bonded to $L_{23}$.

$R^D$ each independently represent a hydrogen atom or a substituent. The substituent for $R^D$ is selected from the group consisting of a halogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms and a substituted or unsubstituted silyl group.

$L_{21}$ and $L_{22}$ are each independently a single bond or a linking group, the linking group for $L_{21}$ and $L_{22}$ being a substituted or unsubstituted aromatic hydrocarbon group having 6 to 30 ring carbon atoms, a substituted or unsubstituted heterocyclic group having 5 to 30 ring atoms, a multiple linking group provided by bonding two to four groups selected from the aromatic hydrocarbon group, a multiple linking group provided by bonding two to four groups selected from the heterocyclic group, or a multiple linking group provided by bonding two to four groups selected from the aromatic hydrocarbon group and the heterocyclic group.

$Ar_{17}$ is a substituted or unsubstituted monocyclic hydrocarbon group having 6 or less ring carbon atoms, or a substituted or unsubstituted monocyclic heterocyclic group having 6 or less ring atoms.

w represents an integer ranging from 0 to 3. When w is 0, at least one of $X_{25}$ to $X_{28}$ and at least one of $Y_{21}$ to $Y_{24}$ are directly bonded.

It should be noted that the monocyclic hydrocarbon group is not a fused ring but is a group derived from a single hydrocarbon ring (alicyclic hydrocarbon or aromatic hydrocarbon) and the monocyclic heterocyclic group is a group derived from a single heterocycle.

It should be noted that the formula (21) satisfies at least one of conditions (i) and (ii) below.
(i) At least one of $A_{21}$ and $B_{21}$ is a cyano-group-substituted aromatic hydrocarbon group having 6 to 30 ring carbon atoms, or a cyano-group-substituted aromatic heterocyclic group having 6 to 30 ring atoms.
(ii) At least one of $X_{21}$ to $X_{24}$ and $Y_{25}$ to $Y_{28}$ is a carbon atom bonded to $R^D$, and at least one of $R^D$ is a cyano-group-substituted aromatic hydrocarbon group having 6 to 30 ring carbon atoms, or a cyano-group-substituted aromatic heterocyclic group having 6 to 30 ring atoms.

When a plurality of $R^D$ are present, the plurality of $R^D$ may be the same or different.

In the formula (21), when the aromatic hydrocarbon group having 6 to 30 ring carbon atoms or the aromatic heterocyclic group having 6 to 30 ring atoms represented by $A_{21}$ and $B_{21}$ has a substituent, the substituent is preferably one or more group selected from the group consisting of a cyano group, a halogen atom, an alkyl group having 1 to 20 carbon atoms, a cycloalkyl group having 3 to 20 carbon atoms, an alkoxy group having 1 to 20 carbon atoms, a haloalkyl group having 1 to 20 carbon atoms, a haloalkoxy group having 1 to 20 carbon atoms, an alkylsilyl group having 1 to 10 carbon atoms, an aryl group having 6 to 30 ring carbon atoms, an aryloxy group having 6 to 30 ring carbon atoms, an aralkyl group having 6 to 30 carbon atoms, and a heterocyclic group having 5 to 30 ring atoms. When $A_{21}$ and $B_{21}$ have a plurality of substituents, the substituents may be the same or different.

It is preferable that the formula (21) satisfies the above condition (i) and does not satisfy the above condition (ii).

Alternatively, it is preferable that the formula (21) satisfies the above condition (ii) and does not satisfy the above condition (i).

Further alternatively, it is preferable that the formula (21) satisfies the above conditions (i) and (ii).

In the formula (21), at least one of $A_{21}$ and $B_{21}$ is preferably a phenyl group substituted by a cyano group, a naphthyl group substituted by a cyano group, a phenanthryl group substituted by a cyano group, a dibenzofuranyl group substituted by a cyano group, a dibenzothiophenyl group substituted by a cyano group, a biphenyl group substituted by a cyano group, a terphenyl group substituted by a cyano group, a 9,9-diphenylfluorenyl group substituted by a cyano group, a 9,9'-spirobi[9H-fluorene]-2-yl group substituted by a cyano group, a 9,9-dimethylfluorenyl group substituted by a cyano group, or a triphenylenyl group substituted by a cyano group.

In the formula (21), it is preferable that at least one of $X_{21}$ to $X_{24}$ and $Y_{25}$ to $Y_{28}$ is $CR^D$, and at least one of $R^D$ in $X_{21}$ to $X_{24}$ and $Y_{25}$ to $Y_{28}$ is a phenyl group substituted by a cyano group, a naphthyl group substituted by a cyano group, a phenanthryl group substituted by a cyano group, a dibenzofuranyl group substituted by a cyano group, a dibenzothiophenyl group substituted by a cyano group, a biphenyl group substituted by a cyano group, a terphenyl group substituted by a cyano group, a 9,9-diphenylfluorenyl group substituted by a cyano group, a 9,9'-spirobi[9H-fluorene]-2-yl group substituted by a cyano group, a 9,9-dimethylfluorenyl group substituted by a cyano group, or a triphenylenyl group substituted by a cyano group.

In the formula (21), it is preferable that $X_{26}$ and $Y_{23}$ are bonded via $L_{23}$, or directly bonded.

In the formula (21), it is also preferable that $X_{26}$ and $Y_{22}$ are bonded via $L_{23}$, or directly bonded.

In the formula (21), it is also preferable that $X_{27}$ and $Y_{23}$ are bonded via $L_{23}$, or directly bonded.

In the formula (21), w is preferably 0.

Alternatively, in the formula (21), w is preferably 1.

In the formula (21), $L_{21}$ and $L_{22}$ are each preferably a single bond or a substituted or unsubstituted aromatic hydrocarbon group having 6 to 30 ring carbon atoms.

Specific examples of the second compound are shown below. It should be noted that the second compound according to the invention is not limited to these specific examples.

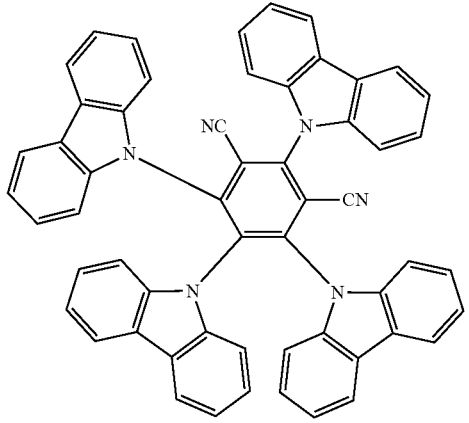

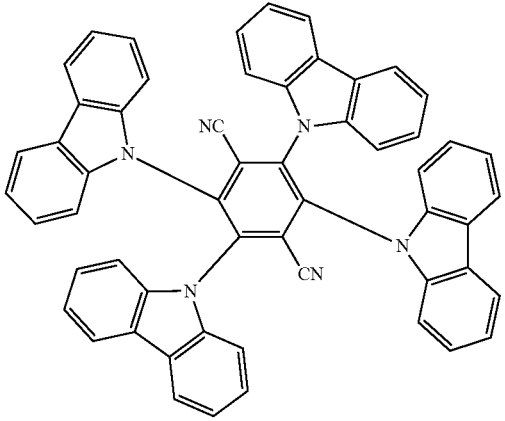

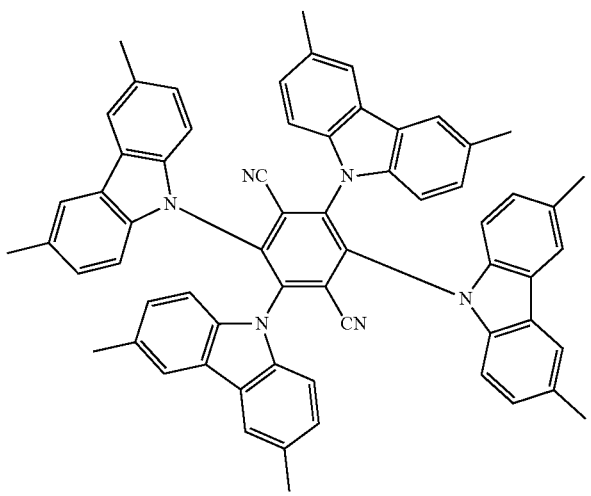

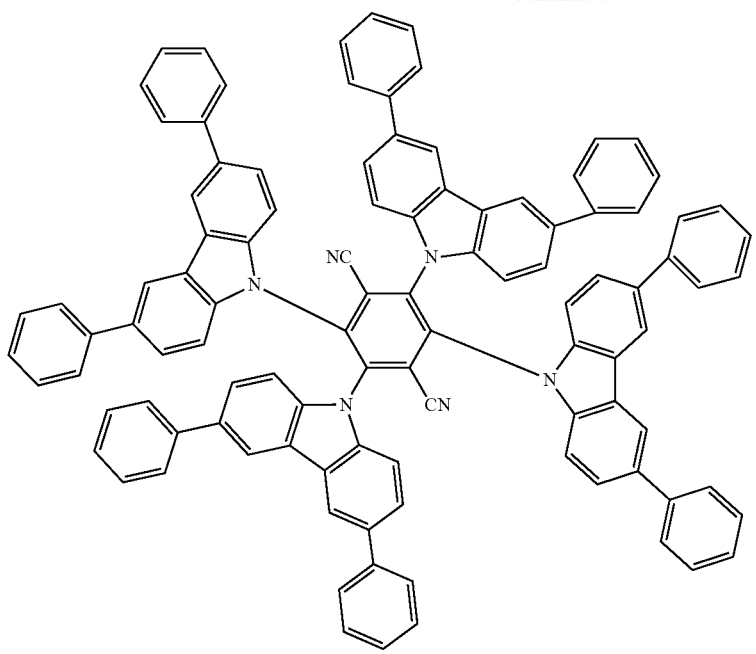
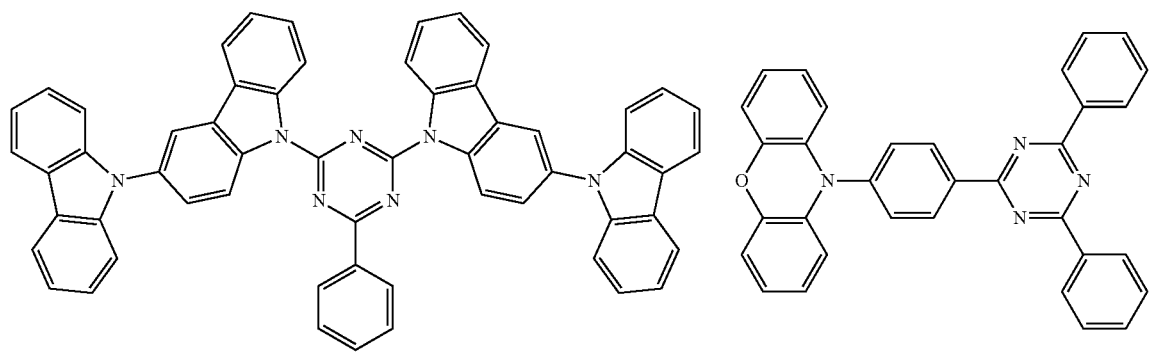
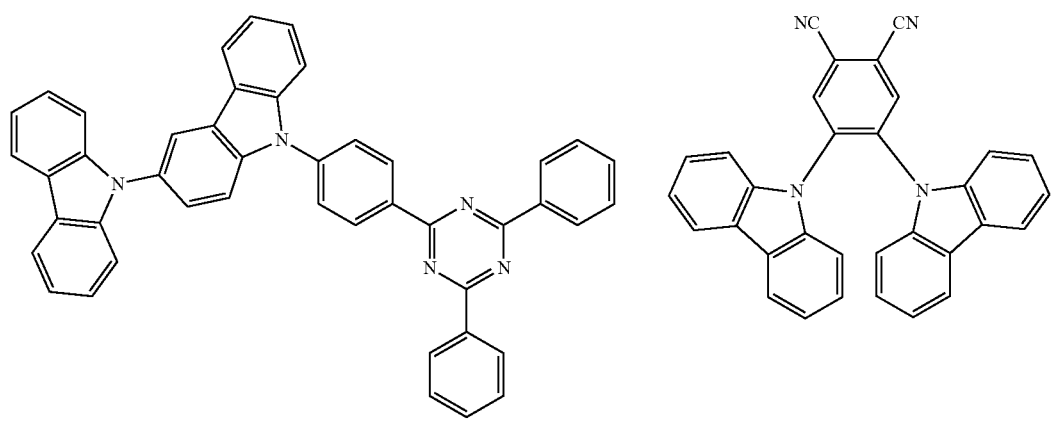

141 142
-continued
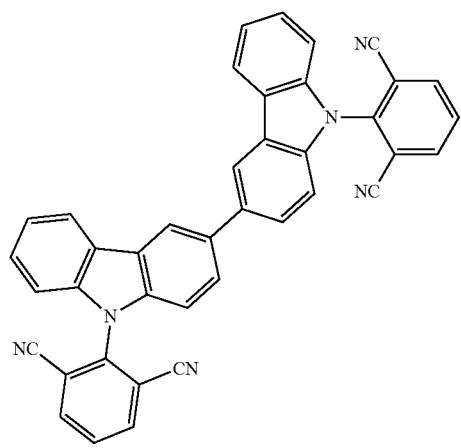 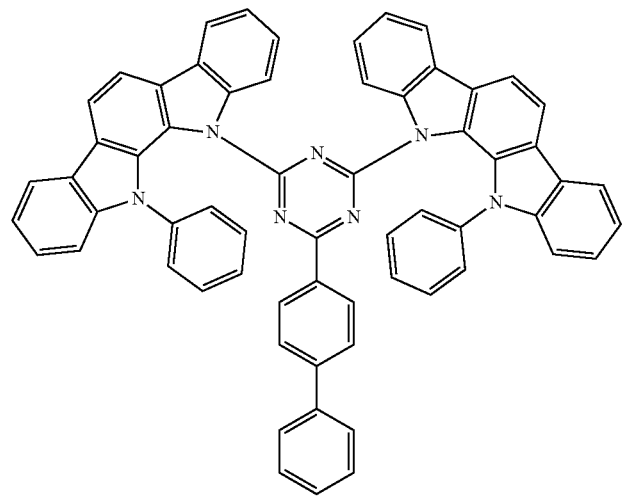
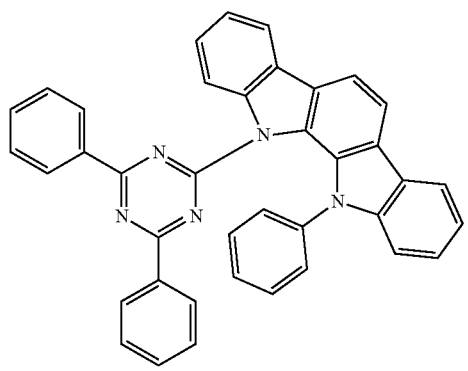 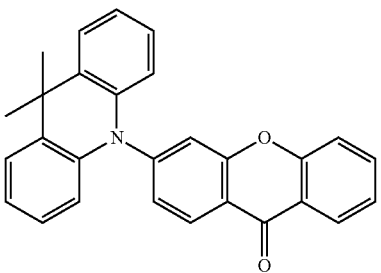 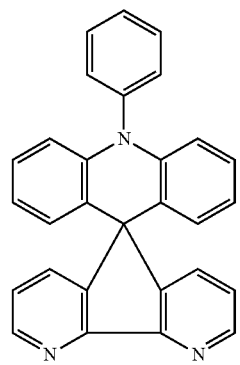
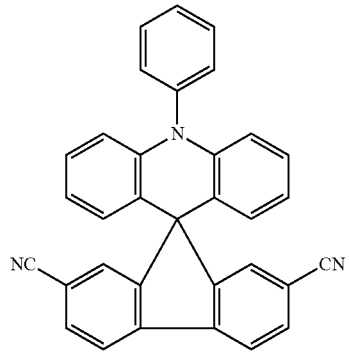 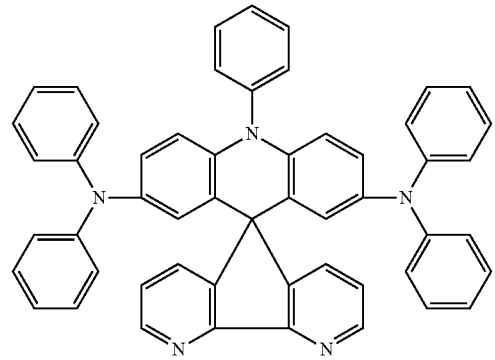
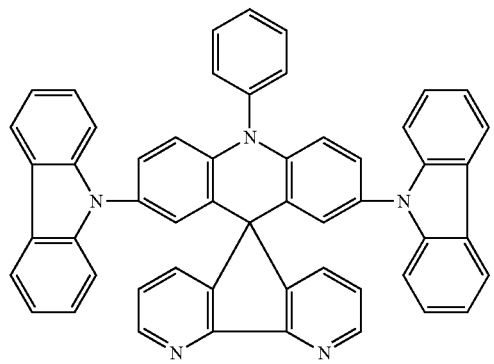 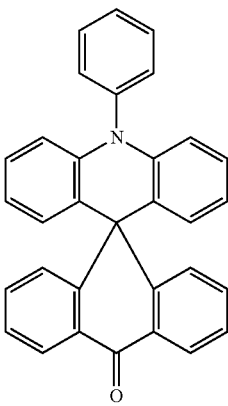

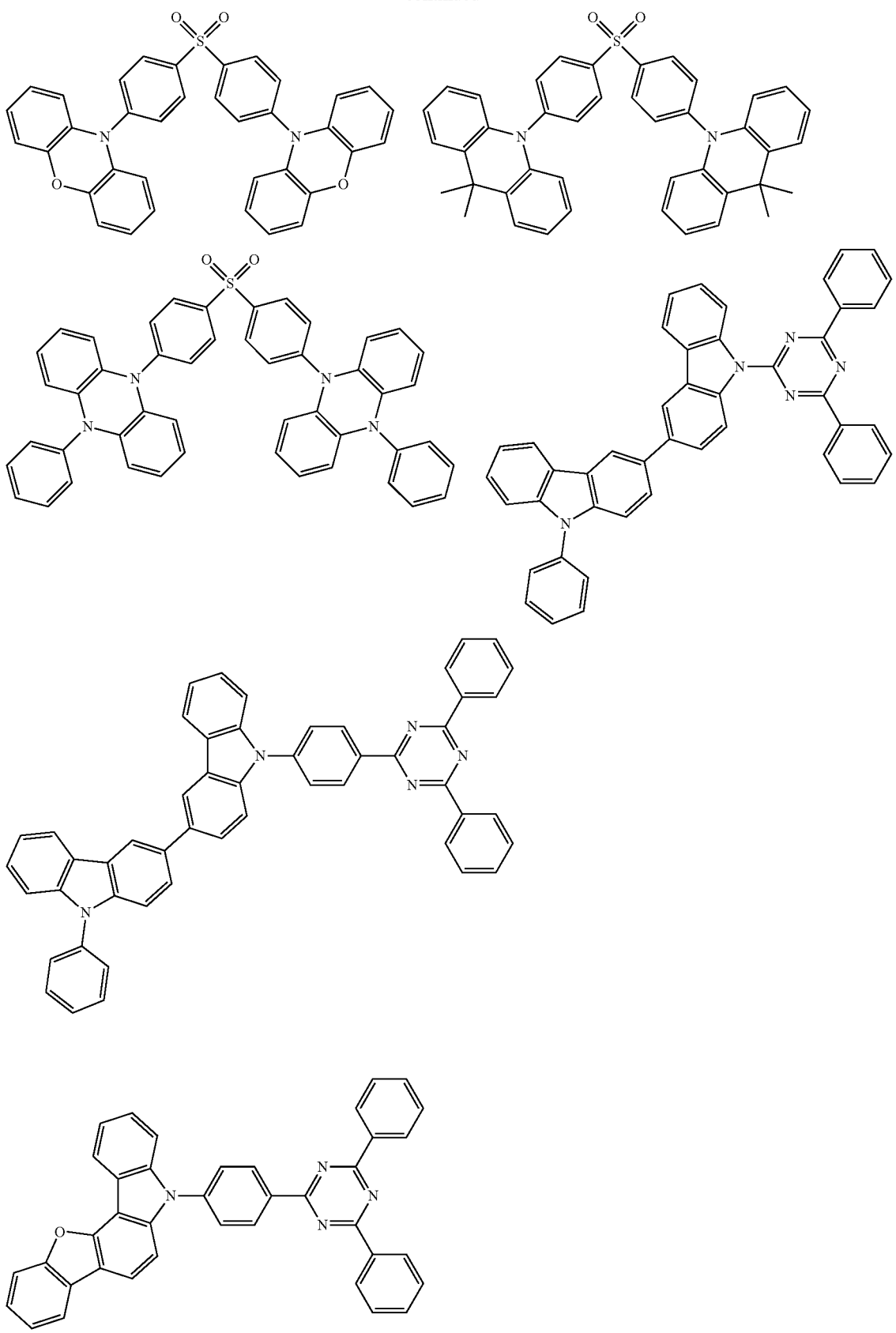

-continued
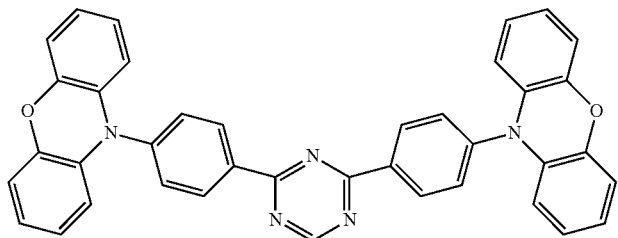
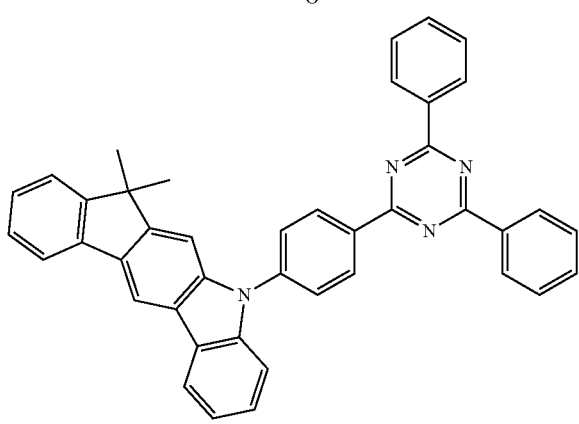
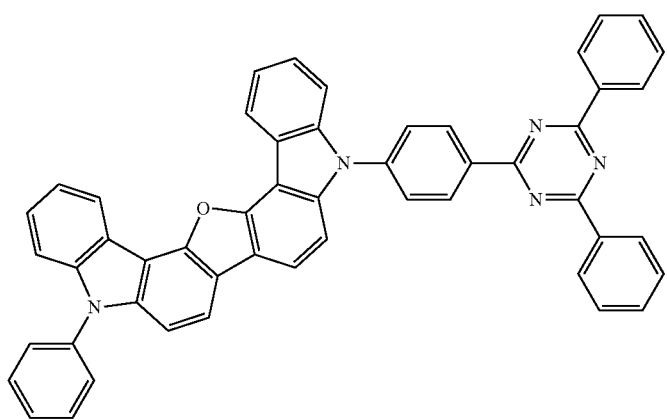
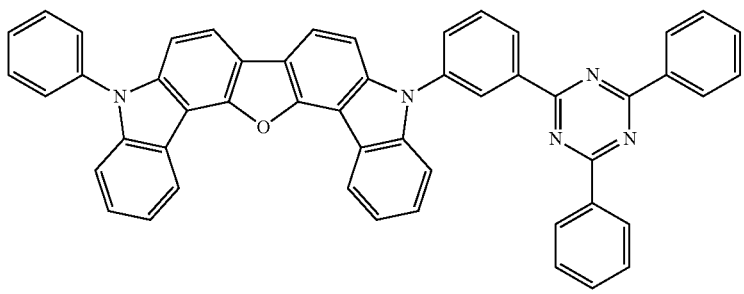

-continued

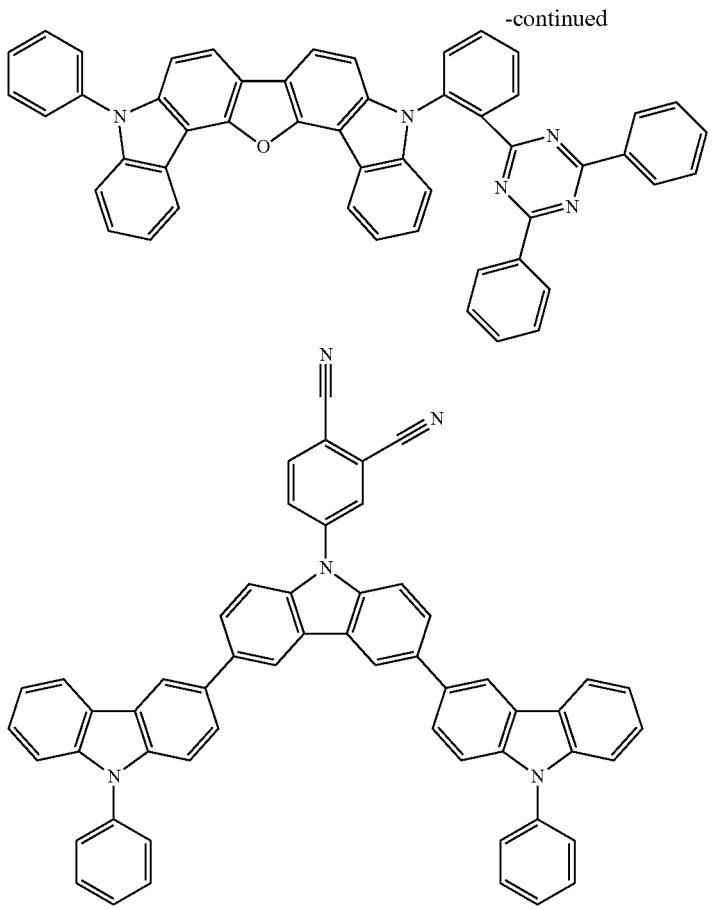

Preparing Method of Second Compound

The second compound can be prepared by methods disclosed in, for instance, International Publication Nos. WO2013/180241, WO2014/092083, WO2014/104346 and the like.

Delayed Fluorescence

Delayed fluorescence (thermally activated delayed fluorescence) is described in "Yuki Hando-tai no Debaisu Bussei (Device Physics of Organic Semiconductor)" edited by Chihaya Adachi, published by Kodansha Company Ltd, pages 261 to 268. This document describes that, when an energy gap $\Delta E_{13}$ between a singlet state and a triplet state of a fluorescent material can be decreased, in spite of a typical low transition probability, inverse energy transfer from the triplet state to the singlet state occurs at a high efficiency to express TADF (Thermally Activated Delayed Fluorescence). Further, a generating mechanism of delayed fluorescence is described in FIG. 10.38 in this document. The second compound in the exemplary embodiment is a compound emitting thermally activated delayed fluorescence to be generated by such a mechanism.

Delayed fluorescence can be observed by measuring transient PL (Photo Luminescence).

Behavior of delayed fluorescence can also be analyzed based on the decay curve obtained by measuring the transient PL. The transient PL measurement is a method for measuring reduction behavior (transitional property) of PL emission obtained after irradiating pulse laser on a sample to excite the sample and stopping irradiating the pulse laser. PL emission using a TADF material is divided into an emission component from singlet excitons generated by the first PL excitation and an emission component from singlet excitons generated via triplet excitons. Lifetime of the singlet excitons initially generated in the PL excitation is very short at a nano-second order. Accordingly, the emission from the singlet excitons is rapidly reduced after pulse laser radiation.

In contrast, since delayed fluorescence provides emission from singlet excitons generated through long-life triplet excitons, emission is gradually reduced. Thus, there is a large difference in time between the emission from the singlet excitons initially generated in the PL excitation and the emission from the singlet excitons derived from the triplet excitons. Accordingly, a luminous intensity derived from delayed fluorescence is obtainable.

Figure 2:
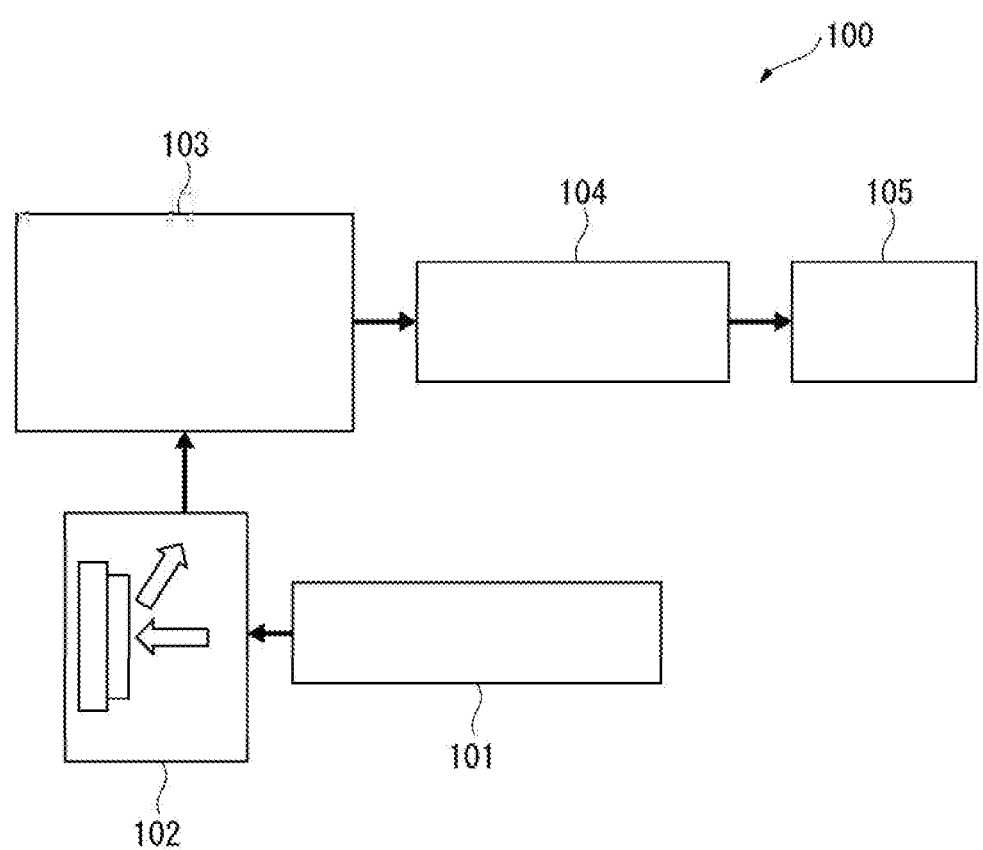

FIG. 2 is a schematic illustration of an exemplary device for measuring the transient PL.

A transient PL measuring device 100 in the exemplary embodiment includes: a pulse laser 101 capable of radiating a light having a predetermined wavelength; a sample chamber 102 configured to house a measurement sample; a spectrometer 103 configured to divide a light radiated from the measurement sample; a streak camera 104 configured to provide a two-dimensional image; and a personal computer 105 configured to import and analyze the two-dimensional image. A device usable for the measurement of the transient PL is not limited to the device described in the exemplary embodiment.

The sample housed in the sample chamber 102 is obtained by forming a thin film, in which a matrix material is doped with a doping material at a concentration of 12 mass %, on the quartz substrate.

The thin film sample housed in the sample chamber 102 is irradiated with pulse laser from the pulse laser 101 to excite the doping material. Emission is extracted at 90 degrees angle relative to an irradiation direction of the excited light. The extracted emission is dispersed with the spectrometer 103 to form a two-dimensional image in the streak camera 104. As a result, the two-dimensional image expressed in coordinates of which ordinate axis indicates time and of which abscissa axis indicates a wavelength, in which a luminous point indicates a luminous intensity, can be obtained. If the two-dimensional image is cut out along a predetermined time axis, emission spectrum expressed in coordinates of which ordinate axis indicates a luminous intensity and of which abscissa axis indicates the wavelength can be obtained. If the two-dimensional image is cut out along a wavelength axis, a decay curve (transient PL) expressed in coordinates of which ordinate axis indicates a logarithm of the luminous intensity and of which abscissa axis indicates time can be obtained.

For instance, using a reference compound H1 below as the matrix material and a reference compound D1 as the doping material, a thin film sample A was prepared as described above and the transitional PL was measured.

(Reference Compound H1)

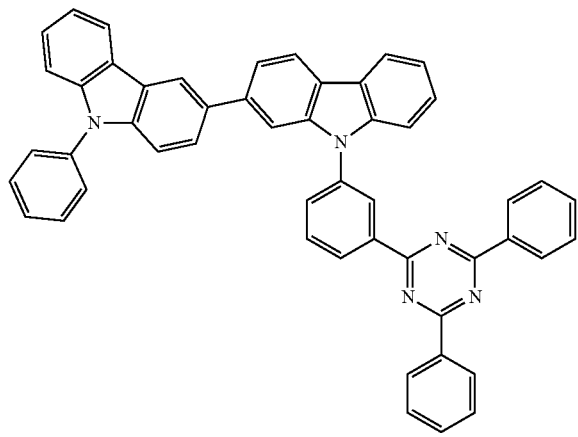

(Reference Compound D1)

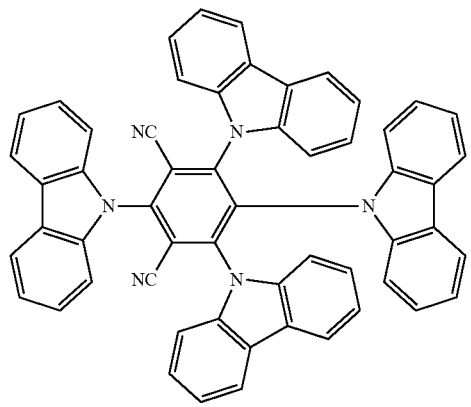

Herein, the decay curve was analyzed using the above-described thin film sample A and a thin film sample B. The thin film sample B was prepared as described above, using a reference compound H2 below as the matrix material and the reference compound D1 as the doping material.

Figure 3:
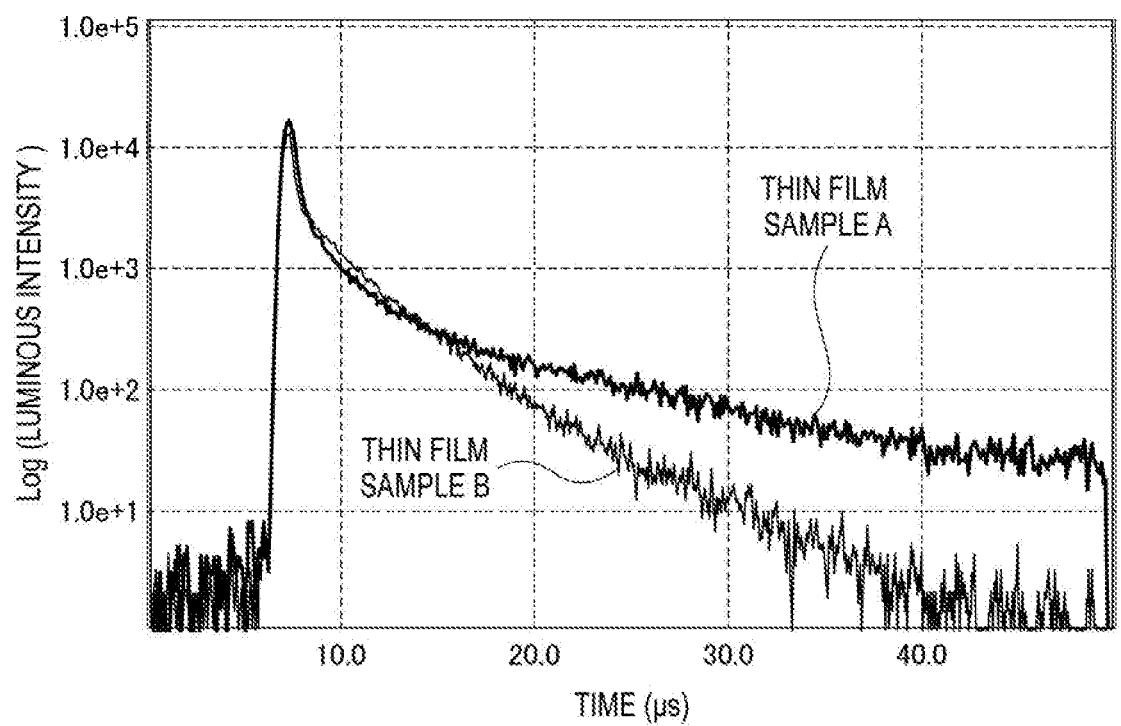
FIG. 3 is an example of a decay curve of the transient PL.

FIG. 3 shows a decay curve obtained from the measured transitional PL of the thin film sample A and the thin film sample B.

(Reference Compound H2)

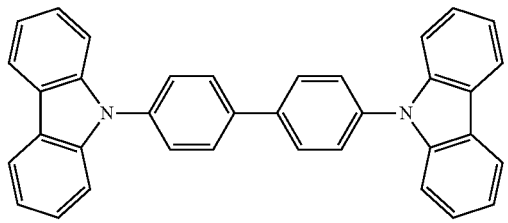

An emission decay curve expressed in coordinates of which ordinate axis indicates a luminous intensity and of which abscissa axis indicates time can be obtained by measuring the transient PL as described above. Based on the emission decay curve, a fluorescence intensity ratio between fluorescence in the single state generated by light excitation and the delayed fluorescence in the singlet state generated by the inverse energy transfer through the triplet state can be estimated. In a delayed fluorescent material, a ratio of the intensity of the slowly decaying delayed fluorescence to the intensity of the promptly decaying fluorescence is relatively large.

In the first exemplary embodiment, an amount of the delayed fluorescence can be calculated using the device of FIG. 2. In the first compound after excited with pulse light (light irradiated from the pulse laser) having a wavelength to be absorbed in the second compound, Prompt Emission that is immediately observed in the excited state and Delay Emission that is not observed immediately after the excitation but is later observed are present. In the first exemplary embodiment, an amount of Delay Emission is preferably 5% or more based on an amount of Prompt Emission.

The amount of Prompt Emission and the amount of Delay Emission can be obtained according to the same method as a method described in "Nature 492, 234-238, 2012." The amount of Prompt emission and the amount of Delay emission may be calculated using a device different from one described in the above Reference Literature.

Moreover, a sample usable for measuring delayed fluorescence is obtained, for instance, by co-depositing the first compound and a compound TH-2 on a quartz substrate at a ratio of the first compound of 12 mass % to form a 100-nm-thick thin film.

TH-2

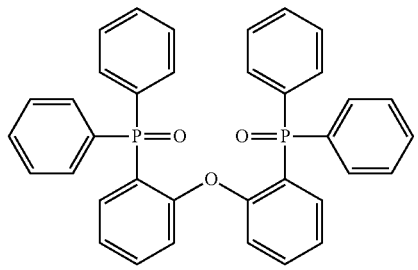

TADF Mechanism

In the organic EL device of the first exemplary embodiment, the second compound is preferably a compound having a small ΔST(Mat1) so that inverse intersystem crossing from the triplet energy level of the second compound to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as TADF Mechanism.

Figure 4:
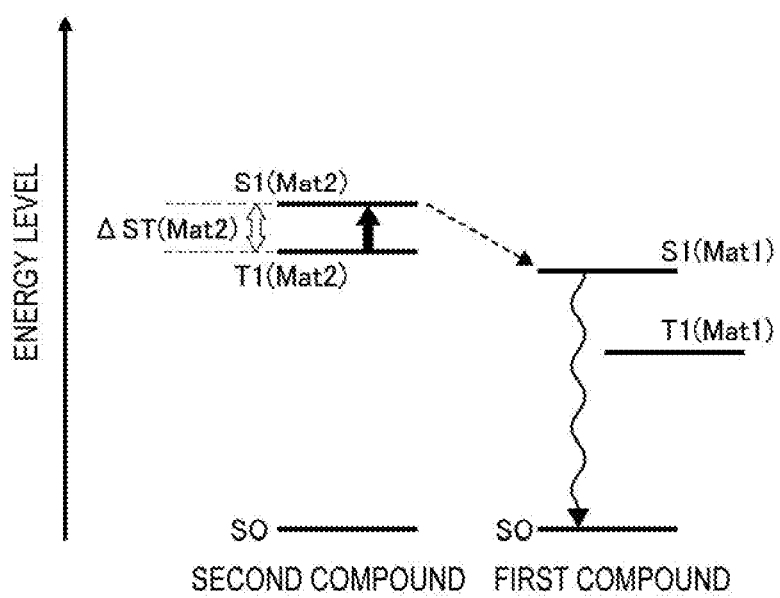
FIG. 4 is an illustration showing a relationship between an energy level and energy transfer for first and second compounds in a first organic layer (emitting layer).

FIG. 4 shows an example of a relationship between energy levels of the first compound and the second compound in the emitting layer. In FIG. 4, S0 represents a ground state, S1(Mat1) represents a lowest singlet state of the first compound, T1(Mat1) represents a lowest triplet state of the first compound, S1(Mat2) represents a lowest singlet state of the second compound, T1(Mat2) represents a lowest triplet state of the second compound. A dashed arrow directed from S1(Mat2) to S1(Mat1) in FIG. 4 represents Förster energy transfer from the lowest singlet state of the second compound to the lowest singlet state of the first compound. In the first exemplary embodiment, a difference between the lowest singlet state S1 and the lowest triplet state T1 is defined as ΔST.

As shown in FIG. 4, when a compound having a small ΔST(Mat2) is used as the second compound, inverse intersystem crossing from the lowest triplet state T1(Mat2) to the lowest singlet state S1(Mat2) can be caused by a heat energy. Consequently, Förster energy transfer from the lowest singlet state S1(Mat2) of the second compound to the lowest singlet state S1(Mat1) of the first compound is caused. As a result, fluorescence from the lowest singlet state S1(Mat1) of the first compound can be observed. It is speculated that the internal quantum efficiency can be theoretically raised up to 100% also by using delayed fluorescence by the TADF mechanism.

Relationship between First Compound and Second Compound in Emitting Layer

In the first exemplary embodiment, the singlet energy $S_1(Mat1)$ of the first compound and the singlet energy $S_1(Mat2)$ of the second compound preferably satisfy a relationship of a numerical formula (Numerical Formula 1) below.

$$S_1(Mat2) > S_1(Mat1) \quad \text{(Numerical Formula 1).}$$

An energy gap $T_{77K}(Mat2)$ at 77 [K] of the second compound is preferably larger than an energy gap $T_{77K}(Mat1)$ at 77 [K] of the first compound.

Relationship between Triplet Energy and Energy Gap at 77[K]

Description will be made on a relationship between a triplet energy and an energy gap at 77[K]. In the first exemplary embodiment, the energy gap at 77[K] is different from a typical triplet energy in some aspects.

The triplet energy is measured as follows. Firstly, a solution in which a compound (measurement target) is dissolved in an appropriate solvent is encapsulated in a quartz glass tube to prepare a sample. A phosphorescent spectrum (ordinate axis: phosphorescent luminous intensity, abscissa axis: wavelength) of each of the samples was measured at a low temperature (77[K]). A tangent was drawn to the rise of the phosphorescent spectrum on the short-wavelength side. Triplet energy was calculated according to a predetermined conversion equation based on a wavelength value at an intersection of the tangent and the abscissa axis.

Herein, the delayed fluorescence compound used in the exemplary embodiment is preferably a compound having a small ΔST. When ΔST is small, intersystem crossing and inverse intersystem crossing are likely to occur even at a low temperature (77[K]), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. The compound to be measured is dissolved in EPA (diethylether:isopentane:ethanol=5:5:2 in volume ratio) at a concentration of 10 μmol/L, and the resulting solution is set in a quartz cell to provide a measurement sample. A phosphorescent spectrum (ordinate axis: phosphorescent luminous intensity, abscissa axis: wavelength) of the sample is measured at a low temperature (77[K]). A tangent is drawn to the rise of the phosphorescent spectrum on the short-wavelength side. An energy amount is calculated as the energy gap $T_{77K}$ at 77[K] according to a conversion equation (F1) below based on a wavelength value $\lambda_{edge}$ (nm) at an intersection of the tangent and the abscissa axis.

$$T_{77K} [eV] = 1239.85/\lambda_{edge} \quad \text{Conversion equation (F1):}$$

The tangent to the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent was checked at each point on the curve toward the long-wavelength of the phosphorescence spectrum. An inclination of the tangent was increased as the curve rises (i.e., a value of the ordinate axis was increased). A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy $S_1$

A method of measuring a singlet energy $S_1$ with use of a solution (occasionally referred to as a solution method) is exemplified by a method below.

A 10 μmol/L toluene solution of a measurement target compound is prepared and put in a quartz cell. An absorption spectrum (ordinate axis: luminous intensity, abscissa axis: wavelength) of the thus-obtained sample is measured at a normal temperature (300K). A tangent is drawn to the fall of the absorption spectrum on the long-wavelength side, and a wavelength value λedge (nm) at an intersection of the tangent and the abscissa axis is assigned to a conversion equation (F2) below to calculate singlet energy.

$$S_1 [eV] = 1239.85/\lambda\text{edge} \quad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance was 0.1 or less) is defined as the tangent to the fall of the absorption spectrum on the long-wavelength side.

The maximum absorbance of 0.2 or less is not included in the above-mentioned maximum absorbance on the long-wavelength side.

In the first exemplary embodiment, a difference $(S_1-T_{77K})$ between the singlet energy S1 and the energy gap $T_{77K}$ at 77[K] is defined as $\Delta ST$.

In the exemplary embodiment, a difference $\Delta ST(Mat2)$ between the singlet energy $S_1(Mat2)$ of the second compound and the energy gap $T_{77K}(Mat2)$ at 77[K] of the second compound is preferably less than 0.3 eV, more preferably less than 0.2 eV, further preferably less than 0.1 eV. In other words, $\Delta ST(Mat2)$ preferably satisfies a relationship of at least one of the following numerical formulae (Formulae 10 to 12).

$\Delta ST(Mat2)=S1(Mat2)-T_{77K}(Mat2)<0.3$ [eV] [Numerical Formula 10]

$\Delta ST(Mat2)=S_1(Mat2)-T_{77K}(Mat2)<0.2$ [eV] [Numerical Formula 11]

$\Delta ST(Mat2)=S_1(Mat2)-T_{77K}(Mat2)<0.1$ [eV] [Numerical Formula 12]

Film Thickness of Emitting Layer

A film thickness of the emitting layer of the organic EL device in the first exemplary embodiment is preferably in a range of 5 nm to 50 nm, more preferably in a range of 7 nm to 50 nm, further preferably in a range of 10 nm to 50 nm. At a film thickness of 5 nm or more, formation and chromaticity adjustment of the emitting layer can be facilitated. At a film thickness of 50 nm or less, the rise in the drive voltage is likely to be restrained.

Content Ratio of Compounds in Emitting Layer

In the organic EL device 1 of the first exemplary embodiment, a content ratio of the first compound is preferably in a range from 0.01 mass % to 10 mass % and a content ratio of the second compound is preferably in a range from 80 mass % to 99.99 mass %. An upper limit of the total of the respective content ratios of the first and second compounds in the emitting layer is 100 mass %. It should be noted that the emitting layer of the first exemplary embodiment may further contain another material in addition to the first and second compounds.

The emitting layer may include a single type of the first compound or may include two or more types of the first compound. The emitting layer may include a single type of the second compound or may include two or more types of the second compound.

Second Organic Layer

The second organic layer (electron blocking layer in the first exemplary embodiment) contains a third compound.

Third Compound

The third compound is a compound represented by a formula (3) below.

$$(Cz)_n-X_B \quad (3)$$

In the formula (3): n is 1, 2, 3 or 4; a plurality of Cz are mutually the same or different when n is 2, 3, or 4; $X_B$ is a group represented by a formula (3A) below; and Cz is a group represented by a formula (3B-1) or a formula (3B-2) below.

$$Ar_1-(Ar_2)_k \quad (3A)$$

In the formula (3A): $Ar_1$ and $Ar_2$ are each independently a substituted or unsubstituted monovalent or polyvalent aromatic hydrocarbon group having 6 to 18 ring carbon atoms; k is 0, 1, or 2; a plurality of $Ar_2$ are mutually the same or different when k is 2; when $Ar_1$ has a substituent D1, the substituent D1 is each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted aralkyl group having 7 to 30 carbon atoms, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 ring carbon atoms, a substituted or unsubstituted silyl group, a halogen atom, a cyano group, and a nitro group; when $Ar_2$ has a substituent D2, the substituent D2 is selected from the same group for the substituent D1, when n is 1, Cz is bonded to $Ar_1$ or bonded to $Ar_2$, and when n is 2, 3, or 4, a plurality of Cz are each independently bonded to $Ar_1$ or bonded to $Ar_2$.

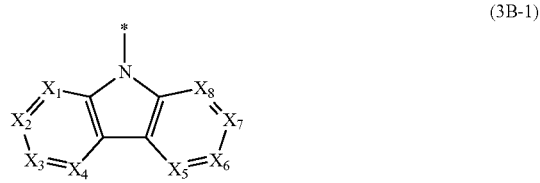

(3B-1)

In the formula (3B-1): $X_1$ to $X_8$ are each independently a nitrogen atom or $CR_A$; $R_A$ represents a hydrogen atom or a substituent, or one or more pairs of adjacent ones of the plurality of $R_A$ are mutually bonded to form a ring; $R_A$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group; <when $R_A$ is a substituted or unsubstituted heteroaryl group having 5 to 30 ring atoms, the heteroaryl group is each independently a carbazolyl group or an azacarbazolyl group; a plurality of $R_A$ are mutually the same or different; and the nitrogen atom in the formula (3B-1) is bonded to one of $Ar_1$ and $Ar_2$ in the formula (3A).

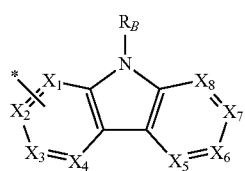

(3B-2)

In the formula (3B-2): $X_1$ to $X_4$ each independently represent a carbon atom bonded to one of $Ar_1$ and $Ar_2$ in the formula (3A), a nitrogen atom or $CR_C$, $R_C$ being a hydrogen atom or a substituent, or one or more of pairs of adjacent one of $R_C$ being mutually bonded to form a ring, one of $X_1$ to $X_4$ being the carbon atom bonded to one of $Ar_1$ and $Ar_2$ in the formula (3A); $X_5$ to $X_8$ represent a nitrogen atom or $CR_D$, $R_D$ being a hydrogen atom or a substituent, or one or more pairs of adjacent ones of the plurality of $R_D$ being mutually bonded to form a ring; and $R_B$, $R_C$ and $R_D$ are each independently selected from the same group for $R_A$ in the formula (3B-1), a plurality of $R_C$ being mutually the same or different, a plurality of $R_D$ being mutually the same or different.

In the third compound, a substituent meant by "substituted or unsubstituted" is selected from the group consisting of a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group; and < when the substituent E has a further substituent F, the substituent F is selected from the group consisting of an unsubstituted aryl group having 6 to 30 ring carbon atoms, an unsubstituted alkyl group having 1 to 30 carbon atoms, an unsubstituted alkyl halide group having 1 to 30 carbon atoms, an unsubstituted cycloalkyl group having 3 to 30 ring carbon atoms, an unsubstituted silyl group, an unsubstituted alkoxy group having 1 to 30 carbon atoms, an unsubstituted alkoxy halide group having 1 to 30 carbon atoms, an unsubstituted aryloxy group having 6 to 30 carbon atoms, an unsubstituted alkylthio group having 1 to 30 carbon atoms, an unsubstituted arylthio group having 6 to 30 ring carbon atoms, an unsubstituted aralkyl group having 7 to 30 carbon atoms, an unsubstituted alkenyl group having 2 to 30 carbon atoms, a halogen atom, an unsubstituted alkynyl group having 2 to 30 carbon atoms, a cyano group, a hydroxy group, a nitro group, and a carboxy group, < the substituent F not being substituted.

In the formula (3), Cz, which is bonded to $X_B$, may be bonded to any of $Ar_1$ and $Ar_2$ in the formula (3A) representing $X_B$.

The bonding form of the compound represented by the formulae (3) and (3A) is determined depending on values n and k. Examples of the bonding form include forms below.

Bonding Form When n=1 in the Formula (3), and k=0 in the Formula (3A)

(3-1)

Bonding Form When n=1 in the Formula (3), and k=1 in the Formula (3A)

(3-2)

(3-3)

Bonding Form When n=1 in the Formula (3), and k=2 in the Formula (3A)

(3-4)

(3-5)

(3-6)

(3-7)

(3-8)

Bonding Form When n=2 in the Formula (3), and k=0 in the Formula (3A)

(3-9)

Bonding Form When n=2 in the Formula (3), and k=1 in the Formula (3A)

(3-10)

(3-11)

(3-12)

Bonding Form When n=2 in the Formula (3), and k=2 in the Formula (3A)

(3-13)

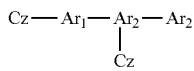 (3-14)
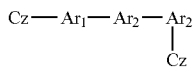 (3-15)
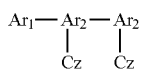 (3-16)
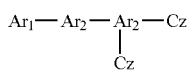 (3-17)
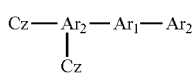 (3-18)
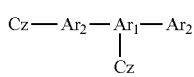 (3-19)
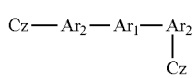 (3-20)
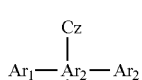 (3-21)
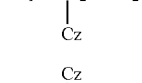 (3-22)
Bonding Form When n=3 in the Formula (3), and k=0 in the Formula (3A)
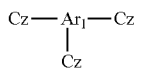 (3-23)
Bonding Form When n=3 in the Formula (3), and k=in the Formula (3A)
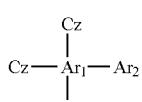 (3-24)
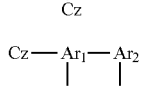 (3-25)
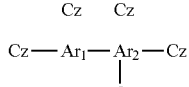 (3-26)
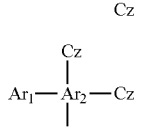 (3-27)
Bonding Form When n=3 in the Formula (3), and k=2 in the Formula (3A)
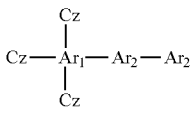 (3-28)
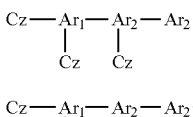 (3-29)
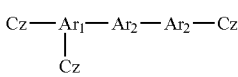 (3-30)
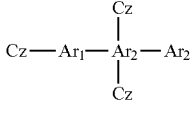 (3-31)
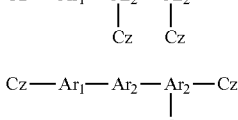 (3-32)
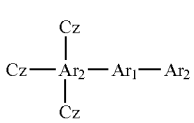 (3-33)
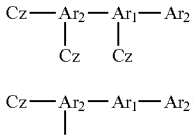 (3-34)
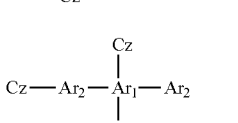 (3-35)
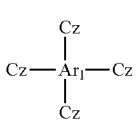 (3-36)
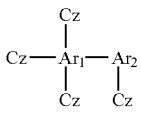 (3-37)
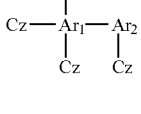 (3-38)
Bonding Form When n=4 in the Formula (3), and k=0 in the Formula (3A)
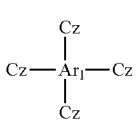 (3-39)
Bonding Form When n=4 in the Formula (3), and k=1 in the Formula (3A)
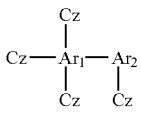 (3-40)

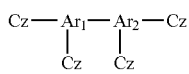
(3-41)

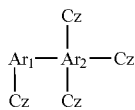
(3-42)

Bonding Form When n=4 in the Formula (3), and k=2 in the Formula (3A)

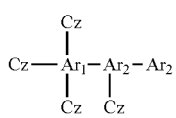
(3-43)

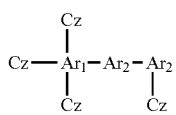
(3-44)

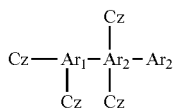
(3-45)

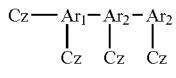
(3-46)

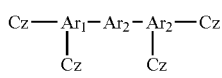
(3-47)

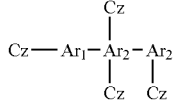
(3-48)

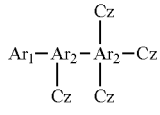
(3-49)

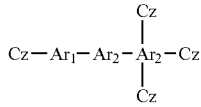
(3-50)

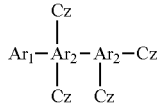
(3-51)

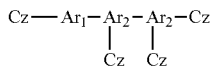
(3-52)

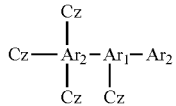
(3-53)

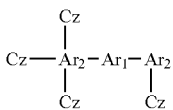
(3-54)

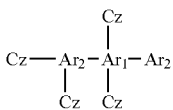
(3-55)

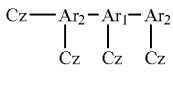
(3-56)

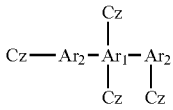
(3-57)

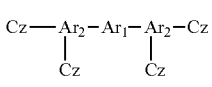
(3-58)

When a plurality of Cz are present in the formulae (3-1) to (3-58), the plurality of Cz are mutually the same or different. When a plurality of $Ar_2$ are present in the formulae (3-1) to (3-58), the plurality of $Ar_2$ are mutually the same or different.

Examples of the third compound in accordance with the above bonding form include compounds below. $Cz_1$ to $Cz_4$ are preferably each independently a group selected as desired from Tables 6 to 13 below. When a plurality of $Cz_1$ to $Cz_4$ are present in a molecule, $Cz_1$ to $Cz_4$ are mutually the same or different. * represents a bonding portion.

In the exemplary third compounds shown below, the group corresponding to $Ar_1$ in the formula (3A) may have the substituent D1, the group corresponding to $Ar_2$ in the formula (3A) may have the substituent D2, the group corresponding to $R_A$ in the formula (3B-1) may have the substituent listed for $R_A$. The substituent D1, the substituent D2, the substituent for $R_A$ are optionally each independently further substituted by the substituent E, the substituent E being optionally further substituted by the substituent F.

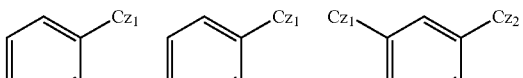

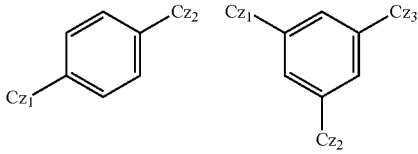

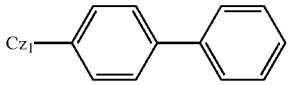

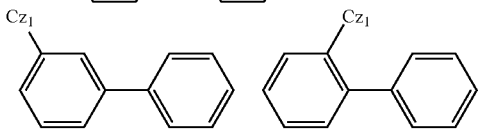

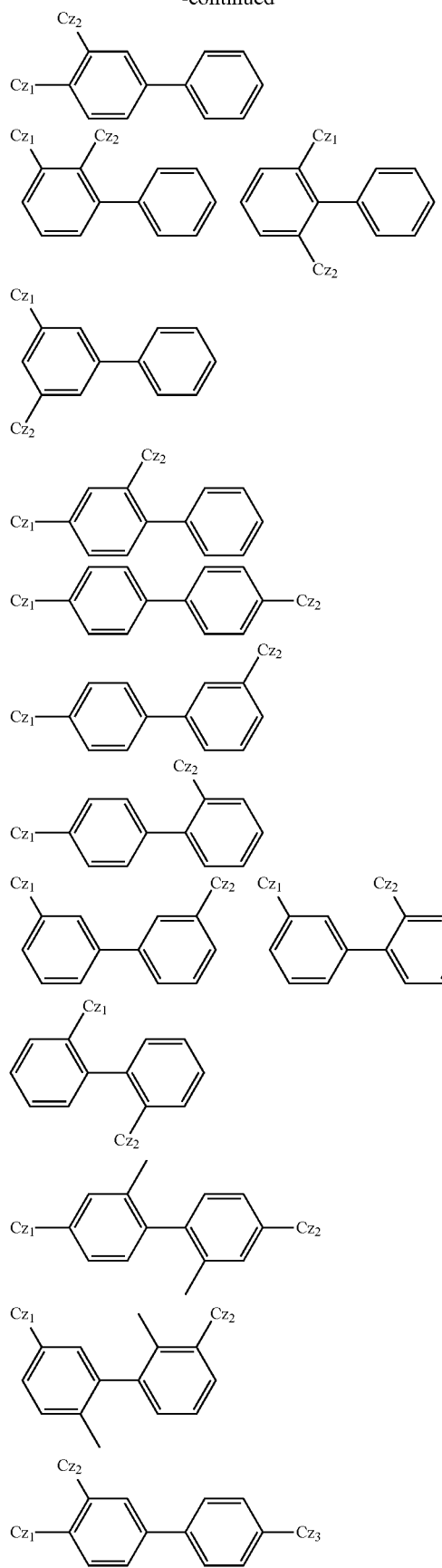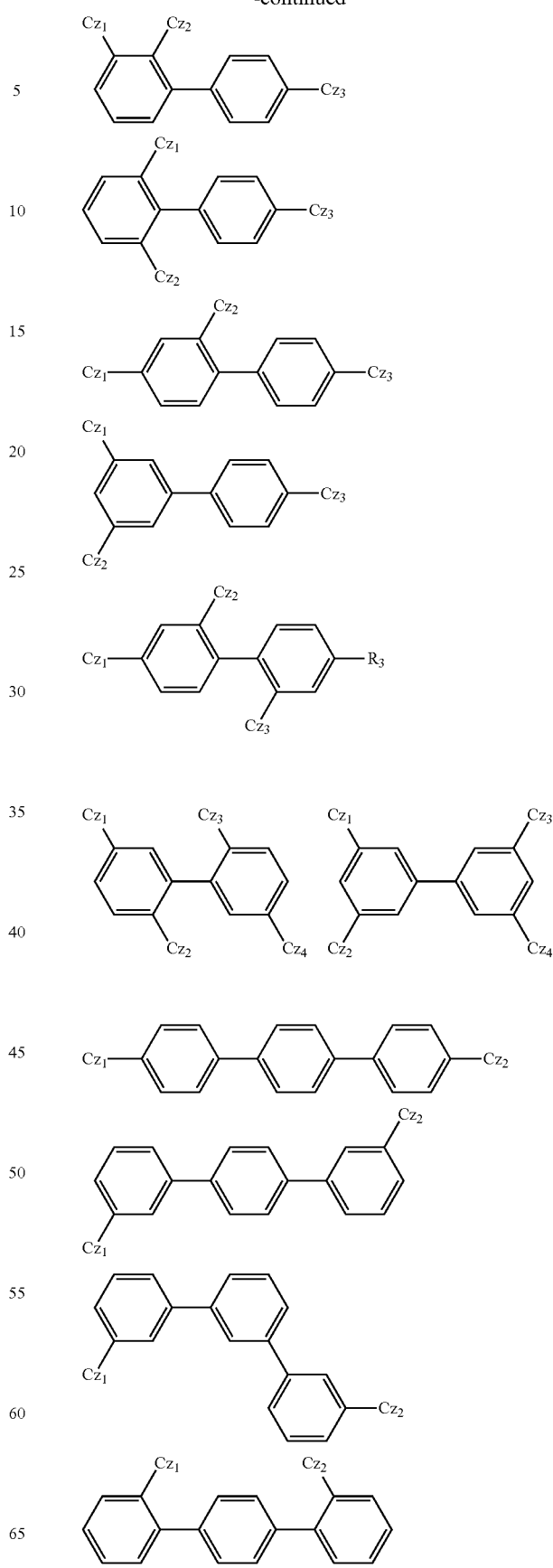

-continued
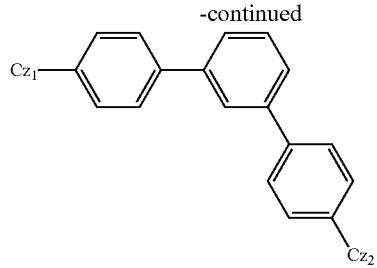
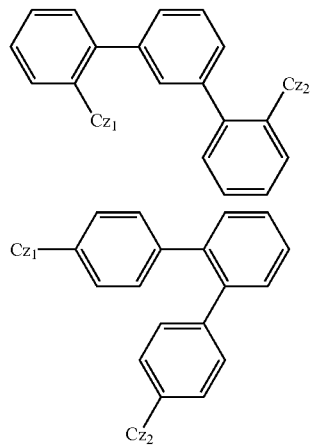
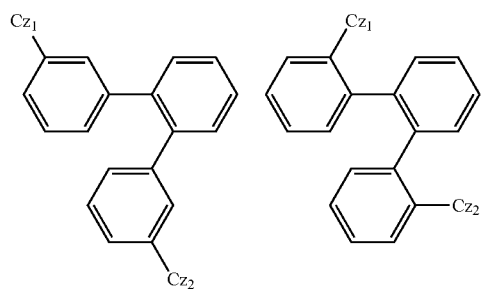
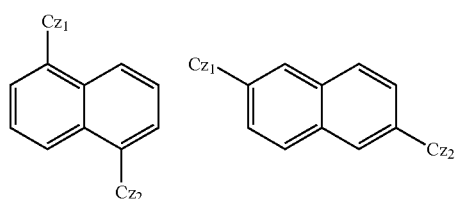
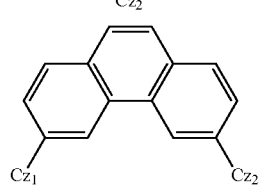
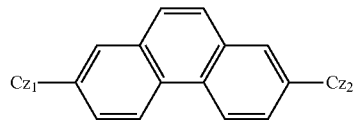
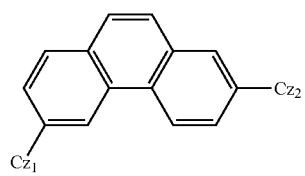
-continued
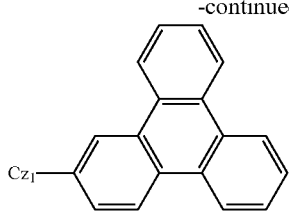
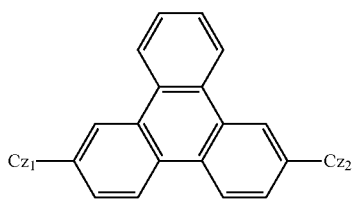
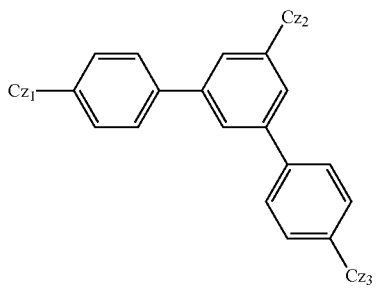
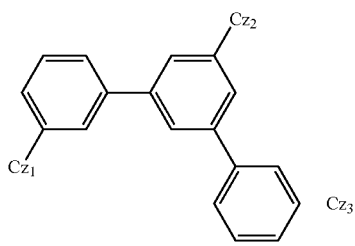
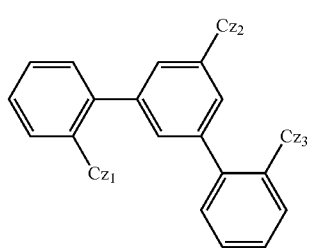

TABLE 6
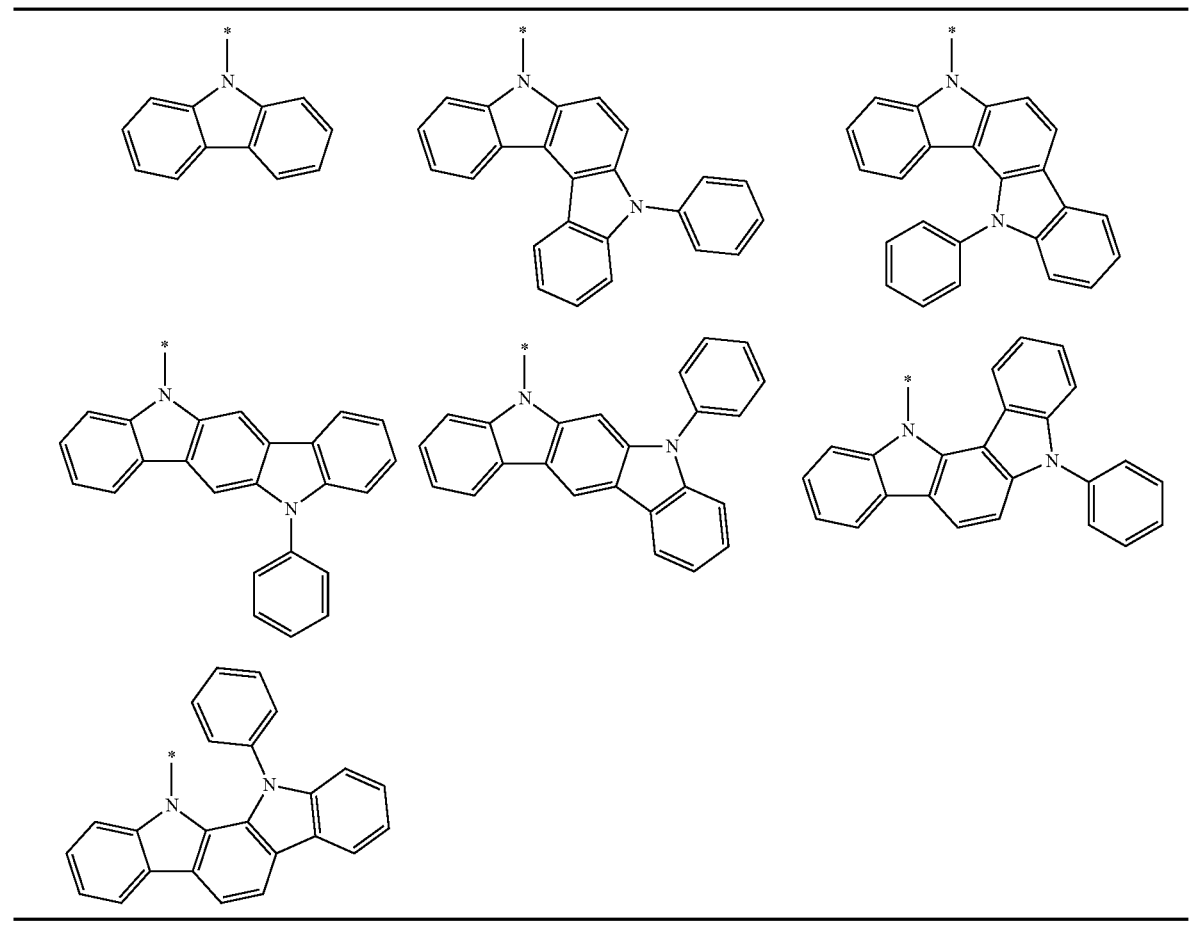
TABLE 7
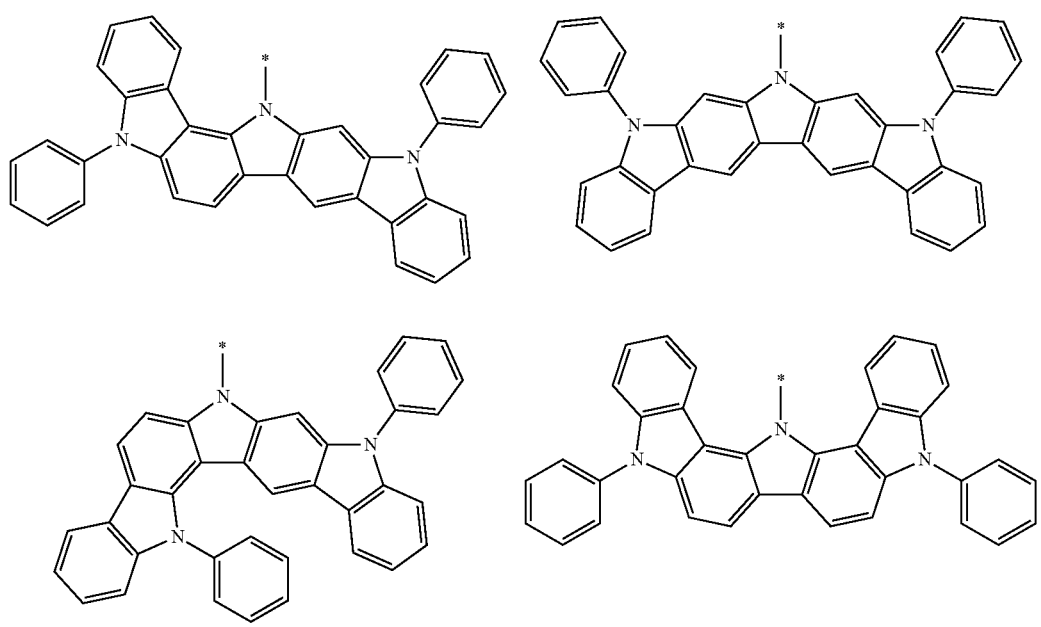

TABLE 7-continued
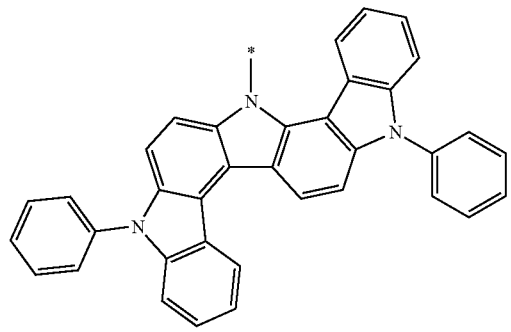 [SMILES: Cn1c2ccc3c(c4ccccc4n3-c3ccccc3)c2c2ccc3c(c4ccccc4n3-c3ccccc3)c21]
TABLE 8
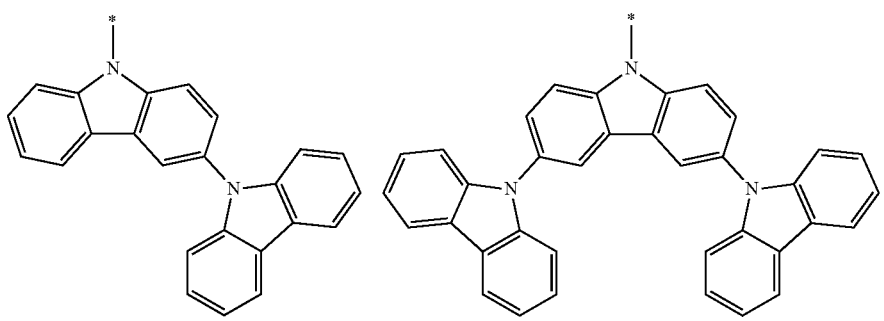
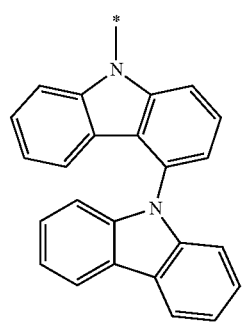 [SMILES: Cn1c2ccccc2c2c(-n3c4ccccc4c4ccccc43)cccc21]
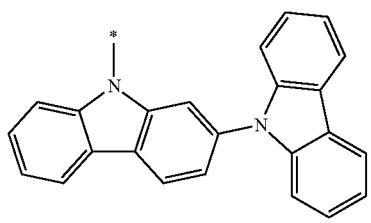 [SMILES: Cn1c2ccccc2c2ccc(-n3c4ccccc4c4ccccc43)cc21]
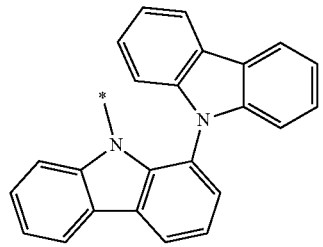 [SMILES: Cn1c2ccccc2c2cccc(-n3c4ccccc4c4ccccc43)c21]
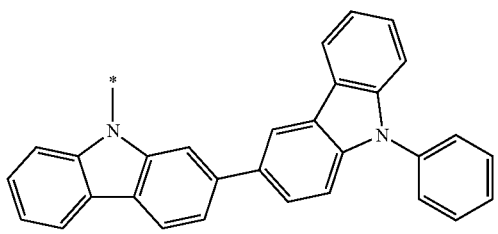 [SMILES: Cn1c2ccccc2c2ccc(-c3ccc4c(c3)c3ccccc3n4-c3ccccc3)cc21]

TABLE 8-continued
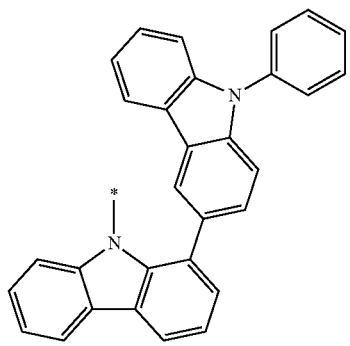 [SMILES: Cn1c2ccccc2c2cccc(-c3ccc4c(c3)c3ccccc3n4-c3ccccc3)c21] 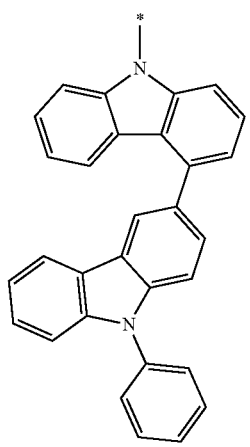 [SMILES: Cn1c2ccccc2c2c(-c3ccc4c(c3)c3ccccc3n4-c3ccccc3)cccc21]
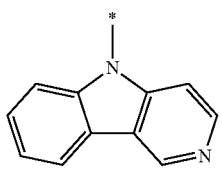 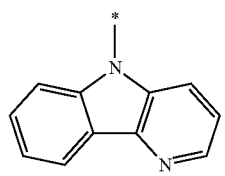
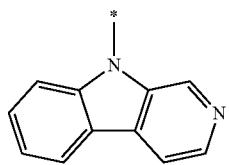 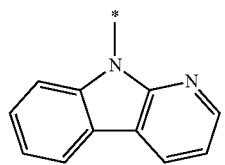
TABLE 9
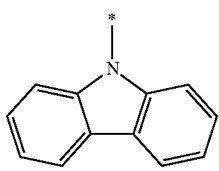 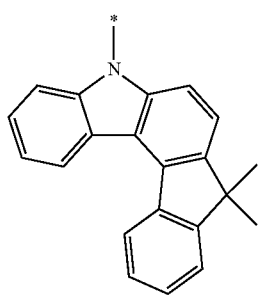 [SMILES: Cn1c2ccccc2c2c3c(ccc21)C(C)(C)c1ccccc1-3]
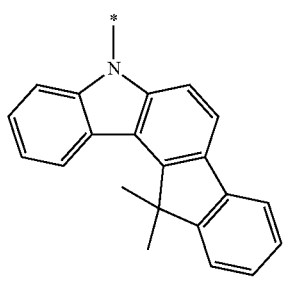 [SMILES: Cn1c2ccccc2c2c3c(ccc21)-c1ccccc1C3(C)C] 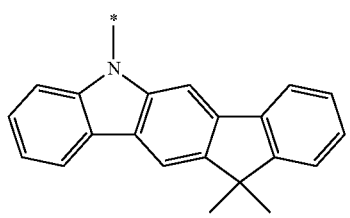 [SMILES: Cn1c2ccccc2c2cc3c(cc21)-c1ccccc1C3(C)C]

TABLE 9-continued
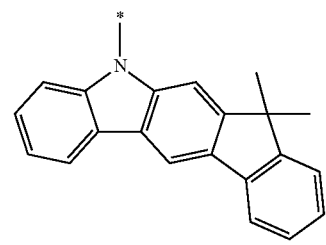 [SMILES: Cn1c2ccccc2c2cc3c(cc21)C(C)(C)c1ccccc1-3]
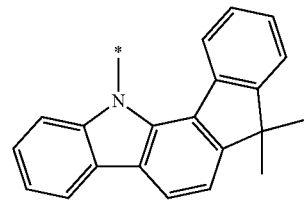 [SMILES: Cn1c2ccccc2c2ccc3c(c21)-c1ccccc1C3(C)C]
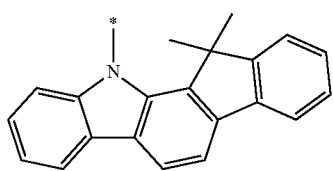 [SMILES: Cn1c2ccccc2c2ccc3c(c21)C(C)(C)c1ccccc1-3]
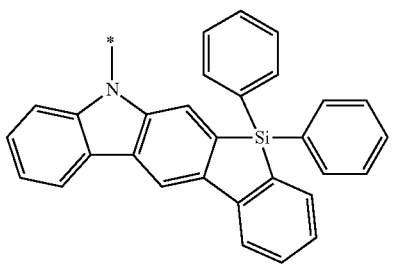 [SMILES: Cn1c2ccccc2c2cc3c(cc21)[Si](c1ccccc1)(c1ccccc1)c1ccccc1-3]
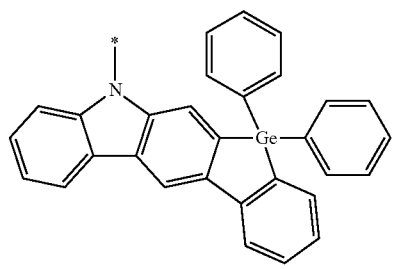
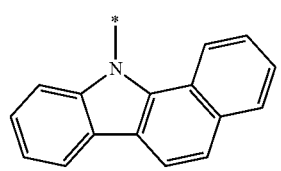 [SMILES: Cn1c2ccccc2c2ccc3ccccc3c21]
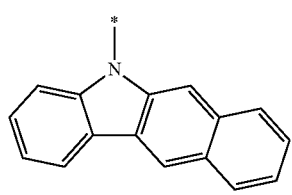 [SMILES: Cn1c2ccccc2c2cc3ccccc3cc21]
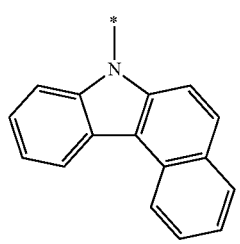 [SMILES: Cn1c2ccccc2c2c3ccccc3ccc21]
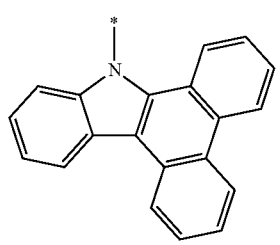 [SMILES: Cn1c2ccccc2c2c3ccccc3c3ccccc3c21]

TABLE 10
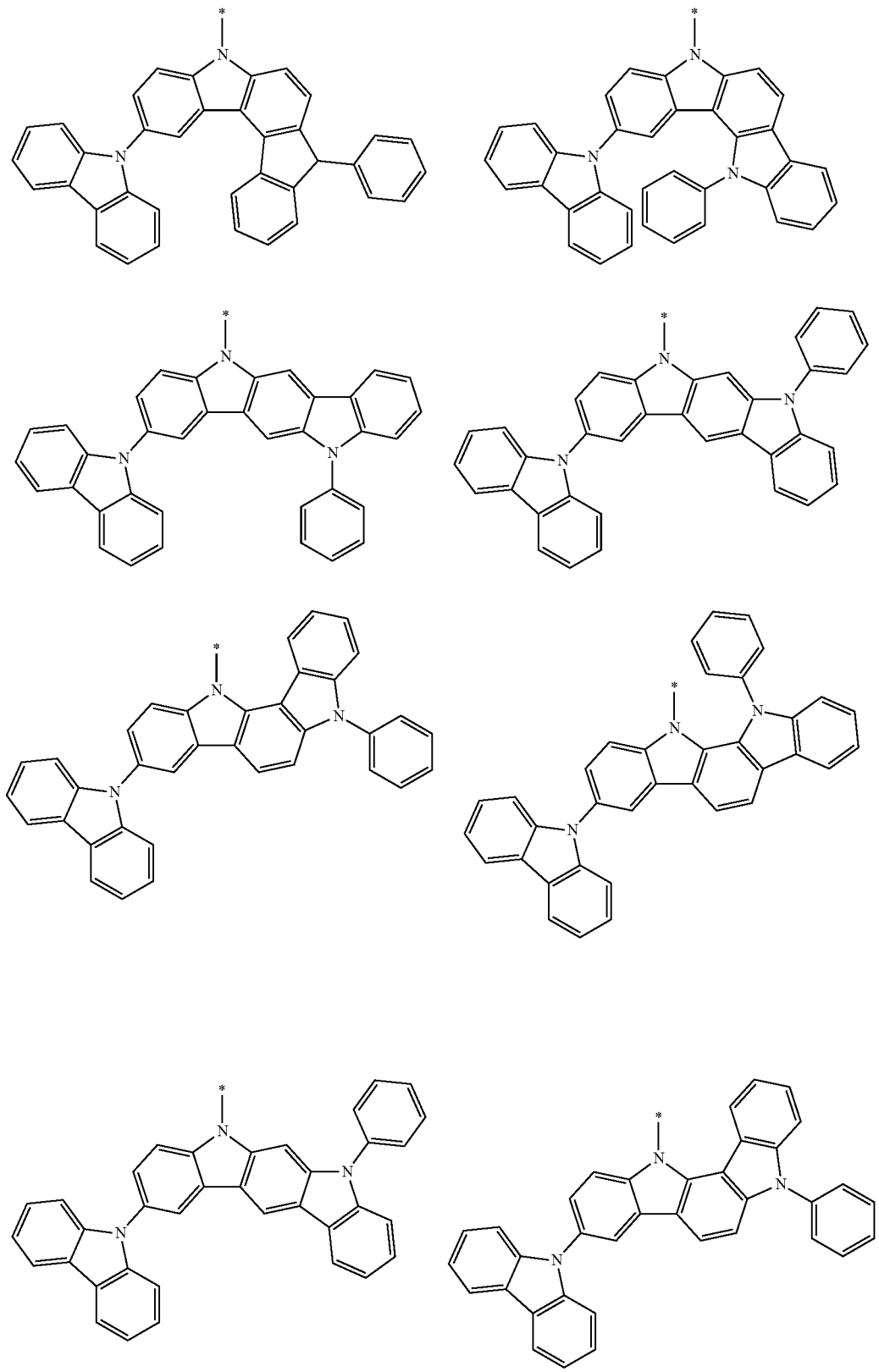

TABLE 10-continued
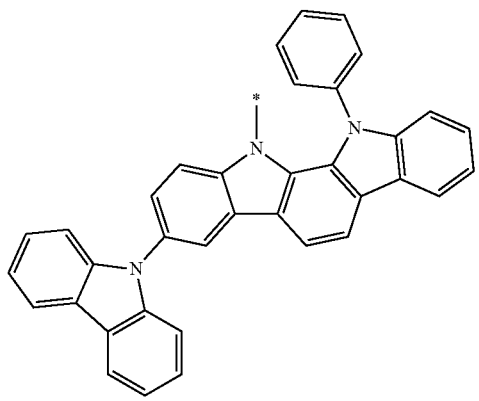 [SMILES: Cn1c2ccc(-n3c4ccccc4c4ccccc43)cc2c2ccc3c4ccccc4n(-c4ccccc4)c3c21]
TABLE 11
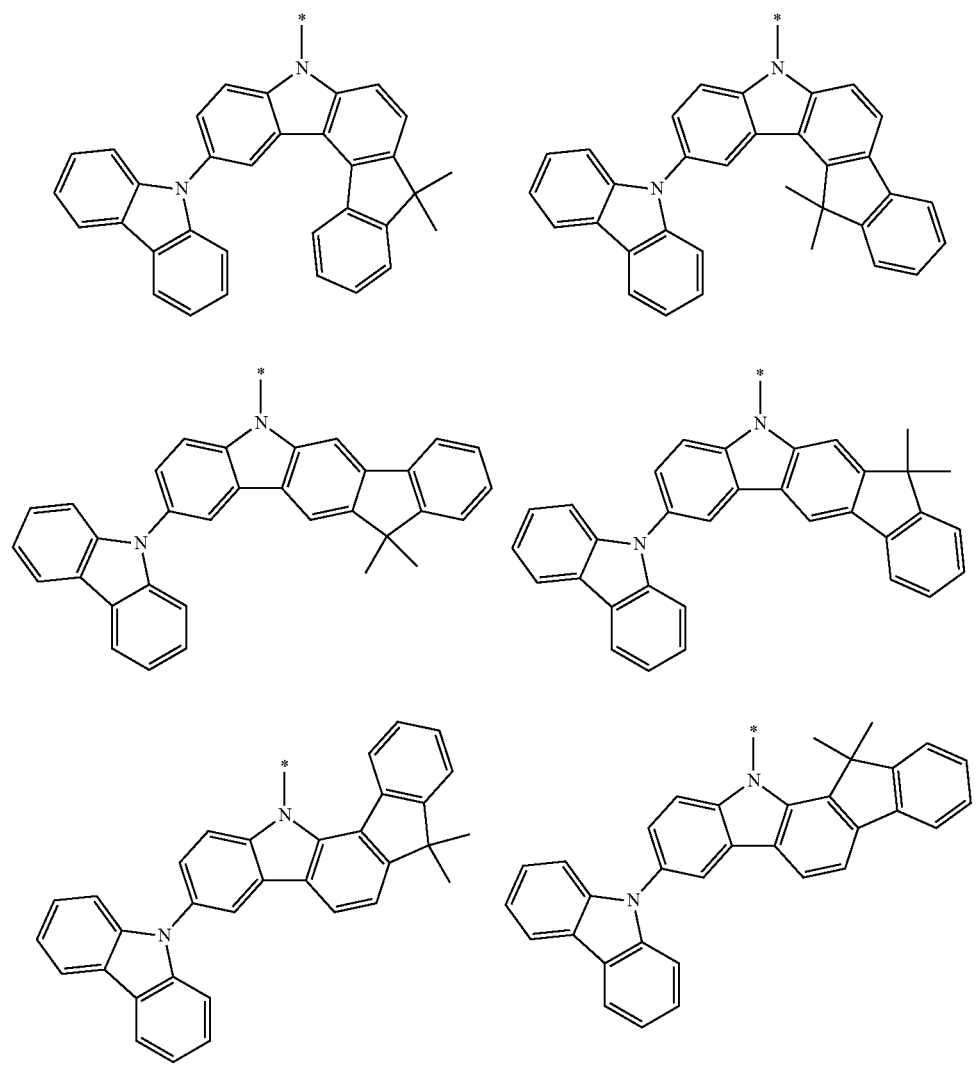

TABLE 11-continued
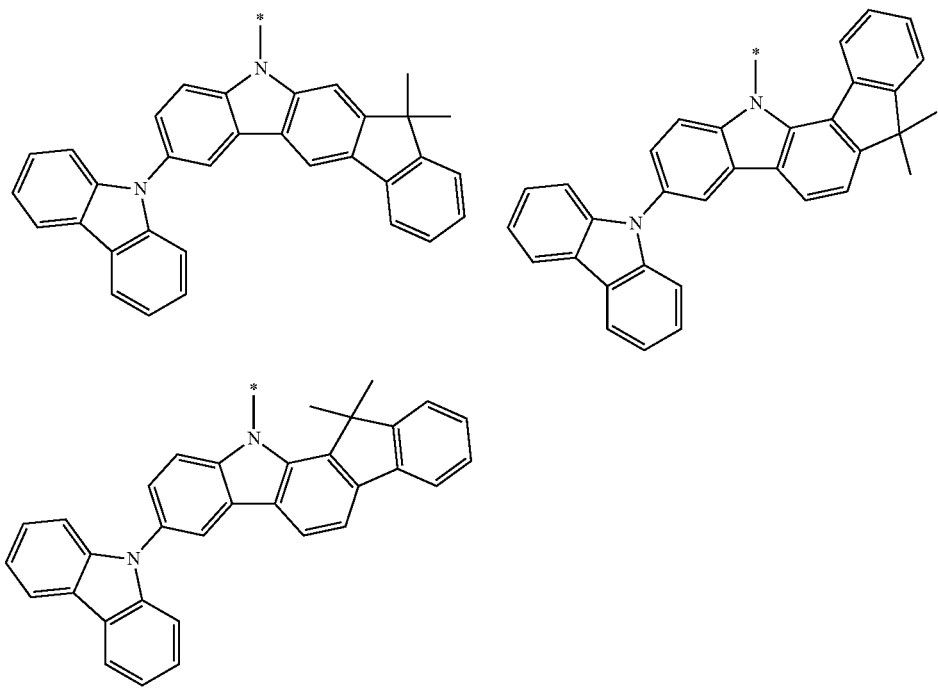
TABLE 12
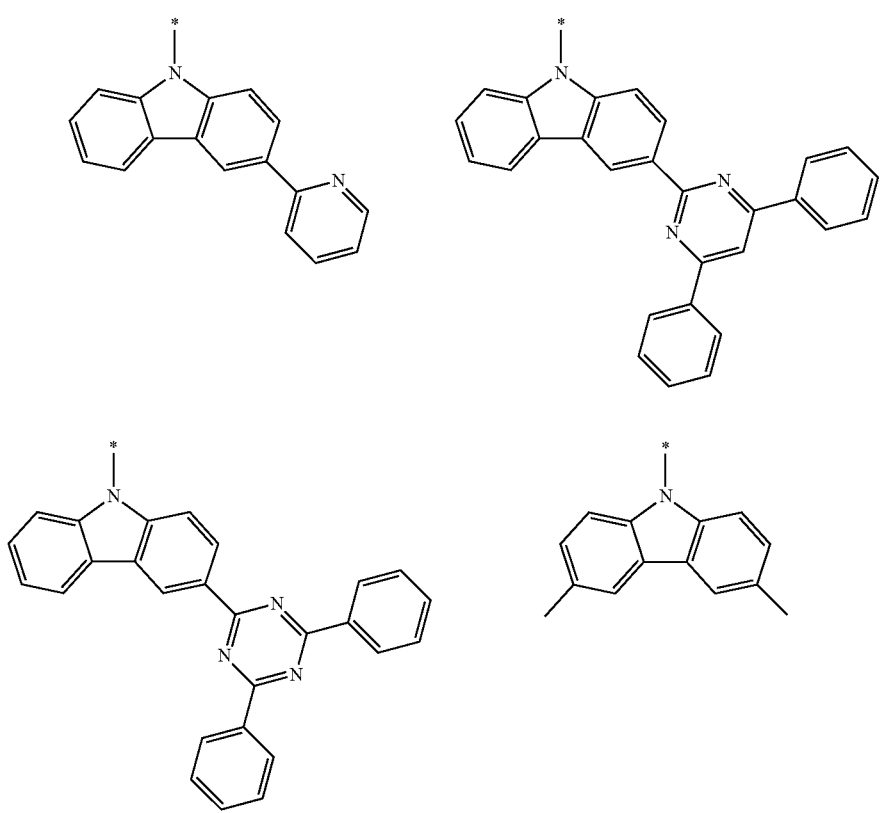

TABLE 12-continued
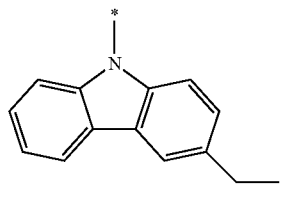 [SMILES: CCc1ccc2c(c1)c1ccccc1n2C] 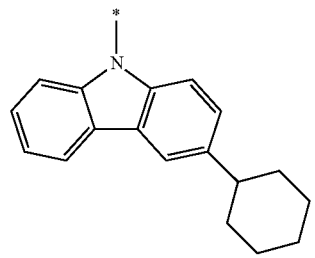 [SMILES: Cn1c2ccccc2c2cc(C3CCCCC3)ccc21]
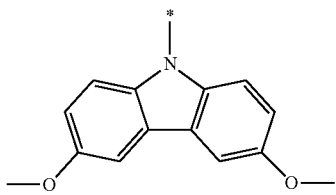 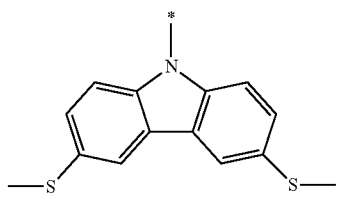
TABLE 13
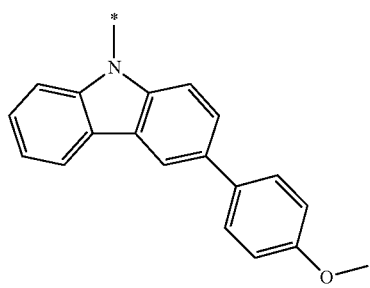 [SMILES: COc1ccc(-c2ccc3c(c2)c2ccccc2n3C)cc1] 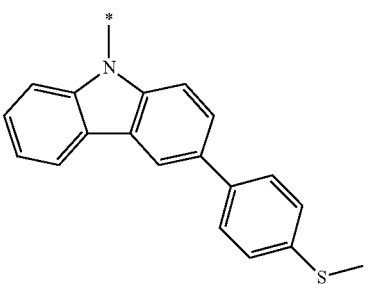 [SMILES: CSc1ccc(-c2ccc3c(c2)c2ccccc2n3C)cc1]
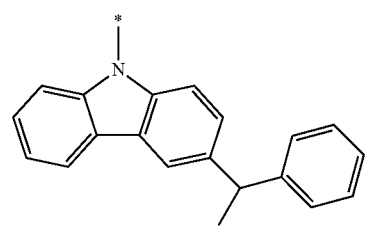 [SMILES: CC(c1ccccc1)c1ccc2c(c1)c1ccccc1n2C] 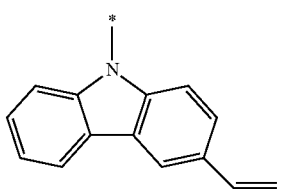 [SMILES: C=Cc1ccc2c(c1)c1ccccc1n2C]
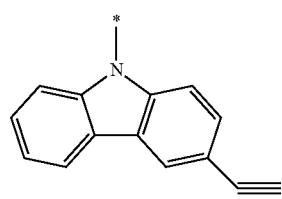 [SMILES: C#Cc1ccc2c(c1)c1ccccc1n2C] 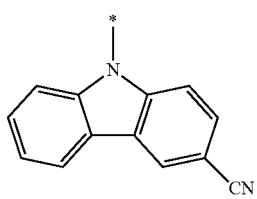 [SMILES: Cn1c2ccccc2c2cc(C#N)ccc21]
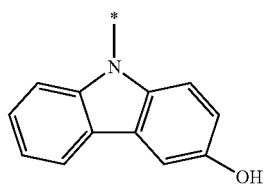 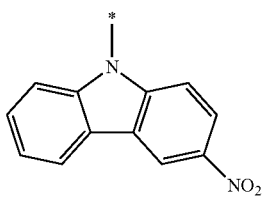 [SMILES: Cn1c2ccccc2c2cc([N+](=O)[O-])ccc21]

Preferable structures of the third compound will be described below.

Cz in the formula (3) is preferably a group represented by the formula (3B-1).

n in the formula (3) is preferably 1 or 2.

$Ar_1$ and $Ar_2$ in the formula (3A) are preferably each independently a monovalent or polyvalent residue derived from one of benzene, biphenyl, terphenyl, naphthalene, anthracene, benzanthracene, phenanthrene, benzophenanthrene, phenalene, picene, pentacene, pyrene, chrysene, benzochrysene, fluoranthene and triphenylene, more preferably a monovalent or polyvalent residue derived from one of benzene, biphenyl, terphenyl, naphthalene, phenanthrene, and triphenylene.

In the formula (3A), the divalent $Ar_1$ group and the divalent $Ar_2$ group are preferably each independently at least one group selected from the group consisting of o-phenylene group, m-phenylene group, p-phenylene group, 4,4'-biphenylylene group, 4,3'-biphenylylene group, 4,2'-biphenylylene group, 3,3'-biphenylylene group, 2,2'-biphenylylene group, 3,2'-biphenylylene group, 4,4"-p-terphenylene, 4,3"-p-terphenylene, 3,3"-p-terphenylene, 2,2'''-p-terphenylene, 4,2"-p-terphenylene, 4,2'-p-terphenylene, 4,3'-p-terphenylene, 4,4"-m-terphenylene, 4,3"-m-terphenylene, 4,2"-m-terphenylene, 4,3'-m-terphenylene, 3,3'-m-terphenylene, 2,2'-m-terphenylene, 4,4"-o-terphenylene, 3,3"-o-terphenylene, 2,2'''-o-terphenylene, 1,4-naphtylene group, 2,6-naphtylene group, 1,5-naphtylene group, 2,7-naphtylene group, 2,6-phenanthrylene group, 3,6-phenanthrylene group, 2,7-phenanthrylene group, fluoranthene-3,8-diyl group and 2,7-triphenylenylene group, more preferably at least one group selected from the group consisting of groups represented by formulae (3a-1) to (3a-27) below.

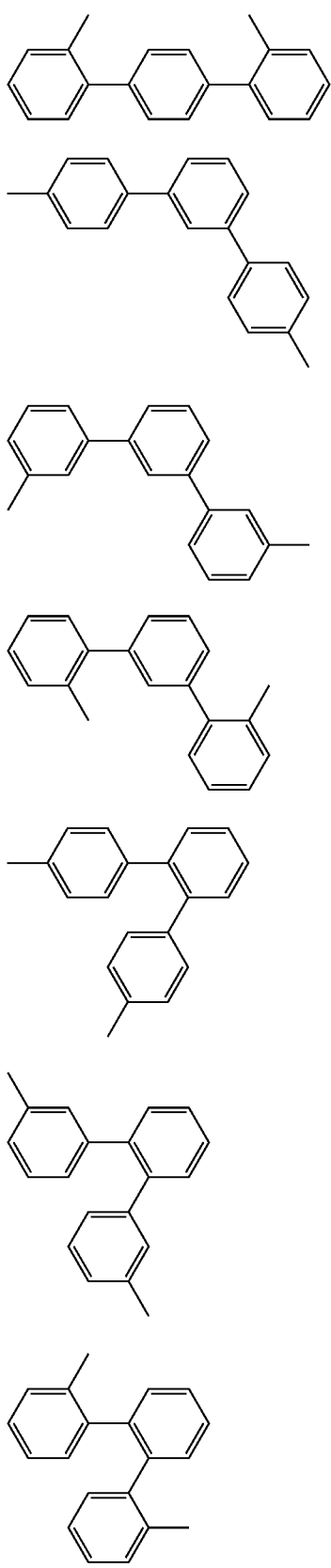
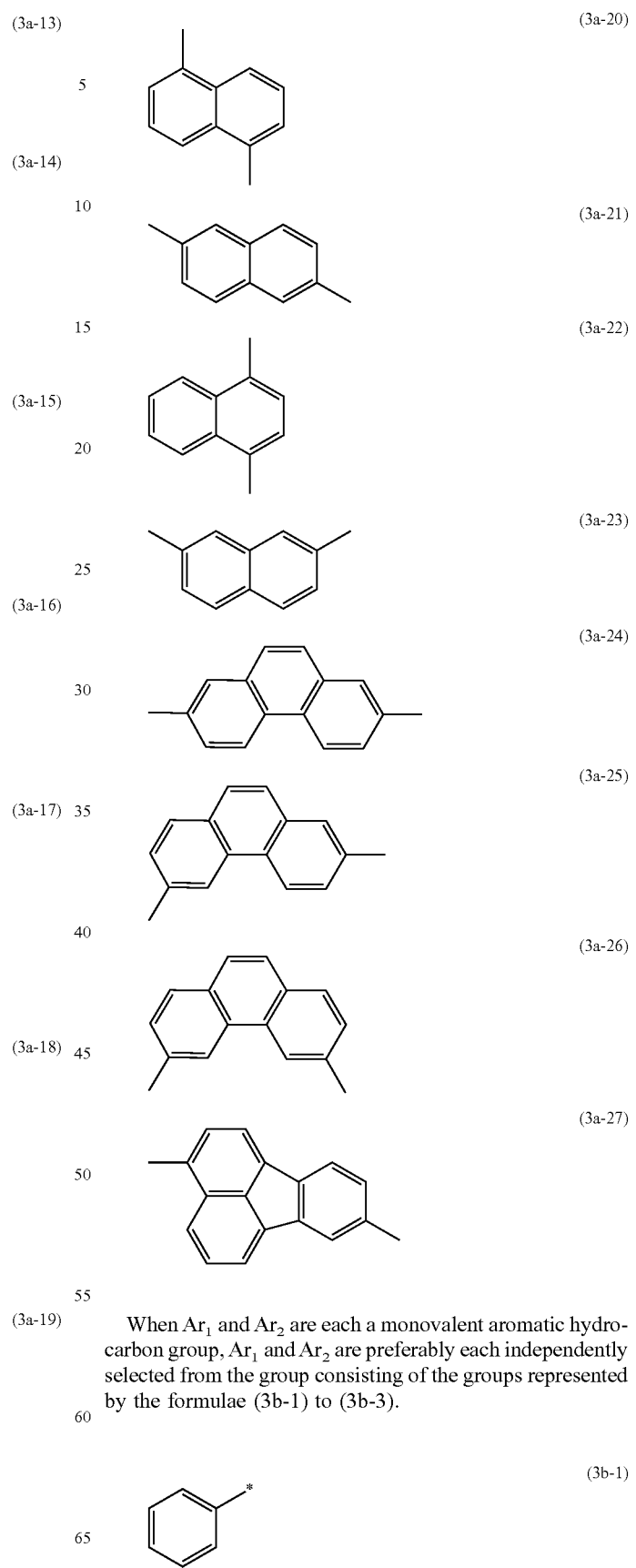
When $Ar_1$ and $Ar_2$ are each a monovalent aromatic hydrocarbon group, $Ar_1$ and $Ar_2$ are preferably each independently selected from the group consisting of the groups represented by the formulae (3b-1) to (3b-3).

-continued (3b-2)
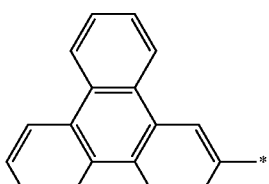

(3b-3)
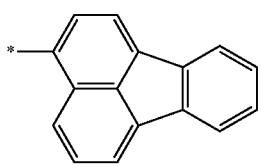

When Ar₁ and Ar₂ are each a divalent aromatic hydrocarbon group, Ar₁ and Ar₂ are preferably each independently selected from the group consisting of the groups represented by the formulae (3b-4) to (3b-10).

(3b-4)
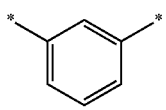

(3b-5)
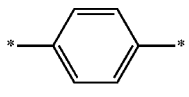

(3b-6)
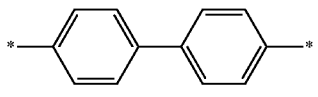

(3b-7)
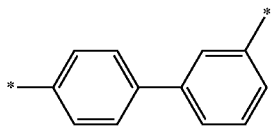

(3b-8)
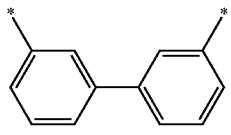

(3b-9)
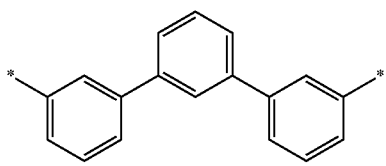

(3b-10)
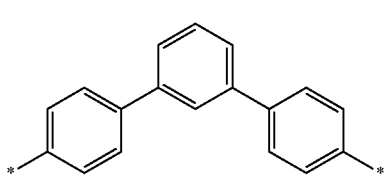

$X_1$ to $X_8$ in the formula (3B-1) are preferably each independently $CR_A$.

In the formula (3B-2), $X_1$ to $X_4$ are preferably each independently a carbon atom bonded to one of Ar₁ and Ar₂, or $CR_C$, one of $X_1$ to $X_4$ being the carbon atom bonded to one of Ar₁ and Ar₂ in the formula (3A), and $X_5$ to $X_8$ in the formula are preferably each independently $CR_D$.

In the formula (3B-1), it is preferable that no pair of adjacent ones of $R_A$ is mutually bonded.

$R_A$ in the formula (3B-1) is preferably a hydrogen atom.

In the formula (3B-2), it is preferable that no pair of adjacent ones of $R_C$ is mutually bonded and no pair of adjacent ones of $R_D$ is mutually bonded.

$R_C$ and $R_D$ in the formula (3B-2) are preferably hydrogen atoms.

$R_A$ in the formula (3B-1) and $R_B$, $R_C$ and $R_D$ in the formula (3B-2) are preferably each independently a hydrogen atom, a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, a carbazolyl group, a substituted carbazolyl group, a halogen atom, or a cyano group, more preferably a hydrogen atom, a substituted or unsubstituted aryl group having 6 to 30 ring carbon atoms, a substituted or unsubstituted alkyl group having 1 to 30 carbon atoms, or a substituted or unsubstituted alkyl halide group having 1 to 30 carbon atoms.

It is also preferable that the third compound is a compound represented by a formula (3C) below.

$$(Cz)_{\overline{n1}}\text{—}Ar_3 \qquad (3C)$$

In the formula (3C): Cz represents the same as Cz in the formula (3); Ar₃ represents the same as Ar₁ in the formula (3A), and n1 represents the same as n in the formula (3A).

n1 is preferably 2.

The third compound is preferably a compound represented by a formula (3C), where n1 is 2, and Ar₃ is preferably at least one group selected from the group consisting of the groups represented by the formulae (3a-1) to (3a-26).

The groups represented by the formulae (3a-1) to (3a-26) are substituted by the substituent E, or unsubstituted.

The substituent E meant by "substituted or unsubstituted" in the formulae (3A), (3B-1) and (3B-2) is preferably selected from the group consisting of a substituted or unsubstituted aryl group having 6 to 30 ring carbon atoms, a substituted or unsubstituted alkyl group having 1 to 30 carbon atoms, a substituted or unsubstituted cycloalkyl group having 3 to 30 ring carbon atoms, a cyano group, and a halogen atom.

The substituent E meant by "substituted or unsubstituted" in the formulae (3A), (3B-1) and (3B-2) is more preferably selected from the group consisting of a substituted or unsubstituted aryl group having 6 to 30 ring carbon atoms, and a substituted or unsubstituted alkyl group having 1 to 30 carbon atoms.

The substituent E meant by "substituted or unsubstituted" in the formulae (3A), (3B-1) and (3B-2) is further preferably selected from the group consisting of a substituted or unsubstituted aryl group having 6 to 18 ring carbon atoms, and a substituted or unsubstituted alkyl group having 1 to 6 carbon atoms.

More preferable structures of the third compound will be described below.

It is preferable that: Cz is a group represented by the formula (3B-1); n is 1 or 2;

$R_A$ in the formula (3B-1) is each independently a hydrogen atom; a substituted or unsubstituted aryl group having 6 to 30 ring carbon atoms, a substituted or unsubstituted alkyl group having 1 to 30 carbon atoms, a carbazolyl group, a substituted carbazolyl group, a halogen atom, or a cyano group;

in the formula (3A), k is 0, and $Ar_1$ is a monovalent or polyvalent residue derived from one of benzene, biphenyl, terphenyl, naphthalene, anthracene, benzanthracene, phenanthrene, benzophenanthrene, phenalene, picene, pentacene, pyrene, chrysene, benzochrysene, fluoranthene and triphenylene; and in the formulae (3A) and (3B-1), the substituent E meant by "substituted or unsubstituted" is a substitutent selected from the group consisting of an unsubstituted aryl group having 6 to 30 ring carbon atoms, an unsubstituted alkyl group having 1 to 30 carbon atoms, an unsubstituted cycloalkyl group having 3 to 30 ring carbon atoms, a cyano group, and a halogen atom.

It is preferable that: in the formula (3), n is 1 or 2;

in the formula (3A), k is 0, and $Ar_1$ and $Ar_2$ are each independently a monovalent or polyvalent residue derived from one of benzene, biphenyl, terphenyl, naphthalene, phenanthrene, fluoranthene and triphenylene;

$X_1$ to $X_8$ in the formula (3B-1) are each independently $CR_A$;

$X_1$ to $X_4$ in the formula (3B-2) are each independently a carbon atom bonded to $Ar_1$, or $CR_C$, one of X, to $X_4$ being the carbon atom bonded to $Ar_1$ in the formula (3A), $X_5$ to $X_8$ being each independently $CR_D$;

$R_A$ in the formula (3B-1) and $R_C$ and $R_D$ in the formula (3B-2) are each independently a hydrogen atom, a substituted or unsubstituted aryl group having 6 to 30 ring carbon atoms, or a substituted or unsubstituted alkyl group having 1 to 30 carbon atoms;

$Ar_1$ is at least one group selected from the group consisting of the groups represented by the formulae (3a-1) to (3a-26); and in the formulae (3A), (3B-1) and (3B-2), the substituent E meant by "substituted or unsubstituted" is a substitutent selected from the group consisting of an unsubstituted aryl group having 6 to 30 ring carbon atoms, and an unsubstituted alkyl group having 1 to 30 carbon atoms.

It is more preferable that: in the formula (3), n is 2;

in the formula (3A), k is 0;

in the formula (3B-1), $X_1$ to $X_8$ are each independently $CR_A$ and no pair of adjacent ones of $R_A$ is mutually bonded;

in the formula (3B-2), $X_1$ to $X_4$ are each independently a carbon atom bonded to $Ar_1$, or $CR_C$, one of $X_1$ to $X_4$ being the carbon atom bonded to $Ar_1$ in the formula (3A), no pair of adjacent ones of $R_A$ being mutually bonded, $X_5$ to $X_8$ being each independently $CR_D$ and no pair of adjacent ones of $R_D$ being mutually bonded;

$R_A$ in the formula (3B-1) and $R_C$ and $R_D$ in the formula (3B-2) are each independently a hydrogen atom; and in the formulae (3A), (3B-1) and (3B-2), the substituent E meant by "substituted or unsubstituted" is a substitutent selected from the group consisting of an unsubstituted aryl group having 6 to 18 ring carbon atoms, an unsubstituted alkyl group having 1 to 6 carbon atoms, and an unsubstituted alkyl halide group having 1 to 30 carbon atoms.

It is preferable that: in the formula (3), n is 2;

in the formula (3A), k is 0;

$Ar_1$ is at least one group selected from the group consisting of the groups represented by the formulae (3a-1) to (3a-26);

In the formula (3B-1), no pair of adjacent ones of $R_A$ is mutually bonded;

In the formula (3B-2), no pair of adjacent ones of $R_C$ is mutually bonded and no pair of adjacent ones of $R_D$ is mutually bonded;

$R_A$ in the formula (3B-1) and $R_C$ and $R_D$ in the formula (3B-2) are each a hydrogen atom; and in the formulae (3A), (3B-1) and (3B-2), the substituent E meant by "substituted or unsubstituted" is a substitutent selected from the group consisting of an unsubstituted aryl group having 6 to 18 ring carbon atoms, and an unsubstituted alkyl group having 1 to 6 carbon atoms.

It is preferable that: in the formula (3), n is 2;

in the formula (3A), k is 0;

$Ar_1$ is at least one group selected from the group consisting of the groups represented by the formulae (3a-1) to (3a-26);

in the formula (3B-1), $X_1$ to $X_8$ are each independently $CR_A$ and no pair of adjacent ones of $R_A$ is mutually bonded;

in the formula (3B-2), $X_1$ to $X_4$ are each independently a carbon atom bonded to $Ar_1$, or $CR_C$, one of $X_1$ to $X_4$ being the carbon atom bonded to $Ar_1$ in the formula (3A), no pair of adjacent ones of $R_A$ being mutually bonded, $X_5$ to $X_8$ being each independently $CR_D$ and no pair of adjacent ones of $R_D$ being mutually bonded;

$R_A$ in the formula (3B-1) and $R_C$ and $R_D$ in the formula (3B-2) are each a hydrogen atom; and in the formulae (3A), (3B-1) and (3B-2), the substituent E meant by "substituted or unsubstituted" is a substitutent selected from the group consisting of an unsubstituted aryl group having 6 to 18 ring carbon atoms, and an unsubstituted alkyl group having 1 to 6 carbon atoms.

Cz in the formula (3) is preferably a group selected from the group consisting of the groups represented by formulae (3B11) to (3B22) below.

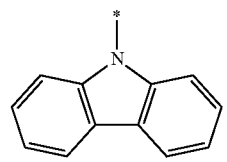

(3B11)

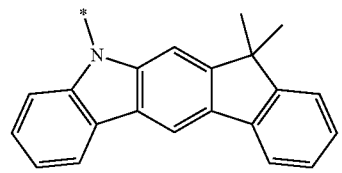

(3B12)

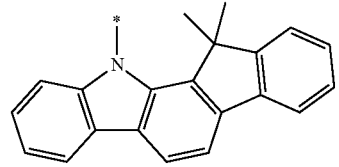

(3B13)

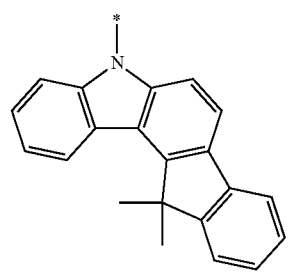

(3B14)

(3B15)
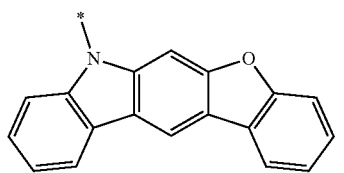

(3B16)
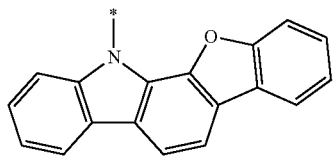

(3B17)
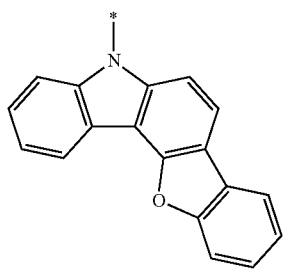

(3B18)
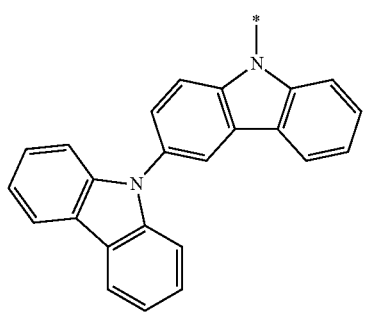

(3B19)
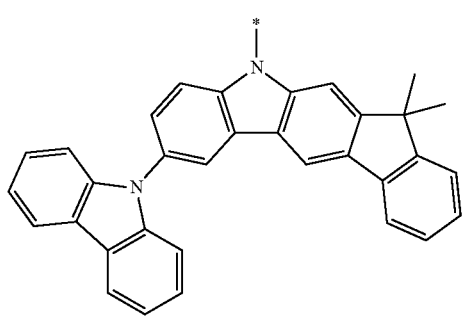

(3B20)
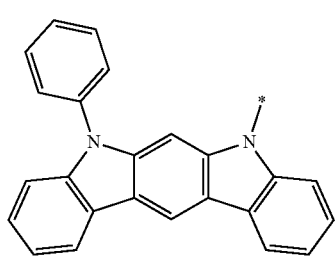

(3B21)
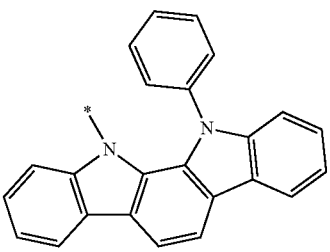

(3B22)
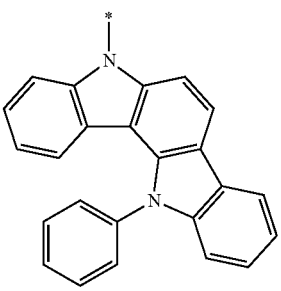

In the groups represented by the formulae (3B11) to (3B22), carbon atoms capable of being substituted has a substituent X, which is selected from the same groups for $R_A$ as a substituent, or has no substituent, and, when a plurality of substituents X are present, the plurality of substituents X are mutually the same or different. In the formulae (3B11) to (3B22), * represents a bonding position.

Cz in the formula (3) is preferably a group selected from the group consisting of the groups represented by the formulae (3B11) to (3B17).

Method of Preparing Third Compound

The third compound can be prepared by any known method.

Specific examples of the third compound of the first exemplary embodiment are shown below. It should be noted that the third compound according to the invention is not limited to these specific examples.

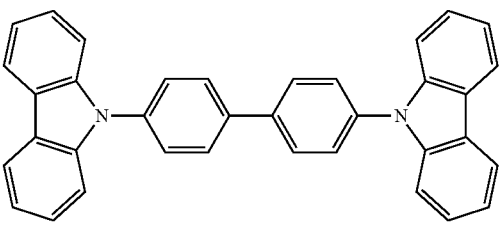

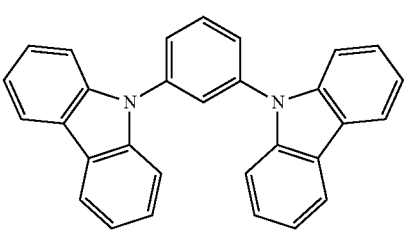

191
-continued

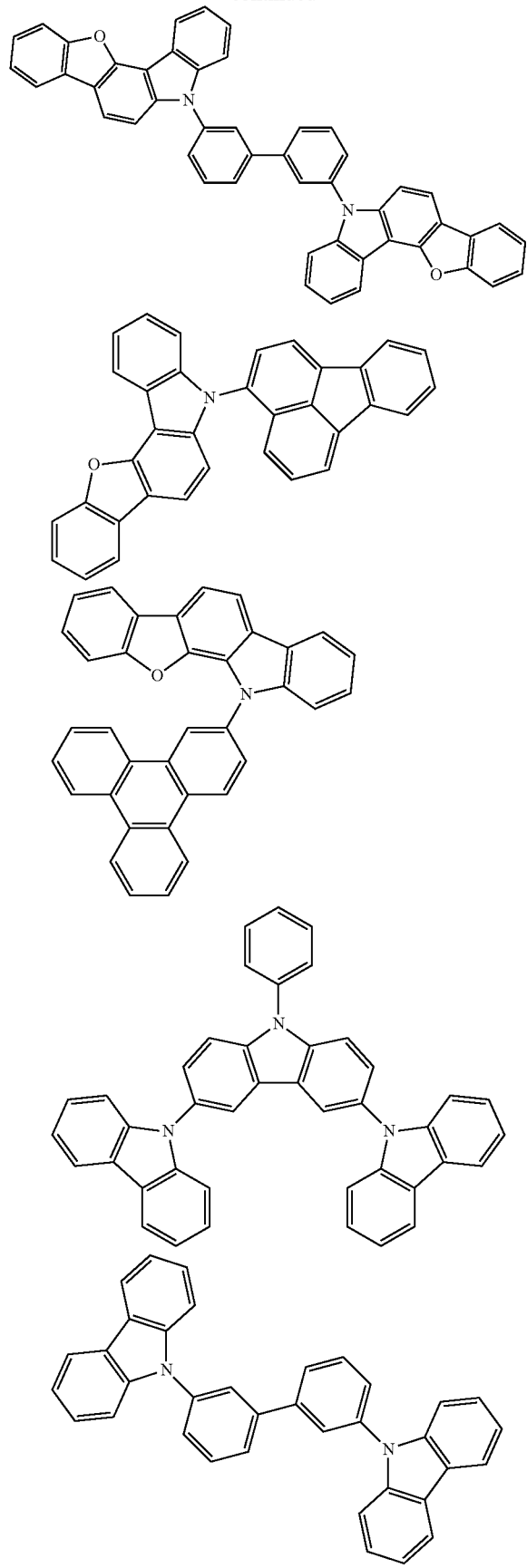

192
-continued

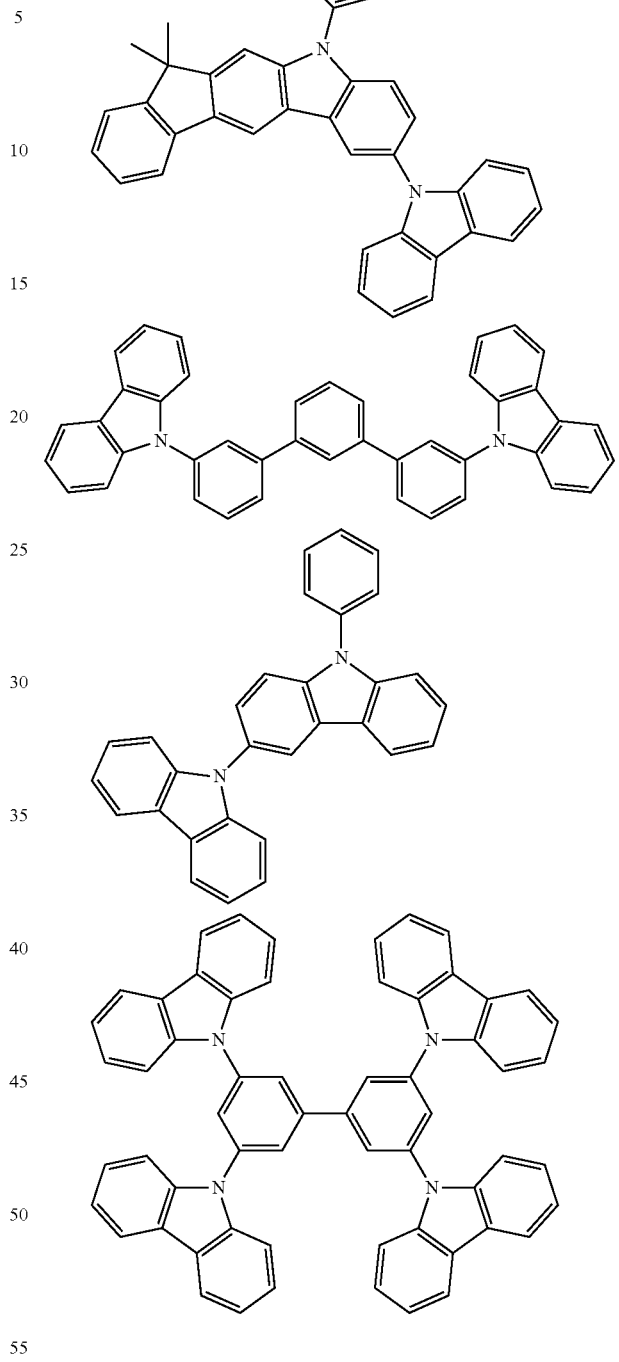

Anode

Metal having a large work function (specifically, 4.0 eV or more), an alloy, an electrically conductive compound and a mixture thereof are preferably usable as the anode formed on the substrate. Specific examples of the material include indium oxide-tin oxide (ITO: Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, and a mixture thereof, which have a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamido](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly (styrene sulfonic acid)(PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ cm$^2$/(V·s) or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance.

When the hole transporting layer includes two or more layers, one of the layers with a larger energy gap is preferably provided closer to the emitting layer. An example of the material with a larger energy gap is HT-2 used in later-described Examples.

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: Almq3), bis(10-hydroxybenzo[h]quinolinato)beryllium (abbreviation: BeBq2), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzoimidazole compound is preferably usable. The above-described substances mostly have an electron mobility of $10^{-6}$ cm$^2$/(V·s) or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Moreover, a high polymer compound is usable for the electron transporting layer. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected form the anode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

The film thickness of each organic layer of the organic EL device in the exemplary embodiment is subject to no limitation except for the thickness particularly described above. However, the thickness is typically preferably in a range of several nanometers to 1 μm because an excessively thin film is likely to entail defects such as a pin hole while an excessively thick film requires high applied voltage and deteriorates efficiency.

Electronic Device

An electronic device of the exemplary embodiment is provided with the organic EL device according to the exemplary embodiment. Examples of the electronic device include a display device and an illuminator. Examples of the display device include a display component (e.g., en organic EL panel module), TV, mobile phone, tablet and personal computer. Examples of the light-emitting unit include an illuminator and a vehicle light.

Herein, numerical ranges represented by "x to y" represents a range whose lower limit is the value (x) recited before "to" and whose upper limit is the value (y) recited after "to."

Herein, the phrase "Rx and Ry are mutually bonded to form a ring" means, for instance, that Rx and Ry include a carbon atom, a nitrogen atom, an oxygen atom, a sulfur atom or a silicon atom, the atom(s) contained in Rx (a carbon atom, a nitrogen atom, an oxygen atom, a sulfur atom or a silicon atom) and the atom(s) contained in Ry (a carbon atom, a nitrogen atom, an oxygen atom, a sulfur atom or a silicon atom) are bonded via a single bond(s), a double bond(s), a triple bond, and/or a divalent linking group(s) to form a ring having 5 or more ring atoms (specifically, a heterocycle or an aromatic hydrocarbon ring), x represents a numeral(s), a character(s) or a combination of a numeral(s) and character(s). y represents a numeral(s), a character(s) or a combination of a numeral(s) and character(s).

The divalent linking group is not limited. Examples of the divalent linking group include —O—, —CO—, —CO$_2$—, —S—, —SO—, —SO$_2$—, —NH—, —NRa—, and a group provided by a combination of two or more of these linking group.

Specific examples of the heterocycle include a cyclic structure (heterocycle) provided by removing a bond from the "heteroaryl group having ring 5 to 30 ring atoms" exemplified in later-described "Description of Substituents in the Formula." These cyclic structures each may have a substituent.

Specific examples of the aromatic hydrocarbon ring include a cyclic structure (aromatic hydrocarbon ring) provided by removing a bond from the "aryl group having ring 6 to 30 ring carbon atoms" exemplified in later-described "Description of Substituents in the Formula." These aromatic hydrocarbon rings each may have a substituent.

Examples of Ra include a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms.

For instance, when "Rx and Ry are mutually bonded to form a ring," an atom(s) contained in $Rx_1$ and an atom(s) contained in $Ry_1$ in a molecular structure represented by a formula (E1) below form a ring (cyclic structure) E represented by a formula (E2); an atom(s) contained in $Rx_1$ and an atom(s) contained in $Ry_1$ in a molecular structure represented by a formula (F1) below form a ring (cyclic structure) F represented by a formula (F2); an atom(s) contained in $Rx_1$ and an atom(s) contained in $Ry_1$ in a molecular structure represented by a formula (G1) below form a ring (cyclic structure) G represented by a formula (G2); an atom(s) contained in $Rx_1$ and an atom(s) contained in $Ry_1$ in a molecular structure represented by a formula (H1) below form a ring (cyclic structure) H represented by a formula (H2); or an atom(s) contained in $Rx_1$ and an atom(s) contained in Ry, in a molecular structure represented by a formula (I1) below form a ring (cyclic structure) I represented by a formula (I2).

In the formulae (E1) to (I1), * each independently represent a bonding position to another atom in a molecule. The two * in the formulae (E1), (F1), (G1), (H1) and (I1) correspond to two * in the formula (E2), (F2), (G2), (H2) and (I2), respectively.

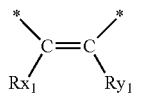

(E1)

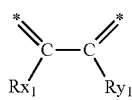

(F1)

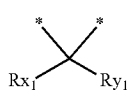

(G1)

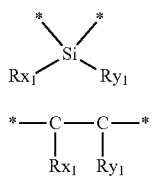

(H1)

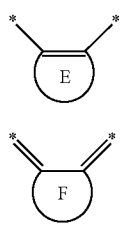

(I1)

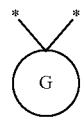

(E2)

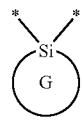

(F2)

-continued

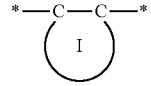

(G2)

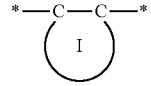

(H2)

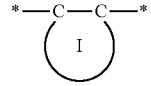

(I2)

In the molecular structures represented by the formulae (E2) to (I2), E to I each represent a cyclic structure (the ring having 5 or more ring atoms). In the formulae (E2) to (I2), * each independently represent a bonding position to another atom in a molecule. The two * in the formula (E2) corresponds to two * in the formula (E1). The two * in the formulae (F2) to (I2) correspond to two * in the formulae (F1) to (I1).

For instance, when $Rx_1$ and $Ry_1$ in the formula (E1) are mutually bonded to form the ring E according to the formula (E2) and the ring E is an unsubstituted benzene ring, the molecular structure represented by the formula (E1) is a molecular structure represented by a formula (E3) below. The two * in the formula (E3) correspond to two * in the formulae (E2) and (E1).

For instance, when $Rx_1$ and $Ry_1$ in the formula (E1) are mutually bonded to form the ring E according to the formula (E2) and the ring E is an unsubstituted pyrrole ring, the molecular structure represented by the formula (E1) is a molecular structure represented by a formula (E4) below. The two * in the formula (E4) correspond to two * in the formulae (E2) and (E1). In the formulae (E3) and (E4), * each independently represent a bonding position to another atom in a molecule.

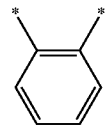

(E3)

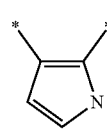

(E4)

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent(s), carbon atom(s) contained in the substituent(s) is not counted in the ring carbon atoms. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring and/or a naphthalene ring is substituted by a substituent (e.g., an alkyl group), the number of carbon atoms of the alkyl group is not counted in the number of the ring carbon atoms. When a fluorene ring is substituted by a substituent (e.g., a fluorene ring) (i.e., a spirofluorene ring is included), the number of carbon atoms of the fluorene ring as the substituent is not counted in the number of the ring carbon atoms of the fluorene ring.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, ring assembly). Atom(s) not forming a ring and atom(s) included in a substituent when the ring is substituted by the substituent are not counted in the number of the ring atoms. Unless specifically described, the same applies to the "ring atoms" described later. For instance, a pyridine ring has six ring atoms, a quinazoline ring has ten ring atoms, and a furan ring has five ring atoms. A hydrogen atom(s) and/or an atom(s) of a substituent which are bonded to carbon atoms of a pyridine ring and/or quinazoline ring are not counted in the ring atoms. When a fluorene ring is substituted by a substituent (e.g., a fluorene ring) (i.e., a spirofluorene ring is included), the number of atoms of the fluorene ring as the substituent is not counted in the number of the ring atoms of the fluorene ring.

Description of Substituents in the Formula in the Specification (Description of Substituents)

Examples of the aryl group having 6 to 30 ring carbon atoms (occasionally referred to as an aromatic hydrocarbon group) in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom in a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms described later herein.

The heteroaryl group (occasionally, referred to as heterocyclic group, heteroaromatic ring group or aromatic heterocyclic group) having 5 to 30 ring atoms herein preferably contains at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group having 5 to 30 ring atoms in the exemplary embodiment are a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthirdinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

Herein, the heterocyclic group preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further preferable. A nitrogen atom in position 9 of 1-carbazolyl group, 2-carbazolyl group, 3-carbazolyl group and 4-carbazolyl group is preferably substituted by the substituted or unsubstituted aryl group having 6 to 30 ring carbon atoms or the substituted or unsubstituted heterocyclic group having 5 to 30 ring atoms described herein.

Herein, the heterocyclic group may be a group derived from any one of moieties represented by formulae (XY-1) to (XY-18) below.

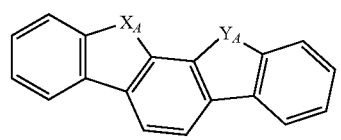

(XY-1)

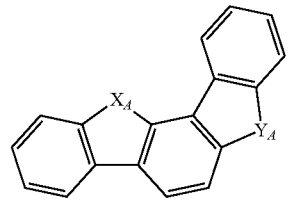

(XY-2)

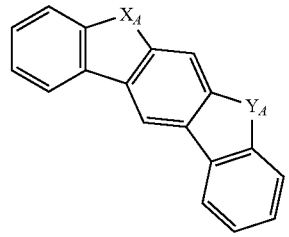

(XY-3)

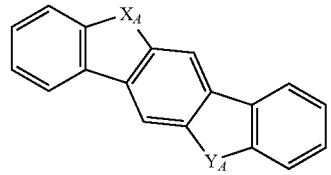

(XY-4)

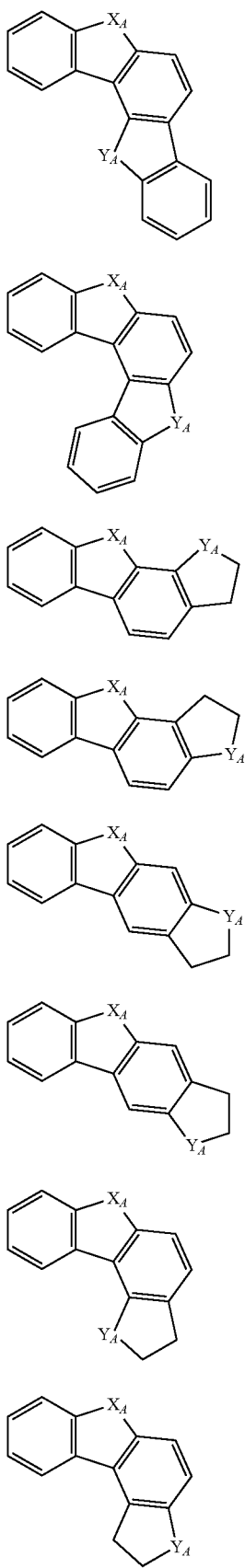

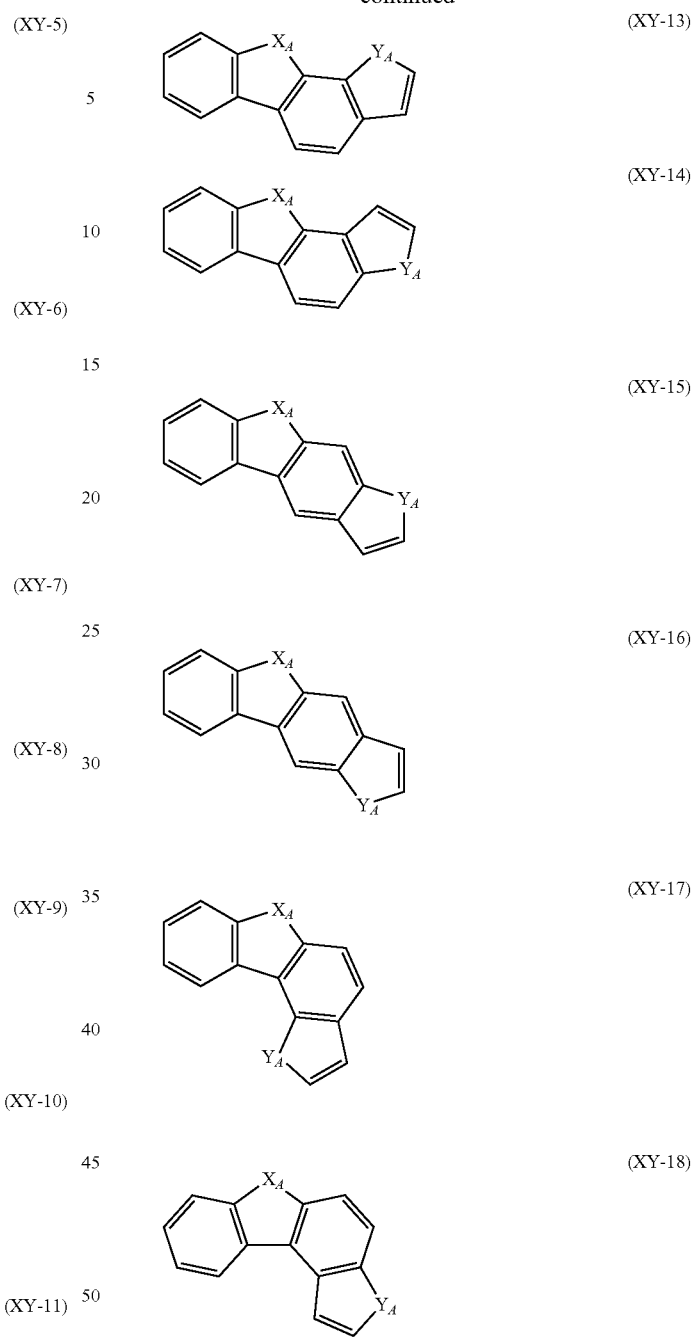

In the formulae (XY-1) to (XY-18), $X_A$ and $Y_A$ each independently represent a hetero atom, and preferably represent an oxygen atom, sulfur atom, selenium atom, silicon atom or germanium atom. Each of the moieties represented by the respective formulae (XY-1) to (XY-18) has a bond at any position to provide a heterocyclic group. The heterocyclic group may be substituted.

Herein, examples of the substituted or unsubstituted carbazolyl group may include a group in which a carbazole ring is further fused with a ring(s) as shown in the following formulae (XY-19) to (XY-22). Such a group may have a substituent. Moreover, the position of the bond may be changed as needed.

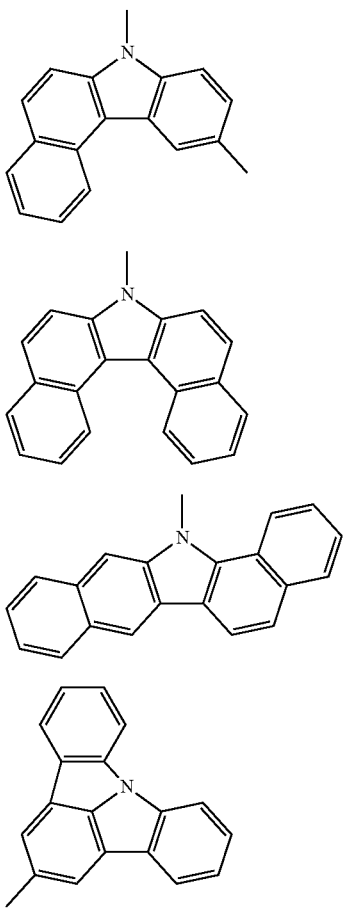

(XY-19)

(XY-20)

(XY-21)

(XY-22)

The alkyl group having 1 to 30 carbon atoms herein may be linear, branched or cyclic. Also, the alkyl group may be an alkyl halide group.

Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear or branched alkyl group preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are preferable.

Herein, examples of the cyclic alkyl group include a cycloalkyl group having 3 to 30 ring carbon atoms.

Examples of the cycloalkyl group having 3 to 30 ring carbon atoms herein are a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are more preferable.

Herein, the alkyl halide group provided by substituting the alkyl group with a halogen atom is exemplified by an alkyl halide group provided by substituting the alkyl group having 1 to 30 carbon atoms with at least one halogen atom, preferably at least one fluorine atom.

Herein, examples of the alkyl halide group having 1 to 30 carbon atoms include a fluoromethyl group, difluoromethyl group, trifluoromethyl group, fluoroethyl group, trifluoromethylmethyl group, trifluoroethyl group, and pentafluoroethyl group.

Herein, examples of a substituted silyl group include an alkylsilyl group having 3 to 30 carbon atoms and an arylsilyl group having 6 to 30 ring carbon atoms.

Herein, the alkylsilyl group having 3 to 30 carbon atoms is exemplified by a trialkylsilyl group having the above examples of the alkyl group having 1 to 30 carbon atoms. Specific examples of the alkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be mutually the same or different.

Herein, examples of the arylsilyl group having 6 to 30 ring carbon atoms include a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

Herein, alkylsulfonyl group is represented by $-SO_2R_w$. $R_w$ in $-SO_2R_w$ represents a substituted or unsubstituted alkyl group.

Examples of the substituted or unsubstituted alkylsulfonyl having 1 to 30 carbon atoms herein include a group represented by the above $-SO_2R_w$, where $R_w$ is substituted or unsubstituted alkyl group having 1 to 30 carbon atoms.

Herein, an aryl group in an aralkyl group (occasionally referred to as an arylalkyl group) is an aromatic hydrocarbon group or a heterocyclic group.

The aralkyl group having 7 to 30 carbon atoms herein is preferably a group having an aryl group having 6 to 30 ring carbon atoms and is represented by $-Z_3-Z_4$. $Z_3$ is exemplified by an alkylene group corresponding to the above alkyl group having 1 to 30 carbon atoms. $Z_4$ is exemplified by the above aryl group having 6 to 30 ring carbon atoms. In this aralkyl group, an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The alkoxy group having 1 to 30 carbon atoms herein is represented by —$OZ_1$. $Z_1$ is exemplified by the above alkyl group having 1 to 30 carbon atoms. Examples of the alkoxy group include a methoxy group, ethoxy group, propoxy group, butoxy group, pentyloxy group and hexyloxy group. The alkoxy group preferably has 1 to 20 carbon atoms.

A halogenated alkoxy group provided by substituting an alkoxy group with a halogen atom is exemplified by one provided by substituting an alkoxy group having 1 to 30 carbon atoms with one or more fluorine atoms.

Herein, examples of an aryl group in an aryloxy group (occasionally referred to as an arylalkoxy group) include a heteroaryl group.

The arylalkoxy group having 6 to 30 ring carbon atoms herein is represented by —$OZ_2$. $Z_2$ is exemplified by the above aryl group having 6 to 30 ring carbon atoms. The arylalkoxy group preferably has 6 to 20 ring carbon atoms. The arylalkoxy group is exemplified by a phenoxy group.

Herein, the substituted amino group is represented by —$NHR_V$ or —$N(R_V)_2$. $R_V$ is exemplified by the above alkyl group having 1 to 30 carbon atoms or aryl group having 6 to 30 ring carbon atoms.

Herein, the alkenyl group having 2 to 30 carbon atoms is linear or branched. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

The alkynyl group having 2 to 30 carbon atoms herein may be linear or branched. Examples of the alkynyl group having 2 to 30 carbon atoms are an ethynyl group, a propynyl group and a 2-phenylethynyl group.

Herein, the alkylthio group having 1 to 30 ring carbon atoms and the arylthio group having 6 to 30 ring carbon atoms is represented by —$SR_v$. $R_V$ is exemplified by the above alkyl group having 1 to 30 carbon atoms or aryl group having 6 to 30 ring carbon atoms. The alkylthio group preferably has 1 to 20 carbon atoms. The arylthio group preferably has 6 to 20 ring carbon atoms.

Herein, examples of the halogen atom include a fluorine atom, a chlorine atom, a bromine atom and an iodine atom, among which a fluorine atom is preferable.

Herein, the substituted phosphino group is exemplified by a phenyl phosphanyl group.

Herein, the arylcarbonyl group having 6 to 30 ring carbon atoms is represented by —COY'. Y' is exemplified by the above "aryl group having 6 to 30 ring carbon atoms." Herein, examples of the arylcarbonyl group having 6 to 30 ring carbon atoms include a phenyl carbonyl group, diphenyl carbonyl group, naphthyl carbonyl group, and triphenyl carbonyl group.

The acyl group having 2 to 31 carbon atoms herein is represented by —COR'. R' is exemplified by the above alkyl group having 1 to 30 carbon atoms. Herein, the acyl group having 2 to 31 carbon atoms is exemplified by an acetyl group and a propionyl group.

Herein, the substituted phosphoryl group is represented by a formula (P) below.

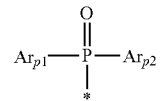

(P)

Herein, the substituted ester group is exemplified by an alkyl ester group. An alkyl ester group is represented by —$C(=O)OR^E$. $R^E$ is exemplified by a substituted or unsubstituted alkyl group having 1 to 30 (preferably 1 to 10) carbon atoms.

A siloxanyl group herein is a silicon-compound group with an ether bond and is exemplified by a trimethyl siloxanyl group.

In the formula (P), examples of $Ar_{P1}$, and $Ar_{P2}$ include a substituent selected from the group consisting of an alkyl group having 1 to 30 (preferably 1 to 10, more preferably 1 to 6 carbon atoms), and an aryl group having 6 to 30 ring carbon atoms (preferably 6 to 20, more preferably 6 to 14 ring carbon atoms). The alkyl group having 1 to 30 carbon atoms is exemplified by the above alkyl groups having 1 to 30 carbon atoms. The aryl group having 6 to 30 ring carbon atoms is exemplified by the above aryl groups having 6 to 30 ring carbon atoms.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a ring including a saturated ring, unsaturated ring, or aromatic ring.

Herein, a hydrogen atom includes isotope having different numbers of neutrons, specifically, protium, deuterium and tritium.

Herein, the substituent meant by "substituted or unsubstituted" is at least one group selected from the group consisting of an aryl group having 6 to 30 ring carbon atoms, heteroaryl group having 5 to 30 ring atoms, linear alkyl group having 1 to 30 carbon atoms, branched alkyl group having 3 to 30 carbon atoms, cycloalkyl group having 3 to 30 ring carbon atoms, alkyl halide group having 1 to 30 carbon atoms, substituted or unsubstituted silyl group (e.g. alkylsilyl group having 3 to 30 carbon atoms and arylsilyl group having 6 to 30 ring carbon atoms), alkoxy group having 1 to 30 carbon atoms, aryloxy group having 6 to 30 carbon atoms, substituted or unsubstituted amino group, alkylthio group having 1 to 30 carbon atoms, arylthio group having 6 to 30 ring carbon atoms, aralkyl group having 7 to 30 carbon atoms, alkenyl group having 2 to 30 carbon atoms, halogen atom, alkynyl group having 2 to 30 carbon atoms, cyano group, hydroxy group, nitro group, carboxy group, and substituted phosphoryl group.

It should be noted that the substituent meant by "substituted or unsubstituted" in the third compound does not include a heteroaryl group having 5 to 30 ring atoms and substituted or unsubstituted amino group.

The substituent meant by "substituted or unsubstituted" herein also includes a diaryl boron group ($Ar_{B1}Ar_{B2}B$—). Examples of $Ar_{B1}$ and $Ar_{B2}$ include the above "aryl group having 6 to 30 ring carbon atoms."

Specific examples and preferable examples of the substituent meant by "substituted or unsubstituted" include the same specific examples and preferable examples for the substituents in the "description of the substituents."

The substituent E meant by "substituted or unsubstituted" for the third compound is preferably at least one group selected from the group consisting of an aryl group having 6 to 20 (preferably 6 to 12) ring carbon atoms, a linear alkyl group having 1 to 10 (preferably 1 to 6) carbon atoms, a branched alkyl group having 3 to 10 (preferably 3 to 6) carbon atoms, an alkyl halide group having 1 to 10 (preferably 1 to 6) carbon atoms, a cycloalkyl group having 3 to 20 (preferably 3 to 12) ring carbon atoms, a silyl group, an alkoxy group having 1 to 10 (preferably 1 to 6) carbon atoms, an alkoxy halide group having 1 to 10 (preferably 1 to 6) carbon atoms, an aryloxy group having 6 to 20 (preferably 6 to 12) ring carbon atoms, an alkylthio group having 1 to 10 (preferably 1 to 6) carbon atoms, an arylthio group having 6 to 20 (preferably 6 to 12) ring carbon atoms, an aralkyl group having 7 to 20 (preferably 7 to 12) ring carbon atoms, an alkenyl group having 2 to 10 (preferably 2 to 6) carbon atoms, a halogen atom, an alkynyl group having 2 to 10 (preferably 2 to 6) carbon atoms, a cyano group, a hydroxy group, a nitro group, and a carboxy group, and specific preferable substituents mentioned in the description for each of the substituents are preferable.

When the substituent E meant by "substituted or unsubstituted" for the third compound is further substituted by the substituent F, the substituent F is preferably at least one group selected from the group consisting of an aryl group having 6 to 30 ring carbon atoms, an alkyl group having 1 to 10 (preferably 1 to 6) carbon atoms, an alkyl halide group having 1 to 10 (preferably 1 to 6) carbon atoms, a cycloalkyl group having 3 to 20 (preferably 3 to 12) ring carbon atoms, a silyl group, an alkoxy group having 1 to 10 carbon atoms, an alkoxy halide group having 1 to 10 (preferably 1 to 6) carbon atoms, an aryloxy group having 6 to 20 (preferably 6 to 12) ring carbon atoms, an alkylthio group having 1 to 10 (preferably 1 to 6) carbon atoms, an arylthio group having 6 to 20 (preferably 6 to 12) ring carbon atoms, an aralkyl group having 7 to 20 (preferably 7 to 12) ring carbon atoms, an alkenyl group having 2 to 10 (preferably 1 to 6) carbon atoms, a halogen atom, an alkynyl group having 2 to 10 (preferably 2 to 6) carbon atoms, a cyano group, a hydroxy group, a nitro group, and a carboxy group, which are unsubstituted. In addition, adjacent two or more of the substituents may be bonded to each other to form a ring.

The substituent meant by "substituted or unsubstituted" in the first, second, and fourth compounds is preferably at least one group selected from the group consisting of an aryl group having 6 to 30 (preferably 6 to 12) ring carbon atoms, heteroaryl group having 5 to 30 (preferably 5 to 12) ring atoms, linear alkyl group having 1 to 30 (preferably 1 to 6) carbon atoms, branched alkyl group having 3 to 30 (preferably 3 to 6) carbon atoms, alkyl halide group having 1 to 30 (preferably 1 to 6) carbon atoms, and cycloalkyl group having 3 to 30 (preferably 3 to 12) ring carbon atoms, further preferably the specific preferable examples described in the description of the sustituents.

The substituent meant by "substituted or unsubstituted" in the first, second, and fourth compounds may be further substituted by at least one group setected from the group consisting of an aryl group having 6 to 30 ring carbon atoms, heteroaryl group having 5 to 30 ring atoms, linear alkyl group having 1 to 30 carbon atoms, branched alkyl group having 3 to 30 carbon atoms, cycloalkyl group having 3 to 30 ring carbon atoms, alkyl halide group having 1 to 30 carbon atoms, alkylsilyl group having 3 to 30 carbon atoms, arylsilyl group having 6 to 30 ring carbon atoms, alkoxy group having 1 to 30 carbon atoms, aryloxy group having 6 to 30 carbon atoms, substituted amino group, alkylthio group having 1 to 30 carbon atoms, arylthio group having 6 to 30 ring carbon atoms, aralkyl group having 7 to 30 carbon atoms, alkenyl group having 2 to 30 carbon atoms, alkynyl group having 2 to 30 carbon atoms, halogen atom, cyano group, hydroxy group, nitro group, and carboxy group. In addition, adjacent two or more of the substituents may be bonded to each other to form a ring. It should be noted that the substituent F has no further substituent.

The substituent for the substituent meant by "substituted or unsubstituted" in the first, second, and fourth compounds is preferably at least one group selected from the group consisting of an aryl group having 6 to 30 ring carbon atoms, heteroaryl group having 5 to 30 ring atoms, a linear alkyl group having 1 to 30 carbon atoms, a branched alkyl group having 3 to 30 carbon atoms, halogen atom, and cyano group, further preferably the specific preferable examples described in the description of the sustituents.

The substituent for the substituent meant by "substituted or unsubstituted" in the first, second, and fourth compounds may be an acyl group having 2 to 31 carbon atoms.

"Unsubstituted" in "substituted or unsubstituted" means that a group is not substituted by the above-described substituents but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group.

Herein, "XX to YY atoms" in the description of "substituted or unsubstituted ZZ group having XX to YY atoms" represent atoms of an unsubstituted ZZ group and does not include atoms of a substituent(s) of the substituted ZZ group.

The same description as the above applies to "substituted or unsubstituted" in compounds or moieties thereof described herein.

Herein, when the substituents are bonded to each other to form a ring, the ring is structured to be a saturated ring, an unsaturated ring, an aromatic hydrocarbon ring or a hetero ring.

Herein, examples of the aromatic hydrocarbon group and the heterocyclic group in the linking group include a divalent or multivalent group obtained by removing one or more atoms from the above monovalent groups.

Second Exemplary Embodiment

An arrangement of an organic EL device according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable, unless otherwise specified.

The organic EL device according to the second exemplary embodiment is different from the organic EL device according to the first exemplary embodiment in that the emitting layer further contains a fourth compound. Other components are the same as those in the first exemplary embodiment.

Specifically, in the second exemplary embodiment, the first organic layer (emitting layer) contains the first compound, the second compound, and the fourth compound. The second organic layer (electron blocking layer) contains the third compound.

In this arrangement, the first compound is preferably a dopant material, the second compound is preferably a host material, and the fourth compound is preferably a host material. One of the second compound and the fourth compound may be referred to as a first host material, and the other of the other may be referred to as a second host material.

The fourth compound is also preferably a material (third component) for dispersing the dopant material in the emitting layer.

Further, the electron blocking layer is preferably adjacent to the emitting layer.

Fourth Compound

The fourth compound may be a thermally activated delayed fluorescent compound or a compound exhibiting no thermally activated delayed fluorescence.

The fourth compound preferably has a singlet energy larger than a singlet energy of the second compound.

Although the fourth compound is not particularly limited, the fourth compound is preferably a compound other than an amine compound. For instance, at least one compound selected from a carbazole derivative, dibenzofuran derivative, and dibenzothiophene derivative is usable as the fourth compound. However, the fourth compound is not limited to these derivatives.

It is also preferable that the fourth compound is a compound having at least one of moieties represented by formulae (31), (32), (33) and (34) below in one molecule.

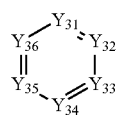
(31)

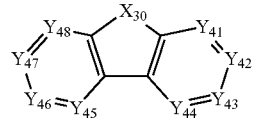
(32)

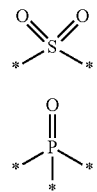
(33)

(34)

In the formula (31): $Y_{31}$ to $Y_{36}$ are each independently a nitrogen atom or a carbon atom bonded to another atom in the molecule of the fourth compound; and at least one of $Y_{31}$ to $Y_{36}$ is a carbon atom bonded to another atom in the molecule of the fourth compound.

In the formula (32): $Y_{41}$ to $Y_{48}$ are each independently a nitrogen atom or a carbon atom bonded to another atom in the molecule of the fourth compound, at least one of $Y_{41}$ to $Y_{48}$ being the carbon atom bonded to another atom in the molecule of the fourth compound; and $X_{30}$ is a nitrogen atom, an oxygen atom or a sulfur atom bonded to another atom in the molecule of the fourth compound.

* in the formulae (33) to (34) each independently represent a bonding position with another atom or another structure in the molecule of the fourth compound.

In the formula (32), at least two of $Y_{41}$ to $Y_{48}$ are preferably carbon atoms bonded to other atoms in the molecule of the fourth compound; and a cyclic structure including the carbon atoms is preferably formed.

For instance, the moiety represented by the formula (32) is preferably any one selected from the group consisting of moieties represented by formulae (321), (322), (323), (324), (325) and (326).

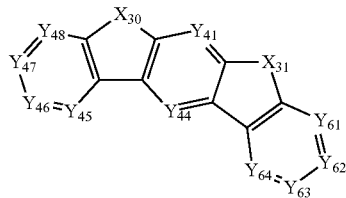
(321)

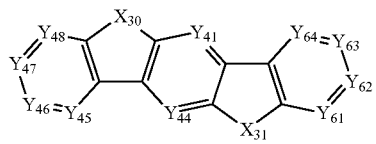
(322)

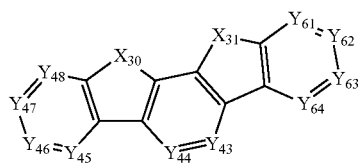
(323)

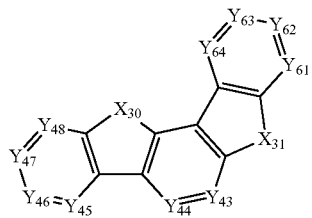
(324)

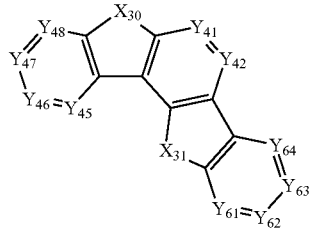
(325)

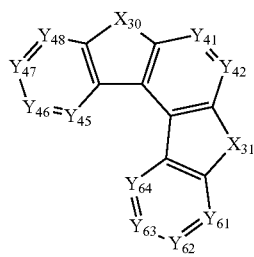
(326)

In the above formulae (321) to (326): $X_{30}$ are each independently a nitrogen atom, an oxygen atom or a sulfur atom bonded to another atom in the molecule of the fourth compound; $Y_{41}$ to $Y_{48}$ are each independently a nitrogen atom or a carbon atom bonded to another atom in the molecule of the fourth compound; $X_{31}$ are each independently a nitrogen atom, an oxygen atom or a sulfur atom bonded to another atom in the molecule of the fourth compound or a carbon atom bonded to another atom in the molecule of the fourth compound; and $Y_{61}$ to $Y_{64}$ each independently represent a nitrogen atom or a carbon atom bonded to another atom in the molecule of the fourth compound.

In the second exemplary embodiment, the fourth compound preferably has the moiety represented by the formula (323) among the moieties represented by the formulae (321) to (326).

The moiety represented by the formula (31) is preferably contained in the fourth compound in a form of at least one group selected from the group consisting of groups represented by formulae (33) and (34) below.

It is also preferable that the fourth compound has at least one of the moieties represented by the formulae (33) and (34). Since bonding positions are situated in meta positions as shown in the moieties represented by the formulae (33) and (34), an energy gap $T_{77}K(Mat4)$ at 77 [K] of the fourth compound can be kept high.

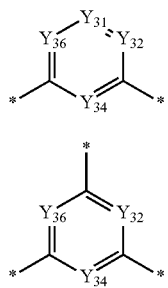

(33)

(34)

In the formula (33), $Y_{31}$, $Y_{32}$, $Y_{34}$ and $Y_{36}$ each independently represent a nitorgen atom or $CR_{31}$.

In the formula (34), $Y_{32}$, $Y_{34}$ and $Y_{36}$ each independently represent a nitorgen atom or $CR_{31}$.

In the formulae (33) and (34), $R_{31}$ each independently represents a hydrogen atom or a substituent, $R_{31}$ as the substituent being each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

The substituted or unsubstituted aryl group having 6 to 30 ring carbon atoms in $R_{31}$ is preferably a non-fused ring.

* in the formulae (33) to (34) each independently represent a bonding position with another atom or another structure in the molecule of the fourth compound.

In the formula (33), $Y_{31}$, $Y_{32}$, $Y_{34}$ and $Y_{36}$ are preferably each independently $CR_{31}$, in which a plurality of $R_{31}$ are the same or different.

In the formula (34), $Y_{32}$, $Y_{34}$ and $Y_{36}$ are preferably each independently $CR_{31}$, in which a plurality of $R_{31}$ are the same or different.

The substituted germanium group is preferably represented by —$Ge(R_{301})_3$. $R_{301}$ is each independently a substituent. The substituent $R_{301}$ is preferably a substituted or unsubstituted alkyl group having 1 to 30 carbon atoms or a substituted or unsubstituted aryl group having 6 to 30 ring carbon atoms. A plurality of $R_{301}$ are mutually the same or different.

The moiety represented by the formula (32) is preferably included in the fourth compound as at least one group selected from the group consisting of groups represented by formulae (35) to (39) and (30a) below.

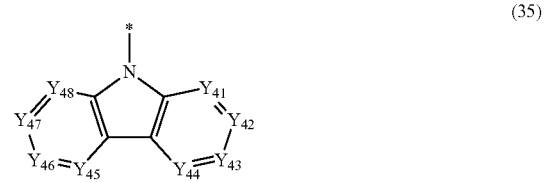

(35)

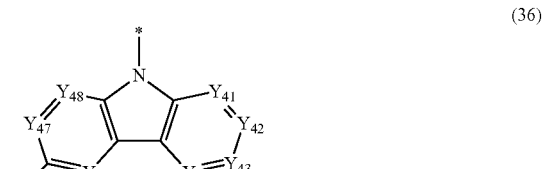

(36)

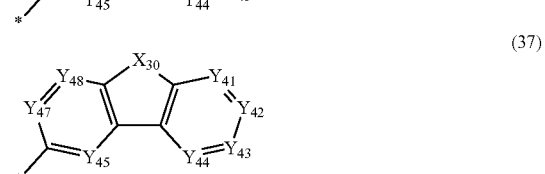

(37)

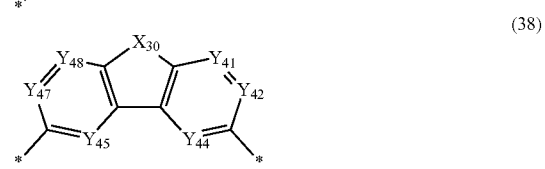

(38)

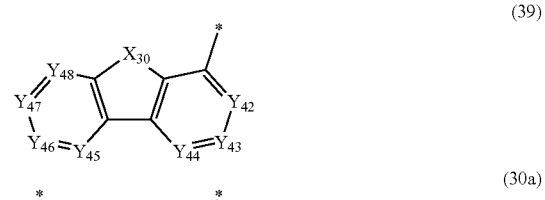

(39)

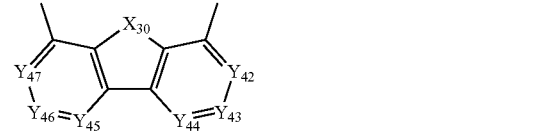

(30a)

In the formula (35), $Y_{41}$ to $Y_{48}$ each independently represent a nitrogen atom or $CR_{32}$.

In the formulae (36) and (37), $Y_{41}$ to $Y_{45}$, $Y_{47}$ and $Y_{48}$ each independently represent a nitrogen atom or $CR_{32}$.

In the formula (38), $Y_{41}$, $Y_{42}$, $Y_{44}$, $Y_{45}$, $Y_{47}$, and $Y_{48}$ each independently represent a nitrogen atom or $CR_{32}$.

In the formula (39), $Y_{42}$ to $Y_{48}$ each independently represent a nitrogen atom or $CR_{32}$.

In the formula (30a), $Y_{42}$ to $Y_{47}$ each independently represent a nitrogen atom or $CR_{32}$.

In the formulae (35) to (39) and (30a), $R_{32}$ each independently represents a hydrogen atom or a substituent, $R_{32}$ as the substituent is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group, and a plurality of $R_{32}$ are mutually the same or different.

In the formulae (37) to (39) and (30a), $X_{30}$ represents $NR_{33}$, an oxygen atom or a sulfur atom, $R_{33}$ is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a fluorine atom, a cyano group, a nitro group, and a substituted or unsubstituted carboxy group, and a plurality of $R_{33}$ are mutually the same or different.

The substituted or unsubstituted aryl group having 6 to 30 ring carbon atoms in $R_{33}$ is preferably a non-fused ring.

* in the formulae (35) to (39) and (30a) each independently represent a bonding position with another atom or another structure in the molecule of the fourth compound.

$Y_{41}$ to $Y_{48}$ in the formula (35) are preferably each independently $CR_{32}$. $Y_{41}$ to $Y_{45}$, $Y_{47}$ and $Y_{48}$ in the formula (36) and the formula (37) are preferably each independently $CR_{32}$. $Y_{41}$, $Y_{42}$, $Y_{44}$, $Y_{45}$, $Y_{47}$ and $Y_{48}$ in the formula (38) are preferably each independently $CR_{32}$. $Y_{42}$ to $Y_{48}$ in the formula (39) are preferably each independently $CR_{32}$. $Y_{42}$ to $Y_{47}$ in the formula (30a) are preferably each independently $CR_{32}$. A plurality of $R_{32}$ are optionally mutually the same or different.

In the fourth compound, $X_{30}$ is preferably an oxygen atom or a sulfur atom, more preferably an oxygen atom.

In the fourth compound, $R_{31}$ and $R_{32}$ each independently represent a hydrogen atom or a substituent. $R_{31}$ and $R_{32}$ as the substituents are preferably each independently a group selected from the group consisting of a fluorine atom, a cyano group, a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms. $R_{31}$ and $R_{32}$ are more preferably a hydrogen atom, a cyano group, a substituted or unsubstituted aryl group having 6 to 30 ring carbon atoms, or a substituted or unsubstituted heteroaryl group having 5 to 30 ring atoms. When $R_{31}$ and $R_{32}$ as the substituents are each a substituted or unsubstituted aryl group having 6 to 30 ring carbon atoms, the aryl group is preferably a non-fused ring.

It is also preferable that the fourth compound is an aromatic hydrocarbon compound or an aromatic heterocyclic compound. Moreover, it is preferable that the fourth compound does not have a fused aromatic hydrocarbon ring in a molecule thereof.

Method of Preparing Fourth Compound

The fourth compound can be prepared by methods disclosed in International Publication No. WO2012/153780, International Publication No. WO2013/038650, and the like. Furthermore, the fourth compound can be prepared, for instance, by application of known substitution reactions and/or materials depending on a target compound.

Examples of the substituent for the fourth compound are shown below, but the invention is not limited thereto.

Specific examples of the aryl group (occasionally referred to as an aromatic hydrocarbonl group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group, 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group, fluorenyl group and the like are preferable.

Specific examples of the aryl group having a substituent include a tolyl group, xylyl group and 9,9-dimethylfluorenyl group.

As is understood from the specific examples, the aryl group includes both fused aryl group and non-fused aryl group.

Preferable examples of the aryl group include a phenyl group, biphenyl group, terphenyl group, quarterphenyl group, naphthyl group, triphenylenyl group and fluorenyl group.

Specific examples of the heteroaryl group (occasionally referred to as a heterocyclic group, heteroaromatic ring group or aromatic heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothienyl group, dibenzothienyl group, azadibenzothienyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothienyl group, carbazolyl group, pyridyl group, pyrimidinyl group, triazinyl group, azadibenzofuranyl group, azadibenzothienyl group and the like are preferable.

The heteroaryl group is preferably a dibenzofuranyl group, dibenzothienyl group, carbazolyl group, pyridyl group, pyrimidinyl group, triazinyl group, azadibenzofuranyl group or azadibenzothienyl group, and further preferably a dibenzofuranyl group, dibenzothienyl group, azadibenzofuranyl group and azadibenzothienyl group.

In the fourth compound, it is also preferable that the substituted silyl group is selected from the group consisting of a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyldimethylsilyl group.

Specific examples of the substituted or unsubstituted triarylsilyl group include triphenylsilyl group and tritolylsilyl group.

In the fourth compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

In the fourth compound, examples of the substituted carboxy group include benzoyloxy group.

Relationship between First Compound, Second Compound and Fourth Compound in Emitting Layer In the second exemplary embodiment, the singlet energy $S_1(Mat2)$ of the second compound and the singlet energy $S_1(Mat4)$ of the fourth compound preferably satisfy a relationship of a numerical formula (Numerical Formula 2) below.

$$S_1(Mat4) > S_1(Mat2) \quad \text{(Numerical Formula 2)}.$$

The singlet energy $S_1(Mat4)$ of the fourth compound is preferably larger than the singlet energy $S_1(Mat1)$ of the first compound.

An energy gap $T_{77K}(Mat4)$ at 77 [K] of the fourth compound is preferably larger than an energy gap $T_{77K}(Mat1)$ at 77 [K] of the first compound.

An energy gap $T_{77K}(Mat4)$ at 77 [K] of the fourth compound is preferably larger than an energy gap $T_{77K}(Mat2)$ at 77 [K] of the second compound.

The singlet energy $S_1(Mat1)$ of the first compound, the singlet energy $S_1(Mat2)$ of the second compound and a singlet energy $S_1(Mat4)$ of the fourth compound preferably satisfy a relationship of a numerical formula (Numerical Formula 3) below.

$$S_1(Mat4) > S1(Mat2) > S_1(Mat1) \quad \text{(Numerical Formula 3)}.$$

The first compound, the second compound, and the fourth compound in the emitting layer preferably satisfy the relationship of Numerical Formula 4 below.

$$T_{77}K(Mat4) > T_{77K}(Mat2) > T_{77K}(Mat1) \quad \text{(Numerical Formula 4)}.$$

When the organic EL device of the second exemplary embodiment emits light, it is preferable that fluorescent compound in the emitting layer mainly emits light.

Content Ratio of Compounds in Emitting Layer

In the organic EL device of the second exemplary embodiment, a content ratio of the first compound in the emitting layer is preferably in a range from 0.01 mass % to 10 mass %, more preferably in a range from 0.01 mass % to 5 mass %, further preferably in a range from 0.01 mass % to 1 mass %.

The content ratio of the second compound preferably ranges from 10 mass % to 80 mass %, more preferably from 10 mass % to 60 mass %, further preferably from 20 mass % to 60 mass %.

The content ratio of the fourth compound preferably ranges from 10 mass % to 80 mass %.

An upper limit of the total of the respective content ratios of the first, second and fourth compounds in the emitting layer is 100 mass %. It should be noted that the emitting layer of the exemplary embodiment may further contain a material other than the first, second and fourth compounds.

The emitting layer may include a single type of the first compound or may include two or more types of the first compound. The emitting layer may include a single type of the second compound or may include two or more types of the second compound. The emitting layer may include a single type of the fourth compound or may include two or more types of the fourth compound.

Figure 5:
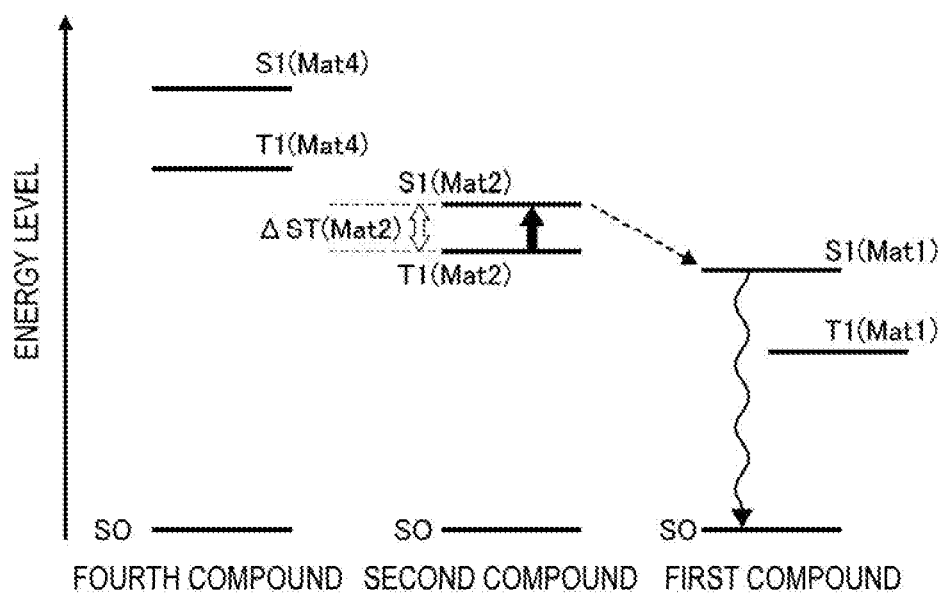
FIG. 5 is an illustration showing a relationship between an energy level and energy transfer for first, second and fourth compounds in the first organic layer (emitting layer).

FIG. 5 shows an example of a relationship among energy levels of the first compound, the second compound and the fourth compound in the emitting layer. In FIG. 5, S0 represents a ground state. S1(Mat1) represents the lowest singlet state of the first compound. T1(Mat1) represents the lowest triplet state of the first compound. S1(Mat2) represents the lowest singlet state of the second compound. T1(Mat2) represents the lowest triplet state of the second compound. S1(Mat4) represents the lowest singlet state of the fourth compound. T1(Mat4) represents the lowest triplet state of the fourth compound. A dashed arrow directed from S1(Mat2) to S1(Mat1) in FIG. 5 represents Förster energy transfer from the lowest singlet state of the second compound to the lowest singlet state of the first compound.

As shown in FIG. 5, when a compound having a small $\Delta ST(Mat2)$ is used as the second compound, inverse intersystem crossing from the lowest triplet state T1(Mat2) to the lowest singlet state S1(Mat2) can be caused by a heat energy. Subsequently, Förster energy transfer from the lowest singlet state S1(Mat2) of the second compound to the first compound occurs to generate the lowest singlet state S1(Mat1). As a result, fluorescence from the lowest singlet state S1(Mat1) of the first compound can be observed. It is speculated that the internal quantum efficiency can be theoretically raised up to 100% also by using delayed fluorescence by the TADF mechanism.

Accordingly, at least one of luminous efficiency and lifetime can be improved by the second exemplary embodiment.

The organic EL device according to the second exemplary embodiment is applicable to an electronic device such as a display device and a light-emitting device in the same manner as the organic EL device according to the first exemplary embodiment.

Modification of Embodiment(s)

It should be noted that the invention is not limited to the above exemplary embodiments but may include any modification and improvement as long as such modification and improvement are compatible with the invention.

For instance, the emitting layer is not limited to a single layer, but may be provided by laminating a plurality of emitting layers. When the organic EL device has the plurality of emitting layers, it is only required that at least one of the emitting layers contains the first and second compounds. For instance, the rest of the emitting layers may be a fluorescent emitting layer or a phosphorescent emitting layer with use of emission caused by electron transfer from the triplet excited state directly to the ground state.

When the organic EL device includes the plurality of emitting layers, the plurality of emitting layers may be adjacent to each other, or provide a so-called tandem-type organic EL device in which a plurality of emitting units are layered through an intermediate layer.

The organic EL device in the above exemplary embodiments include an electron blocking layer (an example of the second organic layer) between the anode and the emitting layer.

The electron blocking layer provided adjacent to a side of the emitting layer near the anode transports the holes and blocks the electrons from reaching a layer (e.g., the hole transporting layer) closer to the anode beyond the electron blocking layer.

For instance, the organic EL device in some exemplary embodiments has a hole blocking layer adjacent to a side of the emitting layer closer to the cathode. The hole blocking layer is preferably adjacent to the emitting layer and blocks at least one of holes and excitons.

For instance, when the hole blocking layer is adjacent to the side of the emitting layer closer to the cathode, the hole blocking layer transports the electrons and blocks the holes from reaching a layer (e.g., the electron transporting layer) closer to the cathode beyond the hole blocking layer. When the organic EL device includes the electron transporting layer, the organic EL device preferably includes the hole blocking layer between the emitting layer and the electron transporting layer.

Moreover, the blocking layer (hole blocking layer and electron blocking layer) may be adjacent to the emitting layer so that excited energy does not leak out from the emitting layer toward neighboring layer(s). When the blocking layer is adjacent to the emitting layer, the blocking layer blocks excitons generated in the emitting layer from transferring to a layer(s) (e.g., the electron transporting layer and the hole transporting layer) closer to the electrode(s) beyond the blocking layer.

The emitting layer and the blocking layer are preferably bonded with each other.

In addition, the specific structure and shapes for practicing the invention may be altered to other structures and shapes as long as such other structures and shapes are compatible with the invention.

EXAMPLES

Example(s) of the invention will be described below. However, the invention is not limited to Example(s).

Compounds

Compounds used for preparing an organic EL device will be shown below.

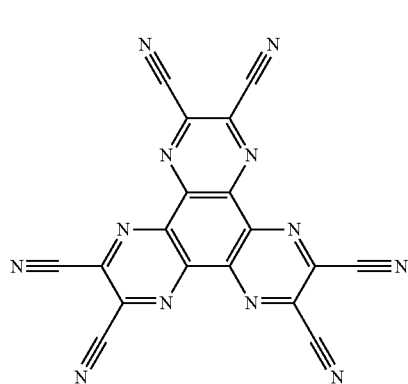

HI1

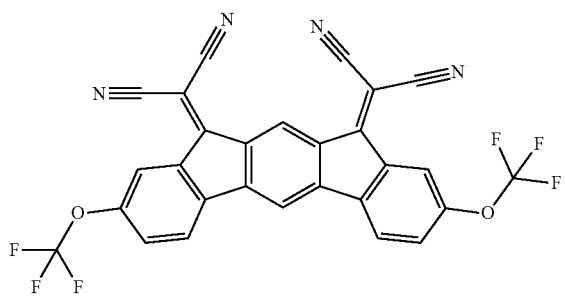

HI2

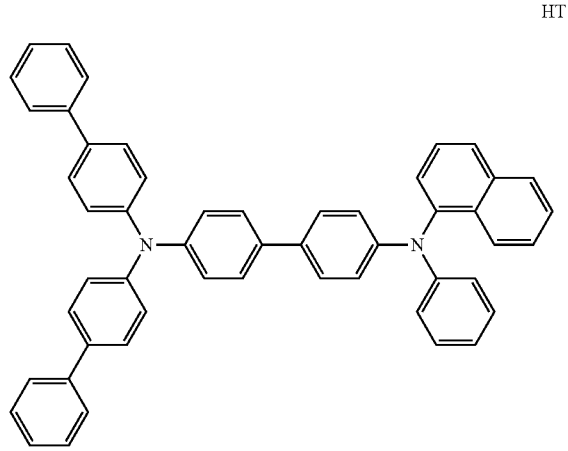

HT1

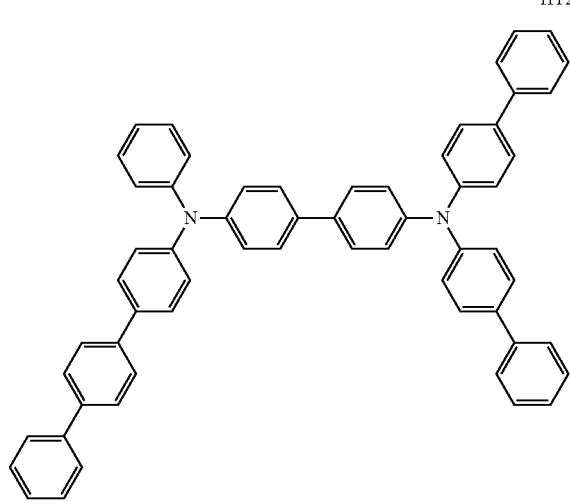

HT2

-continued
ET1
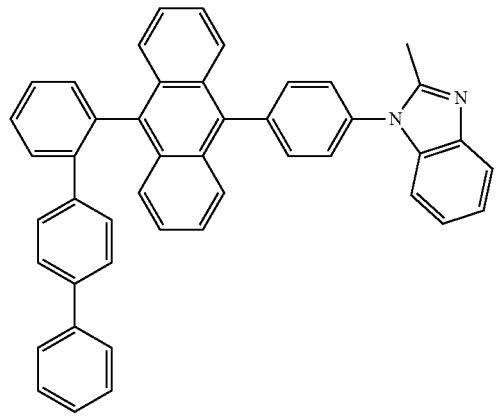
ET2
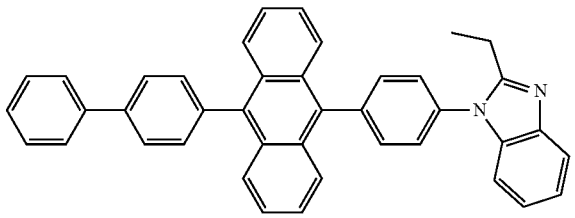
D1
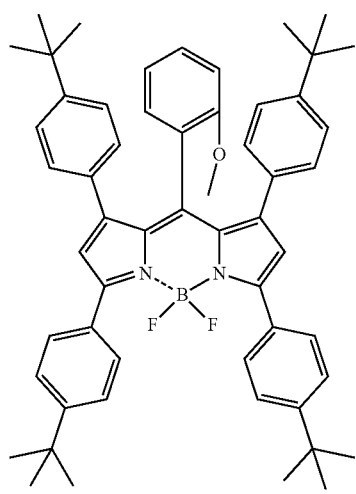
D4
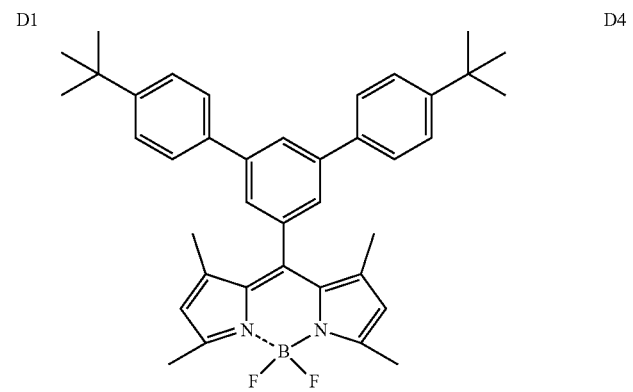
TADF1
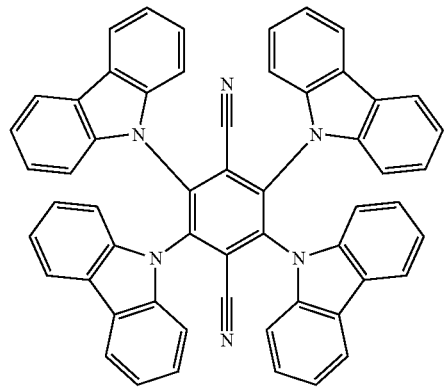
TADF2
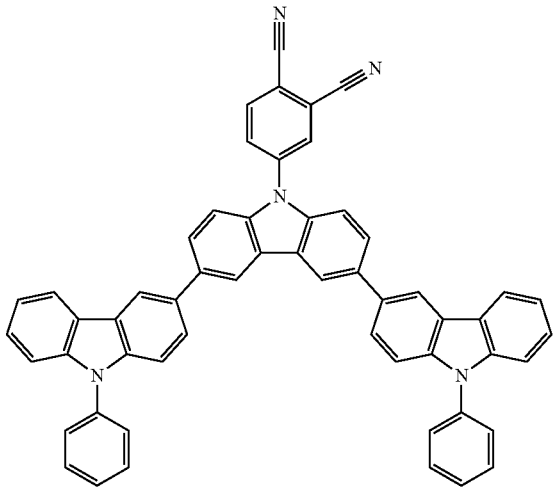
M1
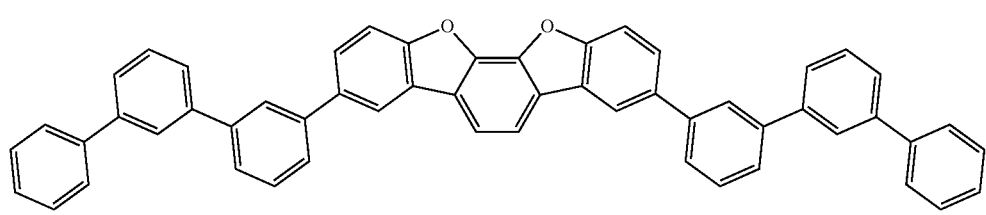

-continued
M2
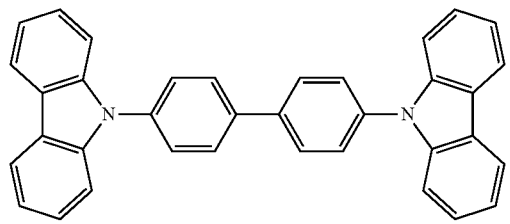
M5
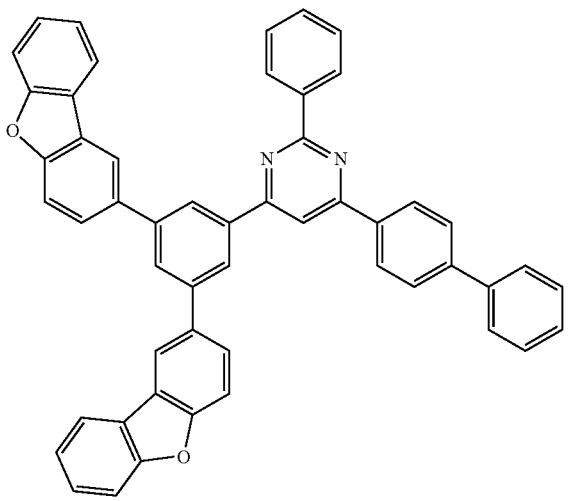
M8
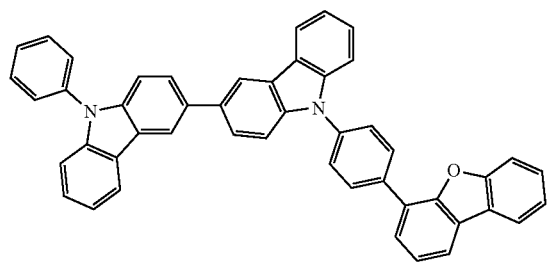
M10
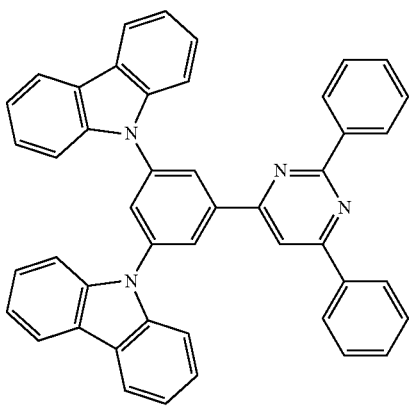
M12
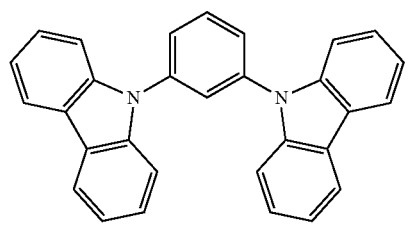
M13
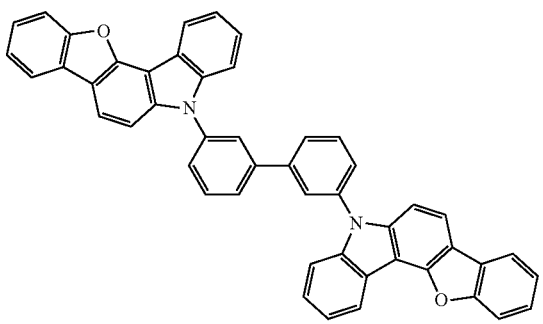

-continued

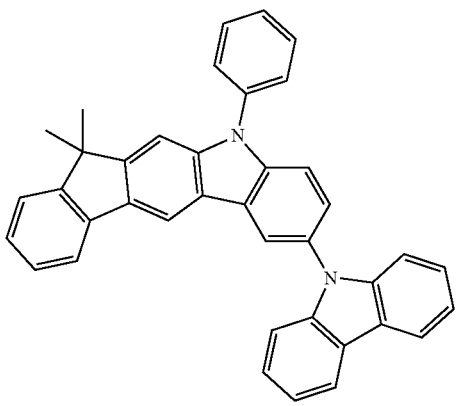
M14

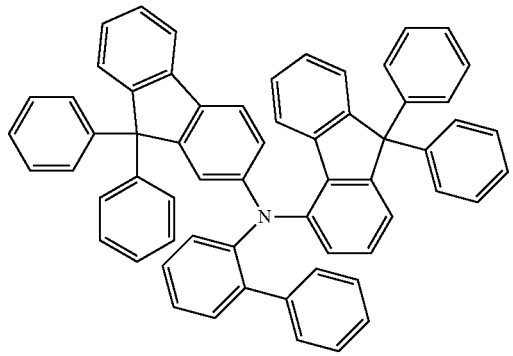
M15

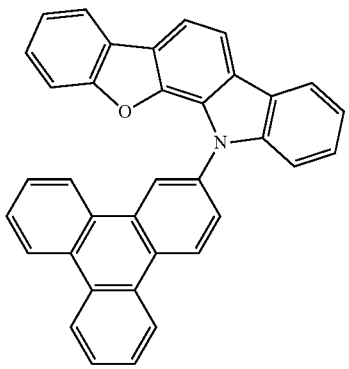
M16

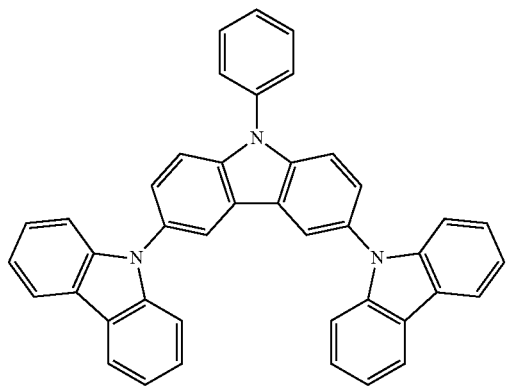
M17

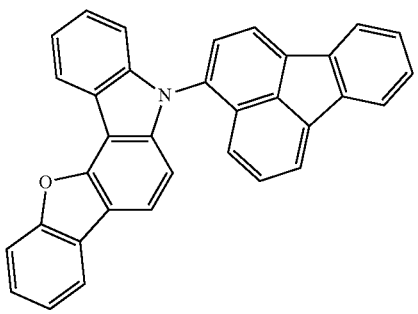
M18

Delayed Fluorescence

Delayed Fluorescence Properties of Compound TADF1

Delayed fluorescence properties were checked by measuring transient photoluminescence (PL) using a device shown in FIG. 2. A sample was prepared by co-depositing the compounds TADF1 and TH-2 on a quartz substrate at a ratio of the compound TADF1 of 12 mass % to form a 100-nm-thick thin film. Prompt emission was observed immediately when the excited state was achieved by exciting the compound TADF1 with a pulse beam (i.e., a beam emitted from a pulse laser) having a wavelength to be absorbed by the compound TADF1, and Delay emission was observed not immediately when the excited state was achieved but after the excited state was achieved. The delayed fluorescence in Examples means that an amount of Delay Emission is 5% or more based on an amount of Prompt Emission. Specifically, provided that the amount of Prompt emission is denoted by $X_P$ and the amount of Delay emission is denoted by $X_D$, a value of $X_D/X_P$ is 0.05 or more.

It was found that the amount of Delay Emission was 5% or more based on the amount of Prompt Emission in the compound TADF-1. Specifically, it was found that the value of $X_D/X_P$ was 0.05 or more in the compound TADF1.

The amount of Prompt Emission and the amount of Delay Emission can be obtained according to the same method as a method described in "Nature 492, 234-238, 2012." A device used for calculating the amounts of Prompt Emission and Delay Emission is not limited to the device of FIG. 2 and a device described in the above document.

Delayed Fluorescence Properties of Compound TADF2

Delayed fluorescence properties of the compound TADF2 were checked in the same manner as the above except for the use of the compound TADF2 in place of the compound TADF1.

As a result, it was found that the amount of Delay Emission was 5% or more based on the amount of Prompt Emission in the compound TADF-2. Specifically, it was found that the value of $X_D/X_P$ was 0.05 or more in the compound TADF2.

Singlet Energy S1

Singlet energies $S_1$ of the compounds TADF1, TADF2, D1, D4, and M1 were measured according to the above-described solution method.

The singlet energy $S_1$ of the compound TADF1 was 2.37 eV.

The singlet energy $S_1$ of the compound TADF2 was 2.80 eV.

The singlet energy $S_1$ of the compound D1 was 2.02 eV.

The singlet energy $S_1$ of the compound D4 was 2.39 eV.

The singlet energy $S_1$ of the compound M1 was 3.63 eV.

Energy Gap $T_{77K}$ at 77 [K]

The energy gap $T_{77K}$ of the compound TADF2 was measured according to the above-described measurement method.

$T_{77K}$ of the compound TADF2 was 2.71 eV. Accordingly, $\Delta ST$ of the compound TADF2 was 0.09 eV.

Main Peak Wavelength of Compounds

A 5 µmol/L toluene solution of a measurement target compound was prepared and put in a quartz cell. A fluorescence spectrum (ordinate axis: fluorescence intensity, abscissa axis: wavelength) of the thus-obtained sample was measured at a normal temperature (300K). In Examples, the fluorescence spectrum was measured using a spectrophotometer (F-7000 manufactured by Hitachi, Ltd.). It should be noted that the fluorescence spectrum measuring device may be different from the above device. A peak wavelength of the fluorescence spectrum exhibiting the maximum luminous intensity was defined as a main peak wavelength.

The main peak wavelength of the compound D1 was 609 nm.

The main peak wavelength of the compound D4 was 516 nm.

Preparation of Red-Emitting Organic EL Device A

A red-emitting organic EL device (sometimes referred to as a red-emitting device hereinafter) A was prepared and evaluated as follows.

Example 1A-1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 1 minute. A film of ITO was 130 nm thick.

After the glass substrate having the transparent electrode line was cleaned, the glass substrate was mounted on a substrate holder of a vacuum evaporation apparatus. Initially, a compound HI1 was vapor-deposited on a surface of the glass substrate where the transparent electrode line was provided in a manner to cover the transparent electrode, thereby forming a 5-nm-thick hole injecting layer.

Next, the compound HT1 was vapor-deposited on the hole injecting layer to form a 55-nm-thick hole transporting layer on the HI1 film.

Next, the compound M2 (third compound) was vapor-deposited on the hole transporting layer to form a 10-nm-thick electron blocking layer (second organic layer).

Further, the compound D1 (first compound), the compound TADF1 (second compound) and the compound M1 (fourth compound) were co-deposited on the electron blocking layer to form a 25-nm-thick emitting layer (first organic layer). A concentration of the compound TADF1 was 10 mass %, a concentration of the compound D1 was 0.5 mass %, and a concentration of the compound M1 was 89.5 mass % in the emitting layer.

Next, a compound M5 was vapor-deposited on the emitting layer to form a 10-nm-thick first electron transporting layer.

The compound ET1 was then vapor-deposited on the first electron transporting layer to form a 30-nm-thick second electron transporting layer.

Next, lithium fluoride (LiF) was vapor-deposited on the second electron transporting layer to form a 1-nm-thick electron injecting electrode (cathode).

Metal aluminum (Al) was then vapor-deposited on the electron injecting electrode to form an 80-nm-thick metal Al cathode.

A device arrangement of the red-emitting device A in Example 1A-1 is schematically shown as follows.

ITO(130)/HI1(5)/HT1(55)/M2(10)/M1:TADF1:D1(25, 89.5%:10%:0.5%) /M5(10)/ET1(30)/LIF(1)/Al(80)

Numerals in parentheses each represent a film thickness (unit: nm). The numerals represented by percentage in the same parentheses each indicate a ratio (mass %) of the fourth compound, the second compound and the first compound in the emitting layer. The above is also applicable in the description below.

Example 1A-2

A red-emitting device A of Example 1A-2 was prepared in the same manner as the organic EL device of Example 1A-1 except that a compound M12 was used in place of the compound M2 in the electron blocking layer of Example 1A-1.

A device arrangement of the red-emitting device A in Example 1A-2 is schematically shown as follows.

ITO(130)/HI1(5)/HT1(55)/M12(10)/M1:TADF1:D1(25, 89.5%:10%:0.5%)/M5(10)/ET1(30)/LIF(1)/Al(80)

Example 1A-3

A red-emitting device A of Example 1A-3 was prepared in the same manner as the organic EL device of Example 1A-1 except that a compound M13 was used in place of the compound M2 in the electron blocking layer of Example 1A-1.

A device arrangement of the red-emitting device A in Example 1A-3 is schematically shown as follows.

ITO(130)/HI1(5)/HT1(55)/M13(10)/M1:TADF1:D1(25, 89.5%:10%:0.5%)/M5(10)/ET1(30)/LIF(1)/Al(80)

Example 1A-4

A red-emitting device A of Example 1A-4 was prepared in the same manner as the organic EL device of Example 1A-1 except that a compound M14 was used in place of the compound M2 in the electron blocking layer of Example 1A-1.

A device arrangement of the red-emitting device A in Example 1A-4 is schematically shown as follows.

ITO(130)/HI1(5)/HT1(55)/M14(10)/M1:TADF1:D1(25, 89.5%:10%:0.5%)/M5(10)/ET1(30)/LIF(1)/Al(80)

Example 1A-5

A red-emitting device A of Example 1A-5 was prepared in the same manner as the organic EL device of Example 1A-1 except that a compound M16 was used in place of the compound M2 in the electron blocking layer of Example 1A-1.

A device arrangement of the red-emitting device A in Example 1A-5 is schematically shown as follows.

ITO(130)/HI1(5)/HT1(55)/M16(10)/M1:TADF1:D1(25, 89.5%:10%:0.5%)/M5(10)/ET1(30)/LIF(1)/Al(80)

Example 1A-6

A red-emitting device A of Example 1A-6 was prepared in the same manner as the organic EL device of Example 1A-1 except that a compound M17 was used in place of the compound M2 in the electron blocking layer of Example 1A-1.

A device arrangement of the red-emitting device A in Example 1A-6 is schematically shown as follows.

ITO(130)/HI1(5)/HT1(55)/M17(10)/M1:TADF1:D1(25, 89.5%:10%:0.5%)/M5(10)/ET1(30)/LIF(1)/Al(80)

Example 1A-7

A red-emitting device A of Example 1A-7 was prepared in the same manner as the organic EL device of Example 1A-1 except that a compound M18 was used in place of the compound M2 in the electron blocking layer of Example 1A-1.

A device arrangement of the red-emitting device A in Example 1A-7 is schematically shown as follows.

ITO(130)/HI1(5)/HT1(55)/M18(10)/M1:TADF1:D1(25, 89.5%:10%:0.5%)/M5(10)/ET1(30)/LIF(1)/Al(80)

Comparative 1A-1

A red-emitting device A of Comparative 1A-1 was prepared in the same manner as the organic EL device of Example 1A-1 except that a compound M8 was used in place of the compound M2 in the electron blocking layer of Example 1A-1.

A device arrangement of the red-emitting device A in Comparative 1A-1 is schematically shown as follows.

ITO(130)/HI1(5)/HT1(55)/M8(10)/M1:TADF1:D1 (25, 89.5%:10%:0.5%) /M5(10)/ET1(30)/LIF(1)/Al(80)

Comparative 1A-2

A red-emitting device A of Comparative 1A-2 was prepared in the same manner as the organic EL device of Example 1A-1 except that a compound M15 was used in place of the compound M2 in the electron blocking layer of Example 1A-1.

A device arrangement of the red-emitting device A in Comparative 1A-2 is schematically shown as follows.

ITO(130)/HI1(5)/HT1(55)/M15(10)/M1:TADF1:D1(25, 89.5%:10%:0.5%)/M5(10)/ETI(30)/LIF(1)/Al(80)

Evaluation of Red-Emitting Devices A

The red-emitting devices A prepared in Examples 1A-1 to 1A-7 and Comparatives 1A-1 to 1A-2 were evaluated as follows. The evaluation results are shown in Table 14. In Table 14, @0.1 means 0.1 mA/cm$^2$, and @10 means 10 mA/cm$^2$.

External Quantum Efficiency EQE

Voltage was applied on each of the organic EL devices such that a current density was 0.1 mA/cm$^2$, where spectral radiance spectra were measured by a spectroradiometer CS-2000 (manufactured by Konica Minolta, Inc.).

The external quantum efficiency EQE (unit: %) was calculated based on the obtained spectral-radiance spectra, assuming that the spectra were provided under a Lambertian radiation.

Values of Chromaticity CIEx, CIEy, and Main Peak Wavelength $\lambda_p$

Voltage was applied on each of the organic EL devices such that a current density was 10 mA/cm$^2$, where spectral radiance spectra were measured by a spectroradiometer CS-2000 (manufactured by Konica Minolta, Inc.). The chromaticities CIEx and CIEy and main peak wavelength $\lambda_p$ (unit: nm) were calculated based on the obtained spectral-radiance spectra.

TABLE 14

|  | Second Organic Layer | First Organic Layer | | | Evaluation | | | |
| --- | --- | --- | --- | --- | --- | --- | --- | --- |
|  | Third Compound | First Compound | Second Compound | Fourth Compound | EQE (%) @0.1 | CIEx @10 | CIEy @10 | $\lambda_p$ (nm) @10 |
| Ex. 1A-1 | M2 | D1 | TADF1 | M1 | 22.1 | 0.626 | 0.371 | 616 |
| Ex. 1A-2 | M12 | D1 | TADF1 | M1 | 20.9 | 0.630 | 0.368 | 616 |
| Ex. 1A-3 | M13 | D1 | TADF1 | M1 | 19.8 | 0.630 | 0.368 | 617 |
| Ex. 1A-4 | M14 | D1 | TADF1 | M1 | 20.6 | 0.626 | 0.371 | 616 |
| Ex. 1A-5 | M16 | D1 | TADF1 | M1 | 20.5 | 0.627 | 0.371 | 616 |
| Ex. 1A-6 | M17 | D1 | TADF1 | M1 | 20.2 | 0.623 | 0.375 | 616 |
| Ex. 1A-7 | M18 | D1 | TADF1 | M1 | 19.7 | 0.623 | 0.375 | 616 |
| Comp. 1A-1 | M8 | D1 | TADF1 | M1 | 13.6 | 0.626 | 0.371 | 616 |
| Comp. 1A-2 | M15 | D1 | TADF1 | M1 | 14.7 | 0.638 | 0.360 | 618 |

The red emitting devices A according to Examples 1A-1 to 1A-7, whose first organic layer contains the first compound represented by the formula (1) and the delayed fluorescent second compound and whose second organic layer contains the third compound represented by the formula (3), exhibited higher external quantum efficiency than devices of Comparatives 1A-1 to 1A-2 whose second organic layer contains the compound not satisfying the formula (3).

It is thus found that the red-emitting devices A of the Examples improve the luminous efficiency.

Preparation of Red-Emitting Device B

A red-emitting device B was prepared and evaluated as follows.

Example 1B-1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 1 minute. A film of ITO was 130 nm thick.

After the glass substrate having the transparent electrode line was cleaned, the glass substrate was mounted on a substrate holder of a vacuum evaporation apparatus. Initially, a compound HI1 was vapor-deposited on a surface of the glass substrate where the transparent electrode line was provided in a manner to cover the transparent electrode, thereby forming a 5-nm-thick hole injecting layer.

Next, the compound HT1 was vapor-deposited on the hole injecting layer to form an 55-nm-thick hole transporting layer on the HI1 film.

Next, the compound M2 (third compound) was vapor-deposited on the hole transporting layer to form a 10-nm-thick electron blocking layer (second organic layer).

Further, the compound D1 (first compound) and the compound TADF1 (second compound) were co-deposited on the electron blocking layer to form a 25-nm-thick emitting layer (first organic layer). A concentration of the compound TADF1 was 99.0 mass % and a concentration of the compound D1 was 1.0 mass % in the emitting layer.

Next, a compound M5 was vapor-deposited on the emitting layer to form a 10-nm-thick first electron transporting layer.

The compound ET1 was then vapor-deposited on the first electron transporting layer to form a 30-nm-thick second electron transporting layer.

Next, lithium fluoride (LiF) was vapor-deposited on the second electron transporting layer to form a 1-nm-thick electron injecting electrode (cathode).

Metal aluminum (Al) was then vapor-deposited on the electron injecting electrode to form an 80-nm-thick metal Al cathode.

A device arrangement of the red-emitting device B in Example 1B-1 is schematically shown as follows.
ITO(130)/HI1(5)/HT1(55)/M2(10)/TADF1:D1(25, 99.0%:1.0%)/M5(10)/ET1(30)/LIF(1)/Al(80)

Numerals in parentheses represent a film thickness (unit: nm). The numerals in the form of percentage in parentheses indicate ratios (mass %) of the first and second compounds in the emitting layer. The above is also applicable in the description below.

Example 1B-2

A red-emitting device B of Example 1B-2 was prepared in the same manner as in Example 1B-1 except that the concentration of the compound TADF1 in the emitting layer was 99.5 mass % and the concentration of the compound D1 in the emitting layer was 0.5 mass %.

A device arrangement of the red-emitting device B in Example 1B-2 is schematically shown as follows.
ITO(130)/HI1(5)/HT1(55)/M2(10)/TADF1:D1(25, 99.5%:0.5%)/M5(10)/ET1(30)/LIF(1)/Al(80)

Comparative 1B-1

A red-emitting device B of Comparative 1B-1 was prepared in the same manner as the organic EL device of Example 1B-1 except that the compound in the electron blocking layer (second organic layer) of Example 1B-1 was changed to the compound M8.

A device arrangement of the red-emitting device B in Comparative 1B-1 is schematically shown as follows.
ITO(130)/HI1(5)/HT1(55)/M8(10)/TADF1:D1(25, 99.0%:1.0%)/M5(10)/ET1(30)/LIF(1)/Al(80)

Comparative 1B-2

A red-emitting device B of Comparative 1B-2 was prepared in the same manner as in Comparative 1B-1 except that the concentration of the compound TADF1 in the emitting layer was 99.5 mass % and the concentration of the compound D1 in the emitting layer was 0.5 mass %.

A device arrangement of the red-emitting device B in Comparative 1B-1 is schematically shown as follows.
ITO(130)/H11(5)/HT1(55)/M8(10)/TADF1:D1(25, 99.5%:0.5%)/M5(10)/ET1(30)/LIF(1)/Al(80)

Comparative 1B-3

A red-emitting device B of Comparative 1B-3 was prepared in the same manner as the organic EL device of Example 1B-1 except that the compound in the electron blocking layer (second organic layer) of Example 1B-1 was changed to the compound M15.

A device arrangement of the red-emitting device B in Comparative 1B-3 is schematically shown as follows.
ITO(130)/HI1(5)/HT1(55)/M15(10)/TADF1:D1(25, 99.0%:1.0%)/M5(10)/ET1(30)/LIF(I)/Al(80)

Comparative 1B-4

A red-emitting device B of Comparative 1B-4 was prepared in the same manner as in Comparative 1B-3 except that the concentration of the compound TADF1 in the emitting layer was 99.5 mass % and the concentration of the compound D1 in the emitting layer was 0.5 mass %.

A device arrangement of the red-emitting device B in Comparative 1B-4 is schematically shown as follows.
ITO(130)/HI1(5)/HT1(55)/M15(10)/TADF1:D1(25, 99.5%:0.5%)/M5(10)/ET1(30)/LIF(1)/Al(80)

Evaluation of Red-Emitting Devices B

The red-emitting devices B prepared in Examples 1B-1 to 1B-2 and Comparatives 1B-1 to 1B-4 were evaluated in the same manner as for the red-emitting devices A. The evaluation results are shown in Table 15. In Table 15, % means "mass %", @0.1 means 0.1 mA/cm$^2$, and @10 means 10 mA/cm$^2$.

TABLE 15

| | 2nd Organic Layer | 1st Organic Layer | | Evaluation | | | |
|---|---|---|---|---|---|---|---|
| | Third Compound | First Compound | Second Compound | EQE (%) @0.1 | CIEx @10 | CIEy @10 | λp (nm) @10 |
| Ex. 1B-1 | M2 | D1 (1.0%) | TADF1 (99.0%) | 11.3 | 0.659 | 0.339 | 620 |
| Ex. 1B-2 | M2 | D1 (0.5%) | TADF1 (99.5%) | 10.3 | 0.650 | 0.347 | 619 |
| Comp. 1B-1 | M8 | D1 (1.0%) | TADF1 (99.0%) | 2.8 | 0.661 | 0.338 | 620 |

TABLE 15-continued

| | 2nd Organic Layer | 1st Organic Layer | | Evaluation | | | |
|---|---|---|---|---|---|---|---|
| | Third Compound | First Compound | Second Compound | EQE (%) @0.1 | CIEx @10 | CIEy @10 | λp (nm) @10 |
| Comp. 1B-2 | M8 | D1 (0.5%) | TADF1 (99.5%) | 2.2 | 0.652 | 0.348 | 618 |
| Comp. 1B-3 | M15 | D1 (1.0%) | TADF1 (99.0%) | 6.7 | 0.662 | 0.337 | 620 |
| Comp. 1B-4 | M15 | D1 (0.5%) | TADF1 (99.5%) | 5.9 | 0.665 | 0.345 | 619 |

The red emitting devices B according to Examples 1B-1 to 1B-2, whose first organic layer contains the first compound represented by the formula (1) and the delayed fluorescent second compound and whose second organic layer contains the third compound represented by the formula (3), exhibited higher external quantum efficiency than devices of Comparatives 1B-1 to 1B-4 whose second organic layer contains the compound not satisfying the formula (3).

It is thus found that the red-emitting devices B of the Examples improve the luminous efficiency.

Preparation of Green-Emitting Organic EL Device

A green-emitting organic EL device (sometimes referred to as a green-emitting device hereinafter) was prepared and evaluated as follows.

Example 2-1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 1 minute. A film of ITO was 130 nm thick.

After the glass substrate having the transparent electrode line was cleaned, the glass substrate was mounted on a substrate holder of a vacuum evaporation apparatus. Initially, a compound H12 was vapor-deposited on a surface of the glass substrate where the transparent electrode line was provided in a manner to cover the transparent electrode, thereby forming a 5-nm-thick hole injecting layer.

Next, the compound HT2 was vapor-deposited on the hole injecting layer to form a 110-nm-thick hole transporting layer on the HI12 film.

Next, the compound M2 (third compound) was vapor-deposited on the hole transporting layer to form a 15-nm-thick electron blocking layer (second organic layer).

Further, the compound D4 (first compound), the compound TADF2 (second compound) and the compound M1 (fourth compound) were co-deposited on the electron blocking layer to form a 25-nm-thick emitting layer (first organic layer). A concentration of the compound TADF2 was 50 mass %, a concentration of the compound D4 was 0.2 mass %, and a concentration of the compound M1 was 49.8 mass % in the emitting layer.

Next, a compound M10 was vapor-deposited on the emitting layer to form a 5-nm-thick first electron transporting layer.

The compound ET2 was then vapor-deposited on the first electron transporting layer to form a 50-nm-thick second electron transporting layer.

Next, lithium fluoride (LiF) was vapor-deposited on the second electron transporting layer to form a 1-nm-thick electron injecting electrode (cathode).

Metal aluminum (Al) was then vapor-deposited on the electron injecting electrode to form an 80-nm-thick metal Al cathode.

A device arrangement of the green-emitting device in Example 2-1 is schematically shown as follows.

ITO(130)/HI12(5)/HT2(110)/M2(15)/M1:TADF2:D4(25, 49.8%:50%:0.2%)/M10(5)/ET2(50)/LIF(1)/Al(80)

Numerals in parentheses represent a film thickness (unit: nm). The numerals represented by percentage in the same parentheses indicate a ratio (mass %) of the fourth compound, the second compound and the first compound in the emitting layer. The above is also applicable in the description below.

Example 2-2

A green-emitting device of Example 2-2 was prepared in the same manner as in Example 2-1 except that the concentration of the compound M1 in the emitting layer was changed to 74.8 mass % and the concentration of the compound TADF2 in the emitting layer was changed to 25 mass %.

A device arrangement of the green-emitting device in Example 2-2 is schematically shown as follows.

ITO(130)/HI12(5)/HT2(110)/M2(15)/M1:TADF2:D4(25, 74.8%:25%:0.2%)/M10(5)/ET2(50)/LIF(1)/Al(80)

Comparative 2-1

A green-emitting device of Comparative 2-1 was prepared in the same manner as in Example 2-1 except that a compound M8 was used in place of the compound M2 in the electron blocking layer of Example 2-1.

A device arrangement of the green-emitting device in Comparative 2-1 is schematically shown as follows.

ITO(130)/HI12(5)/HT2(110)/M8(15)/M1:TADF2:D4(25, 49.8%:50%:0.2%)/M10(5)/ET2(50)/LIF(1)/Al(80)

Comparative 2-2

A green-emitting device of Comparative 2-2 was prepared in the same manner as in Example 2-2 except that a compound M8 was used in place of the compound M2 in the electron blocking layer of Example 2-2.

A device arrangement of the green-emitting device in Comparative 2-2 is schematically shown as follows.

ITO(130)/HI12(5)/HT2(110)/M8(15)/M1:TADF2:D4(25, 74.8%:25%:0.2%)/M10(5)/ET2(50)/LIF(1)/Al(80)

Comparative 2-3

A green-emitting device of Comparative 2-3 was prepared in the same manner as in Example 2-2 except that a compound M15 was used in place of the compound M2 in the electron blocking layer of Example 2-2.

A device arrangement of the green-emitting device in Comparative 2-3 is schematically shown as follows.

ITO(130)/H12(5)/HT2(110)/M15(15)/M1:TADF2:D4 (25, 74.8%:25%:0.2%)/M10(5)/ET2(50)/LiF(1)/AL(80)

Evaluation of Green-Emitting Devices

The green-emitting devices prepared in Examples 2-1 to 2-2 and Comparatives 2-1 to 2-3 were evaluated as follows. The evaluation results are shown in Table 16. In Table 16, % means "mass %", and @10 means 10 mA/cm².

Lifetime LT95

A voltage was applied on each of the devices using a spectroradiometer CS-200 (manufactured by Konica Minolta, Inc.) such that a current density was 10 mA/cm², where a time (unit: hr) elapsed before a luminance intensity was reduced to 95% of the initial luminance intensity was measured.

Values of Chromaticities CIEx, CIEy, and Main Peak Wavelength $\lambda_p$

Voltage was applied on each of the organic EL devices such that a current density was 10 mA/cm², where spectral radiance spectra were measured by a spectroradiometer CS-2000 (manufactured by Konica Minolta, Inc.). The chromaticities CIEx and CIEy and main peak wavelength $\lambda_p$ (unit: nm) were calculated based on the obtained spectral-radiance spectra.

TABLE 16

|  | 2nd Organic Layer | 1st Organic Layer | | | Evaluation | | | |
| --- | --- | --- | --- | --- | --- | --- | --- | --- |
|  | Third Compound | First Compound | Second Compound | Fourth Compound | CIEx @10 | CIEy @10 | λp (nm) @10 | LT95 (hr) @10 |
| Ex. 2-1 | M2 | D4 (0.2%) | TADF2 (50%) | M1 (49.8%) | 0.356 | 0.602 | 524 | 33.0 |
| Ex. 2-2 | M2 | D4 (0.2%) | TADF2 (25%) | M1 (74.8%) | 0.331 | 0.608 | 522 | 27.8 |
| Comp. 2-1 | M8 | D4 (0.2%) | TADF2 (50%) | M1 (49.8%) | 0.349 | 0.607 | 523 | 18.5 |
| Comp. 2-2 | M8 | D4 (0.2%) | TADF2 (25%) | M1 (74.8%) | 0.319 | 0.612 | 521 | 17.7 |
| Comp. 2-3 | M15 | D4 (0.2%) | TADF2 (25%) | M1 (74.8%) | 0.292 | 0.626 | 519 | 11.6 |

The green emitting devices B according to Examples 2-1 to 2-2, whose first organic layer contains the first compound represented by the formula (1) and the delayed fluorescent second compound and whose second organic layer contains the third compound represented by the formula (3), exhibited higher value of LT95 than devices of Comparatives 2-1 to 2-3 whose second organic layer contains the compound not satisfying the formula (3).

It is thus found that the green-emitting devices of the Examples improve the lifetime.

What is claimed is:

1. An organic electroluminescence device comprising:
   an anode;
   a cathode;
   a first organic layer interposed between the anode and the cathode; and
   a second organic layer interposed between the anode and the first organic layer, wherein the first organic layer comprises a first compound and a second compound,
the second organic layer comprises a third compound,
the first compound is a compound represented by a formula (1) below,
the second compound is a delayed fluorescent compound, and
the third compound is a compound represented by a formula (3) below,

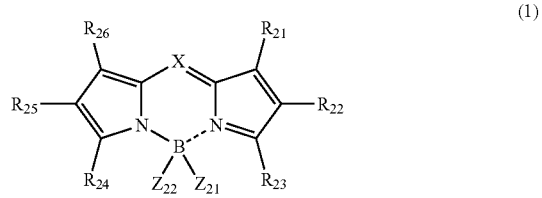

where: in the formula (1), X is a nitrogen atom, or a carbon atom bonded to Y;
Y is a hydrogen atom or a substituent;
$R_{21}$ to $R_{26}$ each independently represent a hydrogen atom or a substituent, or at least one of a pair of $R_{21}$ and $R_{22}$, a pair of $R_{22}$ and $R_{23}$, a pair of $R_{24}$ and $R_{25}$, and a pair of $R_{25}$ and $R_{26}$ are mutually bonded to form a ring;
Y and $R_{21}$ to $R_{26}$ as the substituents are each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, a substituted or unsubstituted alkylthio group having 6 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 7 to 30 carbon atoms, a substituted or unsubstituted heteroaryl group having 5 to 30 ring atoms, a halogen atom, a carboxy group, a substituted or unsubstituted ester group, a substituted or unsubstituted carbamoyl group, a substituted or unsubstituted amino group, a nitro group, a cyano group, a substituted or unsubstituted silyl group, and a substituted or unsubstituted siloxanyl group;

$Z_{21}$ and $Z_{22}$ each independently represent a substituent, or $Z_{21}$ and $Z_{22}$ are mutually bonded to form a ring; and $Z_{21}$ and $Z_{22}$ as the substituents are each independently a group selected from the group consisting of a halogen atom, a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms,

  (3)

where in the formula (3): n is 1, 2, 3 or 4;

a plurality of Cz are mutually the same or different when n is 2, 3, or 4;

$X_B$ is a group represented by a formula (3A) below; and

Cz is a group represented by a formula (3B-1) or a formula (3B-2) below, $$Ar_1\text{-}(Ar_2)_k \qquad (3A)$$

where, in the formula (3A): $Ar_1$ and $Ar_2$ are each independently a substituted or unsubstituted monovalent or polyvalent aromatic hydrocarbon group having 6 to 18 ring carbon atoms;

k is 0, 1, or 2;

a plurality of $Ar_2$ are mutually the same or different when k is 2;

when $Ar_1$ has a substituent D1, the substituent D1 is each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted aralkyl group having 7 to 30 carbon atoms, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 ring carbon atoms, a substituted or unsubstituted silyl group, a halogen atom, a cyano group, and a nitro group;

when $Ar_2$ has a substituent D2, the substituent D2 is selected from the same group for the substituent D1;

when n is 1, Cz is bonded to $Ar_1$ or bonded to $Ar_2$, and when n is 2, 3, or 4, a plurality of Cz are each independently bonded to $Ar_1$ or bonded to $Ar_2$,

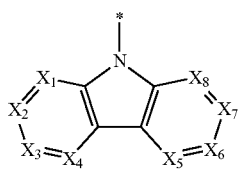  (3B-1)

where, in the formula (3B-1): $X_1$ to $X_8$ are each independently a nitrogen atom or $CR_A$;

$R_A$ represents a hydrogen atom or a substituent, or one or more pairs of adjacent ones of the plurality of $R_A$ are mutually bonded to form a ring;

$R_A$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group;

when $R_A$ is a substituted or unsubstituted heteroaryl group having 5 to 30 ring atoms, the heteroaryl group is each independently a carbazolyl group or an azacarbazolyl group;

a plurality of $R_A$ are mutually the same or different; and the nitrogen atom in the formula (3B-1) is bonded to one of $Ar_1$ and $Ar_2$ in the formula (3A),

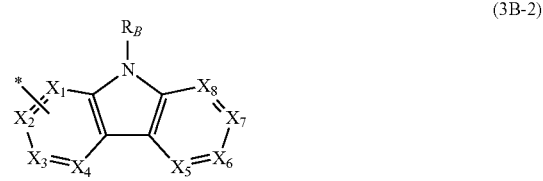  (3B-2)

where, in the formula (3B-2): $X_1$ to $X_4$ each independently represent a carbon atom bonded to one of $Ar_1$ and $Ar_2$ in the formula (3A), a nitrogen atom or $CR_C$, $R_C$ being a hydrogen atom or a substituent, or one or more of pairs of adjacent one of $R_C$ being mutually bonded to form a ring, one of $X_1$ to $X_4$ being the carbon atom bonded to one of $Ar_1$ and $Ar_2$ in the formula (3A);

$X_5$ to $X_8$ represent a nitrogen atom or $CR_D$, $R_D$ being a hydrogen atom or a substituent, or one or more pairs of adjacent ones of the plurality of $R_D$ being mutually bonded to form a ring;

$R_B$, $R_C$ and $R_D$ are each independently selected from the same group for $R_A$ in the formula (3B-1), a plurality of $R_C$ being mutually the same or different, a plurality of $R_D$ being mutually the same or different;

in the third compound, a substituent E meant by "substituted or unsubstituted" is selected from the group consisting of a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a cyano group, a hydroxy group, a nitro group, and a carboxy group; and when the substituent E has a further substituent F, the substituent F is selected from the group consisting of an unsubstituted aryl group having 6 to 30 ring carbon atoms, an unsubstituted alkyl group having 1 to 30 carbon atoms, an unsubstituted alkyl halide group having 1 to 30 carbon atoms, an unsubstituted cycloalkyl group having 3 to 30 ring carbon atoms, an unsubstituted silyl group, an unsubstituted alkoxy group having 1 to 30 carbon atoms, an unsubstituted alkoxy halide group having 1 to 30 carbon atoms, an unsubstituted aryloxy group having 6 to 30 carbon atoms, an unsubstituted alkylthio group having 1 to 30 carbon atoms, an unsubstituted arylthio group having 6 to 30 ring carbon atoms, an unsubstituted aralkyl group having 7 to 30 carbon atoms, an unsubstituted alkenyl group having 2 to 30 carbon atoms, a halogen atom, an unsubstituted alkynyl group having 2 to 30 carbon atoms, a cyano group, a hydroxy group, a nitro group, and a carboxy group, the substituent F having no further substituent.

2. The organic electroluminescence device according to claim 1, wherein
$X_1$ to $X_8$ in the formula (3B-1) are each independently $CR_A$,
$X_1$ to $X_4$ in the formula (3B-2) are each independently a carbon atom bonded to one of $Ar_1$ and $Ar_2$, or $CR_C$, one of $X_1$ to $X_4$ being the carbon atom bonded to one of $Ar_1$ and $Ar_2$ in the formula (3A), and
$X_5$~$X_8$ are each dependently $CR_D$.

3. The organic electroluminescence device according to claim 1, wherein
in the formula (3B-1), no pair of adjacent ones of $R_A$ is mutually bonded, and
in the formula (3B-2), no pair of adjacent ones of $R_C$ is mutually bonded and no pair of adjacent ones of $R_D$ is mutually bonded.

4. The organic electroluminescence device according to claim 1, wherein
$R_A$ in the formula (3B-1) and $R_B$, $R_C$ and $R_D$ in the formula (3B-2) are each independently a hydrogen atom, a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, a carbazolyl group, a substituted carbazolyl group, a halogen atom, or a cyano group.

5. The organic electroluminescence device according to claim 1, wherein
$R_A$ in the formula (3B-1) and $R_B$, $R_C$ and $R_D$ in the formula (3B-2) are each independently a hydrogen atom, a substituted or unsubstituted aryl group having 6 to 30 ring carbon atoms, a substituted or unsubstituted alkyl group having 1 to 30 carbon atoms, or a substituted or unsubstituted alkyl halide group having 1 to 30 carbon atoms.

6. The organic electroluminescence device according to claim 1, wherein
$R_A$ in the formula (3B-1) and $R_C$ and $R_D$ in the formula (3B-2) are each a hydrogen atom.

7. The organic electroluminescence device according to claim 1, wherein
Cz in the formula (3) is a group represented by the formula (3B-1).

8. The organic electroluminescence device according to claim 1, wherein
n in the formula (3) is 1 or 2.

9. The organic electroluminescence device according to claim 1, wherein
$Ar_1$ and $Ar_2$ in the formula (3A) are each independently a monovalent or polyvalent residue derived from one of benzene, biphenyl, terphenyl, naphthalene, anthracene, benzanthracene, phenanthrene, benzophenanthrene, phenalene, picene, pentacene, pyrene, chrysene, benzochrysene, fluoranthene and triphenylene.

10. The organic electroluminescence device according to claim 1, wherein
$Ar_1$ and $Ar_2$ in the formula (3A) are each independently a monovalent or polyvalent residue derived from one of benzene, biphenyl, terphenyl, naphthalene, phenanthrene, fluoranthene and triphenylene.

11. The organic electroluminescence device according to claim 1, wherein
Cz in the formula (3) is a group selected from the group consisting of groups represented by formulae (3B11) to (3B22) below,

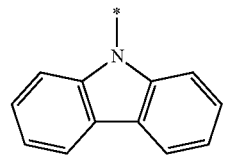
(3B11)

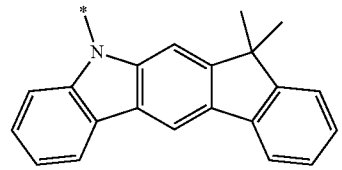
(3B12)

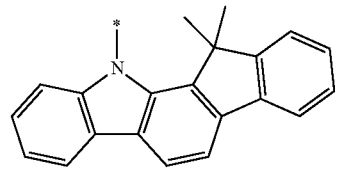
(3B13)

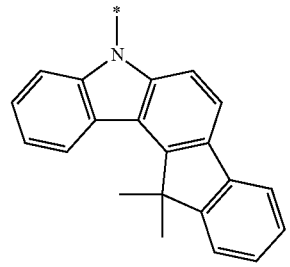
(3B14)

239
-continued (3B15)
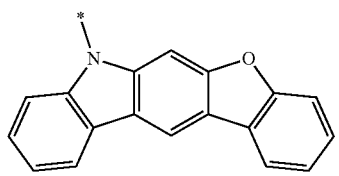

(3B16)
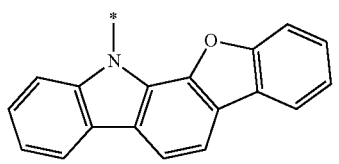

(3B17)
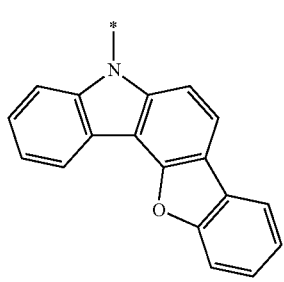

(3B18)
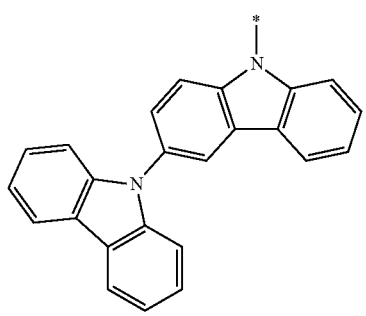

(3B19)
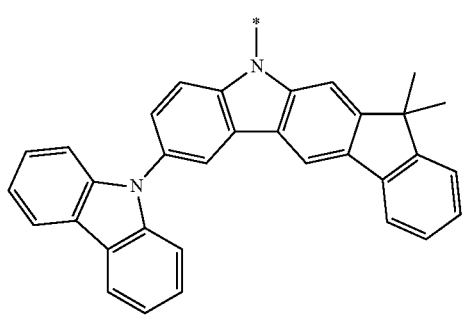

(3B20)
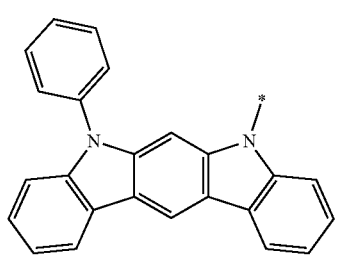

240
-continued (3B21)
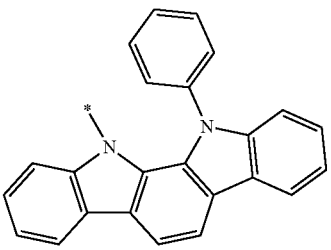

(3B22)
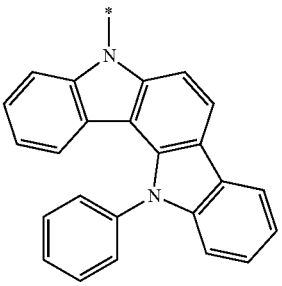

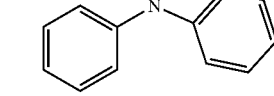

where, in the groups represented by the formulae (3B11) to (3B22), carbon atoms capable of being substituted has a substituent X, which is selected from the same groups for $R_A$ as a substituent or has no substituent, and, when a plurality of substituents X are present, the plurality of substituents X are mutually the same or different.

12. The organic electroluminescence device according to claim 11, wherein
Cz in the formula (3) is a group selected from the group consisting of the groups represented by the formulae (3B11) to (3B17).

13. The organic electroluminescence device according to claim 1, wherein
the third compound is a compound represented by a formula (3C) below, $$(Cz)_{\overline{n1}}-Ar_3 \qquad (3C)$$

where, in the formula (3C): Cz represents the same as Cz in the formula (3);
$Ar_3$ represents the same as $Ar_1$ in the formula (3A); and
n1 represents the same as n in the formula (3A).

14. The organic electroluminescence device according to claim 13, wherein
n1 is 2.

15. The organic electroluminescence device according to claim 13, wherein
n1 is 2, and $Ar_3$ in the formula (3C) is at least one group selected from the group consisting of groups represented by formulae (3a-1) to (3a-27) below, (3a-1)
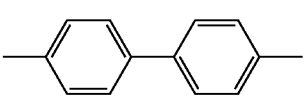

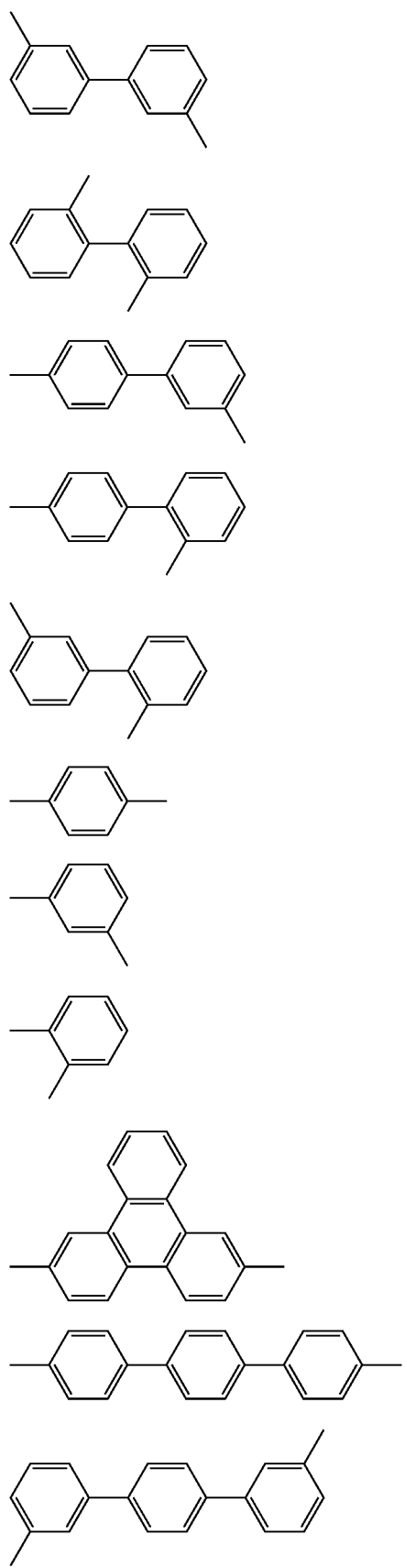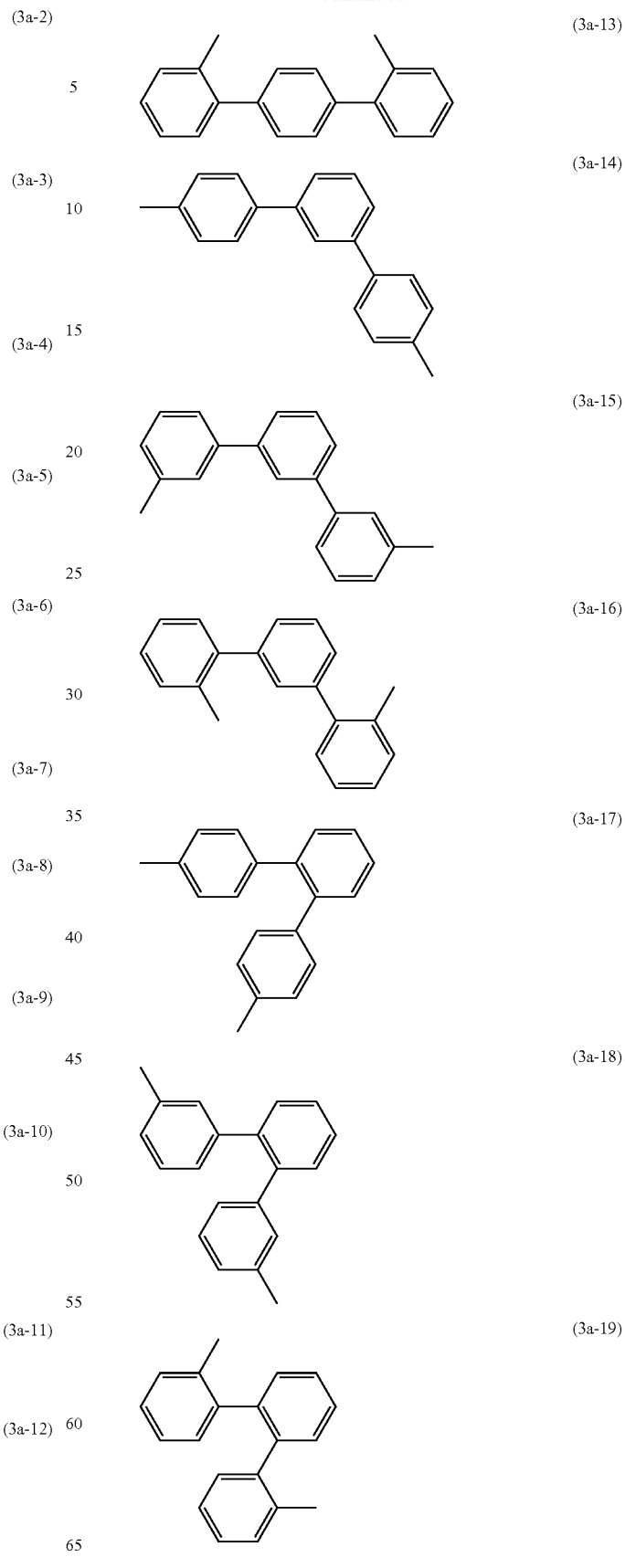

-continued

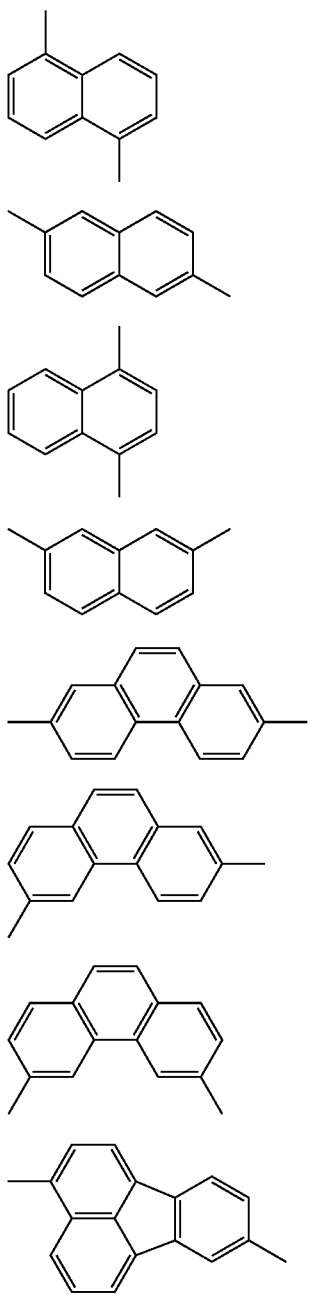

(3a-20)
(3a-21)
(3a-22)
(3a-23)
(3a-24)
(3a-25)
(3a-26)
(3a-27)

the groups represented by the formulae (3a-1) to (3a-27) being substituted by the substituent E, or unsubstituted.

16. The organic electroluminescence device according to claim 1, wherein
in the formulae (3A), (3B-1) and (3B-2), the substituent E meant by "substituted or unsubstituted" is a substitutent selected from the group consisting of an unsubstituted aryl group having 6 to 30 ring carbon atoms, an unsubstituted alkyl group having 1 to 30 carbon atoms, an unsubstituted cycloalkyl group having 3 to 30 ring carbon atoms, a cyano group, and a halogen atom.

17. The organic electroluminescence device according to claim 1, wherein
in the formulae (3A), (3B-1) and (3B-2), the substituent E meant by "substituted or unsubstituted" is a substitutent selected from the group consisting of an unsubstituted aryl group having 6 to 30 ring carbon atoms, and an unsubstituted alkyl group having 1 to 30 carbon atoms.

18. The organic electroluminescence device according to claim 1, wherein
in the formulae (3A), (3B-1) and (3B-2), the substituent E meant by "substituted or unsubstituted" is a substitutent selected from the group consisting of an unsubstituted aryl group having 6 to 18 ring carbon atoms, and an unsubstituted alkyl group having 1 to 6 carbon atoms.

19. The organic electroluminescence device according to claim 1, wherein
Cz is a group represented by the formula (3B-1);
n is 1 or 2;
$R_A$ in the formula (3B-1) is each independently a hydrogen atom, a substituted or unsubstituted aryl group having 6 to 30 ring carbon atoms, a substituted or unsubstituted alkyl group having 1 to 30 carbon atoms, a carbazolyl group, a substituted carbazolyl group, a halogen atom, or a cyano group;
in the formula (3A), k is 0, and $Ar_1$ is a monovalent or polyvalent residue derived from one of benzene, biphenyl, terphenyl, naphthalene, anthracene, benzanthracene, phenanthrene, benzophenanthrene, phenalene, picene, pentacene, pyrene, chrysene, benzochrysene, fluoranthene and triphenylene; and
in the formulae (3A) and (3B-1), the substituent E meant by "substituted or unsubstituted" is a substitutent selected from the group consisting of an unsubstituted aryl group having 6 to 30 ring carbon atoms, an unsubstituted alkyl group having 1 to 30 carbon atoms, an unsubstituted cycloalkyl group having 3 to 30 ring carbon atoms, a cyano group, and a halogen atom.

20. The organic electroluminescence device according to claim 1, wherein
in the formula (3), n is 1 or 2;
in the formula (3A), k is 0, and $Ar_1$ is a monovalent or polyvalent residue derived from one of benzene, biphenyl, terphenyl, naphthalene, phenanthrene, fluoranthene and triphenylene;
$X_1$ to $X_8$ in the formula (3B-1) are each independently $CR_A$;
$X_1$ to $X_4$ in the formula (3B-2) are each independently a carbon atom bonded to $Ar_1$ or $CR_C$, one of $X_1$ to $X_4$ being the carbon atom bonded to $Ar_1$ in the formula (3A), $X_5$ to $X_8$ being each independently $CR_D$;
$R_A$ in the formula (3B-1) and $R_C$ and $R_D$ in the formula (3B-2) are each independently a hydrogen atom, a substituted or unsubstituted aryl group having 6 to 30 ring carbon atoms, or a substituted or unsubstituted alkyl group having 1 to 30 carbon atoms;
$Ar_1$ is at least one group selected from the group consisting of groups represented by formulae (3a-1) to (3a-27) below;
in the formulae (3A), (3B-1) and (3B-2), the substituent E meant by "substituted or unsubstituted" is a substitutent selected from the group consisting of an unsubstituted aryl group having 6 to 30 ring carbon atoms, and an unsubstituted alkyl group having 1 to 30 carbon atoms,

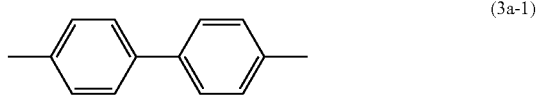

(3a-1)

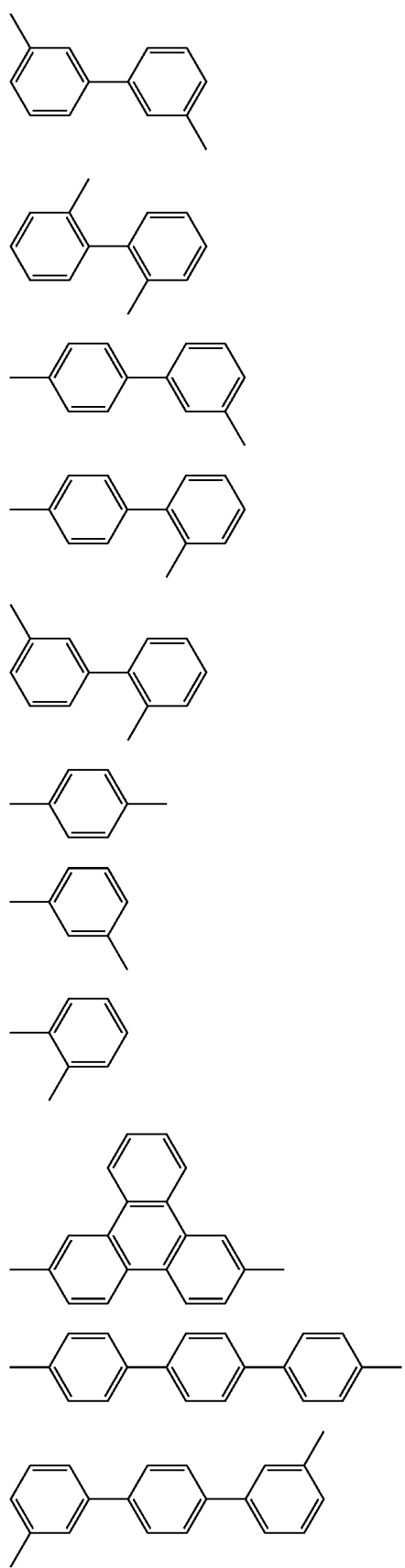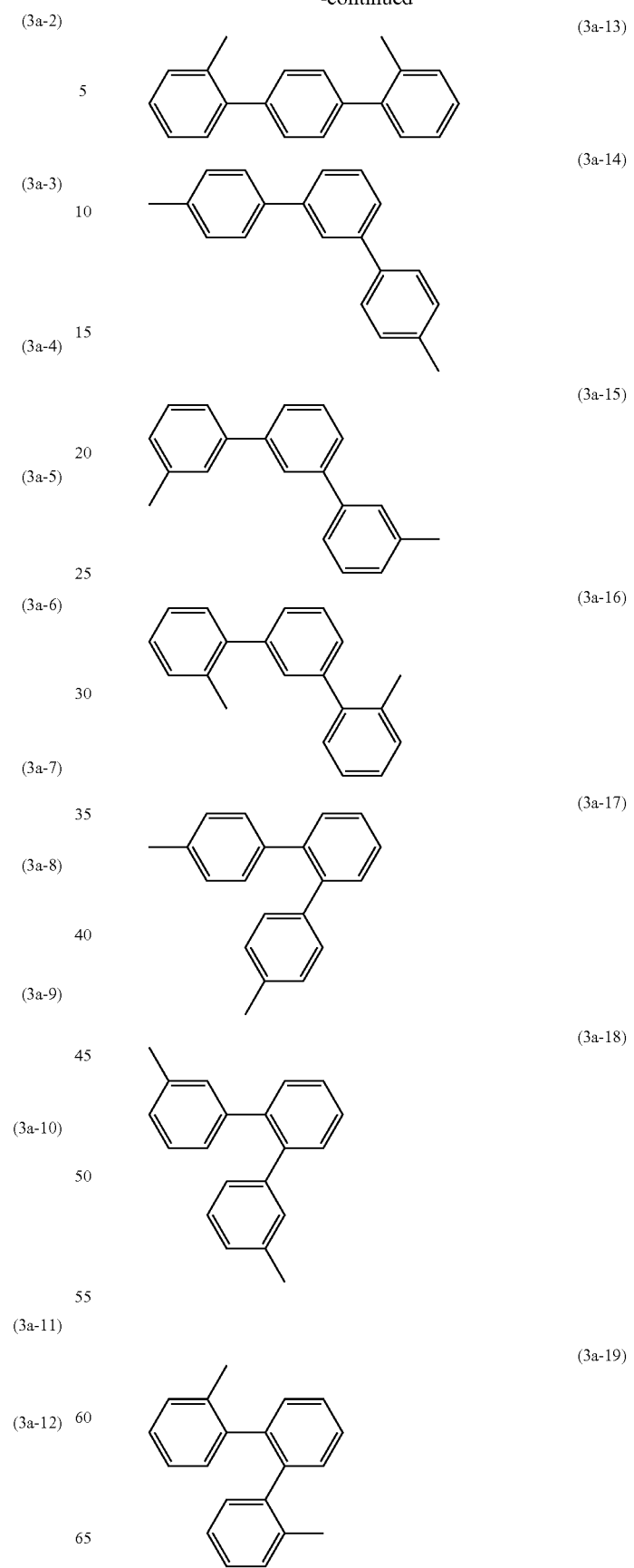

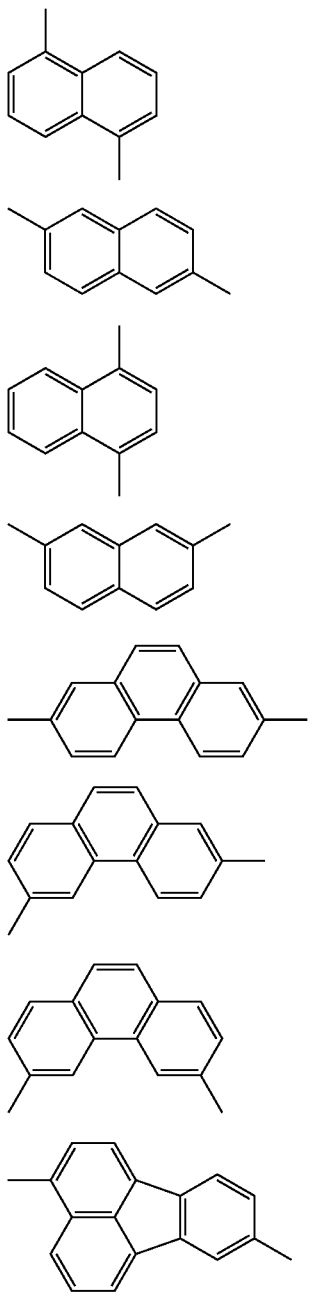

the groups represented by the formulae (3a-1) to (3a-27) being substituted by the substituent E, or unsubstituted.

21. The organic electroluminescence device according to claim 1, wherein:
in the formula (3), n is 2;
in the formula (3A), k is 0;
in the formula (3B-1), no pair of adjacent ones of $R_A$ is mutually bonded;
in the formula (3B-2), no pair of adjacent ones of $R_C$ is mutually bonded and no pair of adjacent ones of $R_D$ is mutually bonded;
$R_A$ in the formula (3B-1) and $R_C$ and $R_D$ in the formula (3B-2) are each independently a hydrogen atom; and
in the formulae (3A), (3B-1) and (3B-2), the substituent E meant by "substituted or unsubstituted" is a substitutent selected from the group consisting of an unsubstituted aryl group having 6 to 18 ring carbon atoms, and an unsubstituted alkyl group having 1 to 6 carbon atoms.

22. The organic electroluminescence device according to claim 1, wherein:
in the formula (3), n is 2;
in the formula (3A), k is 0;
$Ar_1$ is at least one group selected from the group consisting of the groups represented by formulae (3a-1) to (3a-27) below;
in the formula (3B-1), no pair of adjacent ones of $R_A$ is mutually bonded;
in the formula (3B-2), no pair of adjacent ones of $R_C$ is mutually bonded and no pair of adjacent ones of $R_D$ is mutually bonded;
$R_A$ in the formula (3B-1) and $R_C$ and $R_D$ in the formula (3B-2) are each a hydrogen atom; and
in the formulae (3A), (3B-1) and (3B-2), the substituent E meant by "substituted or unsubstituted" is a substitutent selected from the group consisting of an unsubstituted aryl group having 6 to 18 ring carbon atoms, and an unsubstituted alkyl group having 1 to 6 carbon atoms,

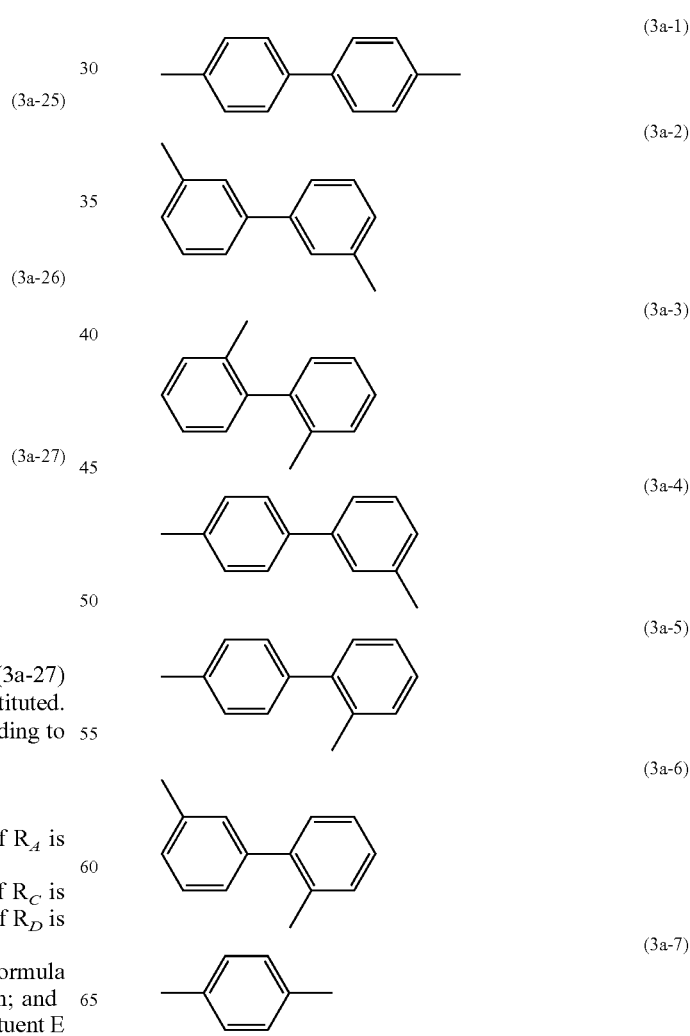

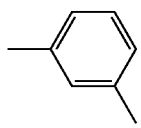
(3a-8)
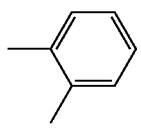
(3a-9)
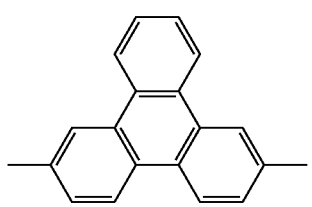
(3a-10)
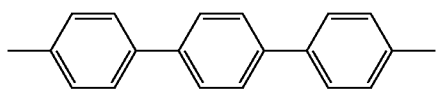
(3a-11)
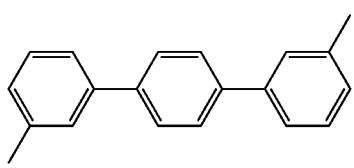
(3a-12)
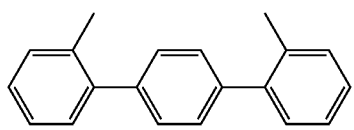
(3a-13)
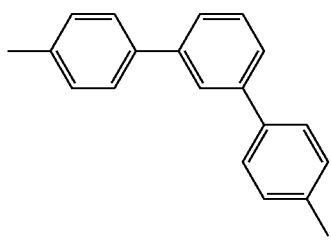
(3a-14)
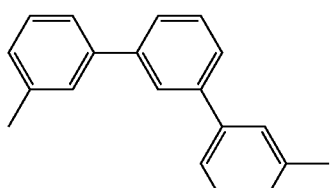
(3a-15)
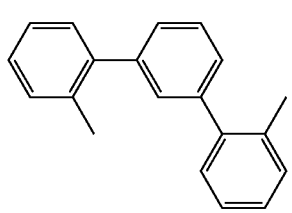
(3a-16)
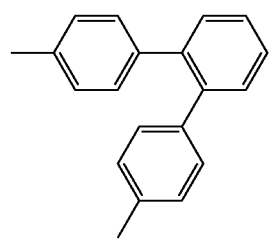
(3a-17)
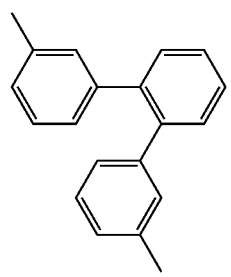
(3a-18)
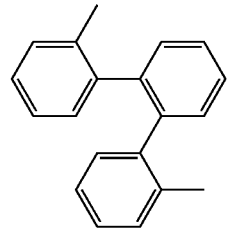
(3a-19)
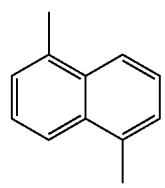
(3a-20)
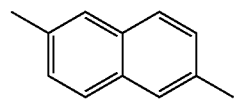
(3a-21)
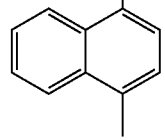
(3a-22)
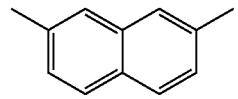
(3a-23)
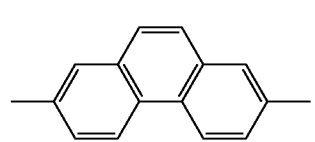
(3a-24)

-continued (3a-25)

(3a-26)

(3a-27)

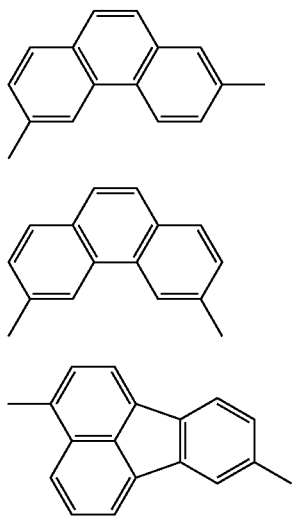

the groups represented by the formulae (3a-1) to (3a-27) being substituted by the substituent E, or unsubstituted.

23. The organic electroluminescence device according to claim 1, wherein
when $Ar_1$ and $Ar_2$ are each a monovalent aromatic hydrocarbon group, $Ar_1$ and $Ar_2$ are each independently selected from the group consisting of groups represented by formulae (3b-1) to (3b-3) below, and
when $Ar_1$ and $Ar_2$ are each a divalent aromatic hydrocarbon group, $Ar_1$ and $Ar_2$ are each independently selected from the group consisting of groups represented by formulae (3b-4) to (3b-10) below.

(3b-1)

(3b-2)

(3b-3)

(3b-4)

(3b-5)

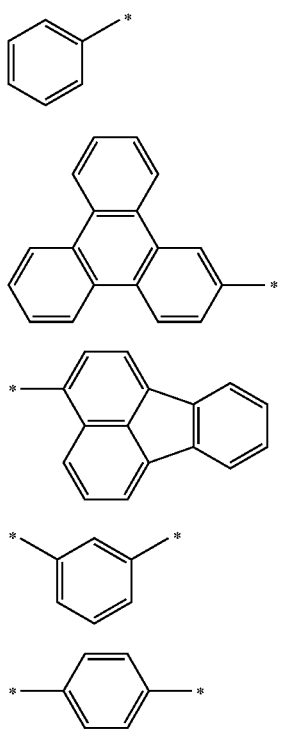

(3b-6)

(3b-7)

(3b-8)

(3b-9)

(3b-10)

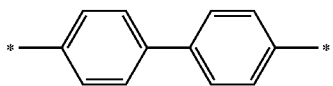
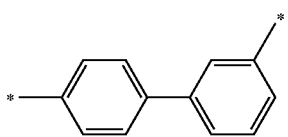
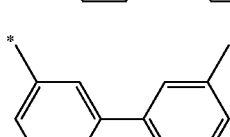
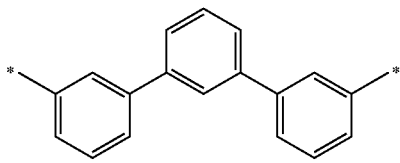
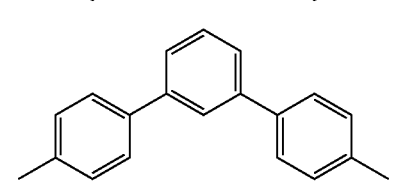

24. The organic electroluminescence device according to claim 1, wherein
$Z_{21}$ and $Z_{22}$ are both fluorine atoms or are both fluorine-atom-substituted alkoxy groups having 1 to 30 carbon atoms.

25. The organic electroluminescence device according to claim 1, wherein
$Z_{21}$ and $Z_{22}$ are both fluorine atoms.

26. The organic electroluminescence device according to claim 1, wherein
the first compound is a compound represented by a formula (10) below, (10)

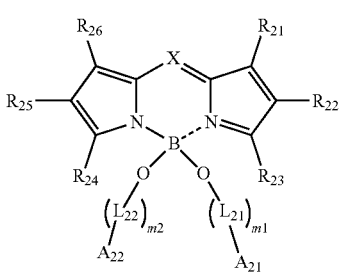

where in the formula (10): X represents the same as X in the formula (1), Y when X is a carbon atom bonded to Y represents the same as Y in the formula (1);
$R_{21}$ to $R_{26}$ each independently represent the same as $R_{21}$ to $R_{26}$ in the formula (1);
$L_{21}$ and $L_{22}$ each independently represent a substituted or unsubstituted alkylene group having 1 to 6 carbon atoms or a substituted or unsubstituted arylene group having 6 to 12 ring carbon atoms;

A$_{21}$ and A$_{22}$ are each independently a substituted or unsubstituted alkyl group having 1 to 6 carbon atoms, a substituted or unsubstituted alkyl halide group having 1 to 6 carbon atoms, or a substituted or unsubstituted aryl group having 6 to 12 ring carbon atoms;

m1 and m2 are each an integer in a range from 0 to 7; and when m1 is an integer in a range from 2 to 7, a plurality of L$_{21}$ are mutually the same or different, when m2 is an integer in a range from 2 to 7, a plurality of L$_{22}$ are mutually the same or different, when m1 is 0, A$_{21}$ is directly bonded to an oxygen atom, and when m2 is 0, A$_{22}$ is directly bonded to an oxygen atom.

27. The organic electroluminescence device according to claim 26, wherein the first compound is a compound represented by a formula (10a) below,

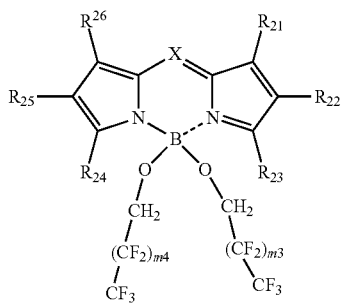

(10a)

where, in the formula (10a): X represents the same as X in the formula (1), Y when X is a carbon atom bonded to Y represents the same as Y in the formula (1);

R$_{21}$ to R$_{26}$ each independently represent the same as R$_{21}$ to R$_{26}$ in the formula (1);

m3 is in a range from 0 to 4;

m4 is in a range from 0 to 4; and m3 and m4 are mutually the same or different.

28. The organic electroluminescence device according to claim 1, wherein:

X is a carbon atom bonded to Y; Y is a hydrogen atom or a substituent;

Y as a substituent is a substituted or unsubstituted aryl group having 6 to 30 ring carbon atoms; and when Y as a substituent is an aryl group having 6 to 30 ring carbon atoms having a substituent, the substituent is a substituted or unsubstituted alkyl group having 1 to 30 carbon atoms, a substituted or unsubstituted alkyl halide group having 1 to 30 carbon atoms, a substituted or unsubstituted alkoxy group having 1 to 30 carbon atoms, a substituted or unsubstituted alkoxy halide group having 1 to 30 carbon atoms, or an aryl group having 6 to 30 ring carbon atoms substituted by an alkyl group having 1 to 30 carbon atoms.

29. The organic electroluminescence device according to claim 1, wherein

R$_{21}$, R$_{23}$, R$_{24}$, and R$_{26}$ each independently represent a substituted or unsubstituted alkyl group having 1 to 30 carbon atoms, a substituted or unsubstituted alkyl halide group having 1 to 30 carbon atoms, or an aryl group having 6 to 30 ring carbon atoms substituted by an alkyl group having 1 to 30 carbon atoms, and R$_{22}$ and R$_{25}$ are hydrogen atoms.

30. The organic electroluminescence device according to claim 1, wherein

R$_{21}$, R$_{23}$, R$_{24}$, and R$_{26}$ each independently represent a substituted or unsubstituted alkyl group having 1 to 6 carbon atoms, a substituted or unsubstituted alkyl halide group having 1 to 6 carbon atoms, or an aryl group having 6 to 12 ring carbon atoms substituted by an alkyl group having 1 to 6 carbon atoms, and R$_{22}$ and R$_{25}$ are hydrogen atoms.

31. The organic electroluminescence device according to claim 1, wherein in the first compound, a substituent meant by "substituted or unsubstituted" is selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted heteroaryl group having 5 to 30 ring atoms, a substituted or unsubstituted alkoxy group having 1 to 30 carbon atoms, a substituted or unsubstituted alkoxy halide group having 1 to 30 carbon atoms, a substituted or unsubstituted alkylthio group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted alkynyl group having 2 to 30 carbon atoms, a substituted or unsubstituted aralkyl group having 7 to 30 carbon atoms, a halogen atom, a carboxy group, a substituted or unsubstituted amino group, a nitro group, a cyano group, a substituted or unsubstituted silyl group, a substituted phosphoryl group, and a hydroxy group.

32. The organic electroluminescence device according to claim 1, wherein in the first compound, a substituent meant by "substituted or unsubstituted" is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, and a substituted or unsubstituted cycloalkyl group having 3 to 30 ring carbon atoms.

33. The organic electroluminescence device according to claim 1, wherein in the first compound, a substituent meant by "substituted or unsubstituted" is selected from the group consisting of a substituted or unsubstituted aryl group having 6 to 12 ring carbon atoms, a substituted or unsubstituted heteroaryl group having 5 to 12 ring atoms, a substituted or unsubstituted alkyl group having 1 to 6 carbon atoms, a substituted or unsubstituted alkyl halide group having 1 to 6 carbon atoms, and a substituted or unsubstituted cycloalkyl group having 3 to 12 ring carbon atoms.

34. The organic electroluminescence device according to claim 1, wherein a singlet energy S$_1$(Mat1) of the first compound and a singlet energy S$_1$(Mat2) of the second compound satisfy a relationship of Numerical Formula 1 below, S$_1$(Mat2)>S$_1$(Mat1)    (Numerical Formula 1).

35. The organic electroluminescence device according to claim 1, wherein the first organic layer comprises a fourth compound, and a singlet energy $S_1(Mat2)$ of the second compound and a singlet energy $S_1(Mat4)$ of the fourth compound satisfy a relationship of Numerical Formula 2 below, $$S_1(Mat4) > S_1(Mat2) \quad \text{(Numerical Formula 2).}$$

36. An electronic device comprising the organic electroluminescence device according to claim 1.

* * * * *